US011732347B2

(12) United States Patent
Okamoto et al.

(10) Patent No.: US 11,732,347 B2
(45) Date of Patent: Aug. 22, 2023

(54) STANDARD MASK APPARATUS AND METHOD OF MANUFACTURING STANDARD MASK APPARATUS

(71) Applicant: Dai Nippon Printing Co., Ltd., Tokyo (JP)

(72) Inventors: Hideyuki Okamoto, Tokyo (JP); Chikao Ikenaga, Tokyo (JP); Yoshihiro Baba, Tokyo (JP); Daigo Aoki, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 95 days.

(21) Appl. No.: 17/194,708

(22) Filed: Mar. 8, 2021

(65) Prior Publication Data

US 2021/0348265 A1 Nov. 11, 2021

(30) Foreign Application Priority Data

Mar. 13, 2020 (JP) ................................ 2020-044575
Mar. 17, 2020 (JP) ................................ 2020-046804
Apr. 24, 2020 (JP) ................................ 2020-077608

(51) Int. Cl.
*C23C 14/52* (2006.01)
*C23C 14/04* (2006.01)
*H10K 71/00* (2023.01)

(52) U.S. Cl.
CPC ............ *C23C 14/52* (2013.01); *C23C 14/042* (2013.01); *H10K 71/00* (2023.02); *Y10T 29/49826* (2015.01); *Y10T 29/49863* (2015.01)

(58) Field of Classification Search
None
See application file for complete search history.

(56) References Cited

U.S. PATENT DOCUMENTS 6,729,927 B2 * 5/2004 Stagnitto ............... C23C 14/042 445/47
6,827,622 B2 * 12/2004 Yamada ................ C23C 14/042 430/315
6,875,542 B2 * 4/2005 Yotsuya .................... G03F 7/12 430/7
6,878,208 B2 * 4/2005 Abiko .................. H01L 51/001 204/298.11
7,074,694 B2 * 7/2006 Kuwahara ............. C23C 14/042 438/455

(Continued)

FOREIGN PATENT DOCUMENTS

JP 2019-065393 A1 4/2019

*Primary Examiner* — Jethro M. Pence
(74) *Attorney, Agent, or Firm* — Burr Patent Law, PLLC

(57) ABSTRACT

A standard mask apparatus includes at least one standard mask including at least one through-hole. The standard mask apparatus may include standard regions each including the at least one through-hole. The standard regions may be arranged in a first direction and in a second direction that intersects with the first direction. A ratio of a dimension of each standard region in the first direction to a dimension of an interval between two of the standard regions in the first direction may be higher than or equal to 0.1. A ratio of a dimension of each standard region in the second direction to a dimension of an interval between the two standard regions in the second direction may be higher than or equal to 0.1.

8 Claims, 77 Drawing Sheets

(56) References Cited

U.S. PATENT DOCUMENTS 7,651,722 B2 * 1/2010 Mori ........ H01L 27/12 118/721
8,151,729 B2 * 4/2012 Ko ........ B23K 31/02 118/301
8,273,179 B2 * 9/2012 Kim ........ B32B 3/266 118/721
8,628,620 B2 * 1/2014 Kawato ........ H01L 21/02263 118/504
9,076,977 B2 * 7/2015 Sonoda ........ H01L 51/0011
9,458,532 B2 * 10/2016 Sonoda ........ H01L 51/56
9,595,674 B2 * 3/2017 Kang ........ C23C 14/042
9,622,319 B2 * 4/2017 Sonoda ........ H01L 27/3211
9,673,424 B2 * 6/2017 Han ........ C23C 14/042
9,741,932 B2 * 8/2017 Sonoda ........ C23C 16/042
9,757,764 B2 * 9/2017 Hong ........ B05C 21/005
9,947,904 B2 * 4/2018 Sonoda ........ H01L 51/56
10,053,766 B2 * 8/2018 Kim ........ C23C 14/042
10,141,511 B2 * 11/2018 Kim ........ H01L 27/3244
10,263,185 B2 * 4/2019 Matsueda ........ C23C 14/165
10,439,170 B2 * 10/2019 Lin ........ H01L 51/0011
10,644,240 B2 * 5/2020 Kim ........ H01L 27/3244
10,669,620 B2 * 6/2020 Sakio ........ C23C 14/12
10,787,729 B2 * 9/2020 Bai ........ C23C 14/042
10,787,730 B2 * 9/2020 Lin ........ B05C 21/005
10,808,314 B2 * 10/2020 Yamabuchi ........ C23C 14/04
10,982,314 B2 * 4/2021 Lin ........ B05D 1/32
10,982,315 B2 * 4/2021 Wang ........ H01L 51/001
11,066,742 B2 * 7/2021 Yamabuchi ........ C23C 14/042
11,136,663 B2 * 10/2021 Kim ........ C23C 14/042
11,149,341 B2 * 10/2021 Zhang ........ H01L 51/0011
11,258,015 B2 * 2/2022 Park ........ H01L 21/682
11,309,518 B2 * 4/2022 Du ........ H01L 51/0097
11,319,625 B2 * 5/2022 Luo ........ H01L 51/0014
11,396,693 B2 * 7/2022 Bai ........ B05C 21/005
2003/0012981 A1 * 1/2003 Yamada ........ H01L 51/56 428/917
2003/0017258 A1 * 1/2003 Yamada ........ C23C 14/12 428/917
2003/0101932 A1 * 6/2003 Kang ........ H01L 51/56 118/504
2003/0151118 A1 * 8/2003 Baude ........ C23C 14/042 257/618
2003/0221614 A1 * 12/2003 Kang ........ C23C 14/042 118/504
2004/0020435 A1 * 2/2004 Tsuchiya ........ C23C 14/042 118/723 VE
2004/0123799 A1 * 7/2004 Clark ........ H01L 51/0011 118/504
2004/0142108 A1 * 7/2004 Atobe ........ C23C 14/24 118/721
2004/0163592 A1 * 8/2004 Abiko ........ C23C 14/042 118/715
2005/0037136 A1 * 2/2005 Yamamoto ........ C23C 14/12 427/66
2005/0098110 A1 * 5/2005 Abiko ........ H01L 51/001 118/715
2006/0057857 A1 * 3/2006 Fleming ........ C23C 14/042 438/761
2006/0103289 A1 * 5/2006 Kim ........ C23C 14/042 313/402
2006/0110663 A1 * 5/2006 Kim ........ C23C 14/042 430/394
2006/0222965 A1 * 10/2006 Tsuruko ........ C23F 1/02 430/311
2006/0258030 A1 * 11/2006 Koeda ........ C23C 14/042 118/715
2007/0018265 A1 * 1/2007 Koeda ........ B82Y 30/00 257/435
2010/0267227 A1 * 10/2010 Ko ........ C23C 14/042 156/60
2011/0067630 A1 * 3/2011 Ko ........ C23C 14/042 118/721
2011/0157575 A1 * 6/2011 Lee ........ H01L 27/3211 313/506
2011/0171768 A1 * 7/2011 Hong ........ C23C 14/042 257/E33.001
2012/0107506 A1 * 5/2012 Ukigaya ........ C23C 14/042 118/500
2012/0237682 A1 * 9/2012 Hong ........ C23C 14/042 118/712
2013/0199445 A1 * 8/2013 Sonoda ........ C23C 14/50 118/712
2014/0033980 A1 * 2/2014 Jeong ........ C23C 14/042 118/720
2014/0041586 A1 * 2/2014 Wu ........ C23C 14/042 118/720
2014/0158044 A1 * 6/2014 Han ........ B05C 21/005 118/504
2015/0026953 A1 * 1/2015 Webb ........ H01L 21/682 118/505
2015/0037928 A1 * 2/2015 Hirobe ........ C23C 14/042 156/272.8
2015/0102329 A1 * 4/2015 Lee ........ H01L 51/0011 438/34
2015/0246416 A1 * 9/2015 Mizumura ........ B23K 26/402 118/504
2015/0259780 A1 * 9/2015 Mizumura ........ C23C 14/042 427/555
2015/0318316 A1 * 11/2015 Xin ........ G02F 1/134309 118/504
2015/0328662 A1 * 11/2015 Mizumura ........ B23K 26/40 427/556
2016/0010201 A1 * 1/2016 Kobayashi ........ C23C 14/042 427/255.5
2016/0079568 A1 * 3/2016 Han ........ C23C 18/31 438/34
2016/0115580 A1 * 4/2016 Mizumura ........ B23K 11/11 264/400
2016/0237546 A1 * 8/2016 Ikenaga ........ C23F 1/02
2016/0369388 A1 * 12/2016 Ma ........ C23C 14/04
2017/0009343 A1 * 1/2017 Cho ........ H01L 51/0011
2017/0104158 A1 * 4/2017 Kawato ........ H01L 51/0011
2017/0106472 A1 * 4/2017 Han ........ C23C 14/042
2017/0141315 A1 * 5/2017 Ikenaga ........ H01L 51/0011
2017/0204506 A1 * 7/2017 Zhang ........ C23C 14/042
2017/0362698 A1 * 12/2017 Kobayashi ........ C23C 16/04
2018/0015493 A1 * 1/2018 Kobayashi ........ H01L 51/5012
2018/0023182 A1 * 1/2018 Ikenaga ........ H05B 33/10 428/137
2018/0026190 A1 * 1/2018 Takeda ........ C23C 16/042 438/99
2018/0040855 A1 * 2/2018 Chen ........ C23C 14/042
2018/0047904 A1 * 2/2018 Kobayashi ........ C23C 14/042
2018/0119268 A1 * 5/2018 Kawato ........ C23C 14/042
2018/0202034 A1 * 7/2018 Lin ........ C23C 14/042
2018/0212150 A1 * 7/2018 Cho ........ C23C 16/042
2018/0216221 A1 * 8/2018 Ji ........ C23C 14/24
2018/0230585 A1 * 8/2018 Bai ........ C23C 14/24
2018/0239241 A1 * 8/2018 Lv ........ B05C 21/005
2018/0277799 A1 * 9/2018 Ikenaga ........ C25D 1/08
2018/0334740 A1 * 11/2018 Ikenaga ........ H01L 51/50
2018/0355466 A1 * 12/2018 Mu ........ C23C 14/24
2018/0366649 A1 * 12/2018 Yamabuchi ........ H01L 51/001
2019/0003033 A1 * 1/2019 Bai ........ C23C 14/042
2019/0018314 A1 * 1/2019 Pei ........ C23C 14/042
2019/0036025 A1 * 1/2019 Nishida ........ H01L 51/5092
2019/0062895 A1 * 2/2019 Zhang ........ B23K 1/0008
2019/0067578 A1 * 2/2019 Kishimoto ........ H01L 51/56
2019/0067579 A1 * 2/2019 Inoue ........ C23C 14/044
2019/0071762 A1 * 3/2019 Kobayashi ........ C23C 14/042
2019/0078193 A1 * 3/2019 Lin ........ C23C 14/042
2019/0097135 A1 * 3/2019 Ichihara ........ C23C 14/24
2019/0144986 A1 * 5/2019 Bai ........ C23C 14/042 118/721
2019/0237349 A1 * 8/2019 Ikenaga ........ B65B 23/00
2019/0256965 A1 * 8/2019 Ikenaga ........ C30B 25/04
2019/0259951 A1 * 8/2019 Seong ........ H01L 21/475
2019/0323117 A1 * 10/2019 Ikenaga ........ C23C 14/04
2019/0345597 A1 * 11/2019 Uchida ........ H01L 51/56

(56) References Cited

U.S. PATENT DOCUMENTS

| | | | | |
|---|---|---|---|---|
| 2019/0345599 | A1* | 11/2019 | Li | C23C 14/042 |
| 2019/0355794 | A1* | 11/2019 | Dai | C23C 14/24 |
| 2019/0372002 | A1* | 12/2019 | Yamabuchi | H01L 51/56 |
| 2020/0019056 | A1* | 1/2020 | Ikenaga | C21D 8/0236 |
| 2020/0189054 | A1* | 6/2020 | Mimura | H01L 51/56 |
| 2020/0384497 | A1* | 12/2020 | Lv | C03C 17/28 |
| 2021/0108304 | A1* | 4/2021 | Kim | G03F 7/2063 |
| 2021/0343760 | A1* | 11/2021 | Jo | C23C 14/54 |
| 2021/0388479 | A1* | 12/2021 | Kim | C23C 14/042 |
| 2022/0020926 | A1* | 1/2022 | Kim | H01L 51/56 |
| 2022/0148931 | A1* | 5/2022 | Okabe | H05B 33/10 |
| 2022/0181595 | A1* | 6/2022 | Kim | C23C 14/042 |

* cited by examiner

| FRAME THICKNESS T2 [mm] | BAR THICKNESS T3 [mm] | T3/T2 | FRAME DEFORMATION AMOUNT K [mm] |
|---|---|---|---|
| 30.0 | 0.0 | 0.00 | 0.0639 |
| 30.0 | 1.5 | 0.05 | 0.0367 |
| 30.0 | 4.0 | 0.13 | 0.0066 |
| 30.0 | 7.0 | 0.23 | 0.0037 |
| 30.0 | 9.7 | 0.32 | 0.0028 |
| 30.0 | 12.3 | 0.41 | 0.0026 |
| 30.0 | 15.0 | 0.50 | 0.0026 |
| 30.0 | 20.0 | 0.67 | 0.0028 |
| 30.0 | 25.0 | 0.83 | 0.0032 |
| 30.0 | 30.0 | 1.00 | 0.0035 |

FIG. 69

STANDARD MASK APPARATUS AND METHOD OF MANUFACTURING STANDARD MASK APPARATUS

CROSS-REFERENCE TO RELATED APPLICATIONS

The present application contains subject matter related to Japanese Patent Application No. 2020-044575 filed in the Japan Patent Office on Mar. 13, 2020, Japanese Patent Application No. 2020-046804 filed in the Japan Patent Office on Mar. 17, 2020, and Japanese Patent Application No. 2020-077608 filed in the Japan Patent Office on Apr. 24, 2020, the entire contents of which are incorporated herein by reference.

BACKGROUND

Field

Embodiments of the present disclosure relate to an evaluation method for a vapor deposition chamber of a manufacturing apparatus for an organic device, a standard mask apparatus and a standard substrate for use in the evaluation method, a method of manufacturing the standard mask apparatus, a manufacturing apparatus for an organic device, including the vapor deposition chamber evaluated in the evaluation method, an organic device including a vapor deposition layer formed in the vapor deposition chamber evaluated in the evaluation method, and a maintenance method for the vapor deposition chamber of the manufacturing apparatus for an organic device.

Background Art

Organic EL display devices have become a focus of attention in the field of display device for use in portable devices, such as smartphones and tablet PCs. As a manufacturing method and a manufacturing apparatus for organic devices, such as organic EL display devices, a method and an apparatus that form pixels in the desired pattern by using a mask including through-holes arranged in a desired pattern are known. For example, initially, an electrode substrate on which first electrodes are formed in a pattern corresponding to pixels is prepared. Subsequently, the electrode substrate is carried into a manufacturing apparatus, and organic material is deposited on the first electrodes via the through-holes of the mask in a vapor deposition chamber to form organic layers, such as light-emitting layers, on the first electrodes. Subsequently, a second electrode is formed on the organic layers. Subsequently, component elements, that is, the organic layers and the like, on the electrode substrate are sealed by a sealing substrate, and then the electrode substrate is carried out from the manufacturing apparatus. In this way, organic devices, such as organic EL display devices, are manufactured. Japanese Unexamined Patent Application Publication No. 2019-065393 is an example of related art.

SUMMARY

When manufactured organic devices do not meet the specifications, an investigation of the cause is needed.

A standard mask apparatus according to an embodiment of the present disclosure includes at least one standard mask including at least one through-hole. The standard mask apparatus may include standard regions each including the at least one through-hole. The standard regions may be arranged in a first direction and in a second direction that intersects with the first direction. A ratio of a dimension of each standard region in the first direction to a dimension of an interval between two of the standard regions in the first direction may be higher than or equal to 0.1. A ratio of a dimension of each standard region in the second direction to a dimension of an interval between two of the standard regions in the second direction may be higher than or equal to 0.1.

According to the present disclosure, a vapor deposition chamber of a manufacturing apparatus for an organic device can be evaluated.

BRIEF DESCRIPTION OF THE DRAWINGS

FIG. 69 is a table showing the results of simulation;

DETAILED DESCRIPTION

Figure 1A:
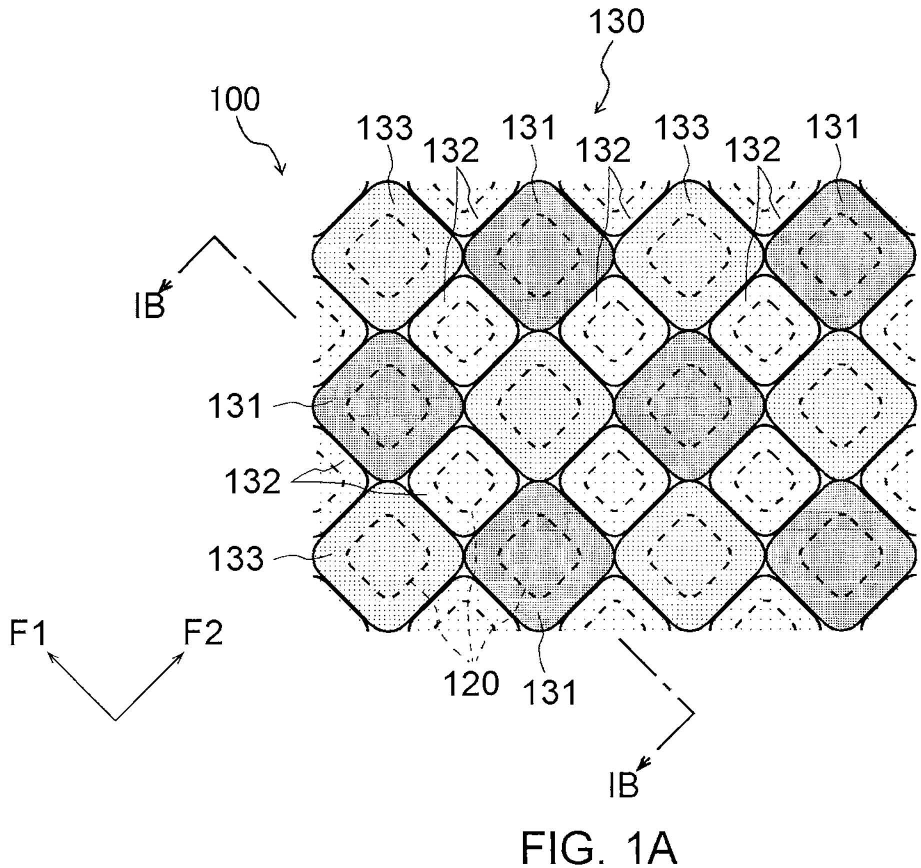
FIG. 1A is a plan view showing an example of an organic device.

In the specification and drawings, terms that mean substances as bases for components such as "substrate", "base material", "plate", "sheet", and "film" are not distinguished from one another based on only differences in name unless otherwise explained.

In the specification and drawings, for example, terms such as "parallel" and "perpendicular", values of length and angle, and the like that specify shape and geometrical conditions and their extents are not limited to strict meanings and are interpreted including a range to such an extent that similar functions can be expected unless otherwise explained.

In the specification and drawings, when a component of a member, a region, or the like is placed "on" or "under", "on the upper side of" or "on the lower side of", or "above" or "below" another component of another member or another region, a case where the component is directly in contact with the another component is included unless otherwise explained. In addition, a case where a third component is included between a component and another component, that is, a case where a component is indirectly in contact with another component, is also included. An up and down direction may be inverted for words "on", "on the upper side of", and "above", or "under", "on the lower side of", and "below" unless otherwise explained.

In the specification and drawings, unless otherwise explained, like reference signs or similar reference signs denote the same portions or portions having similar functions, and the description thereof may not be repeated. The dimensional ratios in the drawings may be different from actual ratios for the sake of convenience of description or part of components may be omitted from the drawings.

In the specification and drawings, unless otherwise explained, one embodiment of the specification may be combined with another embodiment without any contradiction. Other embodiments may also be combined without any contradiction.

In the specification and drawings, unless otherwise explained, when a plurality of steps is disclosed in relation to a method, such as a manufacturing method, another undisclosed step may be performed between disclosed steps. The order of disclosed steps may be selected without any contradiction.

In the specification and drawings, unless otherwise explained, a numeric range expressed by using "to" includes numeric values placed before and behind "to". For example, a numeric range defined by the expression "34 percent by mass to 38 percent by mass" is the same as a numeric range defined by the expression "higher than or equal to 34 percent by mass and lower than or equal to 38 percent by mass".

Hereinafter, one embodiment of the present disclosure will be described in detail with reference to the accompanying drawings. The embodiments described below are examples of the embodiment of the present disclosure, and the present disclosure is not interpreted limitedly to only these embodiments.

A first aspect of the present disclosure is an evaluation method for a vapor deposition chamber of a manufacturing apparatus for an organic device. The evaluation method includes a vapor deposition step of, in the vapor deposition chamber, forming a vapor deposition layer on a standard substrate including a standard mark by depositing a material onto the standard substrate through at least one through-hole of at least one standard mask of a standard mask apparatus, a carry-out step of carrying out the standard substrate including the vapor deposition layer from the manufacturing apparatus, and an observation step of observing a positional relation between the standard mark and the vapor deposition layer on the standard substrate carried out from the manufacturing apparatus.

In a second aspect of the present disclosure, the evaluation method according to the first aspect may further include a determination step of determining whether the positional relation between the standard mark and the vapor deposition layer satisfies a condition.

In a third aspect of the present disclosure, in the evaluation method according to the second aspect, the standard substrate may have divided regions obtained by dividing a region of the standard substrate including the vapor deposition layer into m in a first direction and dividing the region of the standard substrate into n in a second direction that intersects with the first direction. The variables m and n are integers greater than or equal to two. The determination step may determine for each divided region whether a positional relation between the standard mark and the vapor deposition layer satisfies the condition.

In a fourth aspect of the present disclosure, in the evaluation method according to the second or third aspect, the determination step may include a step of determining whether an outer edge of the vapor deposition layer is located inside an outer edge of a first mark of the standard mark.

In a fifth aspect of the present disclosure, in the evaluation method according to the fourth aspect, the determination step may include a step of determining whether the outer edge of the vapor deposition layer is located outside an outer edge of a second mark located inside the first mark.

In a sixth aspect of the present disclosure, in the evaluation method according to the second or third aspect, in the vapor deposition step, the vapor deposition layer may be formed on a light blocking layer that is a component of the standard mark. The observation step may include a step of applying light from, of surfaces of the standard substrate, the surface across from the light blocking layer and the vapor deposition layer toward the standard mark and observing whether excitation light is generated from the vapor deposition layer.

In a seventh aspect of the present disclosure, in the evaluation method according to any one of the first to sixth aspects, the at least one standard mask of the standard mask apparatus may include at least one standard region including the at least one through-hole and a non-penetrated region located around the at least one through-hole and having a dimension greater in plan view than an arrangement period of the at least one through-hole.

In an eighth aspect of the present disclosure, in the evaluation method according to the seventh aspect, the at least one standard mask of the standard mask apparatus may include the two or more standard regions located in a middle region in a width direction of the at least one standard mask and arranged in a longitudinal direction of the at least one standard mask.

In a ninth aspect of the present disclosure, in the evaluation method according to the eighth aspect, the at least one standard mask of the standard mask apparatus may include the two or more through-holes located in an end region adjacent to the middle region in the width direction of the at least one standard mask and arranged in the longitudinal direction and in the width direction of the at least one standard mask.

In a tenth aspect of the present disclosure, in the evaluation method according to the eighth aspect, the at least one standard mask of the standard mask apparatus may include the non-penetrated region located in an end region adjacent to the middle region in the width direction of the at least one standard mask.

In an eleventh aspect of the present disclosure, in the evaluation method according to any one of the first to tenth aspects, the standard mask apparatus may include standard regions each including the at least one through-hole and arranged in a first direction and in a second direction that intersects with the first direction. Each standard region may be located in a device space. The device space is a space that overlaps the organic device to be manufactured in the vapor deposition chamber.

In a twelfth aspect of the present disclosure, in the evaluation method according to any one of the first to eleventh aspects, the standard mask apparatus may include standard regions each including the at least one through-hole and arranged in a first direction and in a second direction that intersects with the first direction. A ratio of a dimension of each standard region in the first direction to a dimension of an interval between two of the standard regions in the first direction may be higher than or equal to 0.1. A ratio of a dimension of each standard region in the second direction to a dimension of an interval between two of the standard regions in the second direction may be higher than or equal to 0.1.

In a thirteenth aspect of the present disclosure, in the evaluation method according to any one of the first to twelfth aspects, the standard mask apparatus may include a frame including a pair of first sides extending in a first direction and a pair of second sides extending in a second direction that intersects with the first direction, and the two or more standard masks fixed to the pair of second sides and arranged in the second direction.

In a fourteenth aspect of the present disclosure, in the evaluation method according to any one of the first to thirteenth aspects, in the carry-out step, the standard substrate may be carried out from the manufacturing apparatus in a state where elements on the standard substrate, including the vapor deposition layer, is not sealed.

A fifteenth aspect of the present disclosure is a standard mask apparatus to be used in the evaluation method according to the first aspect.

In a sixteenth aspect of the present disclosure, the standard mask apparatus according to the fifteenth aspect may include a standard mask including a standard region, the standard region including at least one through-hole and a non-penetrated region located around the at least one through-hole and having a dimension greater in plan view than an arrangement period of the at least one through-hole.

A seventeenth aspect of the present disclosure is a standard mask apparatus for evaluating a vapor deposition chamber of a manufacturing apparatus for an organic device. The standard mask apparatus includes at least one standard mask including at least one through-hole. The standard mask apparatus includes standard regions each including the at least one through-hole and arranged in a first direction and in a second direction that intersects with the first direction. A ratio of a dimension of each standard region in the first direction to a dimension of an interval between two of the standard regions in the first direction is higher than or equal to 0.1. A ratio of a dimension of each standard region in the second direction to a dimension of an interval between two of the standard regions in the second direction is higher than or equal to 0.1.

In an eighteenth aspect of the present disclosure, in the standard mask apparatus according to the seventeenth aspect, each standard region may be located in a device space. The device space is a space that overlaps the organic device to be manufactured in the vapor deposition chamber.

In a nineteenth aspect of the present disclosure, in the standard mask apparatus according to the seventeenth or eighteenth aspect, the standard mask apparatus may include a frame including a pair of first sides extending in the first direction, a pair of second sides extending in the second direction, and an opening, and the two or more standard masks fixed to the pair of second sides and arranged in the second direction.

In a twentieth aspect of the present disclosure, in the standard mask apparatus according to the nineteenth aspect, each standard region may be located in a middle region. The middle region may be a region in a middle when the at least one standard mask is trisected in the second direction.

In a twenty-first aspect of the present disclosure, in the standard mask apparatus according to the twentieth aspect, each standard region may include a non-penetrated region located around the at least one through-hole in the middle region and having a dimension greater in plan view than an arrangement period of the at least one through-hole.

In a twenty-second aspect of the present disclosure, in the standard mask apparatus according to any one of the nineteenth to twenty-first aspects, the standard mask apparatus may include at least one bar located in the opening and connected to the frame. The frame may include a frame first surface to which the at least one standard mask is fixed, a frame second surface located across from the frame first surface, an inner surface located between the frame first surface and the frame second surface and to which the at least one bar is connected, and an outer surface located across from the inner surface. The at least one bar may include a bar first surface located on the frame first surface side, a bar second surface located across from the bar first surface, and bar side surfaces located between the bar first surface and the bar second surface. The frame first surface and the bar first surface may be continuous.

In a twenty-third aspect of the present disclosure, in the standard mask apparatus according to the twenty-second aspect, the frame first surface and the bar first surface may be located in a same plane.

In a twenty-fourth aspect of the present disclosure, in the standard mask apparatus according to the twenty-second or twenty-third aspect, in plan view, the inner surface and each of the bar side surfaces may be connected via a first connection portion having a first radius of curvature.

In a twenty-fifth aspect of the present disclosure, in the standard mask apparatus according to any one of the twenty-second to twenty-fourth aspects, the inner surface and the bar second surface may be connected via a second connection portion having a second radius of curvature.

In a twenty-sixth aspect of the present disclosure, in the standard mask apparatus according to any one of the twenty-second to twenty-fifth aspects, the at least one bar may include a first bar connected to the first sides.

In a twenty-seventh aspect of the present disclosure, in the standard mask apparatus according to any one of the twenty-second to twenty-fifth aspects, the at least one bar may include a second bar connected to the second sides.

In a twenty-eighth aspect of the present disclosure, in the standard mask apparatus according to any one of the twenty-second to twenty-fifth aspects, the at least one bar may include a first bar connected to the first sides and a second bar connected to the second sides. In plan view, each of the bar side surfaces of the first bar and an associated one of the bar side surfaces of the second bar may be connected via a third connection portion having a third radius of curvature.

In a twenty-ninth aspect of the present disclosure, in the standard mask apparatus according to any one of the twenty-second to twenty-eighth aspects, a thickness of the at least one bar may be less than a thickness of the frame.

In a thirtieth aspect of the present disclosure, in the standard mask apparatus according to the twenty-ninth aspect, a ratio of the thickness of the at least one bar to the thickness of the frame may be lower than or equal to 0.85.

A thirty-first aspect of the present disclosure is a method of manufacturing a standard mask apparatus for evaluating a vapor deposition chamber of a manufacturing apparatus for an organic device. The method includes a fixing step of fixing at least one standard mask to a frame. The frame includes a pair of first sides extending in a first direction, a pair of second sides extending in a second direction that intersects with the first direction, and an opening. The at least one standard mask includes a pair of end portions in the first direction and at least one through-hole located between the pair of end portions. The fixing step includes a placement step of placing the at least one standard mask such that the pair of end portions overlaps the pair of second sides, a mask alignment step of, after the placement step, while a joint tension is being applied to the at least one standard mask in the first direction and the at least one standard mask is being pressed against the frame, adjusting a position of the at least one standard mask with respect to the frame, and a joining step of, after the mask alignment step, while a joint tension is being applied to the at least one standard mask in the first direction and the at least one standard mask is being pressed against the frame, joining the at least one standard mask with the frame.

In a thirty-second aspect of the present disclosure, in the method according to the thirty-first aspect, the mask alignment step may include a first checking step of, while a joint tension is being applied to the at least one standard mask in the first direction and the at least one standard mask is being pressed against the frame, checking a position of the at least one through-hole with respect to the frame.

In a thirty-third aspect of the present disclosure, in the method according to the thirty-first or thirty-second aspect, the mask alignment step may include a moving step of, while a joint tension is being applied to the at least one standard mask in the first direction and the at least one standard mask is being pressed against the frame, moving the at least one standard mask in any one of directions in a two-dimensional plane defined by the first direction and the second direction.

In a thirty-fourth aspect of the present disclosure, in the method according to any one of the thirty-first to thirty-third aspects, the frame may include a frame first surface to which the at least one standard mask is fixed, a frame second surface located across from the frame first surface, an inner surface located between the frame first surface and the frame second surface and facing the opening, and a frame wall surface located outside the inner surface in plan view and connected to the frame first surface. The frame wall surface may include a first wall surface edge where the frame wall surface and the frame first surface intersect with each other. In the mask alignment step, the pair of end portions may overlap the first wall surface edge. Part of the first wall surface edge that overlaps the pair of end portions may extend in a straight line in the second direction.

In a thirty-fifth aspect of the present disclosure, in the method according to any one of the thirty-first to thirty-fourth aspects, the standard mask apparatus may include at least one bar located in the opening and connected to the frame. The frame may include a frame first surface to which the at least one standard mask is fixed, a frame second surface located across from the frame first surface, an inner surface located between the frame first surface and the frame second surface and to which the at least one bar is connected, and an outer surface located across from the inner surface. The at least one bar may include a bar first surface located on the frame first surface side, a bar second surface located across from the bar first surface, and bar side surfaces located between the bar first surface and the bar second surface. The frame first surface and the bar first surface may be continuous.

In a thirty-sixth aspect of the present disclosure, in the method according to any one of the thirty-first to thirty-fifth aspects, the standard mask apparatus may include the two or more standard masks fixed to the pair of second sides and arranged in the second direction.

In a thirty-seventh aspect of the present disclosure, in the method according to the thirty-sixth aspect, the standard mask apparatus may include standard regions each including the at least one through-hole, and the standard regions may be arranged in a first direction and in a second direction that intersects with the first direction. Each standard region may include a non-penetrated region located around the at least one through-hole in the middle region, and the non-penetrated region may have a dimension greater in plan view than an arrangement period of the at least one through-hole. The middle region may be a region in a middle when the at least one standard mask is trisected in the second direction.

In a thirty-eighth aspect of the present disclosure, in the method according to the thirty-seventh aspect, each standard region may include a non-penetrated region located around the at least one through-hole in the middle region, and the non-penetrated region may have a dimension greater in plan view than an arrangement period of the at least one through-hole.

A thirty-ninth aspect of the present disclosure is a standard substrate to be used in the evaluation method according to the first aspect.

In a fortieth aspect of the present disclosure is a manufacturing apparatus for an organic device. The manufacturing apparatus includes a vapor deposition chamber evaluated in the evaluation method according to the fourth aspect. In the determination step, it is determined that an outer edge of the vapor deposition layer is located inside an outer edge of a first mark of the standard mark.

A forty-first aspect of the present disclosure is an organic device including a vapor deposition layer formed in the vapor deposition chamber of the manufacturing apparatus according to the fortieth aspect.

A forty-second aspect of the present disclosure is a maintenance method for a vapor deposition chamber of a manufacturing apparatus for an organic device. The maintenance method includes an assembling step of, in the vapor deposition chamber, assembling a standard substrate including a standard mark with a standard mask apparatus in accordance with an assembling condition, a vapor deposition step of, in the vapor deposition chamber, forming a vapor deposition layer on the standard substrate including the standard mark by depositing a material onto the standard substrate through at least one through-hole of at least one standard mask of the standard mask apparatus, a carry-out step of carrying out the standard substrate including the vapor deposition layer from the manufacturing apparatus, an observation step of observing a positional relation between the standard mark and the vapor deposition layer on the standard substrate carried out from the manufacturing apparatus, and an adjustment step of adjusting the assembling condition in accordance with the positional relation between the standard mark and the vapor deposition layer.

In a forty-third aspect of the present disclosure, in the maintenance method according to the forty-second aspect, the adjustment step may include a magnet adjustment step of adjusting a magnetic force distribution of a magnet located on, of surfaces of the standard substrate, the surface side across from the standard mask apparatus or a distribution of electrostatic force of an electrostatic chuck.

In the forty-fourth aspect of the present disclosure, in the maintenance method according to the forty-second or forty-third aspect, the adjustment step may include a cooling plate step of adjusting placement of a cooling plate located on, of surfaces of the standard substrate, the surface side across from the standard mask apparatus.

Hereinafter, one embodiment of the present disclosure will be described in detail with reference to the accompanying drawings. The embodiments described below are examples of the embodiment of the present disclosure, and the present disclosure is not interpreted limitedly to only these embodiments.

Figure 1B:
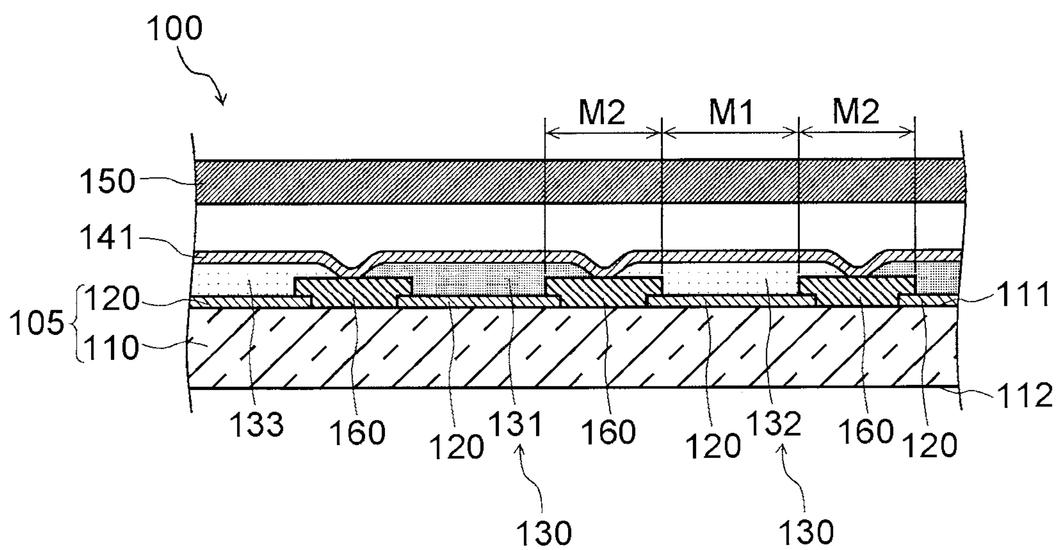
FIG. 1B is a sectional view of the organic device, taken along the line IB-IB in FIG. 1A.

FIG. 1A is a plan view showing an example of an organic device 100. FIG. 1B is a sectional view of the organic device 100, taken along the line IB-IB in FIG. 1A. In FIG. 1A, a second electrode layer 141 and a sealing substrate 150 are not shown.

As shown in FIG. 1A and FIG. 1B, the organic device 100 may include a substrate 110, first electrode layers 120 located on a first surface 111 side of the substrate 110, first organic layers 131, second organic layers 132, and third organic layers 133 respectively located on the first electrode layers 120, and the second electrode layer 141 located on the first organic layers 131, the second organic layers 132, and the third organic layers 133. In the following description, the substrate 110 on which the first electrode layers 120 are formed is also referred to as electrode substrate 105. As indicated by the dashed lines in FIG. 1A, the first electrode layers 120 may be arranged along a first arrangement direction F1 and a second arrangement direction F2 in plan view. As shown in FIG. 1A, the second arrangement direction F2 may be a direction perpendicular to the first arrangement direction F1. Although not shown in the drawing, the second arrangement direction F2 does not need to be perpendicular to the first arrangement direction F1.

As shown in FIG. 1B, the organic device 100 may include an electrically insulating layer 160 located between any adjacent two of the first electrode layers 120 in plan view. The electrically insulating layer 160 contains, for example, polyimide. The electrically insulating layer 160 may overlap the ends of the first electrode layers 120. In this case, the dashed line indicated by the reference sign 120 in FIG. 1A represents the outer edge of the region of the first electrode layer 120, not overlapping the electrically insulating layer 160. As shown in FIG. 1A, the first organic layers 131, the second organic layers 132, and the third organic layers 133 may expand so as to enclose the corresponding first electrode layers 120 in plan view.

The substrate 110 may be an electrically insulative plate-shaped member. The substrate 110 preferably has transparency for transmitting light. The substrate 110 contains, for example, glass.

The first electrode layers 120 contain an electrically conductive material. For example, the first electrode layers 120 contain a metal, an electrically conductive metal oxide, another inorganic material, or the like. The first electrode layers 120 may contain a transparent and electrically conductive metal oxide, such as indium tin oxide.

The first organic layers 131, the second organic layers 132, and the third organic layers 133 are layers containing an organic semiconductor material. When the organic device 100 is an organic EL display device, the first organic layers 131, the second organic layers 132, and the third organic layers 133 each may be a light-emitting layer. For example, the first organic layers 131, the second organic layers 132, and the third organic layers 133 may be respectively red light-emitting layers, green light-emitting layers, and blue light-emitting layers. As shown in FIG. 1A, the first organic layers 131, the second organic layers 132, and the third organic layers 133 may be arranged such that the organic layers of the same type are not adjacent in the first arrangement direction F1 or in the second arrangement direction F2. For example, the first organic layers 131, the second organic layers 132, and the third organic layers 133 may be arranged in the first arrangement direction F1 and in the second arrangement direction F2 such that each second organic layer 132 is located between two of the first organic layers 131 and each second organic layer 132 is located between two of the third organic layers 133.

Each of a set of the first organic layers 131, a set of the second organic layers 132, and a set of the third organic layers 133 may be formed by depositing a vapor deposition material onto the electrode substrate 105 through the through-holes of an associated mask in a vapor deposition chamber in which the mask is set. In the following description, layers formed on the electrode substrate 105 through the through-holes of the masks, that is, the first organic layers 131, the second organic layers 132, the third organic layers 133, and the like are also referred to as first vapor deposition layers and indicated by the reference sign 130. One first vapor deposition layer 130 may make up the unit structure of one pixel or the like of an organic EL display device.

The second electrode layer 141 may contain an electrically conductive material, such as a metal. Examples of the material of the second electrode layer 141 may include platinum, gold, silver, copper, iron, tin, chromium, aluminum, indium, lithium, sodium, potassium, calcium, magnesium, carbon, and alloys of these metals.

As shown in FIG. 1A and FIG. 1B, the second electrode layer 141 may expand so as to lie astride adjacent two of the first vapor deposition layers 130 in plan view. The second electrode layer 141 may be formed by a vapor deposition method as in the case of the first organic layers 131, the second organic layers 132, the third organic layers 133, and the like. In the following description, a layer formed by a vapor deposition method lies astride a plurality of unit structures of the organic device 100, that is, the second electrode layer 141 or the like, is also referred to as second vapor deposition layer and indicated by the reference sign 140.

Although not shown in the drawing, the second electrode layer 141 may be formed such that there is a gap between the second electrode layers 141 located on adjacent two of the organic layers 131, 132, 133. The thus configured second electrode layers 141, as well as the first organic layers 131, the second organic layer 132, and the third organic layers 133, can be formed by depositing a vapor deposition material onto the electrode substrate 105 through the through-holes of a mask. In this case, the second electrode layers 141 may be regarded as a type of first vapor deposition layer 130.

As shown in FIG. 1B, the organic device 100 may include the sealing substrate 150 that covers elements on the substrate 110, that is, the organic layers 131, 132, 133, and the like on the first surface 111 side of the substrate 110. The sealing substrate 150 is capable of suppressing entry of water vapor or the like from the outside of the organic device 100 into the organic device 100. Thus, degradation of the organic layers 131, 132, 133 and the like due to moisture is suppressed. The sealing substrate 150 contains, for example, glass.

Although not shown in the drawing, the organic device 100 may include a hole injection layer or a hole transport layer located between each first electrode layer 120 and an associated one of the organic layers 131, 132, 133. The organic device 100 may include an electron transport layer or an electron injection layer located between each of the organic layers 131, 132, 133 and the second electrode layer 141. The hole injection layer, the hole transport layer, the electron transport layer, and the electron injection layer each may be the second vapor deposition layer 140 formed by a vapor deposition method so as to lie astride a plurality of unit structures of the organic device 100. Alternatively, the hole injection layer, the hole transport layer, the electron transport layer, and the electron injection layer, as well as the organic layers 131, 132, 133, may be the first vapor deposition layer 130.

Figure 2:
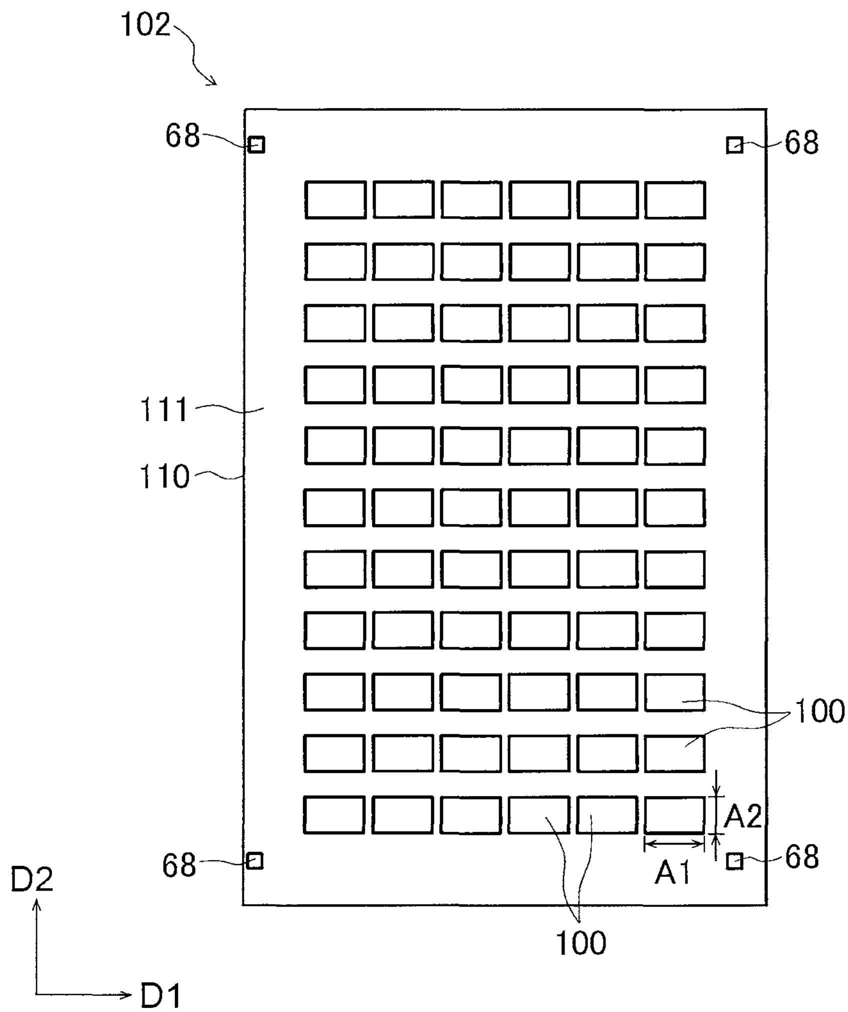
FIG. 2 is a plan view showing an example of an organic device group.

In a method of manufacturing the organic device 100, an organic device group 102 as shown in FIG. 2 may be manufactured. The organic device group 102 includes the two or more organic devices 100. For example, the organic device group 102 may include the organic devices 100 arranged in a first direction D1 and in a second direction D2. The two or more organic devices 100 may include the one common substrate 110. For example, the organic device group 102 may include layers, that is, the first electrode layers 120, the first organic layers 131, the second organic layers 132, the third organic layers 133, the second electrode layers 141, and the like, located on the one substrate 110 and making up the two or more organic devices 100. By dividing the organic device group 102, the single organic devices 100 are obtained.

The first direction D1 may be a direction in which masks 50, 50A extend as will be described later. The second direction D2 may be a direction in which two or more masks 50, 50A are arranged as will be described later.

For example, the dimension A1 of each organic device 100 in the first direction D1 may be greater than or equal to 20 mm, may be greater than or equal to 30 mm, or may be greater than or equal to 50 mm. For example, the dimension A1 may be less than or equal to 100 mm, may be less than or equal to 200 mm, or may be less than or equal to 300 mm. The range of the dimension A1 may be determined from a first group consisting of 20 mm, 30 mm, and 50 mm and/or a second group consisting of 100 mm, 200 mm, and 300 mm. The range of the dimension A1 may be determined by a combination of any one of the values included in the first group and any one of the values included in the second group. The range of the dimension A1 may be determined by a combination of any two of the values included in the first group. The range of the dimension A1 may be determined by a combination of any two of the values included in the second group. For example, the range of the dimension A1 may be greater than or equal to 20 mm and less than or equal to 300 mm, may be greater than or equal to 20 mm and less than or equal to 200 mm, may be greater than or equal to 20 mm and less than or equal to 100 mm, may be greater than or equal to 20 mm and less than or equal to 50 mm, may be greater than or equal to 20 mm and less than or equal to 30 mm, may be greater than or equal to 30 mm and less than or equal to 300 mm, may be greater than or equal to 30 mm and less than or equal to 200 mm, may be greater than or equal to 30 mm and less than or equal to 100 mm, may be greater than or equal to 30 mm and less than or equal to 50 mm, may be greater than or equal to 50 mm and less than or equal to 300 mm, may be greater than or equal to 50 mm and less than or equal to 200 mm, may be greater than or equal to 50 mm and less than or equal to 100 mm, may be greater than or equal to 100 mm and less than or equal to 300 mm, may be greater than or equal to 100 mm and less than or equal to 200 mm, or may be greater than or equal to 200 mm and less than or equal to 300 mm.

For example, the dimension A2 of each organic device 100 in the second direction D2 may be greater than or equal to 20 mm, may be greater than or equal to 30 mm, or may be greater than or equal to 50 mm. For example, the dimension A2 may be less than or equal to 100 mm, may be less than or equal to 200 mm, or may be less than or equal to 300 mm. The range of the dimension A2 may be determined from a first group consisting of 20 mm, 30 mm, and 50 mm and/or a second group consisting of 100 mm, 200 mm, and 300 mm. The range of the dimension A2 may be determined by a combination of any one of the values included in the first group and any one of the values included in the second group. The range of the dimension A2 may be determined by a combination of any two of the values included in the first group. The range of the dimension A2 may be determined by a combination of any two of the values included in the second group. For example, the range of the dimension A2 may be greater than or equal to 20 mm and less than or equal to 300 mm, may be greater than or equal to 20 mm and less than or equal to 200 mm, may be greater than or equal to 20 mm and less than or equal to 100 mm, may be greater than or equal to 20 mm and less than or equal to 50 mm, may be greater than or equal to 20 mm and less than or equal to 30 mm, may be greater than or equal to 30 mm and less than or equal to 300 mm, may be greater than or equal to 30 mm and less than or equal to 200 mm, may be greater than or equal to 30 mm and less than or equal to 100 mm, may be greater than or equal to 30 mm and less than or equal to 50 mm, may be greater than or equal to 50 mm and less than or equal to 300 mm, may be greater than or equal to 50 mm and less than or equal to 200 mm, may be greater than or equal to 50 mm and less than or equal to 100 mm, may be greater than or equal to 100 mm and less than or equal to 300 mm, may be greater than or equal to 100 mm and less than or equal to 200 mm, or may be greater than or equal to 200 mm and less than or equal to 300 mm.

Figure 3:
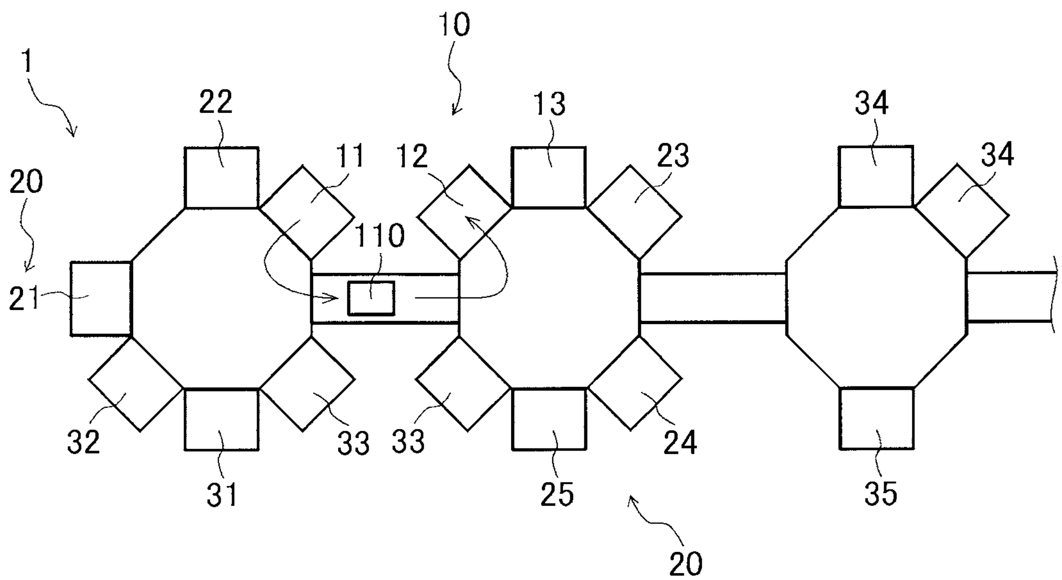
FIG. 3 is a plan view showing an example of a manufacturing apparatus for an organic device.

Next, a manufacturing apparatus 1 for manufacturing the organic device 100 will be described. FIG. 3 is a plan view showing an example of the manufacturing apparatus 1.

The manufacturing apparatus 1 may include vapor deposition chambers each used to form the first vapor deposition layers 130 by depositing a material onto the electrode substrate 105 through the through-holes of a mask in a vacuum atmosphere. For example, as shown in FIG. 3, the vapor deposition chambers of the manufacturing apparatus 1 may include an eleventh vapor deposition chamber 11 for forming the first organic layers 131, a twelfth vapor deposition chamber 12 for forming the second organic layers 132, and a thirteenth vapor deposition chamber 13 for forming the third organic layers 133. In the following description, vapor deposition chambers each used to form the first vapor deposition layers 130 by depositing a material onto the electrode substrate 105 through the through-holes of a mask are referred to as first vapor deposition chambers and indicated by the reference sign 10.

The manufacturing apparatus 1 may include vapor deposition chambers each used to form the second vapor deposition layers 140 by depositing a material onto the electrode substrate 105 in a vacuum atmosphere. For example, as shown in FIG. 3, the vapor deposition chambers of the manufacturing apparatus 1 may include a twenty-first vapor deposition chamber 21 for forming hole injection layers, a twenty-second vapor deposition chamber 22 for forming hole transport layers, a twenty-third vapor deposition chamber 23 for forming electron transport layers, a twenty-fourth vapor deposition chamber 24 for forming electron injection layers, and a twenty-fifth vapor deposition chamber 25 for forming the second electrode layer 141. In the following description, vapor deposition chambers each used to form the second vapor deposition layers 140 are referred to as second vapor deposition chambers and indicated by the reference sign 20. When the hole injection layers, the hole transport layers, the electron transport layers, the electron injection layers, the second electrode layer 141, and the like are the first vapor deposition layers 130 as well as the organic layers 131, 132, 133, vapor deposition chambers for forming these layers may be the first vapor deposition chambers 10 using masks.

As shown in FIG. 3, the manufacturing apparatus 1 may include a substrate carrying-in chamber 31 for carrying the substrate 110, that is, the electrode substrate 105 or the like, into the manufacturing apparatus 1. The manufacturing apparatus 1 may include a substrate pretreatment chamber 32 for subjecting the electrode substrate 105 to pretreatment, such as washing. The manufacturing apparatus 1 may include a mask stock chamber 33 in which mask assemblies each including masks to be used in the first vapor deposition chambers 10 are stored. The manufacturing apparatus 1 may include a sealing chamber 34 for assembling the sealing substrate 150 with the substrate 110. The manufacturing apparatus 1 may include a substrate carrying-out chamber 35 for carrying out the substrate 110.

Inside the manufacturing apparatus 1, the substrate 110 may be moved between chambers, that is, vapor deposition chambers and other chambers, by a substrate transport apparatus, such as a robot arm.

Figure 4:
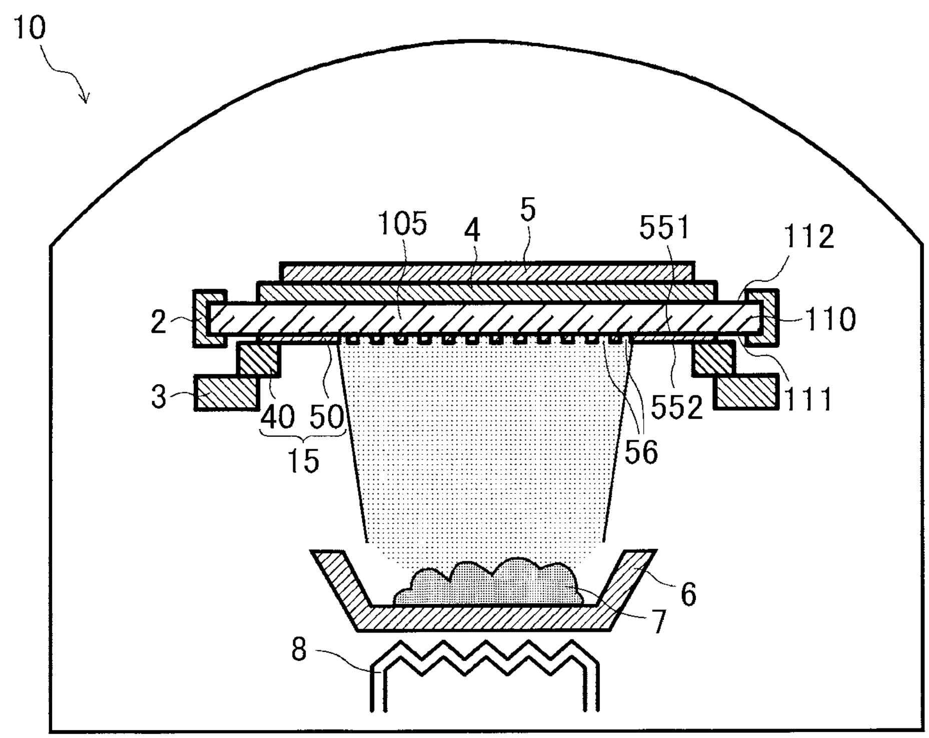
FIG. 4 is a longitudinal sectional view showing an example of a first vapor deposition chamber of the manufacturing apparatus.

Next, the first vapor deposition chamber 10 will be described. FIG. 4 is a longitudinal sectional view showing an example of the first vapor deposition chamber 10.

As shown in FIG. 4, the first vapor deposition chamber 10 may include a vapor deposition source 6, a heater 8, and a mask apparatus 15 inside. The first vapor deposition chamber 10 may further include an evacuating device for producing a vacuum atmosphere inside the first vapor deposition chamber 10. The vapor deposition source 6 is, for example, a melting pot and stores a vapor deposition material 7, such as an organic light-emitting material. The heater 8 vaporizes the vapor deposition material 7 in the vacuum atmosphere by heating the vapor deposition source 6. The mask apparatus 15 is placed so as to face the melting pot 6.

As shown in FIG. 4, the mask apparatus 15 includes at least one mask 50. The mask apparatus 15 may include a mask support 40 that supports the mask 50. The mask support 40 may include a frame 41 including an opening 43. The mask 50 may be fixed to the frame 41 so as to cross the opening 43 in plan view. The frame 41 may support the mask 50 in a state of pulling the mask 50 in its surface direction such that warpage of the mask 50 is suppressed. A mask frame is also referred to as frame.

As shown in FIG. 4, the mask apparatus 15 is placed in the first vapor deposition chamber 10 such that the mask 50 faces the substrate 110 that is an object on which the vapor deposition material 7 is deposited. The mask 50 includes a plurality of through-holes 56 that pass the vapor deposition material 7 flying from the vapor deposition source 6. In the following description, the surface of the mask 50 located adjacent to the substrate 110 is referred to as first surface 551, and the surface of the mask 50 located across from the first surface 551 is referred to as second surface 552. The surface of the substrate 110 located adjacent to the mask apparatus 15 is referred to as first surface 111, and the surface of the substrate 110 located across from the first surface 111 is referred to as second surface 112.

As shown in FIG. 4, the first vapor deposition chamber 10 may include a substrate holder 2 that holds the substrate 110. The substrate holder 2 may be movable in the thickness direction of the substrate 110. The substrate holder 2 may be movable in the surface direction of the substrate 110. The substrate holder 2 may be configured to control the inclination of the substrate 110. For example, the substrate holder 2 may include a plurality of chucks attached to the outer edge of the substrate 110, and each chuck may be movable independently in the thickness direction and the surface direction of the substrate 110.

As shown in FIG. 4, the first vapor deposition chamber 10 may include a mask holder 3 that holds the mask apparatus 15. The mask holder 3 may be movable in the thickness direction of the mask 50. The mask holder 3 may be movable in the surface direction of the mask 50. The mask holder 3 may be configured to control the inclination of the mask 50. For example, the mask holder 3 may include a plurality of chucks attached to the outer edge of the frame 41, and each chuck may be movable independently in the thickness direction and the surface direction of the mask 50.

By moving at least any one of the substrate holder 2 and the mask holder 3, the position of the mask 50 of the mask apparatus 15 with respect to the substrate 110 can be adjusted.

As shown in FIG. 4, the first vapor deposition chamber 10 may include a cooling plate 4 placed on the second surface 112 side. The second surface 112 is, of the surfaces of the substrate 110, the surface across from the mask apparatus 15. The cooling plate 4 may include a channel in the cooling plate 4 for circulating refrigerant. The cooling plate 4 suppresses an increase in the temperature of the substrate 110 in a vapor deposition step.

As shown in FIG. 4, the first vapor deposition chamber 10 may include a magnet 5 placed on the second surface 112 side. The second surface 112 is, of the surfaces of the substrate 110, the surface across from the mask apparatus 15. As shown in FIG. 4, the magnet 5 may be placed on, of the surfaces of the cooling plate 4, the surface across from the mask apparatus 15. The magnet 5 attracts the mask 50 of the mask apparatus 15 toward the substrate 110 by magnetic force. Thus, a gap between the mask 50 and the substrate 110 is reduced, or the gap is eliminated. Therefore, occurrence of a shadow is suppressed in the vapor deposition step, so the dimensional accuracy and positional accuracy of the first vapor deposition layers 130 are increased. In the present application, the shadow means a phenomenon in which the vapor deposition material 7 enters a gap between the mask 50 and the substrate 110 and, as a result, the thickness of the first vapor deposition layer 130 is uneven. The mask 50 may be attracted toward the substrate 110 by using an electrostatic chuck that uses electrostatic force.

Figure 5:
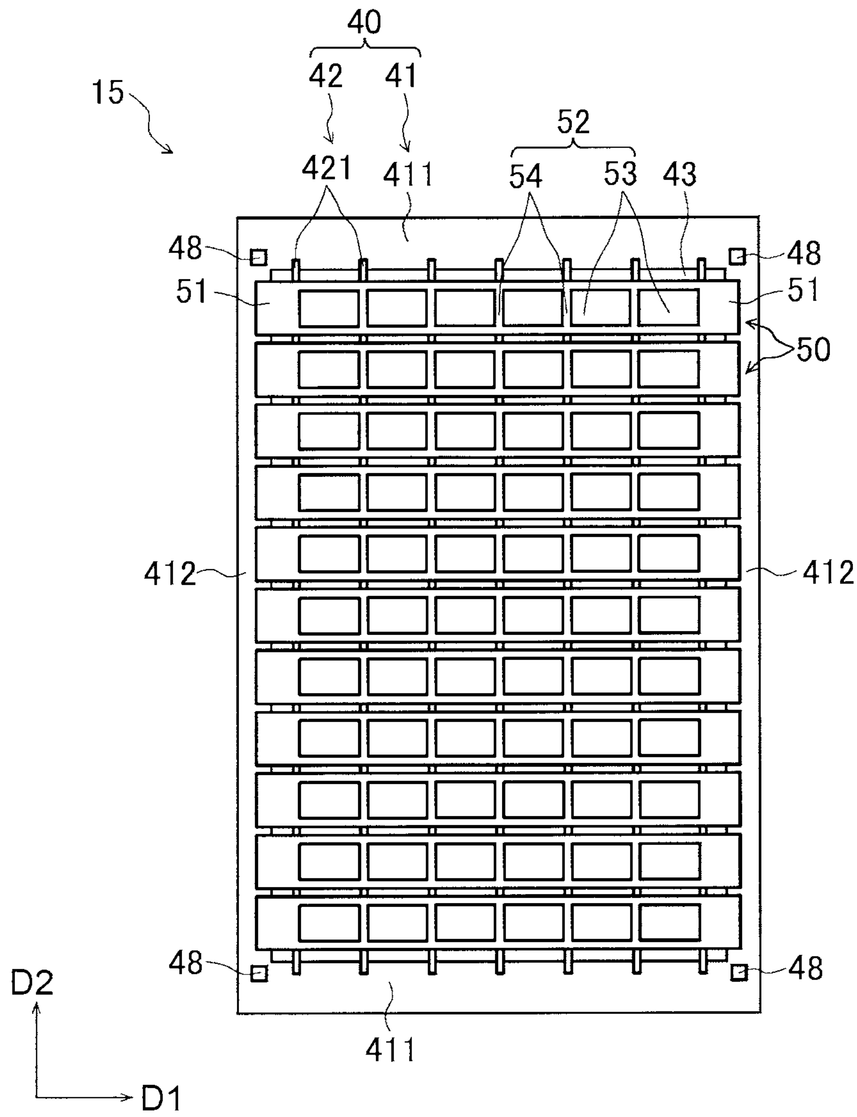
FIG. 5 is a plan view showing an example of a mask apparatus in the first vapor deposition chamber.

FIG. 5 is a plan view showing the mask apparatus 15 when viewed from the first surface 551 side of each mask 50. As shown in FIG. 5, the mask apparatus 15 may include a plurality of the masks 50. In the present embodiment, the shape of each mask 50 may be a rectangular shape extending in the first direction D1. In the mask apparatus 15, the plurality of masks 50 is arranged in a direction that intersects with the first direction D1 that is the longitudinal direction of each mask 50. As shown in Hg. 5, the plurality of masks 50 may be arranged in the second direction D2 that is the width direction of each mask 50. The width direction is perpendicular to the longitudinal direction of each mask 50.

Each mask 50 may be fixed to the frame 41 by, for example, welding at both end portions in the longitudinal direction of the mask 50.

The frame 41 may have a rectangular outline including a pair of first regions 411 extending in the first direction D1 and a pair of second regions 412 extending in the second direction D2. The first regions 411 are also referred to as first sides, and the second regions 412 are also referred to as second sides. As shown in Hg. 5, the second sides 412 to which tabs 51 of each mask 50 are fixed may be longer than the first sides 411.

The mask apparatus 15 may include a member fixed to the frame 41 and partially overlapping each mask 50 in the thickness direction of the mask 50. For example, as shown in FIG. 5, the mask apparatus 15 may include supporting members 42 that support the masks 50 from the lower side. The supporting members 42 may be in contact with the masks 50. Alternatively, the supporting members 42 may indirectly support the masks 50 from the lower side via another member. Although not shown in the drawing, the mask apparatus 15 may include members fixed to the frame 41 and each overlapping a gap between adjacent two of the masks 50. Members located in the opening 43 and connected to the frame 41, that is, the supporting members and the like, are also referred to as bars. In the example shown in FIG. 5, the bars 42 include first bars 421 connected to the first sides 411. The first bars 421 extend in the second direction D2 that intersects with the first direction D1.

As shown in FIG. 5, each mask 50 may include the pair of tabs 51 overlapping the frame 41 and an intermediate portion 52 located between the tabs 51. The tabs 51 are also referred to as end portions. The intermediate portion 52 may include at least one effective region 53 and a peripheral region 54 located around the effective region 53. In the example shown in FIG. 5, the intermediate portion 52 includes a plurality of the effective regions 53 arranged at predetermined intervals along the first direction D1. The peripheral region 54 surrounds the plurality of effective regions 53.

Figure 6:
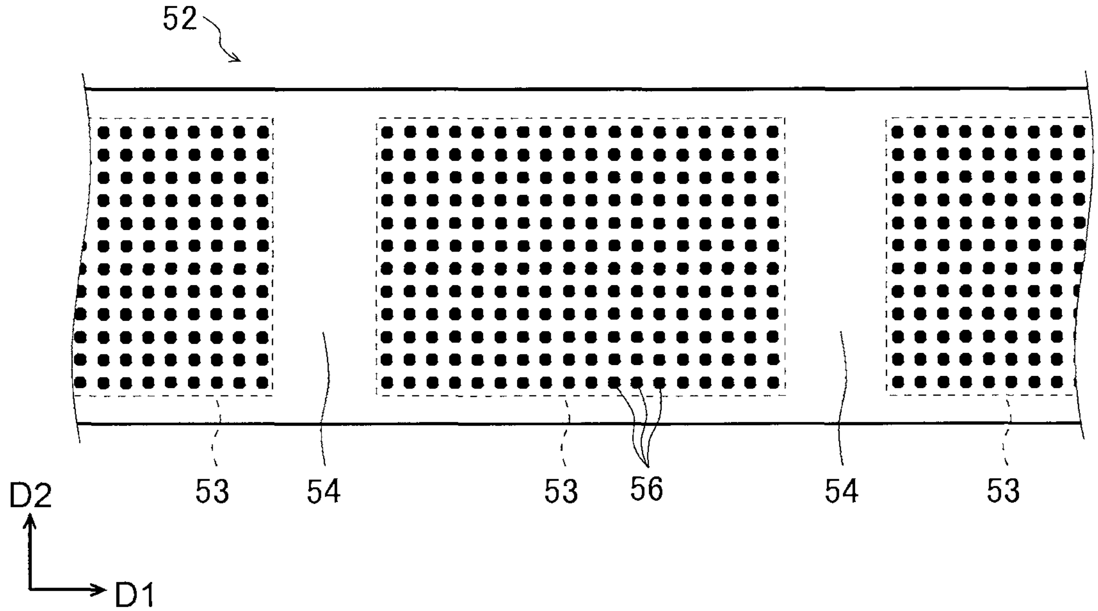
FIG. 6 is a plan view showing an example of an intermediate portion of a mask of the mask apparatus.

FIG. 6 is a plan view showing an example of the intermediate portion 52 of each mask 50. Each of the effective regions 53 of the intermediate portion 52 may include a plurality of through-holes 56. A vapor deposition material deposited onto the substrate 110 through the through-holes 56 of the intermediate portion 52 may form the first vapor deposition layers 130 on the substrate 110. In this case, each of the effective regions 53 includes a group of the through-holes 56 regularly arranged at a period in association with the first vapor deposition layers 130 in plan view.

As shown in FIG. 6, the peripheral region 54 does not need to include the through-holes 56. Although not shown in the drawing, the peripheral region 54 may include through-holes 56. In this case, the through-holes 56 located in the peripheral region 54 do not need to be periodically arranged in plan view. The through-holes 56 located in the peripheral region 54 may be regularly arranged at a period not in association with the first vapor deposition layers 130.

When a display device, such as an organic EL display device, is manufactured by using the masks 50, one effective region 53 corresponds to the display region of one organic EL display device. For this reason, with the mask apparatus 15 shown in FIG. 5, multiple-surface imposition vapor deposition for organic EL display devices is possible. One effective region 53 may correspond to a plurality of display regions. Although not shown in the drawing, a plurality of the effective regions 53 may be arranged at predetermined intervals in the width direction of the mask 50.

The effective region 53 may have a rectangular outline in plan view. The effective region 53 may have an outline of various shapes according to the shape of the display region of an organic EL display device. For example, the effective region 53 may have a circular outline.

Figure 7:
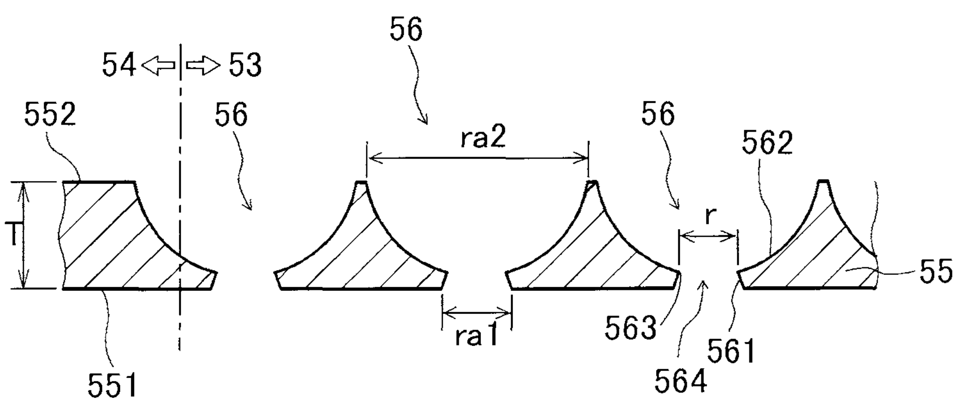
FIG. 7 is a sectional view showing an example of through-holes of the mask.

FIG. 7 is a sectional view showing an example of the mask 50. As shown in FIG. 7, the mask 50 includes a metal plate 55 and the through-holes 56 extending from the first surface 551 of the metal plate 55 to the second surface 552. Each through-hole 56 includes a first recess 561 located on the first surface 551 side of the metal plate 55 and a second recess 562 located on the second surface 552 side and connected to the first recess 561. The second recess 562 may have a dimension r2 greater than a dimension r1 of the first recess 561 in plan view. The first recess 561 and the second recess 562 can be formed by processing the metal plate 55 through etching, laser, or the like from the first surface 551 side and the second surface 552 side.

The first recess 561 and the second recess 562 are connected via a circumferential connection portion 563. The connection portion 563 may define such a pass-through portion 564 in which the opening area of the through-hole 56 is minimum in plan view of the mask 50.

For example, the dimension r of the pass-through portion 564 may be greater than or equal to 10 μm, may be greater than or equal to 15 μm, may be greater than or equal to 20 μm, or may be greater than or equal to 25 μm. For example, the dimension r of the pass-through portion 564 may be less than or equal to 40 μm, may be less than or equal to 45 μm, may be less than or equal to 50 μm, or may be less than or equal to 55 μm. The range of the dimension r of the pass-through portion 564 may be determined from a first group consisting of 10 μm, 15 μm, 20 μm, and 25 μm and/or a second group consisting of 40 μm, 45 μm, 50 μm, and 55 μm. The range of the dimension r of the pass-through portion 564 may be determined by a combination of any one of the values included in the first group and any one of the values included in the second group. The range of the dimension r of the pass-through portion 564 may be determined by a combination of any two of the values included in the first group. The range of the dimension r of the pass-through portion 564 may be determined by a combination of any two of the values included in the second group. For example, the range of the dimension r may be greater than or equal to 10 μm and less than or equal to 55 μm, may be greater than or equal to 10 μm and less than or equal to 50 μm, may be greater than or equal to 10 μm and less than or equal to 45 μm, may be greater than or equal to 10 μm and less than or equal to 40 μm, may be greater than or equal to 10 μm and less than or equal to 25 μm, may be greater than or equal to 10 μm and less than or equal to 20 μm, may be greater than or equal to 10 μm and less than or equal to 15 μm, may be greater than or equal to 15 μm and less than or equal to 55 μm, may be greater than or equal to 15 μm and less than or equal to 50 μm, may be greater than or equal to 15 μm and less than or equal to 45 μm, may be greater than or equal to 15 μm and less than or equal to 40 μm, may be greater than or equal to 15 μm and less than or equal to 25 μm, may be greater than or equal to 15 μm and less than or equal to 20 μm, may be greater than or equal to 20 μm and less than or equal to 55 μm, may be greater than or equal to 20 μm and less than or equal to 50 μm, may be greater than or equal to 20 μm and less than or equal to 45 μm, may be greater than or equal to 20 μm and less than or equal to 40 μm, may be greater than or equal to 20 μm and less than or equal to 25 μm, may be greater than or equal to 25 μm and less than or equal to 55 μm, may be greater than or equal to 25 μm and less than or equal to 50 μm, may be greater than or equal to 25 μm and less than or equal to 45 μm, may be greater than or equal to 25 μm and less than or equal to 40 μm, may be greater than or equal to 40 μm and less than or equal to 55 μm, may be greater than or equal to 40 μm and less than or equal to 50 μm, may be greater than or equal to 40 μm and less than or equal to 45 μm, may be greater than or equal to 45 μm and less than or equal to 55 μm, may be greater than or equal to 45 μm and less than or equal to 50 μm, or may be greater than or equal to 50 μm and less than or equal to 55 μm.

The dimension r of the pass-through portion 564 can be defined by light that transmits through the through-hole 56. For example, parallel rays of light are caused to enter one of the first surface 551 and second surface 552 of the mask 50 along the direction normal to the mask 50, transmit through the through-hole 56, and exit from the other one of the first surface 551 and the second surface 552. The dimension of a region occupied by the exited light in the surface direction of the mask 50 is adopted as the dimension r of the pass-through portion 564.

FIG. 7 shows an example in which the second surface 552 of the metal plate 55 remains between adjacent two of the second recesses 562; however, the configuration is not limited thereto. Although not shown in the drawing, etching may be performed such that adjacent two of the second recesses 562 are connected. In other words, there may be a portion where the second surface 552 of the metal plate 55 does not remain between adjacent two of the second recesses 562.

Next, the material of the mask 50 and frame 41 of the mask apparatus 15 will be described. An iron alloy containing nickel may be used as the major material of the mask 50 and frame 41. An iron alloy may further contain cobalt in addition to nickel. For example, an iron alloy having a total content of nickel and cobalt of higher than or equal to 28 percent by mass and lower than or equal to 54 percent by mass and having a cobalt content of higher than or equal to zero percent by mass and lower than or equal to six percent by mass can be used as the material of the metal plate 55 of the mask 50. Thus, a difference between the coefficient of thermal expansion of the mask 50 and frame 41 and the coefficient of thermal expansion of the substrate 110 containing glass is reduced. Therefore, a decrease in the dimensional accuracy and positional accuracy of the first vapor deposition layers 130, to be formed on the substrate 110, due to thermal expansion of the mask 50, frame 41, substrate 110, and the like is suppressed.

The total content of nickel and cobalt in the metal plate 55 may be higher than or equal to 28 percent by mass and lower than or equal to 38 percent by mass. In this case, specific examples of the iron alloy containing nickel or both nickel and cobalt may include an invar material, a super invar material, and an ultra invar material. The invar material is an iron alloy containing nickel of higher than or equal to 34 percent by mass and lower than or equal to 38 percent by mass, iron of the remaining part, and inevitable impurities. The super invar material is an iron alloy containing nickel of higher than or equal to 30 percent by mass and lower than or equal to 34 percent by mass, cobalt, iron of the remaining part, and inevitable impurities. The ultra invar material is an iron alloy containing nickel of higher than or equal to 28 percent by mass and lower than or equal to 34 percent by mass, cobalt of higher than or equal to two percent by mass and lower than or equal to seven percent by mass, manganese of higher than or equal to 0.1 percent by mass and lower than or equal to 1.0 percent by mass, silicon of lower than or equal to 0.10 percent by mass, carbon of lower than or equal to 0.01 percent by mass, iron of the remaining part, and inevitable impurities.

The total content of nickel and cobalt in the metal plate 55 may be higher than or equal to 38 percent by mass and lower than or equal to 54 percent by mass. In this case, specific examples of the iron alloy containing nickel or both nickel and cobalt may include a low-thermal expansion Fe—Ni plating alloy. The low-thermal expansion Fe—Ni plating alloy is an iron alloy containing nickel of higher than or equal to 38 percent by mass and lower than or equal to 54 percent by mass, iron of the remaining part, and inevitable impurities.

In vapor deposition process, when the temperatures of the mask 50, frame 41, and substrate 110 do not reach high temperatures, the coefficient of thermal expansion of the mask 50 and frame 41 does not need to be set to a value equivalent to the coefficient of thermal expansion of the substrate 110. In this case, a material other than the above-described iron alloys may be used as the material of the mask 50. For example, iron alloys other than the above-described iron alloys containing nickel, such as an iron alloy containing chromium, may be used. For example, an iron alloy referred to as a so-called stainless steel may be used as the iron alloy containing chromium. An alloy other than an iron alloy, such as a nickel alloy and a nickel-cobalt alloy, may be used.

For example, the thickness T of the metal plate 55 of the mask 50 may be greater than or equal to 8 μm, may be greater than or equal to 10 μm, may be greater than or equal to 13 μm, or may be greater than or equal to 15 μm. For example, the thickness T of the metal plate 55 may be less than or equal to 20 μm, may be less than or equal to 30 μm, may be less than or equal to 40 μm, or may be less than or equal to 50 μm. The range of the thickness T of the metal plate 55 may be determined from a first group consisting of 8 μm, 10 μm, 13 μm, and 15 μm and/or a second group consisting of 20 μm, 30 μm, 40 μm, and 50 μm. The range of the thickness T of the metal plate 55 may be determined by a combination of any one of the values included in the first group and any one of the values included in the second group. The range of the thickness T of the metal plate 55 may be determined by a combination of any two of the values included in the first group. The range of the thickness T of the metal plate 55 may be determined by a combination of any two of the values included in the second group. For example, the range of the thickness T may be greater than or equal to 8 μm and less than or equal to 50 μm, may be greater than or equal to 8 μm and less than or equal to 40 μm, may be greater than or equal to 8 μm and less than or equal to 30 μm, may be greater than or equal to 8 μm and less than or equal to 20 μm, may be greater than or equal to 8 μm and less than or equal to 15 μm, may be greater than or equal to 8 μm and less than or equal to 13 μm, may be greater than or equal to 8 μm and less than or equal to 10 μm, may be greater than or equal to 10 μm and less than or equal to 50 μm, may be greater than or equal to 10 μm and less than or equal to 40 μm, may be greater than or equal to 10 μm and less than or equal to 30 μm, may be greater than or equal to 10 μm and less than or equal to 20 μm, may be greater than or equal to 10 μm and less than or equal to 15 μm, may be greater than or equal to 10 μm and less than or equal to 13 μm, may be greater than or equal to 13 μm and less than or equal to 50 μm, may be greater than or equal to 13 μm and less than or equal to 40 μm, may be greater than or equal to 13 μm and less than or equal to 30 μm, may be greater than or equal to 13 μm and less than or equal to 20 μm, may be greater than or equal to 13 μm and less than or equal to 15 μm, may be greater than or equal to 15 μm and less than or equal to 50 μm, may be greater than or equal to 15 μm and less than or equal to 40 μm, may be greater than or equal to 15 μm and less than or equal to 30 μm, may be greater than or equal to 15 μm and less than or equal to 20 μm, may be greater than or equal to 20 μm and less than or equal to 50 μm, may be greater than or equal to 20 μm and less than or equal to 40 μm, may be greater than or equal to 20 μm and less than or equal to 30 μm, may be greater than or equal to 30 μm and less than or equal to 50 μm, may be greater than or equal to 30 μm and less than or equal to 40 μm, or may be greater than or equal to 40 μm and less than or equal to 50 μm.

When the thickness T of the metal plate 55 is less than or equal to 50 μm, the ratio of the vapor deposition material 7 to be caught by the wall surfaces of the through-holes 56 before passing through the through-holes 56 in the vapor deposition material 7 is reduced. Thus, the efficiency of use of the vapor deposition material 7 is increased. When the thickness T of the metal plate 55 is greater than or equal to 8 μm, the strength of the mask 50 is ensured, so occurrence of damage or deformation of the mask 50 is suppressed.

A contact-type measuring method is adopted as a method of measuring the thickness of the metal plate 55. A length gauge HEIDENHAIN-METRO "MT1271" made by HEIDENHAIN, including a ball-push guide-type plunger, is used as the contact-type measuring method.

Next, an example of a method of manufacturing the organic device 100 using the manufacturing apparatus 1 will be described.

Initially, the substrate 110 on which the first electrode layers 120 and the electrically insulating layer 160 are formed is carried into the manufacturing apparatus 1 via the substrate carrying-in chamber 31. Subsequently, the substrate 110 may be subjected to pretreatment, such as dry washing, in the substrate pretreatment chamber 32. Dry washing is, for example, ultraviolet irradiation treatment, plasma treatment, or the like. Hole injection layers may be respectively formed on the first electrode layers 120 in the twenty-first vapor deposition chamber 21. Hole transport layers may be respectively formed on the hole injection layers in the twenty-second vapor deposition chamber 22.

Subsequently, a vapor deposition step of forming the first organic layers 131 is performed in the eleventh vapor deposition chamber 11. Initially, the mask apparatus 15 including the mask 50 associated with the first organic layers 131 is prepared. Subsequently, the mask apparatus 15 is set above the vapor deposition source 6 by using the mask holder 3.

The substrate 110 is faced to the mask 50 of the mask apparatus 15 by using the substrate holder 2. The substrate holder 2 is moved in the surface direction of the substrate 110 to adjust the position of the substrate 110 with respect to the mask 50. For example, the substrate 110 is moved in the surface direction such that alignment marks of the mask 50 or the frame 41 and alignment marks of the substrate 110 overlap each other. In adjusting the position of the substrate 110 in the surface direction, the first surface 111 of the substrate 110 does not need to be in contact with the first surface 551 of the mask 50. In this case, after adjusting the position of the substrate 110 in the surface direction, the substrate holder 2 is moved in the thickness direction of the substrate 110 to bring the first surface 111 of the substrate 110 into contact with the first surface 551 of the mask 50.

Subsequently, a step of placing the cooling plate 4 on the second surface 112 side of the substrate 110 by moving the cooling plate 4 toward the substrate 110 may be performed.

A step of placing the magnet 5 on the second surface 112 side of the substrate 110 may be performed. Thus, the mask 50 is attracted toward the substrate 110 by magnetic force.

Subsequently, the vapor deposition material 7 is vaporized to fly toward the substrate 110. Part of the vapor deposition material 7, passing through the through-holes 56 of the mask 50, is deposited on the substrate 110 in a pattern in association with the through-holes 56. Thus, the first organic layers 131 are formed on the substrate 110.

Subsequently, a vapor deposition step of forming the second organic layers 132 may be performed in the twelfth vapor deposition chamber 12. In addition, a vapor deposition step of forming the third organic layers 133 may be performed in the thirteenth vapor deposition chamber 13. The vapor deposition step for the second organic layers 132 and the vapor deposition step for the third organic layers 133 are similar to the vapor deposition step for the first organic layers 131, so the description is omitted.

Subsequently, electron transport layers may be respectively formed on the organic layers 131, 132, 133 in the twenty-third vapor deposition chamber 23. Electron injection layers may be respectively formed on the electron transport layers in the twenty-fourth vapor deposition chamber 24.

Subsequently, the second electrode layer 141 is formed in the twenty-fifth vapor deposition chamber 25. Then, a sealing step of assembling the sealing substrate 150 with the substrate 110 in the sealing chamber 34 is performed. After that, the substrate 110 is carried out from the manufacturing apparatus 1 to the outside via the substrate carrying-out chamber 35. In this way, the organic device 100 is manufactured.

After that, an inspection step for the organic device 100 may be performed. For example, whether layers, that is, the organic layers 131, 132, 133 and the like, are appropriately formed is inspected by applying a voltage between each first electrode layer 120 and the second electrode layer 141 of the organic device 100. When, for example, the organic layers 131, 132, 133 are light-emitting layers, it is determined whether the organic device 100 is a conforming product in accordance with whether each of the pixels including the organic layers 131, 132, 133 appropriately emits light.

When the organic device 100 does not meet the desired specifications, an investigation of the cause is needed. Factors that can influence whether the organic device 100 is good in the manufacturing step for the organic device 100 are, for example, conceivably as follows.

(1) The accuracy of the positions of the first electrode layers 120 on the substrate 110

(2) The accuracy of the positions of the through-holes 56 of the mask 50 of the mask apparatus 15

(3) The accuracy of the relative position between the mask apparatus 15 and the electrode substrate 105

(4) The thermal expansion of the substrate 110 in the vapor deposition steps (5) The thermal expansion of the mask apparatus 15 in the vapor deposition step (6) A deformation, such as warpage, occurring in the substrate 110

(7) A deformation, such as warpage, occurring in the mask apparatus 15

(1), (4), and (6) are factors based on the characteristics of the electrode substrate 105 including the substrate 110 and the first electrode layers 120. (2), (5), and (7) are factors based on the characteristics of the mask apparatus 15. The relative position between the mask apparatus 15 and the electrode substrate 105 in (3) is adjusted by, for example, moving the substrate holder 2 in the first vapor deposition chamber 10 of the manufacturing apparatus 1. Therefore, (3) is regarded as a factor based on the characteristics of the first vapor deposition chamber 10.

Figure 8:
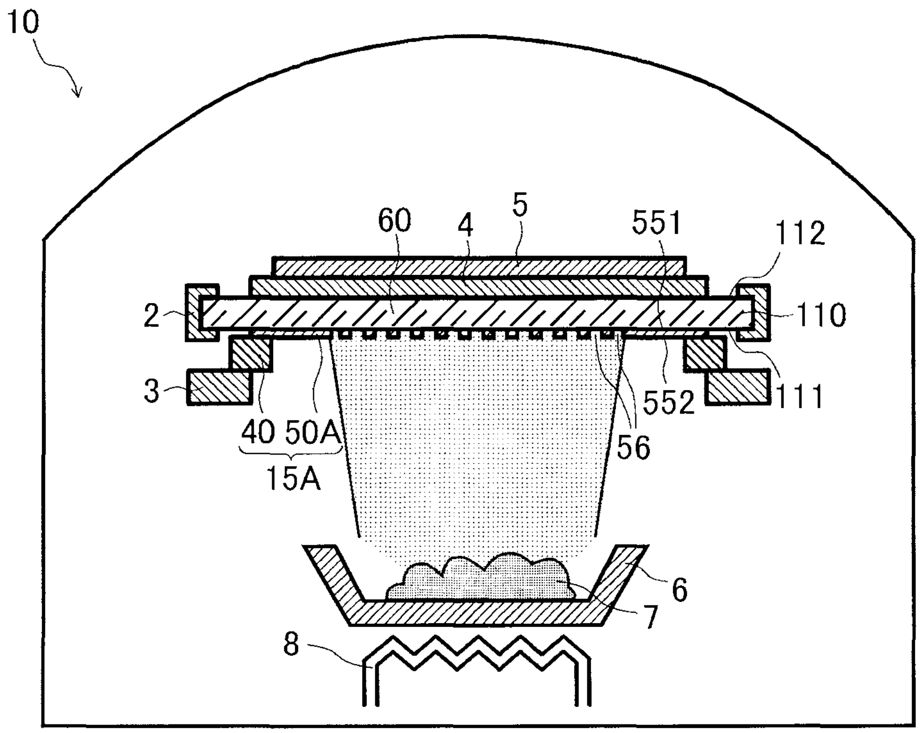
FIG. 8 is a longitudinal sectional view showing an example of the first vapor deposition chamber in which a standard substrate and a standard mask apparatus are set.

In the present embodiment, it is proposed to perform the vapor deposition step in the first vapor deposition chamber 10 of the manufacturing apparatus 1 by using a standard substrate 60 and a standard mask apparatus 15A and to inspect whether the first vapor deposition layers 130 are appropriately formed. Specifically, as shown in FIG. 8, the first vapor deposition layers 130 are formed by depositing a material onto the standard substrate 60 through the through-holes 56 of a standard mask 50A of the standard mask apparatus 15A in the first vapor deposition chamber 10, and it is inspected whether the position and dimension of each first vapor deposition layer 130 is appropriate.

The standard substrate 60 includes the substrate 110 and a pattern for checking the position and dimension of each first vapor deposition layer 130. The standard mask apparatus 15A includes the frame 41 and the standard mask 50A held by the frame 41. The standard substrate 60 and the standard mask apparatus 15A that are guaranteed to appropriately function in the vapor deposition step are used. For example, the standard substrate 60 and the standard mask apparatus 15A having a track record of forming appropriate first vapor deposition layers 130 in another first vapor deposition chamber 10 different from the first vapor deposition chamber 10 to be checked are used. Thus, the possibility of occurrence of a failed position or dimension of each first vapor deposition layer 130 due to the standard substrate 60 and the standard mask apparatus 15A is reduced. For example, a situation in which (1), (4), and (6), and (2), (5), and (7) in the above-described factors (1) to (7) are ignored is provided. Therefore, by performing the vapor deposition step using the standard substrate 60 and the standard mask apparatus 15A, the characteristics of each first vapor deposition chamber 10 included in the manufacturing apparatus 1 can be individually evaluated.

Figure 9A:
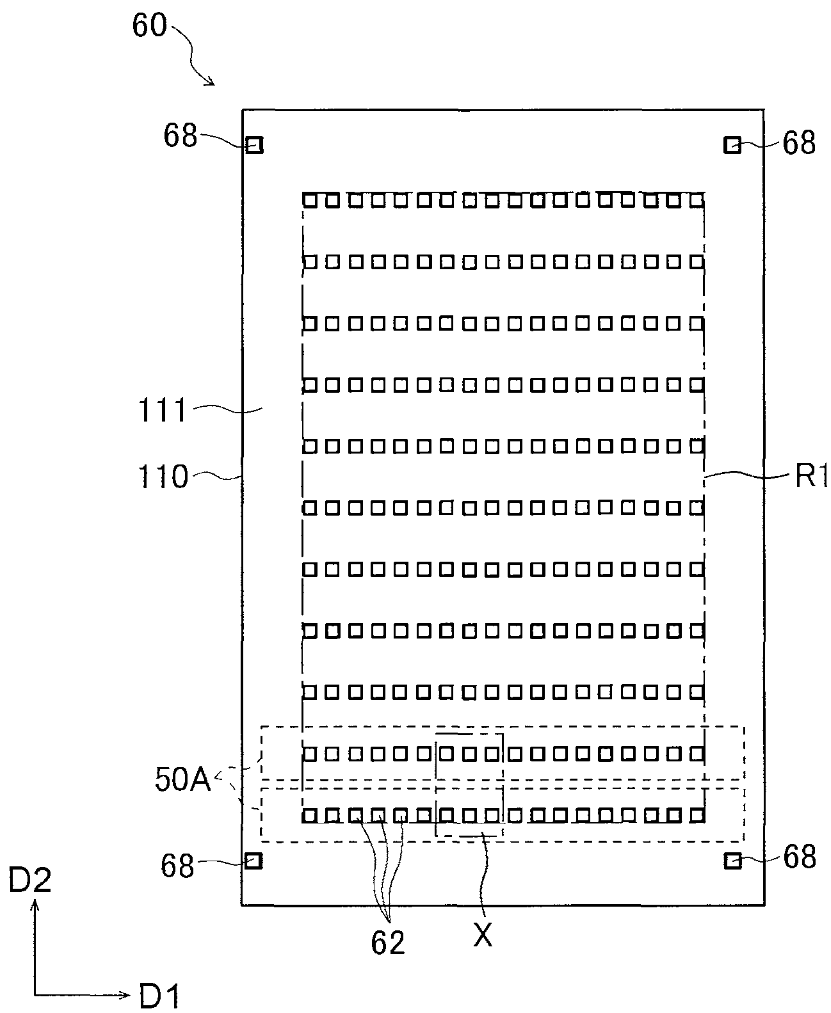
FIG. 9A is a plan view showing an example of the standard substrate.

Next, the standard substrate 60 will be specifically described. FIG. 9A is a plan view showing an example of the standard substrate 60. Like reference signs denote the same portions as those of the electrode substrate 105 among the component elements of the standard substrate 60, and the detailed description may be omitted.

The standard substrate 60 may include the substrate 110 and standard mark regions 62 located on the first surface 111 of the substrate 110. In FIG. 9A, the reference sign 50A indicates the outline of each standard mask 50A when the standard substrate 60 and the standard mask apparatus 15A are assembled to each other. The standard substrate 60 may include two or more standard mark regions 62 arranged in the first direction D1 that is a direction in which the standard masks 50A extend.

As shown in FIG. 9A, the standard mark regions 62 are preferably placed over a wide area of the substrate 110. In FIG. 9A, the region surrounded by the alternate long and short dashed line and indicated by the reference sign R1 represents a range in which the standard mark regions 62 are present on the substrate 110. The presence range R1 of the standard mark regions 62 includes sides extending in the first direction D1 and sides extending in the second direction D2 and is defined by a maximum rectangle that touches the standard mark regions 62. As the ratio of the area of the presence range R1 of the standard mark regions 62 to the area of the substrate 110 increases, the characteristics of the first vapor deposition chamber 10 are evaluated over a wider area.

The ratio of the area of the presence range R1 of the standard mark regions 62 to the area of the substrate 110 may be, for example, higher than or equal to 0.50, may be higher than or equal to 0.70, may be higher than or equal to 0.75, or may be higher than or equal to 0.80. In addition, the ratio of the area of the presence range R1 of the standard mark regions 62 to the area of the substrate 110 may be, for example, lower than or equal to 0.85, may be lower than or equal to 0.90, may be lower than or equal to 0.95, or may be lower than or equal to 0.98. The ratio of the area of the range R1 in which the standard mark regions 62 are present to the area of the substrate 110 may be determined from a first group consisting of 0.50, 0.70, 0.75, and 0.80 and/or a second group consisting of 0.85, 0.90, 0.95, and 0.98. The ratio of the area of the presence range R1 of the standard mark regions 62 to the area of the substrate 110 may be determined by a combination of any one of the values included in the first group and any one of the values included in the second group. The ratio of the area of the presence range R1 of the standard mark regions 62 to the area of the substrate 110 may be determined by a combination of any two of the values included in the first group. The ratio of the area of the presence range R1 of the standard mark regions 62 to the area of the substrate 110 may be determined by a combination of any two of the values included in the second group. For example, the range of the ratio may be higher than or equal to 0.50 and lower than or equal to 0.98, may be higher than or equal to 0.50 and lower than or equal to 0.95, may be higher than or equal to 0.50 and lower than or equal to 0.90, may be higher than or equal to 0.50 and lower than or equal to 0.85, may be higher than or equal to 0.50 and lower than or equal to 0.80, may be higher than or equal to 0.50 and lower than or equal to 0.75, may be higher than or equal to 0.50 and lower than or equal to 0.70, may be higher than or equal to 0.70 and lower than or equal to 0.98, may be higher than or equal to 0.70 and lower than or equal to 0.95, may be higher than or equal to 0.70 and lower than or equal to 0.90, may be higher than or equal to 0.70 and lower than or equal to 0.85, may be higher than or equal to 0.70 and lower than or equal to 0.80, may be higher than or equal to 0.70 and lower than or equal to 0.75, may be higher than or equal to 0.75 and lower than or equal to 0.98, may be higher than or equal to 0.75 and lower than or equal to 0.95, may be higher than or equal to 0.75 and lower than or equal to 0.90, may be higher than or equal to 0.75 and lower than or equal to 0.85, may be higher than or equal to 0.75 and lower than or equal to 0.80, may be higher than or equal to 0.80 and lower than or equal to 0.98, may be higher than or equal to 0.80 and lower than or equal to 0.95, may be higher than or equal to 0.80 and lower than or equal to 0.90, may be higher than or equal to 0.80 and lower than or equal to 0.85, may be higher than or equal to 0.85 and lower than or equal to 0.98, may be higher than or equal to 0.85 and lower than or equal to 0.95, may be higher than or equal to 0.85 and lower than or equal to 0.90, may be higher than or equal to 0.90 and lower than or equal to 0.98, may be higher than or equal to 0.90 and lower than or equal to 0.95, or may be higher than or equal to 0.95 and lower than or equal to 0.98.

As shown in FIG. 9A, the standard substrate 60 may include alignment marks 68. The alignment marks 68 can be used to adjust the position of the substrate 110 of the standard substrate 60 with respect to the standard mask apparatus 15A. The alignment marks 68 of the standard substrate 60 may be located outside the presence range R1 of the standard mark regions 62.

Figure 9B:
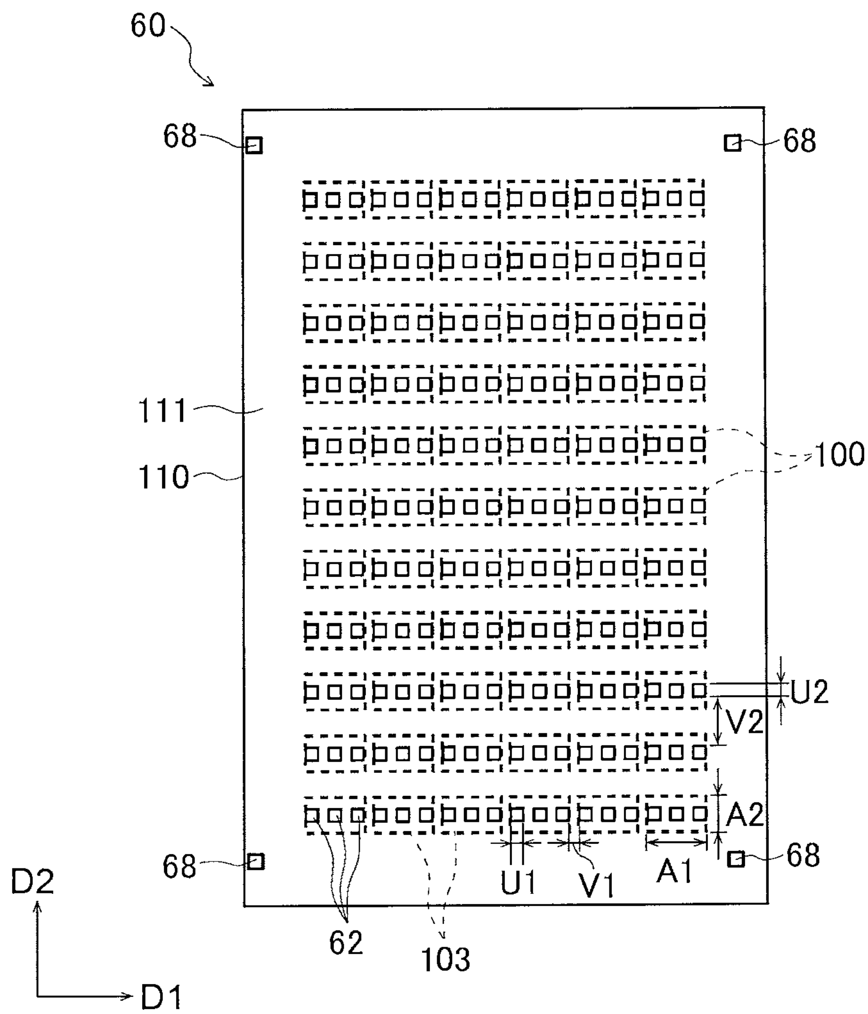
FIG. 9B is a plan view showing an example of a relation between the standard substrate and device spaces.

FIG. 9B is a plan view showing an example of the relation between the standard substrate 60 and device spaces 103. The device spaces 103 are spaces that each overlap the organic device 100 to be manufactured in the first vapor deposition chamber 10, in the direction normal to the first surface 551 of the mask 50. In FIG. 9B, the dashed lines indicated by the reference sign 103 represent the outlines of the device spaces 103 projected onto the standard substrate 60.

As shown in FIG. 9B, the standard mark regions 62 may be located in the device spaces 103. Thus, the characteristics of the first vapor deposition chamber 10 in each of the device spaces 103 can be evaluated.

In FIG. 9B, the reference sign V1 represents an interval between two adjacent standard mark regions 62 in the first direction D1 (hereinafter, also referred to as first interval). The first interval V1 may be less than the dimension A1 of each organic device 100 in the first direction D1. For example, V1/A1 that is the ratio of the first interval V1 to the dimension A1 may be lower than or equal to 0.9, may be lower than or equal to 0.8, or may be lower than or equal to 0.7. Thus, the standard mark regions 62 more easily overlap the device spaces 103 in the first direction D1.

For example, the first interval V1 may be greater than or equal to 10 mm, may be greater than or equal to 15 mm, or may be greater than or equal to 25 mm. For example, the first interval V1 may be less than or equal to 50 mm, may be less than or equal to 100 mm, or may be less than or equal to 150 mm. The range of the first interval V1 may be determined from a first group consisting of 10 mm, 15 mm, and 25 mm and/or a second group consisting of 50 mm, 100 mm, and 150 mm. The range of the first interval V1 may be determined by a combination of any one of the values included in the first group and any one of the values included in the second group. The range of the first interval V1 may be determined by a combination of any two of the values included in the first group. The range of the first interval V1 may be determined by a combination of any two of the values included in the second group. For example, the range of the first interval V1 may be greater than or equal to 10 mm and less than or equal to 150 mm, may be greater than or equal to 10 mm and less than or equal to 100 mm, may be greater than or equal to 10 mm and less than or equal to 50 mm, may be greater than or equal to 10 mm and less than or equal to 25 mm, may be greater than or equal to 10 mm and less than or equal to 15 mm, may be greater than or equal to 15 mm and less than or equal to 150 mm, may be greater than or equal to 15 mm and less than or equal to 100 mm, may be greater than or equal to 15 mm and less than or equal to 50 mm, may be greater than or equal to 15 mm and less than or equal to 25 mm, may be greater than or equal to 25 mm and less than or equal to 150 mm, may be greater than or equal to 25 mm and less than or equal to 100 mm, may be greater than or equal to 25 mm and less than or equal to 50 mm, may be greater than or equal to 50 mm and less than or equal to 150 mm, may be greater than or equal to 50 mm and less than or equal to 100 mm, or may be greater than or equal to 100 mm and less than or equal to 150 mm.

In FIG. 9B, the reference sign U1 represents the dimension of each standard mark region 62 in the first direction D1 (hereinafter, also referred to as first dimension). It is preferable that the ratio of the first dimension U1 to the first interval V1 be higher than or equal to a certain value. Thus, the standard mark regions 62 more easily overlap the device spaces 103 in the first direction D1.

For example, U1/V1 that is the ratio of the first dimension U1 to the first interval V1 may be higher than or equal to 0.005, may be higher than or equal to 0.1, may be higher than or equal to 0.2, or may be higher than or equal to 0.3. For example, U1/V1 may be lower than or equal to 0.5, may be lower than or equal to 0.6, may be lower than or equal to 0.8, or may be lower than or equal to 1.0. The range of U1/V1 may be determined from a first group consisting of 0.005, 0.1, 0.2, and 0.3 and/or a second group consisting of 0.5, 0.6, 0.8, and 1.0. The range of U1/V1 may be determined by a combination of any one of the values included in the first group and any one of the values included in the second group. The range of U1/V1 may be determined by a combination of any two of the values included in the first group. The range of U1/V1 may be determined by a combination of any two of the values included in the second group. For example, the range of U1/V1 may be higher than or equal to 0.005 and lower than or equal to 1.0, may be higher than or equal to 0.005 and lower than or equal to 0.8, may be higher than or equal to 0.005 and lower than or equal to 0.6, may be higher than or equal to 0.005 and lower than or equal to 0.5, may be higher than or equal to 0.005 and lower than or equal to 0.3, may be higher than or equal to 0.005 and lower than or equal to 0.2, may be higher than or equal to 0.005 and lower than or equal to 0.1, may be higher than or equal to 0.1 and lower than or equal to 1.0, may be higher than or equal to 0.1 and lower than or equal to 0.8, may be higher than or equal to 0.1 and lower than or equal to 0.6, may be higher than or equal to 0.1 and lower than or equal to 0.5, may be higher than or equal to 0.1 and lower than or equal to 0.3, may be higher than or equal to 0.1 and lower than or equal to 0.2, may be higher than or equal to 0.2 and lower than or equal to 1.0, may be higher than or equal to 0.2 and lower than or equal to 0.8, may be higher than or equal to 0.2 and lower than or equal to 0.6, may be higher than or equal to 0.2 and lower than or equal to 0.5, may be higher than or equal to 0.2 and lower than or equal to 0.3, may be higher than or equal to 0.3 and lower than or equal to 1.0, may be higher than or equal to 0.3 and lower than or equal to 0.8, may be higher than or equal to 0.3 and lower than or equal to 0.6, may be higher than or equal to 0.3 and lower than or equal to 0.5, may be higher than or equal to 0.5 and lower than or equal to 1.0, may be higher than or equal to 0.5 and lower than or equal to 0.8, may be higher than or equal to 0.5 and lower than or equal to 0.6, may be higher than or equal to 0.6 and lower than or equal to 1.0, may be higher than or equal to 0.6 and lower than or equal to 0.8, or may be higher than or equal to 0.8 and lower than or equal to 1.0.

In FIG. 9B, the reference sign V2 represents an interval between two adjacent standard mark regions 62 in the second direction D2 (hereinafter, also referred to as second interval). The second interval V2 may be less than the dimension A2 of each organic device 100 in the second direction D2. For example, V2/A2 that is the ratio of the second interval V2 to the dimension A2 may be lower than or equal to 0.9, may be lower than or equal to 0.8, or may be lower than or equal to 0.7. Thus, the standard mark regions 62 more easily overlap the device spaces 103 in the second direction D2.

For example, the second interval V2 may be greater than or equal to 10 mm, may be greater than or equal to 15 mm, or may be greater than or equal to 25 mm. For example, the second interval V2 may be less than or equal to 50 mm, may be less than or equal to 100 mm, or may be less than or equal to 150 mm. The range of the second interval V2 may be determined from a first group consisting of 10 mm, 15 mm, and 25 mm and/or a second group consisting of 50 mm, 100 mm, and 150 mm. The range of the second interval V2 may be determined by a combination of any one of the values included in the first group and any one of the values included in the second group. The range of the second interval V2 may be determined by a combination of any two of the values included in the first group. The range of the second interval V2 may be determined by a combination of any two of the values included in the second group. For example, the range of the second interval V2 may be greater than or equal to 10 mm and less than or equal to 150 mm, may be greater than or equal to 10 mm and less than or equal to 100 mm, may be greater than or equal to 10 mm and less than or equal to 50 mm, may be greater than or equal to 10 mm and less than or equal to 25 mm, may be greater than or equal to 10 mm and less than or equal to 15 mm, may be greater than or equal to 15 mm and less than or equal to 150 mm, may be greater than or equal to 15 mm and less than or equal to 100 mm, may be greater than or equal to 15 mm and less than or equal to 50 mm, may be greater than or equal to 15 mm and less than or equal to 25 mm, may be greater than or equal to 25 mm and less than or equal to 150 mm, may be greater than or equal to 25 mm and less than or equal to 100 mm, may be greater than or equal to 25 mm and less than or equal to 50 mm, may be greater than or equal to 50 mm and less than or equal to 150 mm, may be greater than or equal to 50 mm and less than or equal to 100 mm, or may be greater than or equal to 100 mm and less than or equal to 150 mm.

In FIG. 9B, the reference sign U2 represents the dimension of each standard mark region 62 in the second direction D2 (hereinafter, also referred to as second dimension). It is preferable that the ratio of the second dimension U2 to the second interval V2 be higher than or equal to a certain value. Thus, the standard mark regions 62 more easily overlap the device spaces 103 in the second direction D2.

For example, U2/V2 that is the ratio of the second dimension U2 to the second interval V2 may be higher than or equal to 0.005, may be higher than or equal to 0.1, may be higher than or equal to 0.2, or may be higher than or equal to 0.3. For example, U2/V2 may be lower than or equal to 0.5, may be lower than or equal to 0.6, may be lower than or equal to 0.8, or may be lower than or equal to 1.0. The range of U2/V2 may be determined from a first group consisting of 0.005, 0.1, 0.2, and 0.3 and/or a second group consisting of 0.5, 0.6, 0.8, and 1.0. The range of U2/V2 may be determined by a combination of any one of the values included in the first group and any one of the values included in the second group. The range of U2/V2 may be determined by a combination of any two of the values included in the first group. The range of U2/V2 may be determined by a combination of any two of the values included in the second group. For example, the range of U2/V2 may be higher than or equal to 0.005 and lower than or equal to 1.0, may be higher than or equal to 0.005 and lower than or equal to 0.8, may be higher than or equal to 0.005 and lower than or equal to 0.6, may be higher than or equal to 0.005 and lower than or equal to 0.5, may be higher than or equal to 0.005 and lower than or equal to 0.3, may be higher than or equal to 0.005 and lower than or equal to 0.2, may be higher than or equal to 0.005 and lower than or equal to 0.1, may be higher than or equal to 0.1 and lower than or equal to 1.0, may be higher than or equal to 0.1 and lower than or equal to 0.8, may be higher than or equal to 0.1 and lower than or equal to 0.6, may be higher than or equal to 0.1 and lower than or equal to 0.5, may be higher than or equal to 0.1 and lower than or equal to 0.3, may be higher than or equal to 0.1 and lower than or equal to 0.2, may be higher than or equal to 0.2 and lower than or equal to 1.0, may be higher than or equal to 0.2 and lower than or equal to 0.8, may be higher than or equal to 0.2 and lower than or equal to 0.6, may be higher than or equal to 0.2 and lower than or equal to 0.5, may be higher than or equal to 0.2 and lower than or equal to 0.3, may be higher than or equal to 0.3 and lower than or equal to 1.0, may be higher than or equal to 0.3 and lower than or equal to 0.8, may be higher than or equal to 0.3 and lower than or equal to 0.6, may be higher than or equal to 0.3 and lower than or equal to 0.5, may be higher than or equal to 0.5 and lower than or equal to 1.0, may be higher than or equal to 0.5 and lower than or equal to 0.8, may be higher than or equal to 0.5 and lower than or equal to 0.6, may be higher than or equal to 0.6 and lower than or equal to 1.0, may be higher than or equal to 0.6 and lower than or equal to 0.8, or may be higher than or equal to 0.8 and lower than or equal to 1.0.

The substrate 110 may contain an electrical insulator, such as glass. For example, the thickness of the substrate 110 may be greater than or equal to 0.1 mm, may be greater than or equal to 0.3 mm, may be greater than or equal to 0.4 mm, or may be greater than or equal to 0.5 mm. For example, the thickness of the substrate 110 may be less than or equal to 0.6 mm, may be less than or equal to 0.8 mm, may be less than or equal to 1.0 mm, or may be less than or equal to 2.0 mm. The range of the thickness of the substrate 110 may be determined from a first group consisting of 0.1 mm, 0.3 mm, 0.4 mm, and 0.5 mm and/or a second group consisting of 0.6 mm, 0.8 mm, 1.0 mm, and 2.0 mm. The range of the thickness of the substrate 110 may be determined by a combination of any one of the values included in the first group and any one of the values included in the second group. The range of the thickness of the substrate 110 may be determined by a combination of any two of the values included in the first group. The range of the thickness of the substrate 110 may be determined by a combination of any two of the values included in the second group. For example, the range of the thickness may be greater than or equal to 0.1 mm and less than or equal to 2.0 mm, may be greater than or equal to 0.1 mm and less than or equal to 1.0 mm, may be greater than or equal to 0.1 mm and less than or equal to 0.8 mm, may be greater than or equal to 0.1 mm and less than or equal to 0.6 mm, may be greater than or equal to 0.1 mm and less than or equal to 0.5 mm, may be greater than or equal to 0.1 mm and less than or equal to 0.4 mm, may be greater than or equal to 0.1 mm and less than or equal to 0.3 mm, may be greater than or equal to 0.3 mm and less than or equal to 2.0 mm, may be greater than or equal to 0.3 mm and less than or equal to 1.0 mm, may be greater than or equal to 0.3 mm and less than or equal to 0.8 mm, may be greater than or equal to 0.3 mm and less than or equal to 0.6 mm, may be greater than or equal to 0.3 mm and less than or equal to 0.5 mm, may be greater than or equal to 0.3 mm and less than or equal to 0.4 mm, may be greater than or equal to 0.4 mm and less than or equal to 2.0 mm, may be greater than or equal to 0.4 mm and less than or equal to 1.0 mm, may be greater than or equal to 0.4 mm and less than or equal to 0.8 mm, may be greater than or equal to 0.4 mm and less than or equal to 0.6 mm, may be greater than or equal to 0.4 mm and less than or equal to 0.5 mm, may be greater than or equal to 0.5 mm and less than or equal to 2.0 mm, may be greater than or equal to 0.5 mm and less than or equal to 1.0 mm, may be greater than or equal to 0.5 mm and less than or equal to 0.8 mm, may be greater than or equal to 0.5 mm and less than or equal to 0.6 mm, may be greater than or equal to 0.6 mm and less than or equal to 2.0 mm, may be greater than or equal to 0.6 mm and less than or equal to 1.0 mm, may be greater than or equal to 0.6 mm and less than or equal to 0.8 mm, may be greater than or equal to 0.8 mm and less than or equal to 2.0 mm, may be greater than or equal to 0.8 mm and less than or equal to 1.0 mm, or may be greater than or equal to 1.0 mm and less than or equal to 2.0 mm.

Figure 10:
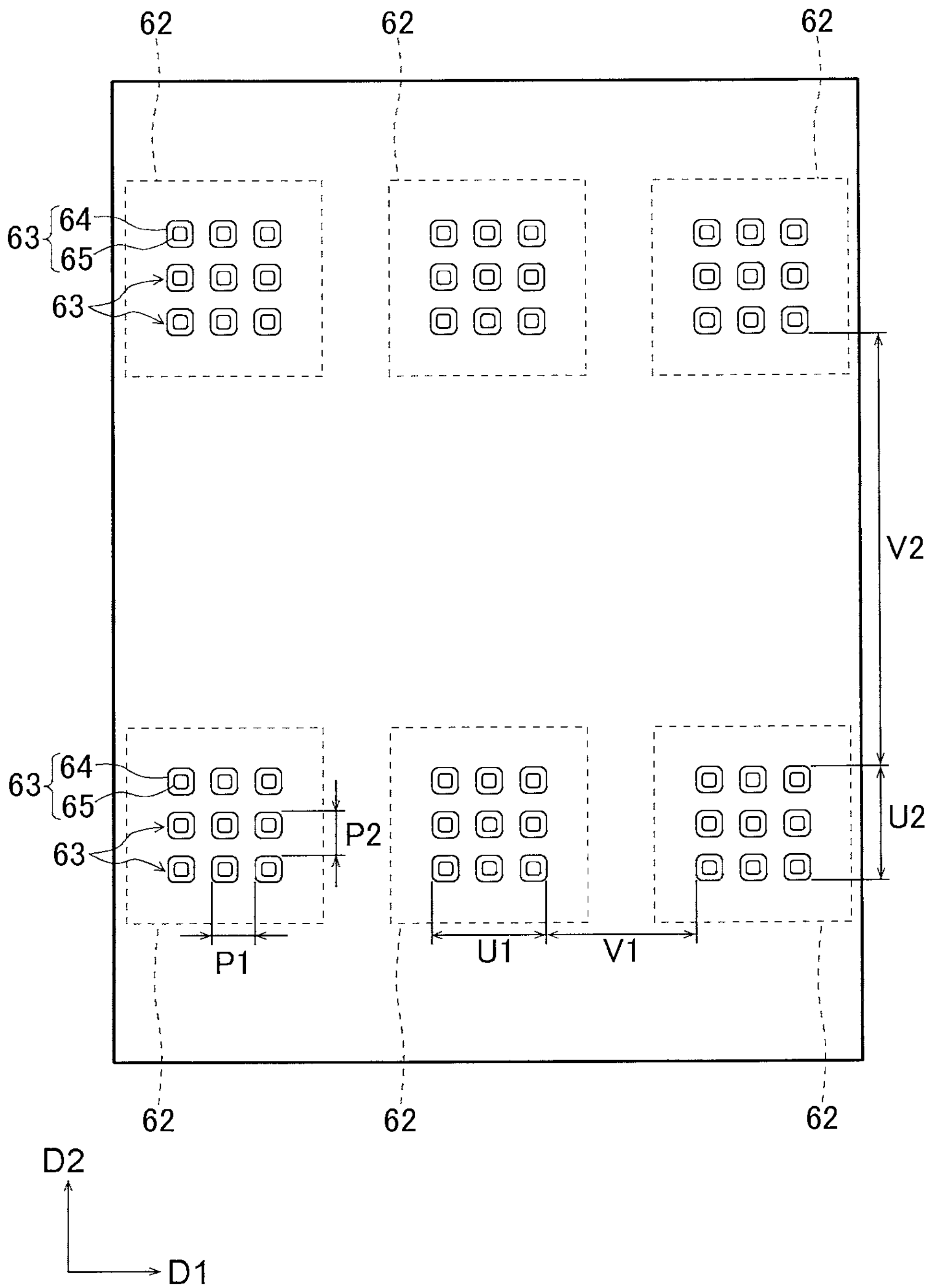
FIG. 10 is an enlarged plan view showing the region surrounded by the alternate long and short dashed line and indicated by the reference sign X on the standard substrate of FIG. 9A.

FIG. 10 is an enlarged plan view showing a region surrounded by the alternate long and short dashed line and indicated by the reference sign X on the standard substrate 60 of FIG. 9A. Each standard mark region 62 includes at least one standard mark 63. Each standard mark 63 is a mark indicating a region in which the first vapor deposition layer 130 is to be formed in the vapor deposition step. As shown in FIG. 10, each standard mark region 62 may include a plurality of the standard marks 63. The plurality of standard marks 63 may be periodically arranged at certain intervals. For example, as shown in FIG. 10, the standard marks 63 may be arranged at an arrangement period P1 in one direction and may be arranged at an arrangement period P2 in another direction. The direction of the arrangement period P1 may be the first direction D1 that is the longitudinal direction of the standard mask 50A. The direction of the arrangement period P2 may be the second direction D2 that is the width direction of the standard mask 50A.

The arrangement periods of the standard marks 63, that is, the arrangement periods P1, P2 and the like, may be the same as the arrangement periods of the through-holes 56 of the mask 50 to be used in manufacturing the organic device 100. For example, the arrangement period of the standard marks 63 may be greater than or equal to 30 μm, may be greater than or equal to 50 μm, may be greater than or equal to 70 μm, or may be greater than or equal to 100 μm. For example, the arrangement period of the standard marks 63 may be less than or equal to 150 μm, may be less than or equal to 200 μm, may be less than or equal to 300 μm, or may be less than or equal to 400 μm. The range of the arrangement period of the standard marks 63 may be determined from a first group consisting of 30 μm, 50 μm, 70 μm, and 100 μm and/or a second group consisting of 150 μm, 200 μm, 300 μm, and 400 μm. The range of the arrangement period of the standard marks 63 may be determined by a combination of any one of the values included in the first group and any one of the values included in the second group. The range of the arrangement period of the standard marks 63 may be determined by a combination of any two of the values included in the first group. The range of the arrangement period of the standard marks 63 may be determined by a combination of any two of the values included in the second group. For example, the range of the arrangement period may be greater than or equal to 30 μm and less than or equal to 400 μm, may be greater than or equal to 30 μm and less than or equal to 300 μm, may be greater than or equal to 30 μm and less than or equal to 200 μm, may be greater than or equal to 30 μm and less than or equal to 150 μm, may be greater than or equal to 30 μm and less than or equal to 100 μm, may be greater than or equal to 30 μm and less than or equal to 70 μm, may be greater than or equal to 30 μm and less than or equal to 50 μm, may be greater than or equal to 50 μm and less than or equal to 400 μm, may be greater than or equal to 50 μm and less than or equal to 300 μm, may be greater than or equal to 50 μm and less than or equal to 200 μm, may be greater than or equal to 50 μm and less than or equal to 150 μm, may be greater than or equal to 50 μm and less than or equal to 100 μm, may be greater than or equal to 50 μm and less than or equal to 70 μm, may be greater than or equal to 70 μm and less than or equal to 400 μm, may be greater than or equal to 70 μm and less than or equal to 300 μm, may be greater than or equal to 70 μm and less than or equal to 200 μm, may be greater than or equal to 70 μm and less than or equal to 150 μm, may be greater than or equal to 70 μm and less than or equal to 100 μm, may be greater than or equal to 100 μm and less than or equal to 400 μm, may be greater than or equal to 100 μm and less than or equal to 300 μm, may be greater than or equal to 100 μm and less than or equal to 200 μm, may be greater than or equal to 100 μm and less than or equal to 150 μm, may be greater than or equal to 150 μm and less than or equal to 400 μm, may be greater than or equal to 150 μm and less than or equal to 300 prn, may be greater than or equal to 150 μm and less than or equal to 200 μm, may be greater than or equal to 200 μm and less than or equal to 400 μm, may be greater than or equal to 200 μm and less than or equal to 300 μm, or may be greater than or equal to 300 μm and less than or equal to 400 μm.

As shown in FIG. 10, the first dimension U1 may be the dimension, in the first direction D1, of a region in which a group of the standard marks 63 is located. The first interval V1 may be an interval in the first direction D1 between two groups of the standard marks 63. The second dimension U2 may be the dimension, in the second direction D2, of a region in which a group of the standard marks 63 is located. The second interval V2 may be an interval in the second direction D2 between two groups of the standard marks 63.

As shown in FIG. 10, each standard mark 63 may include a first mark 64. The first mark 64 represents the outer edge of a region in which the first vapor deposition layer 130 is to be formed. The outer edge of the first mark 64 in plan view may have a shape corresponding to the shape of each through-hole 56 of the standard mask 50A. For example, the outer edge of the first mark 64 in plan view may have a quadrangular shape, a circular shape, or the like.

As shown in FIG. 10, each standard mark 63 may include a second mark 65 located inside the first mark 64. The second mark 65 represents an allowable minimum dimension of the first vapor deposition layer 130. The second mark 65 may have a shape similar to the shape of the first mark 64.

Figure 11A:
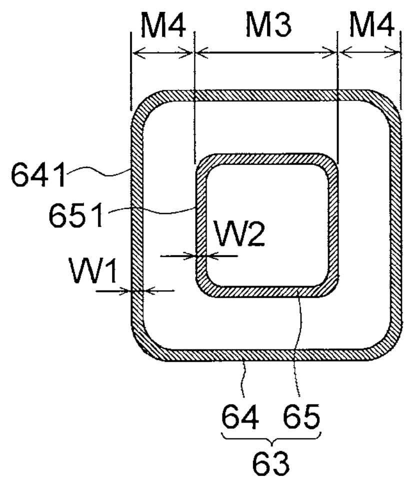
FIG. 11A is a plan view showing an example of a standard mark in a standard mark region of the standard substrate.
Figure 11B:
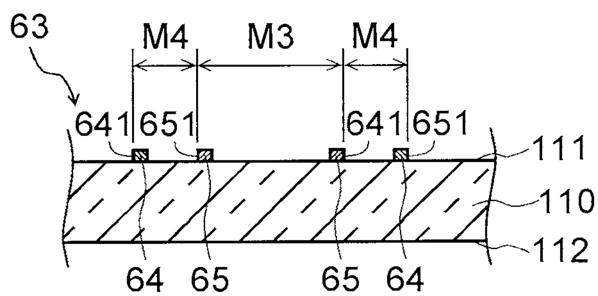
FIG. 11B is a sectional view showing an example of the standard mark in the standard mark region of the standard substrate.

FIG. 11A is a partially enlarged plan view of the standard mark 63. FIG. 11B is a partially enlarged sectional view of the standard mark 63. The shape of the first mark 64 may be defined by a linear element having a first width W1. Similarly, the shape of the second mark 65 may also be defined by a linear element having a second width W2. The first width W1 and the second width W2 may be the same or may be different from each other.

In FIG. 11A and FIG. 11B, the reference sign M3 represents the dimension of the second mark 65 in a direction in which the standard marks 63 are arranged. The reference sign M4 represents a shortest distance in plan view between a first outer edge 641 of the first mark 64 and a second outer edge 651 of the second mark 65. The dimension M3 of the standard mark 63 may correspond to the dimension M1 of a region that does not overlap the electrically insulating layer 160 in the first electrode layer 120, shown in FIG. 1B. The shortest distance M4 may correspond to the dimension M2 of the electrically insulating layer 160 in the arrangement direction of the first vapor deposition layers 130, shown in FIG. 16.

The dimension M2 in FIG. 1B is determined in accordance with, for example, an allowable value of a position deviation of each first vapor deposition layer 130. When the pixel density of the organic device 100 is constant, the area of each first electrode layer 120 and the area of each first vapor deposition layer 130 can be increased as the dimension M2 reduces. Thus, the drive efficiency of the organic device 100 is increased, with the result that the service life of the organic device 100 is extended.

The shortest distance M4 in FIG. 11A and FIG. 11B may be determined in accordance with an allowable value of a position deviation of each first vapor deposition layer 130, which can occur in all the manufacturing steps for the organic device 100. Alternatively, the shortest distance M4 may be determined in accordance with an allowable value of a position deviation of each first vapor deposition layer 130 due to the vapor deposition step in the first vapor deposition chamber 10. For example, the shortest distance M4 may be greater than or equal to 0.5 μm, may be greater than or equal to 1.0 μm, may be greater than or equal to 1.5 μm, or may be greater than or equal to 2.0 μm. For example, the shortest distance M4 may be less than or equal to 3.0 μm, may be less than or equal to 5.0 μm, may be less than or equal to 7.0 μm, or may be less than or equal to 9.0 μm. The range of the shortest distance M4 may be determined from a first group consisting of 0.5 μm, 1.0 μm, 1.5 μm, and 2.0 μm and/or a second group consisting of 3.0 μm, 5.0 μm, 7.0 μm, and 9.0 μm. The range of the shortest distance M4 may be determined by a combination of any one of the values included in the first group and any one of the values included in the second group. The range of the shortest distance M4 may be determined by a combination of any two of the values included in the first group. The range of the shortest distance M4 may be determined by a combination of any two of the values included in the second group. For example, the range of the shortest distance M4 may be greater than or equal to 0.5 μm and less than or equal to 9.0 μm, may be greater than or equal to 0.5 μm and less than or equal to 7.0 μm, may be greater than or equal to 0.5 μm and less than or equal to 5.0 μm, may be greater than or equal to 0.5 μm and less than or equal to 3.0 μm, may be greater than or equal to 0.5 μm and less than or equal to 2.0 μm, may be greater than or equal to 0.5 μm and less than or equal to 1.5 μm, may be greater than or equal to 0.5 μm and less than or equal to 1.0 μm, may be greater than or equal to 1.0 μm and less than or equal to 9.0 μm, may be greater than or equal to 1.0 μm and less than or equal to 7.0 μm, may be greater than or equal to 1.0 μm and less than or equal to 5.0 μm, may be greater than or equal to 1.0 μm and less than or equal to 3.0 μm, may be greater than or equal to 1.0 μm and less than or equal to 2.0 μm, may be greater than or equal to 1.0 μm and less than or equal to 1.5 μm, may be greater than or equal to 1.5 μm and less than or equal to 9.0 μm, may be greater than or equal to 1.5 μm and less than or equal to 7.0 μm, may be greater than or equal to 1.5 μm and less than or equal to 5.0 μm, may be greater than or equal to 1.5 μm and less than or equal to 3.0 μm, may be greater than or equal to 1.5 μm and less than or equal to 2.0 μm, may be greater than or equal to 2.0 μm and less than or equal to 9.0 μm, may be greater than or equal to 2.0 μm and less than or equal to 7.0 μm, may be greater than or equal to 2.0 μm and less than or equal to 5.0 μm, may be greater than or equal to 2.0 μm and less than or equal to 3.0 μm, may be greater than or equal to 3.0 μm and less than or equal to 9.0 μm, may be greater than or equal to 3.0 μm and less than or equal to 7.0 μm, may be greater than or equal to 3.0 μm and less than or equal to 5.0 μm, may be greater than or equal to 5.0 μm and less than or equal to 9.0 μm, may be greater than or equal to 5.0 μm and less than or equal to 7.0 μm, or may be greater than or equal to 7.0 μm and less than or equal to 9.0 μm.

Figure 12:
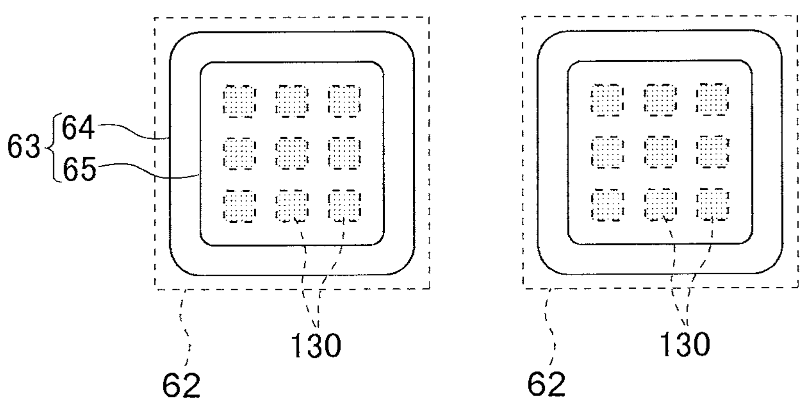
FIG. 12 is a plan view showing an example of a standard mark in a standard mark region.

FIG. 12 is a plan view showing another example of the standard mark region 62. As shown in FIG. 12, the standard mark region 62 may include only one standard mark 63. For example, the standard mark region 62 may include one first mark 64 and one second mark 65 located inside the first mark 64.

In FIG. 12, elements indicated by the reference sign 130 represent first vapor deposition layers formed on the standard substrate 60 in the vapor deposition step using the standard mask 50A. As shown in FIG. 12, two or more first vapor deposition layers 130 may be located inside one standard mark 63. In other words, the standard mask 50A may be configured such that two or more through-holes 56 overlap the region of one standard mark 63. Although not shown in the drawing, in a mode in which the standard mark region 62 includes two or more standard marks 63 as well, the standard mask 50A may be configured such that two or more through-holes 56 overlap the region of one standard mark 63.

As long as the positional relation between the standard mark 63 and each first vapor deposition layer 130 can be observed, the material of the standard mark 63 is any material. For example, the standard mark 63, as well as the first electrode layer 120 or the second electrode layer 141, may contain a metal, an electrically conductive metal oxide, or an electrically conductive material, such as other inorganic materials. The standard mark 63 may contain a resin material, such as an acrylic resin. For example, the standard mark 63 may contain a resin material having a photosensitivity and used as a resist.

The standard mark 63 may have a light blocking property. The standard mark 63 may contain a resin material and a colorant. For example, carbon black, titanium black, or the like may be used as the colorant.

When the standard mark 63 has a light blocking property, the total light transmittance of a region that overlaps the standard mark 63 in plan view in the standard substrate 60 may be, for example, higher than or equal to 0%, may be higher than or equal to 1%, may be higher than or equal to 2%, or may be higher than or equal to 3%. For example, the total light transmittance may be lower than or equal to 5%, may be lower than or equal to 10%, may be lower than or equal to 20%, or may be lower than or equal to 30%. The range of the total light transmittance may be determined from a first group consisting of 0%, 1%, 2%, and 3% and/or a second group consisting of 5%, 10%, 20%, and 30%. The range of the total light transmittance may be determined by a combination of any one of the values included in the first group and any one of the values included in the second group. The range of the total light transmittance may be determined by a combination of any two of the values included in the first group. The range of the total light transmittance may be determined by a combination of any two of the values included in the second group. For example, the range of the total light transmittance may be higher than or equal to 0% and lower than or equal to 30%, may be higher than or equal to 0% and lower than or equal to 20%, may be higher than or equal to 0% and lower than or equal to 10%, may be higher than or equal to 0% and lower than or equal to 5%, may be higher than or equal to 0% and lower than or equal to 3%, may be higher than or equal to 0% and lower than or equal to 2%, may be higher than or equal to 0% and lower than or equal to 1%, may be higher than or equal to 1% and lower than or equal to 30%, may be higher than or equal to 1% and may be higher than or equal to 20%, may be higher than or equal to 1% and lower than or equal to 10%, may be higher than or equal to 1% and lower than or equal to 5%, may be higher than or equal to 1% and lower than or equal to 3%, may be higher than or equal to 1% and lower than or equal to 2%, may be higher than or equal to 2% and lower than or equal to 30%, may be higher than or equal to 2% and lower than or equal to 20%, may be higher than or equal to 2% and lower than or equal to 10%, may be higher than or equal to 2% and lower than or equal to 5%, may be higher than or equal to 2% and lower than or equal to 3%, may be higher than or equal to 3% and lower than or equal to 30%, may be higher than or equal to 3% and lower than or equal to 20%, may be higher than or equal to 3% and lower than or equal to 10%, may be higher than or equal to 3% and lower than or equal to 5%, may be higher than or equal to 5% and lower than or equal to 30%, may be higher than or equal to 5% and lower than or equal to 20%, may be higher than or equal to 5% and lower than or equal to 10%, may be higher than or equal to 10% and lower than or equal to 30%, may be higher than or equal to 10% and lower than or equal to 20%, or may be higher than or equal to 20% and lower than or equal to 30%. The total light transmittance is measured in conformity with JIS K7361-1:1997. A spectrometer OSP-SMU made by Olympus Corporation is used as a measuring instrument for total light transmittance.

The thickness of the standard mark 63 preferably corresponds to a distance from a surface on which the first vapor deposition layers 130 are formed to the first surface 111 of the substrate 110 in the organic device 100. The surface on which the first vapor deposition layers 130 are formed in the organic device 100 is, for example, the surface of each hole transport layer. For example, the thickness of the standard mark 63 may be greater than or equal to 0.01 μm, may be greater than or equal to 0.05 μm, may be greater than or equal to 0.08 μm, or may be greater than or equal to 0.10 μm. For example, the thickness of the standard mark 63 may be less than or equal to 0.15 μm, may be less than or equal to 0.20 μm, may be less than or equal to 0.50 μm, or may be less than or equal to 1.00 μm. The range of the thickness of the standard mark 63 may be determined from a first group consisting of 0.01 μm, 0.05 μm, 0.08 μm, and 0.10 μm and/or a second group consisting of 0.15 μm, 0.20 μm, 0.50 μm, and 1.00 μm. The range of the thickness of the standard mark 63 may be determined by a combination of any one of the values included in the first group and any one of the values included in the second group. The range of the thickness of the standard mark 63 may be determined by a combination of any two of the values included in the first group. The range of the thickness of the standard mark 63 may be determined by a combination of any two of the values included in the second group. For example, the range of the thickness may be greater than or equal to 0.01 μm and less than or equal to 1.00 μm, may be greater than or equal to 0.01 μm and less than or equal to 0.50 μm, may be greater than or equal to 0.01 μm and less than or equal to 0.20 μm, may be greater than or equal to 0.01 μm and less than or equal to 0.15 μm, may be greater than or equal to 0.01 μm and less than or equal to 0.10 μm, may be greater than or equal to 0.01 μm and less than or equal to 0.08 μm, may be greater than or equal to 0.01 μm and less than or equal to 0.05 μm, may be greater than or equal to 0.05 μm and less than or equal to 1.00 μm, may be greater than or equal to 0.05 μm and less than or equal to 0.50 μm, may be greater than or equal to 0.05 μm and less than or equal to 0.20 μm, may be greater than or equal to 0.05 μm and less than or equal to 0.15 μm, may be greater than or equal to 0.05 μm and less than or equal to 0.10 μm, may be greater than or equal to 0.05 μm and less than or equal to 0.08 μm, may be greater than or equal to 0.08 μm and less than or equal to 1.00 μm, may be greater than or equal to 0.08 μm and less than or equal to 0.50 μm, may be greater than or equal to 0.08 μm and less than or equal to 0.20 μm, may be greater than or equal to 0.08 μm and less than or equal to 0.15 μm, may be greater than or equal to 0.08 μm and less than or equal to 0.10 μm, may be greater than or equal to 0.10 μm and less than or equal to 1.00 μm, may be greater than or equal to 0.10 μm and less than or equal to 0.50 μm, may be greater than or equal to 0.10 μm and less than or equal to 0.20 μm, may be greater than or equal to 0.10 μm and less than or equal to 0.15 μm, may be greater than or equal to 0.15 μm and less than or equal to 1.00 μm, may be greater than or equal to 0.15 μm and less than or equal to 0.50 μm, may be greater than or equal to 0.15 μm and less than or equal to 0.20 μm, may be greater than or equal to 0.20 μm and less than or equal to 1.00 μm, may be greater than or equal to 0.20 μm and less than or equal to 0.50 μm, or may be greater than or equal to 0.50 μm and less than or equal to 1.00 μm.

Figure 13A:
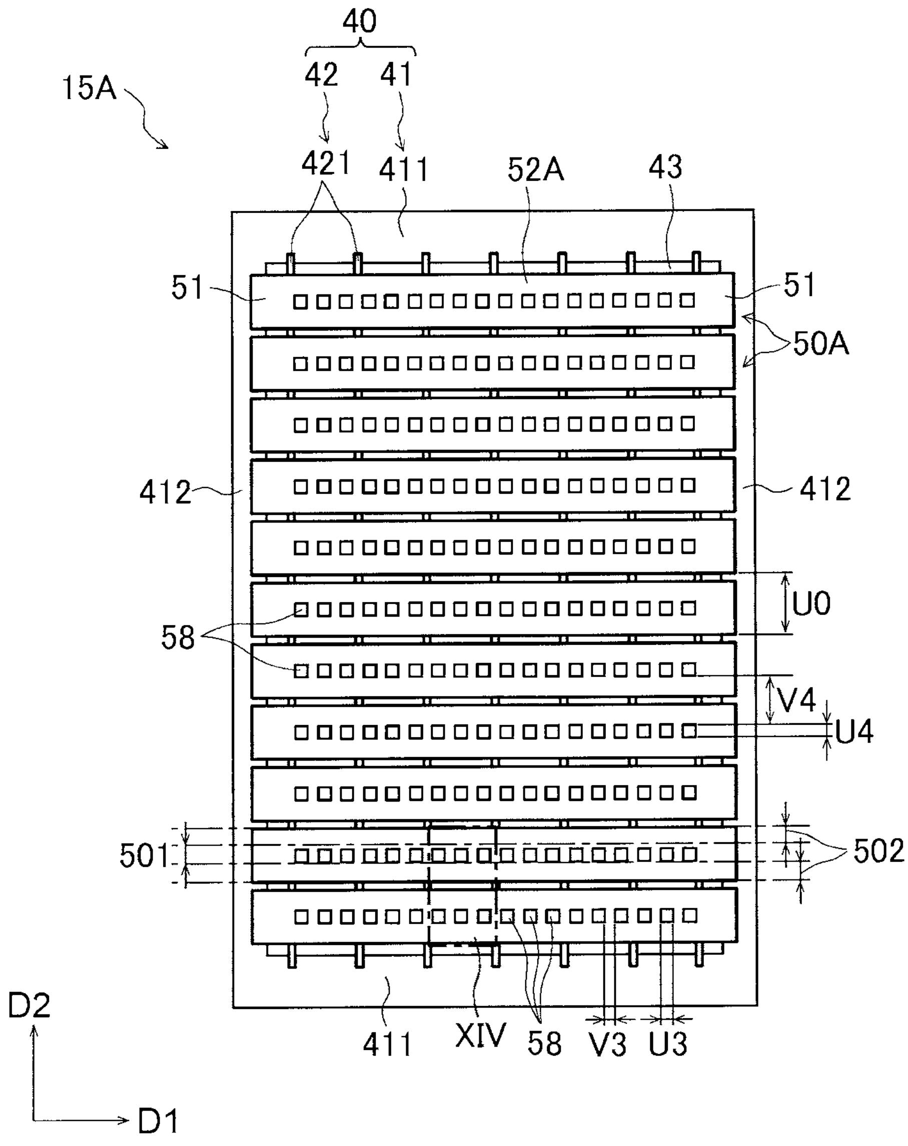
FIG. 13A is a plan view showing an example of a standard mask apparatus.

Next, the standard mask apparatus 15A will be specifically described. FIG. 13A is a plan view showing an example of the standard mask apparatus 15A. Like reference signs denote the same portions as those of the mask apparatus 15 among the component elements of the standard mask apparatus 15A, and the detailed description may be omitted.

The standard mask apparatus 15A includes at least one standard mask 50A. The standard mask 50A includes the metal plate 55 and the through-holes 56 extending from the first surface 551 of the metal plate 55 to the second surface 552. The standard mask apparatus 15A may include the frame 41 that supports the standard mask 50A. The frame 41 supports the standard mask 50A in a state of being pulled in the surface direction so as to suppress warpage of the standard mask 50A. The standard mask 50A, as well as the mask 50, includes a pair of end portions 51 overlapping the frame 41 and an intermediate portion 52A located between the end portions 51.

The standard mask 50A of the standard mask apparatus 15A may be placed similarly to the mask 50 of the mask apparatus 15. For example, the standard mask apparatus 15A may include a plurality of the standard masks 50A. As shown in FIG. 13A, the shape of each standard mask 50A may be a rectangular shape extending in the first direction D1. In the standard mask apparatus 15A, the plurality of standard masks 50A is arranged in a direction that intersects with the first direction D1 that is the longitudinal direction of the standard masks 50A. As shown in FIG. 13A, the plurality of standard masks 50A may be arranged in the second direction D2 that is the width direction of the standard masks 50A. The width direction is perpendicular to the longitudinal direction of the standard masks 50A. Each standard mask 50A may be fixed to the frame 41 by, for example, welding at both end portions in the longitudinal direction of the standard mask 50A.

As shown in FIG. 13A, each standard mask 50A may include two or more standard regions 58 arranged in the first direction D1. Each standard region 58 may include the through-hole 56 facing the standard mark 63 of the standard mark region 62 of the standard substrate 60.

Figure 13B:
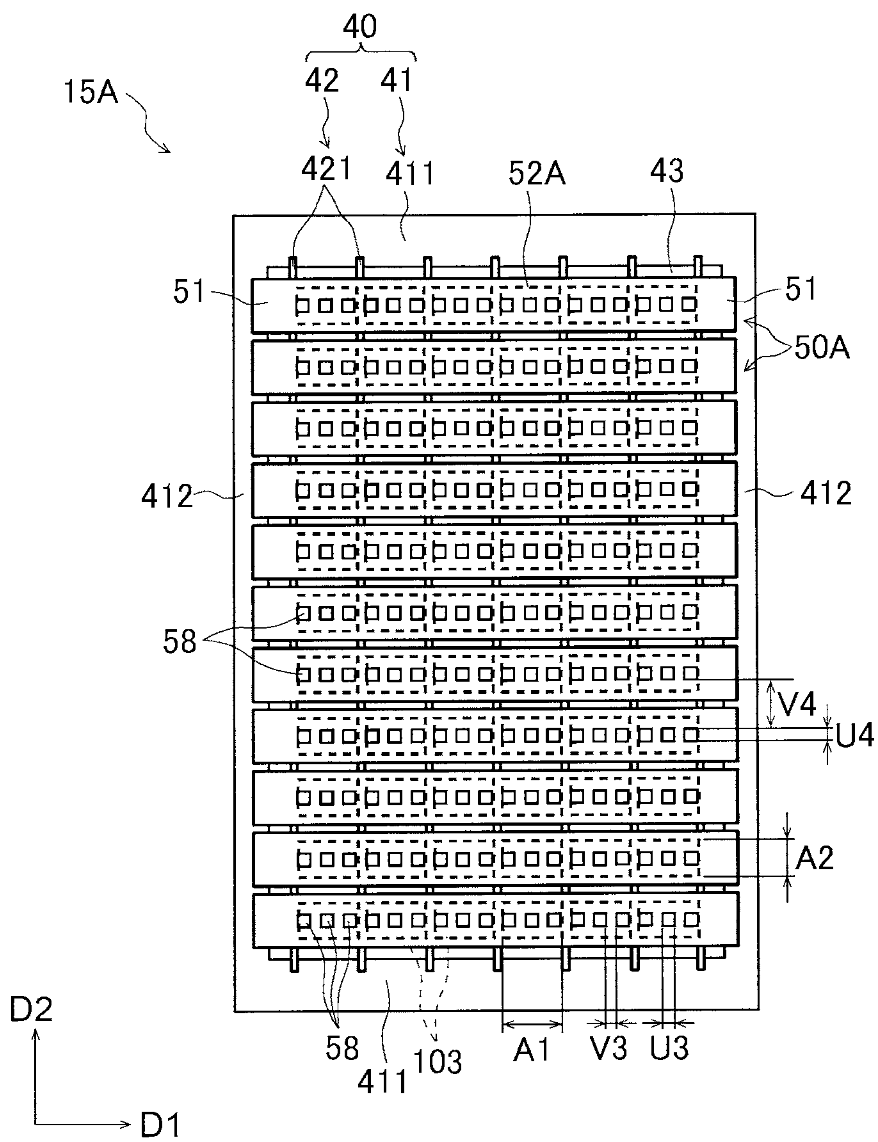
FIG. 13B is a plan view showing an example of a relation between the standard mask apparatus and device spaces.

FIG. 13B is a plan view showing an example of the relation between the standard mask apparatus 15A and the device spaces 103. In FIG. 13B, the dashed lines indicated by reference sign 103 represent the outlines of the device spaces 103 projected onto the standard masks 50A.

As shown in FIG. 13B, the standard regions 58 may be located in the device spaces 103. Thus, the characteristics of the first vapor deposition chamber 10 in each of the device spaces 103 can be evaluated.

In FIG. 13B, the reference sign V3 represents an interval between two adjacent standard regions 58 in the first direction D1 (hereinafter, also referred to as third interval). The third interval V3 may be less than the dimension A1 of each organic device 100 in the first direction D1. For example, V3/A1 that is the ratio of the third interval V3 to the dimension A1 may be lower than or equal to 0.9, may be lower than or equal to 0.8, or may be lower than or equal to 0.7. Thus, the standard regions 58 more easily overlap the device spaces 103 in the first direction D1. As shown in FIG. 13B, the third interval V3 may be an interval between two standard regions 58 included in one standard mask 50A. Although not shown in the drawing, the third interval V3 may be an interval between the standard region 58 of the first standard mask 50A and the standard region 58 of the second standard mask 50A adjacent to the first standard mask 50A in the first direction D1.

For example, the third interval V3 may be greater than or equal to 10 mm, may be greater than or equal to 15 mm, or may be greater than or equal to 25 mm. For example, the third interval V3 may be less than or equal to 50 mm, may be less than or equal to 100 mm, or may be less than or equal to 150 mm. The range of the third interval V3 may be determined from a first group consisting of 10 mm, 15 mm, and 25 mm and/or a second group consisting of 50 mm, 100 mm, and 150 mm. The range of the third interval V3 may be determined by a combination of any one of the values included in the first group and any one of the values included in the second group. The range of the third interval V3 may be determined by a combination of any two of the values included in the first group. The range of the third interval V3 may be determined by a combination of any two of the values included in the second group. For example, the range of the third interval V3 may be greater than or equal to 10 mm and less than or equal to 150 mm, may be greater than or equal to 10 mm and less than or equal to 100 mm, may be greater than or equal to 10 mm and less than or equal to 50 mm, may be greater than or equal to 10 mm and less than or equal to 25 mm, may be greater than or equal to 10 mm and less than or equal to 15 mm, may be greater than or equal to 15 mm and less than or equal to 150 mm, may be greater than or equal to 15 mm and less than or equal to 100 mm, may be greater than or equal to 15 mm and less than or equal to 50 mm, may be greater than or equal to 15 mm and less than or equal to 25 mm, may be greater than or equal to 25 mm and less than or equal to 150 mm, may be greater than or equal to 25 mm and less than or equal to 100 mm, may be greater than or equal to 25 mm and less than or equal to 50 mm, may be greater than or equal to 50 mm and less than or equal to 150 mm, may be greater than or equal to 50 mm and less than or equal to 100 mm, or may be greater than or equal to 100 mm and less than or equal to 150 mm.

In FIG. 13B, the reference sign U3 represents the dimension of each standard region 58 in the first direction D1 (hereinafter, also referred to as third dimension). It is preferable that the ratio of the third dimension U3 to the third interval V3 be higher than or equal to a certain value. Thus, the standard regions 58 more easily overlap the device spaces 103 in the first direction D1.

For example, U3/V3 that is the ratio of the third dimension U3 to the third interval V3 may be higher than or equal to 0.005, may be higher than or equal to 0.1, may be higher than or equal to 0.2, or may be higher than or equal to 0.3. For example, U3/V3 may be lower than or equal to 0.5, may be lower than or equal to 0.6, may be lower than or equal to 0.8, or may be lower than or equal to 1.0. The range of U3/V3 may be determined from a first group consisting of 0.005, 0.1, 0.2, and 0.3 and/or a second group consisting of 0.5, 0.6, 0.8, and 1.0. The range of U3/V3 may be determined by a combination of any one of the values included in the first group and any one of the values included in the second group. The range of U3/V3 may be determined by a combination of any two of the values included in the first group. The range of U3/V3 may be determined by a combination of any two of the values included in the second group. For example, the range of U3/V3 may be higher than or equal to 0.005 and lower than or equal to 1.0, may be higher than or equal to 0.005 and lower than or equal to 0.8, may be higher than or equal to 0.005 and lower than or equal to 0.6, may be higher than or equal to 0.005 and lower than or equal to 0.5, may be higher than or equal to 0.005 and lower than or equal to 0.3, may be higher than or equal to 0.005 and lower than or equal to 0.2, may be higher than or equal to 0.005 and lower than or equal to 0.1, may be higher than or equal to 0.1 and lower than or equal to 1.0, may be higher than or equal to 0.1 and lower than or equal to 0.8, may be higher than or equal to 0.1 and lower than or equal to 0.6, may be higher than or equal to 0.1 and lower than or equal to 0.5, may be higher than or equal to 0.1 and lower than or equal to 0.3, may be higher than or equal to 0.1 and lower than or equal to 0.2, may be higher than or equal to 0.2 and lower than or equal to 1.0, may be higher than or equal to 0.2 and lower than or equal to 0.8, may be higher than or equal to 0.2 and lower than or equal to 0.6, may be higher than or equal to 0.2 and lower than or equal to 0.5, may be higher than or equal to 0.2 and lower than or equal to 0.3, may be higher than or equal to 0.3 and lower than or equal to 1.0, may be higher than or equal to 0.3 and lower than or equal to 0.8, may be higher than or equal to 0.3 and lower than or equal to 0.6, may be higher than or equal to 0.3 and lower than or equal to 0.5, may be higher than or equal to 0.5 and lower than or equal to 1.0, may be higher than or equal to 0.5 and lower than or equal to 0.8, may be higher than or equal to 0.5 and lower than or equal to 0.6, may be higher than or equal to 0.6 and lower than or equal to 1.0, may be higher than or equal to 0.6 and lower than or equal to 0.8, or may be higher than or equal to 0.8 and lower than or equal to 1.0.

In FIG. 13B, the reference sign V4 represents an interval between two adjacent standard regions 58 in the second direction D2 (hereinafter, also referred to as fourth interval). The fourth interval V4 may be less than the dimension A2 of each organic device 100 in the second direction D2. For example, V4/A2 that is the ratio of the fourth interval V4 to the dimension A2 may be lower than or equal to 0.9, may be lower than or equal to 0.8, or may be lower than or equal to 0.7. Thus, the standard regions 58 more easily overlap the device spaces 103 in the second direction D2. As shown in FIG. 13B, the fourth interval V4 may be an interval between the standard region 58 of the first standard mask 50A and the standard region 58 of the second standard mask 50A adjacent to the first standard mask 50A in the second direction D2. Although not shown in the drawing, the fourth interval V4 may be an interval between two standard regions 58 included in one standard mask 50A.

For example, the fourth interval V4 may be greater than or equal to 10 mm, may be greater than or equal to 15 mm, or may be greater than or equal to 25 mm. For example, the fourth interval V4 may be less than or equal to 50 mm, may be less than or equal to 100 mm, or may be less than or equal to 150 mm. The range of the fourth interval V4 may be determined from a first group consisting of 10 mm, 15 mm, and 25 mm and/or a second group consisting of 50 mm, 100 mm, and 150 mm. The range of the fourth interval V4 may be determined by a combination of any one of the values included in the first group and any one of the values included in the second group. The range of the fourth interval V4 may be determined by a combination of any two of the values included in the first group. The range of the fourth interval V4 may be determined by a combination of any two of the values included in the second group. For example, the range of the fourth interval V4 may be greater than or equal to 10 mm and less than or equal to 150 mm, may be greater than or equal to 10 mm and less than or equal to 100 mm, may be greater than or equal to 10 mm and less than or equal to 50 mm, may be greater than or equal to 10 mm and less than or equal to 25 mm, may be greater than or equal to 10 mm and less than or equal to 15 mm, may be greater than or equal to 15 mm and less than or equal to 150 mm, may be greater than or equal to 15 mm and less than or equal to 100 mm, may be greater than or equal to 15 mm and less than or equal to 50 mm, may be greater than or equal to 15 mm and less than or equal to 25 mm, may be greater than or equal to 25 mm and less than or equal to 150 mm, may be greater than or equal to 25 mm and less than or equal to 100 mm, may be greater than or equal to 25 mm and less than or equal to 50 mm, may be greater than or equal to 50 mm and less than or equal to 150 mm, may be greater than or equal to 50 mm and less than or equal to 100 mm, or may be greater than or equal to 100 mm and less than or equal to 150 mm.

In FIG. 13B, the reference sign U4 represents the dimension of each standard region 58 in the second direction D2 (hereinafter, also referred to as fourth dimension). It is preferable that the ratio of the fourth dimension U4 to the fourth interval V4 be higher than or equal to a certain value. Thus, the standard regions 58 more easily overlap the device spaces 103 in the second direction D2.

For example, U4/V4 that is the ratio of the fourth dimension U4 to the fourth interval V4 may be higher than or equal to 0.005, may be higher than or equal to 0.1, may be higher than or equal to 0.2, or may be higher than or equal to 0.3. For example, U4/V4 may be lower than or equal to 0.5, may be lower than or equal to 0.6, may be lower than or equal to 0.8, or may be lower than or equal to 1.0. The range of U4/V4 may be determined from a first group consisting of 0.005, 0.1, 0.2, and 0.3 and/or a second group consisting of 0.5, 0.6, 0.8, and 1.0. The range of U4/V4 may be determined by a combination of any one of the values included in the first group and any one of the values included in the second group. The range of U4/V4 may be determined by a combination of any two of the values included in the first group. The range of U4/V4 may be determined by a combination of any two of the values included in the second group. For example, the range of U4/V4 may be higher than or equal to 0.005 and lower than or equal to 1.0, may be higher than or equal to 0.005 and lower than or equal to 0.8, may be higher than or equal to 0.005 and lower than or equal to 0.6, may be higher than or equal to 0.005 and lower than or equal to 0.5, may be higher than or equal to 0.005 and lower than or equal to 0.3, may be higher than or equal to 0.005 and lower than or equal to 0.2, may be higher than or equal to 0.005 and lower than or equal to 0.1, may be higher than or equal to 0.1 and lower than or equal to 1.0, may be higher than or equal to 0.1 and lower than or equal to 0.8, may be higher than or equal to 0.1 and lower than or equal to 0.6, may be higher than or equal to 0.1 and lower than or equal to 0.5, may be higher than or equal to 0.1 and lower than or equal to 0.3, may be higher than or equal to 0.1 and lower than or equal to 0.2, may be higher than or equal to 0.2 and lower than or equal to 1.0, may be higher than or equal to 0.2 and lower than or equal to 0.8, may be higher than or equal to 0.2 and lower than or equal to 0.6, may be higher than or equal to 0.2 and lower than or equal to 0.5, may be higher than or equal to 0.2 and lower than or equal to 0.3, may be higher than or equal to 0.3 and lower than or equal to 1.0, may be higher than or equal to 0.3 and lower than or equal to 0.8, may be higher than or equal to 0.3 and lower than or equal to 0.6, may be higher than or equal to 0.3 and lower than or equal to 0.5, may be higher than or equal to 0.5 and lower than or equal to 1.0, may be higher than or equal to 0.5 and lower than or equal to 0.8, may be higher than or equal to 0.5 and lower than or equal to 0.6, may be higher than or equal to 0.6 and lower than or equal to 1.0, may be higher than or equal to 0.6 and lower than or equal to 0.8, or may be higher than or equal to 0.8 and lower than or equal to 1.0.

Figure 14:
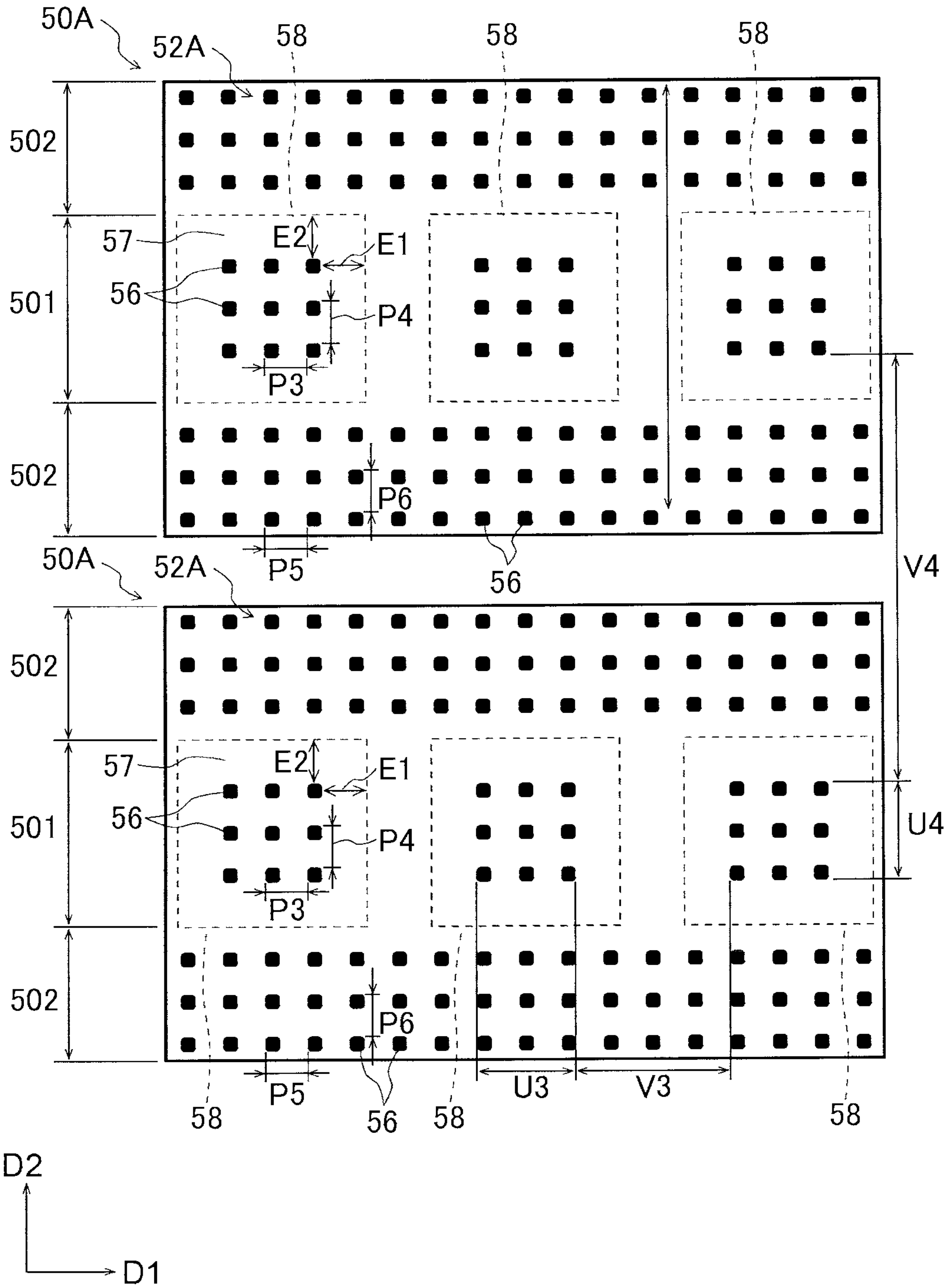
FIG. 14 is an enlarged plan view of the region surrounded by the alternate long and short dashed line and indicated by the reference sign XIV in the standard masks of FIG. 13A.

FIG. 14 is an enlarged plan view of the region surrounded by the alternate long and short dashed line and indicated by the reference sign XIV in the standard masks 50A of FIG. 13A. Each standard region 58 includes at least one through-hole 56. As shown in FIG. 14, each standard region 58 may include a plurality of through-holes 56. The plurality of through-holes 56 may be periodically arranged at certain intervals. For example, as shown in FIG. 14, the through-holes 56 may be arranged at an arrangement period P3 in one direction and may be arranged at an arrangement period P4 in another direction. The arrangement period P3 and arrangement period P4 of the through-holes 56 may be the same as the arrangement period P1 and arrangement period P2 of the standard marks 63 of the standard substrate 60.

As shown in FIG. 14, the third dimension U3 may be the dimension, in the first direction D1, of a region in which a group of the through-holes 56 is located. The third interval V3 may be an interval in the first direction D1 between two groups of the through-holes 56. The fourth dimension U4 may be the dimension, in the second direction D2, of a region in which a group of the through-holes 56 is located. The fourth interval V4 may be an interval in the second direction D2 between two groups of the through-holes 56.

As shown in FIG. 14, the standard regions 58 may be located in a middle region 501 in the second direction D2 that is the width direction of the standard mask 50A. In the present embodiment, the plurality of standard regions 58 is arranged in the middle region 501 in the first direction D1 that is the longitudinal direction of the standard mask 50A. The middle region 501 is a region in a middle when the standard mask 50A is trisected in the width direction. Two regions adjacent to the middle region 501 in the width direction are referred to as end regions 502. Hereinafter, the advantage resulting from the fact that the standard regions 58 are located in the middle region 501 will be described.

In a step of fixing the standard mask 50A to the frame 41, the standard mask 50A is aligned with the frame 41 in a state where the standard mask 50A is pulled in the longitudinal direction, and then the standard mask 50A is attached to the frame 41 by welding or the like. When the frame 41 includes alignment marks 48 as shown in FIG. 5, the standard mask 50A may be aligned with the frame 41 with reference to the alignment marks 48. Although not shown in the drawing, the standard mask 50A may also include alignment marks. When the positions of the standard regions 58 are limited to the middle region 501 as in the case of the present embodiment, the standard mask 50A is aligned with the frame 41 by placing more importance on the middle region 501 than on the end regions 502. For example, larger weights are assigned to the middle region 501 than to the end regions 502. Thus, the middle region 501 is aligned with the frame 41 more accurately than the end regions 502.

An example of the background to place more importance on the middle region 501 than on the end regions 502 will be described. The thickness of the metal plate 55 forming each standard mask 50A is small. In this case, when the standard mask 50A is pulled in the longitudinal direction, a deformation of a wrinkle or the like extending in the longitudinal direction may occur in the standard mask 50A. Such a deformation is more likely to occur in the end regions 502 than in the middle region 501. In a case where there is a deformation, such as a wrinkle, in the end regions 502, when any of the middle region 501 and the end regions 502 is equally considered in the step of aligning the standard mask 50A with the frame 41, the accuracy of the position of the middle region 501 can decrease due to a deformation of the end regions 502. In such a case, it is useful to align the standard mask 50A with the frame 41 by placing more importance on the middle region 501 than on the end regions 502 as described above. Thus, the influence of a deformation, such as a wrinkle, occurring in the end regions 502 on the accuracy of alignment of the middle region 501 with the frame 41 is suppressed. Therefore, further ideal arrangement of the standard regions 58 is possible.

As shown in FIG. 14, the standard mask 50A may include two or more through-holes 56 located in each of the end regions 502 and arranged in the longitudinal direction and the width direction of the standard mask 50A. The arrangement period P5 and arrangement period P6 of the through-holes 56 of the end regions 502 may be the same or may be different from the arrangement period P3 and arrangement period P4 of the through-holes 56 of the middle region 501. The arrangement period P5 and arrangement period P6 of the through-holes 56 of the end regions 502 may be the same as the arrangement period of the through-holes 56 of the mask 50 used to manufacture the organic device 100.

As shown in FIG. 14, each standard region 58 located in the middle region 501 may include a non-penetrated region 57 located around the through-holes 56 and having a dimension greater than the arrangement period of the through-holes 56 in plan view. For example, the dimension E1 of the non-penetrated region 57 of the standard region 58 in the longitudinal direction of the standard mask 50A may be greater than the arrangement period P3 of the through-holes 56 in the longitudinal direction. The dimension E2 of the non-penetrated region 57 of the standard region 58 in the width direction of the standard mask 50A may be greater than the arrangement period P4 of the through-holes 56 in the width direction. The non-penetrated region 57 is a region in which no through-hole 56 is formed.

When the standard region 58 includes the non-penetrated region 57 having a greater dimension than the arrangement period of the through-holes 56, the through-holes 56 of the standard region 58 are more easily distinguished from the other through-holes 56 that do not face the standard mark 63 of the standard substrate 60 in the vapor deposition step (described later), that is, the through-holes 56 of the end regions 502. In the observation step of observing the standard substrate 60 after the vapor deposition step, the first vapor deposition layers 130 made up of the vapor deposition material deposited onto the standard substrate 60 through the through-holes 56 of the standard region 58 are more easily distinguished from the first vapor deposition layers 130 made up of the vapor deposition material deposited onto the standard substrate 60 through the other through-holes 56. Therefore, the first vapor deposition layers 130 to be observed are more easily found.

Next, a method of evaluating the first vapor deposition chamber 10 of the manufacturing apparatus 1 using the standard substrate 60 and the standard mask apparatus 15A will be described.

Initially, the standard mask apparatus 15A is prepared and is carried into the manufacturing apparatus 1. In addition, the standard substrate 60 is prepared, and the standard substrate 60 is carried into the manufacturing apparatus 1 via the substrate carrying-in chamber 31. Subsequently, the standard substrate 60 may be subjected to pretreatment, such as dry washing, in the substrate pretreatment chamber 32.

Subsequently, the vapor deposition step of forming the first vapor deposition layers 130 on the standard substrate 60 is performed in the first vapor deposition chamber 10. For example, the vapor deposition step of forming the first organic layers 131 on the standard substrate 60 is performed in the eleventh vapor deposition chamber 11. The vapor deposition step is similar to the case where the electrode substrate 105 and the mask apparatus 15 are used, as follows.

Initially, an assembling step of, in the first vapor deposition chamber 10, assembling the standard substrate 60 and the standard mask apparatus 15A is performed. For example, in the eleventh vapor deposition chamber 11, the standard mask apparatus 15A is set above the vapor deposition source 6 by using the mask holder 3. The substrate 110 of the standard substrate 60 is faced to the standard mask 50A of the standard mask apparatus 15A by using the substrate holder 2. The substrate holder 2 is moved in the surface direction of the substrate 110 to adjust the position of the substrate 110 with respect to the standard mask 50A. For example, the substrate 110 is moved in the surface direction such that alignment marks of the standard mask 50A or the frame 41 and alignment marks 68 of the substrate 110 overlap each other.

Subsequently, a step of placing the cooling plate 4 on the second surface 112 side of the substrate 110 by moving the cooling plate 4 toward the substrate 110 may be performed. A step of placing the magnet 5 on the second surface 112 side of the substrate 110 may be performed. Thus, the standard mask 50A is attracted toward the substrate 110 by magnetic force. A step of attracting the standard mask 50A toward the substrate 110 by using an electrostatic chuck may be performed.

The assembling step of assembling the standard substrate 60 and the standard mask apparatus 15A may be performed in accordance with predetermined settings. Examples of the conditions may include the following conditions. In the assembling step, any one of the settings may be considered or some of the settings may be considered.

The placement of the substrate 110

The distribution of magnetic force

The distribution of electrostatic force

The placement of the cooling plate 4

The placement of the substrate 110 is, for example, the orientation of the substrate 110, such as the surface direction of the substrate 110. When the substrate holder 2 include a plurality of chucks attached to the outer edge of the substrate 110, the orientation of the substrate 110 can be set by independently moving the chucks.

When a plurality of the magnets 5 is placed on the second surface 112 side of the substrate 110, the distribution of magnetic force can be set by changing the type or layout of the magnets 5.

The placement of the cooling plate 4 is, for example, the orientation of the cooling plate 4, such as the surface direction of the cooling plate 4.

Figure 15:
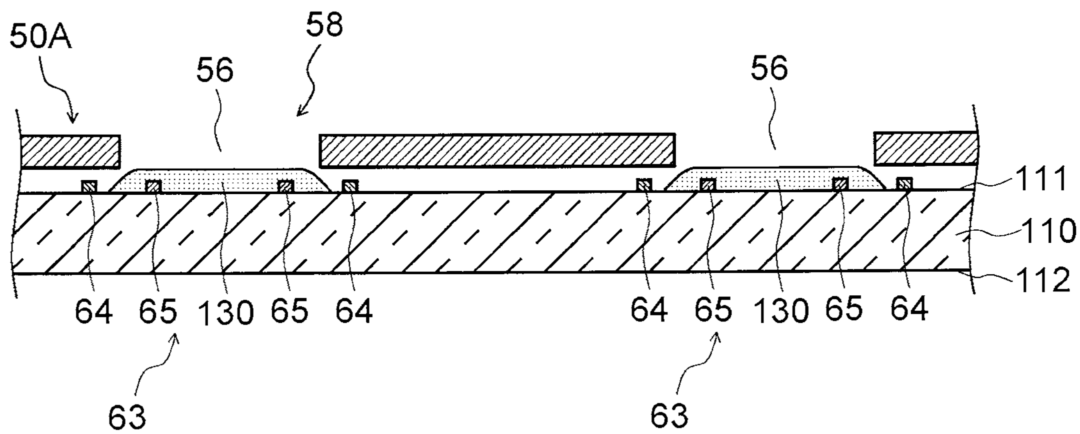
FIG. 15 is a sectional view showing a state where first vapor deposition layers are respectively formed on the standard marks of the standard substrate via through-holes of the standard mask.

Subsequently, the vapor deposition step of vaporizing the vapor deposition material 7 to fly toward the substrate 110 is performed. Part of the vapor deposition material 7, passing through the through-holes 56 of the standard mask 50A, is deposited on the standard marks 63 of the substrate 110 in a pattern in association with the through-holes 56. Thus, the first organic layers 131 are formed on the standard mark regions 62 of the substrate 110. FIG. 15 is a sectional view showing a state where the first vapor deposition layers 130, that is, the first organic layers 131 or the like, are respectively formed on the standard marks 63 of the standard substrate 60 via the through-holes 56 of the standard mask 50A.

Subsequently, the carry-out step of carrying out the substrate 110 including the first vapor deposition layers 130 from the manufacturing apparatus 1 to the outside via the substrate carrying-out chamber 35 may be performed. The substrate 110 may be carried out to the outside of the manufacturing apparatus 1 in a state where the elements on the substrate 110, that is, the first vapor deposition layers 130 or the like, are not sealed. A mechanism for carrying out the substrate 110 from the manufacturing apparatus 1 to the outside may be an arm, or the like, that is movable while supporting the substrate 110.

Subsequently, the observation step of observing a positional relation between the standard marks 63 and the first vapor deposition layers 130 on the substrate 110 carried out from the manufacturing apparatus 1 is performed. In the observation step of the present embodiment, the substrate 110 including the standard marks 63 and the first vapor deposition layers 130 is observed from the first surface 111 side with an optical microscope. The large automatic two-dimensional coordinate measuring system AMIC-1710 made by Sinto S-Precision, Ltd. may be used as the optical microscope. The conditions for observation using the optical microscope are as follows.

Magnification: 10× to 20×

Camera: ⅔ inches, monochrome CCD camera

Image processing software: 3D-SACM

Another step may be performed between the carry-out step and the observation step. For example, a step of moving the substrate 110 to an observation location, a step of subjecting the substrate 110 to a treatment for increasing the efficiency of observation, or another step, may be performed.

FIG. 16 to FIG. 19 each are a plan view showing an example of the observation result of the positional relation between the standard marks 63 and the first vapor deposition layers 130.

Figure 16:
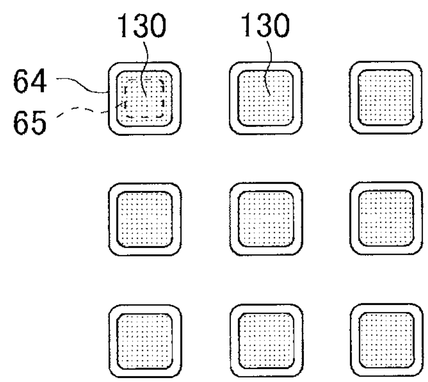
FIG. 16 is a plan view showing an example of the first vapor deposition layers respectively formed on the standard marks of the standard substrate.

In the example shown in FIG. 16, each first vapor deposition layer 130 is located inside the outer edge of the first mark 64 of the standard mark 63. In this case, the outer edge of the first mark 64 surrounding the outer edge of the first vapor deposition layer 130 is observed. In the example shown in FIG. 16, each first vapor deposition layer 130 is located outside the outer edge of the second mark 65 of the standard mark 63. In this case, the outer edge of the second mark 65 is not observed.

Figure 17:
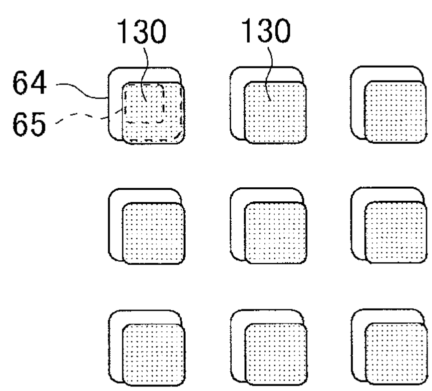
FIG. 17 is a plan view showing an example of the first vapor deposition layers respectively formed on the standard marks of the standard substrate.

In the example shown in FIG. 17, each first vapor deposition layer 130 is partially located outside the outer edge of the first mark 64 of the standard mark 63. In this case, part of the outer edge of the first mark 64 is not observed. In the example shown in FIG. 17, each first vapor deposition layer 130 is located outside the outer edge of the second mark 65 of the standard mark 63. In this case, the outer edge of the second mark 65 is not observed.

Figure 18:
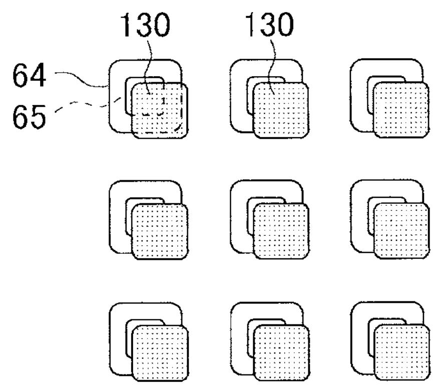
FIG. 18 is a plan view showing an example of the first vapor deposition layers respectively formed on the standard marks of the standard substrate.

In the example shown in FIG. 18, each first vapor deposition layer 130 is partially located outside the outer edge of the first mark 64 of the standard mark 63. In this case, part of the outer edge of the first mark 64 is not observed. In the example shown in FIG. 18, each first vapor deposition layer 130 is partially located inside the outer edge of the second mark 65 of the standard mark 63. In this case, part of the outer edge of the second mark 65 is observed.

Figure 19:
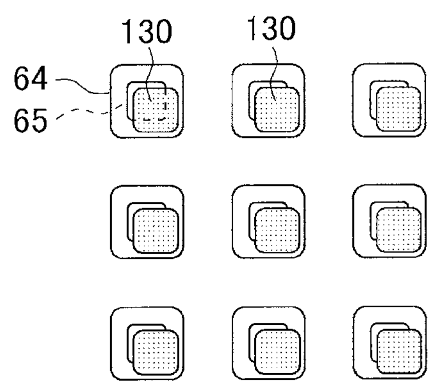
FIG. 19 is a plan view showing an example of the first vapor deposition layers respectively formed on the standard marks of the standard substrate.

In the example shown in FIG. 19, each first vapor deposition layer 130 is located inside the outer edge of the first mark 64 of the standard mark 63. In this case, the outer edge of the first mark 64 surrounding the outer edge of the first vapor deposition layer 130 is observed. In the example shown in FIG. 19, each first vapor deposition layer 130 is partially located inside the outer edge of the second mark 65 of the standard mark 63. In this case, part of the outer edge of the second mark 65 is observed.

Subsequently, a determination step of determining whether the positional relation between the standard marks 63 and the first vapor deposition layers 130 satisfies a condition may be performed. For example, the determination step may include a first determination step of determining whether the following condition (1) is satisfied.

(1) The outer edge of each first vapor deposition layer 130 is located inside the outer edge of the first mark 64 of the standard mark 63.

Of the examples shown in FIG. 16 to FIG. 19, the condition (1) is satisfied in the examples shown in FIG. 16 and FIG. 19. When the organic device 100 is manufactured by using the first vapor deposition chamber 10 with which the condition (1) is satisfied, partial overlap of unit structures, such as adjacent two pixels, on the substrate 110 is reduced. Thus, when, for example, the organic device 100 is an organic EL display device, occurrence of color mixture in adjacent two pixels is reduced.

The determination step may include a second determination step of determining whether the following condition (2) is satisfied.

(2) The outer edge of the first vapor deposition layer 130 is located outside the outer edge of the second mark 65.

Of the examples shown in FIG. 16 to FIG. 19, the condition (2) is satisfied in the examples shown in FIG. 16 and FIG. 17. When the organic device 100 is manufactured by using the first vapor deposition chamber 10 with which the condition (2) is satisfied, a reduction in the size of the first vapor deposition layer 130 in plan view as compared to a region exposed from the electrically insulating layer 160 in the first electrode layer 120 is suppressed. Thus, when, for example, the organic device 100 is an organic EL display device, a decrease in the light emission efficiency of each pixel is suppressed.

In the determination step, when the above-described condition (1) is satisfied, the first vapor deposition chamber 10 used to form the first vapor deposition layers 130 may be determined as a conforming product. Alternatively, in the determination step, when the above-described conditions (1) and (2) are satisfied, the first vapor deposition chamber 10 used to form the first vapor deposition layers 130 may be determined as a conforming product. Alternatively, in the determination step, when the above-described condition (2) is satisfied, the first vapor deposition chamber 10 used to form the first vapor deposition layers 130 may be determined as a conforming product.

The positional relation between the standard marks 63 and the first vapor deposition layers 130 may be evaluated in more details in accordance with the observation results as shown in FIG. 16 to FIG. 19. For example, the amount, direction, or the like of a deviation of each first vapor deposition layer 130 with respect to the standard mark 63 may be evaluated. Thus, the state of the first vapor deposition chamber 10 is obtained in more details.

Figure 20:
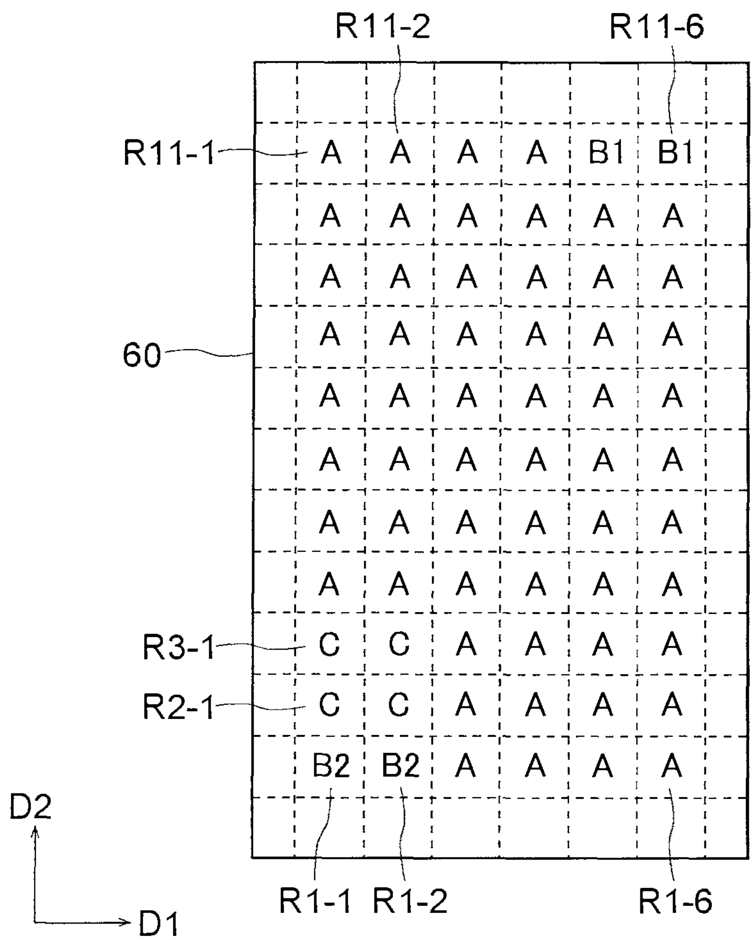
FIG. 20 is a view showing an example of evaluation results for the first vapor deposition chamber.

In the determination step, a determination based on the above-described conditions (1), (2), or the like may be performed on each region of the substrate 110, in which the first vapor deposition layer 130 is deposited. For example, a region in which the first vapor deposition layers 130 are deposited on the substrate 110 may be divided into m in the first direction D1 and divided into n in the second direction D2, and then the determination step may be performed on each of m×n regions. FIG. 20 is a plan view showing an example of a case where the determination step is performed on each of the regions on the substrate 110. In the example shown in FIG. 20, m=6, and n=11. The reference sign Rk-I indicates a region that is the Ith region in the first direction D1 and the kth region in the second direction D2.

In the example shown in FIG. 20, the determination result for the region Rk-I of the substrate 110 is indicated by the characters A, B1, B2, or C. The character A indicates that both the conditions (1) and (2) are satisfied as in the case of the example shown in FIG. 16. The character B1 indicates that the condition (1) is not satisfied but the condition (2) is satisfied as in the case of the example shown in FIG. 17. The character B2 indicates that both the conditions (1) and (2) are not satisfied as in the case of the example shown in FIG. 18. The character C indicates that the condition (1) is satisfied but the condition (2) is not satisfied as in the case of the example shown in FIG. 19.

According to the example shown in FIG. 20, the state of the first vapor deposition chamber 10 is obtained in more details for each region. In each region Rk-I of the substrate 110, the amount, direction, or the like of a deviation of the first vapor deposition layer 130 with respect to the standard mark 63 may be evaluated. Thus, the state of each region in the first vapor deposition chamber 10 is obtained in more details.

Subsequently, an adjustment step of adjusting settings of the assembling step of assembling the standard substrate 60 with the standard mask apparatus 15A may be performed in accordance with information about the positional relation between the standard marks 63 and the first vapor deposition layers 130, obtained in the observation step. For example, the placement of the substrate 110, the distribution of magnetic force of the magnets 5, the distribution of electrostatic force of the electrostatic chucks, the placement of the cooling plate 4, and the like may be adjusted in accordance with information about the positional relation. After that, the above-described vapor deposition step, observation step, and determination step may be performed in the adjusted first vapor deposition chamber 10, and whether the adjusted first vapor deposition chamber 10 satisfies the above-described conditions (1) and (2) may be checked. Settings adjusted in the adjustment step can also be adopted in the method of manufacturing the organic device 100 using the electrode substrate 105 and the mask apparatus 15.

The above-described vapor deposition step, observation step, determination step, adjustment step, and the like using the standard substrate 60 and the standard mask apparatus 15A may be performed in an evaluation method at the time of delivery of a newly manufactured manufacturing apparatus 1 to a customer. Alternatively, the above-described vapor deposition step, observation step, determination step, adjustment step, and the like may be performed in a maintenance method for a manufacturing apparatus 1 that has been delivered to a customer.

According to the present embodiment, by performing the vapor deposition step using the standard substrate 60 and the standard mask apparatus 15A, the characteristics of each of the first vapor deposition chambers 10 included in the manufacturing apparatus 1 can be individually evaluated. For this reason, when the organic device 100 manufactured by the manufacturing apparatus 1 does not meet the desired specifications, the cause is more easily identified. Each of the first vapor deposition chambers 10 included in the manufacturing apparatus 1 can be individually guaranteed in accordance with an evaluation result.

By performing the above-described evaluation method or maintenance method, the manufacturing apparatus 1 including the first vapor deposition chambers 10 that satisfy the conditions of the determination step is obtained. For example, the manufacturing apparatus 1 including the first vapor deposition chambers 10 for which it has been proven that the above-described condition (1) is satisfied, that is, the outer edge of each first vapor deposition layer 130 is located inside the outer edge of the first mark 64 of the standard mark 63, is obtained. By forming the first vapor deposition layers 130 on the electrode substrate 105 with the mask apparatus 15 in the first vapor deposition chamber 10 that satisfies the conditions of the determination step, the accuracy of the position and dimension of each of the first vapor deposition layers 130 in the organic device 100 is increased. Thus, the fraction defective of the organic device 100 is reduced, and the characteristics of the organic device 100 are enhanced.

Various changes may be added to the above-described embodiment. Hereinafter, other embodiments will be described with reference to the drawings as needed. In the following description and the drawings to be used in the following description, like reference signs used for corresponding portions in the above-described embodiment denote portions that can be configured similarly to those of the above-described embodiment, and the description will not be repeated. When it is apparent that the operation and advantageous effects obtained in the above-described embodiment are also obtained in other embodiments, the description may be omitted.

Figure 21:
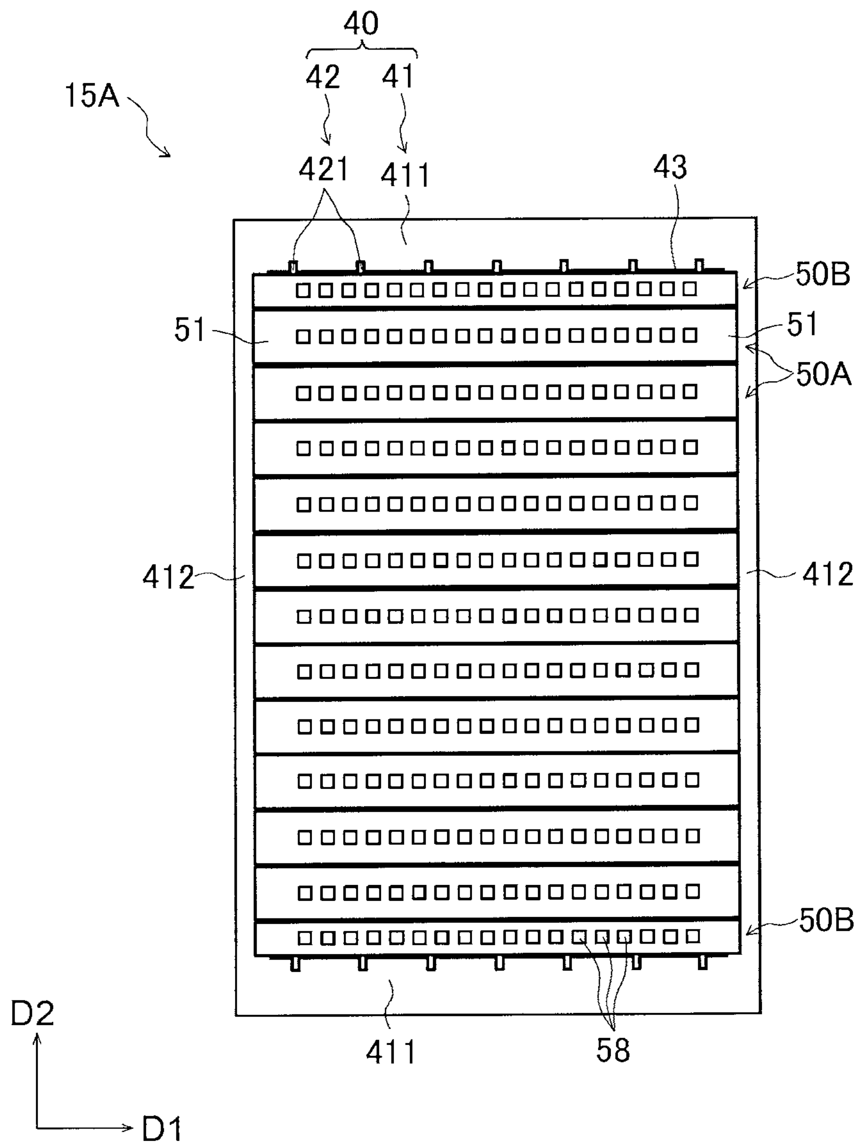
FIG. 21 is a plan view showing an example of a standard mask apparatus.

FIG. 21 is a plan view showing an example of the standard mask apparatus 15A. As shown in FIG. 21, the standard mask apparatus 15A may include end standard masks 50B each closer to one of the first sides 411 of the frame 41 with respect to the standard masks 50A in the second direction D2 and having a different width from the standard masks 50A. In the example shown in FIG. 21, the width of each end standard mask 50B is less than the width of each standard mask 50A. The end standard mask 50B, as well as the standard mask 50A, may include two or more standard regions 58 arranged in the first direction D1. When the standard mask apparatus 15A includes the end standard masks 50B, the presence range of the standard regions 58 in the standard mask apparatus 15A can be expanded to regions further closer to the first sides 411 in the region of the opening 43 of the frame 41. Thus, the presence range R1 of the standard mark regions 62 of the standard substrate 60, determined corresponding to the presence range of the standard regions 58 of the standard mask apparatus 15A, can be expanded. For this reason, evaluation of the first vapor deposition chamber 10 can be performed over a wider region.

Figure 22:
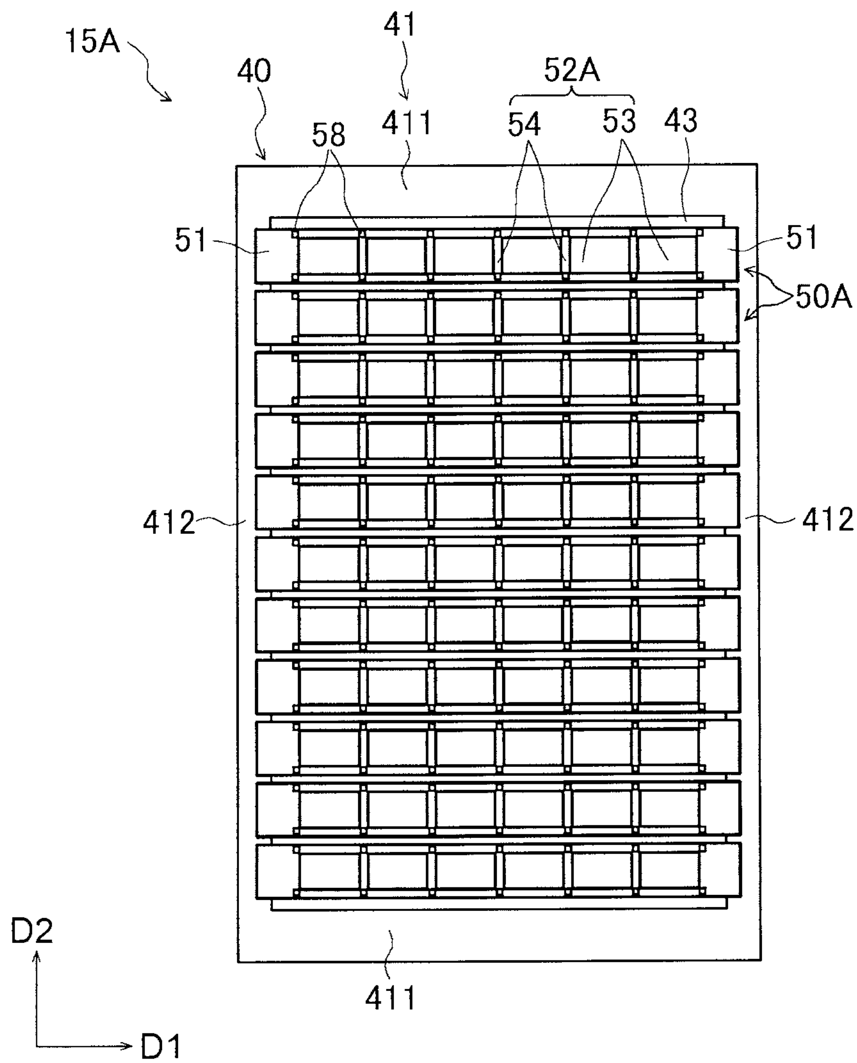
FIG. 22 is a plan view showing an example of a standard mask apparatus.
Figure 23:
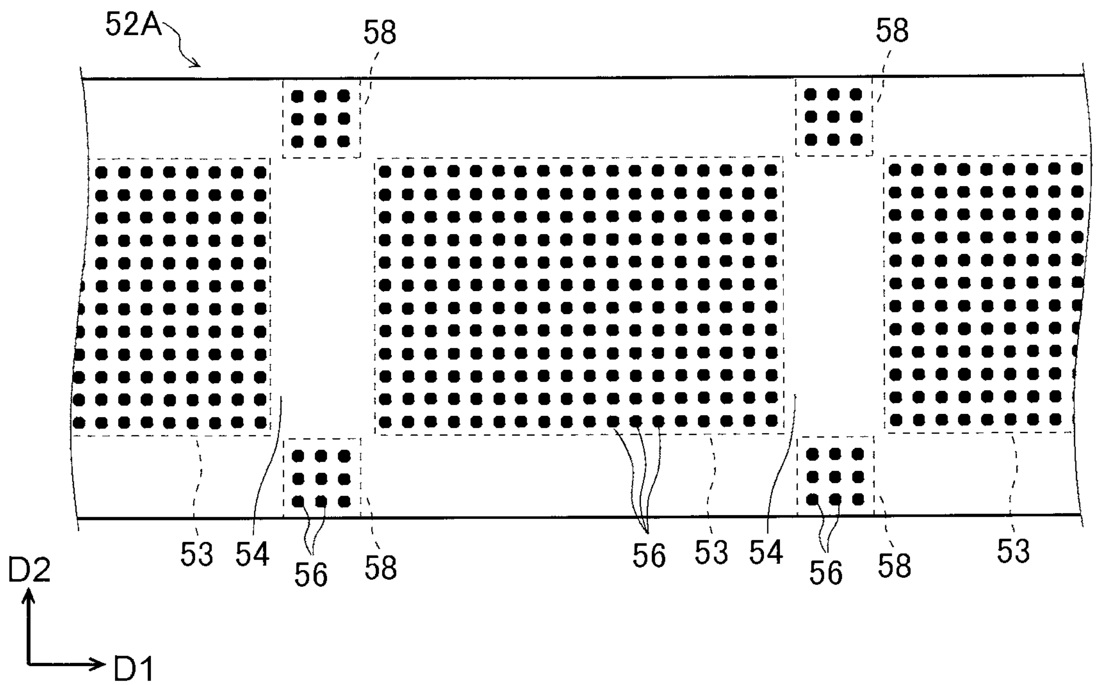
FIG. 23 is an enlarged plan view showing an intermediate portion of each standard mask of FIG. 22.

FIG. 22 is a plan view showing an example of the standard mask apparatus 15A. FIG. 23 is an enlarged plan view showing the intermediate portion 52A of each standard mask 50A of FIG. 22. The standard mask 50A, as well as the mask 50 to be used to manufacture the organic device 100, may include effective regions 53 each including the plurality of through-holes 56. In this case, each standard region 58 may be located in the peripheral region 54 around the effective region 53. For example, as shown in FIG. 23, each standard region 58 may be located in a region that does not overlap the effective regions 53 when viewed along the first direction D1 and that does not overlap the effective regions 53 when viewed along the second direction D2 in the peripheral region 54. When each standard region 58 is located in the peripheral region 54, the standard mask apparatus 15A, as shown in FIG. 22, does not need to include the above-described supporting members that overlap the peripheral region 54 in plan view and that extend in the second direction D2.

Figure 24:
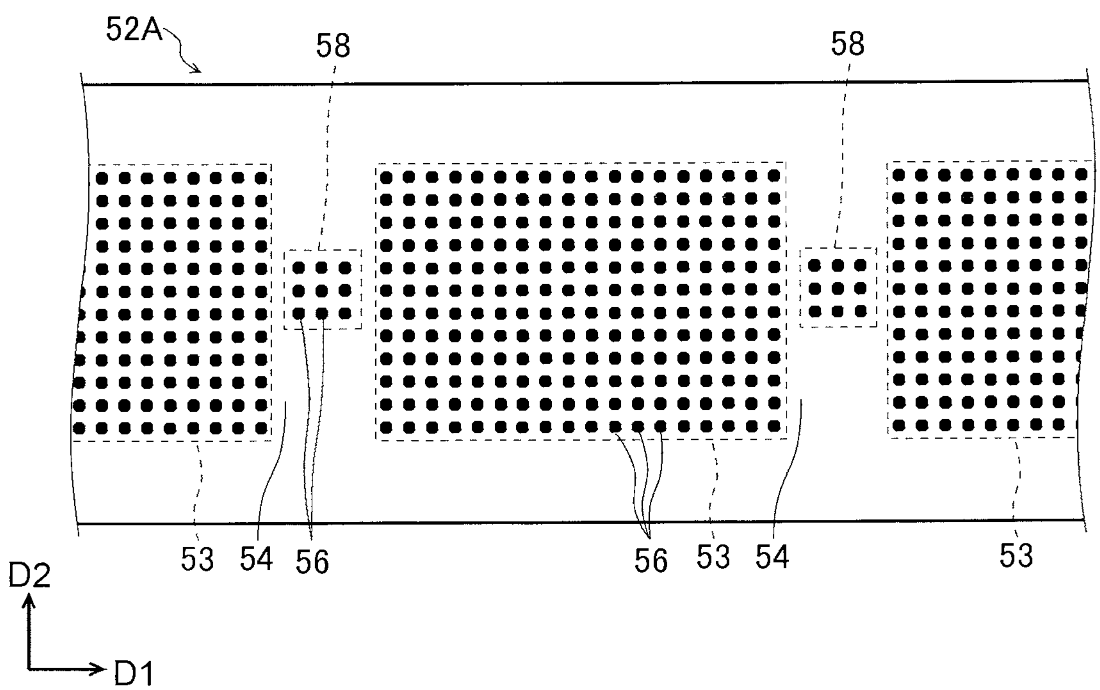
FIG. 24 is a plan view showing an example of an intermediate portion of each standard mask.

FIG. 24 is a plan view showing an example of the intermediate portion 52A of the standard mask 50A. As shown in FIG. 24, each standard region 58 may be located in a region that overlaps the effective regions 53 when viewed along the first direction D1 and that does not overlap the effective regions 53 when viewed along the second direction D2 in the peripheral region 54.

Figure 25:
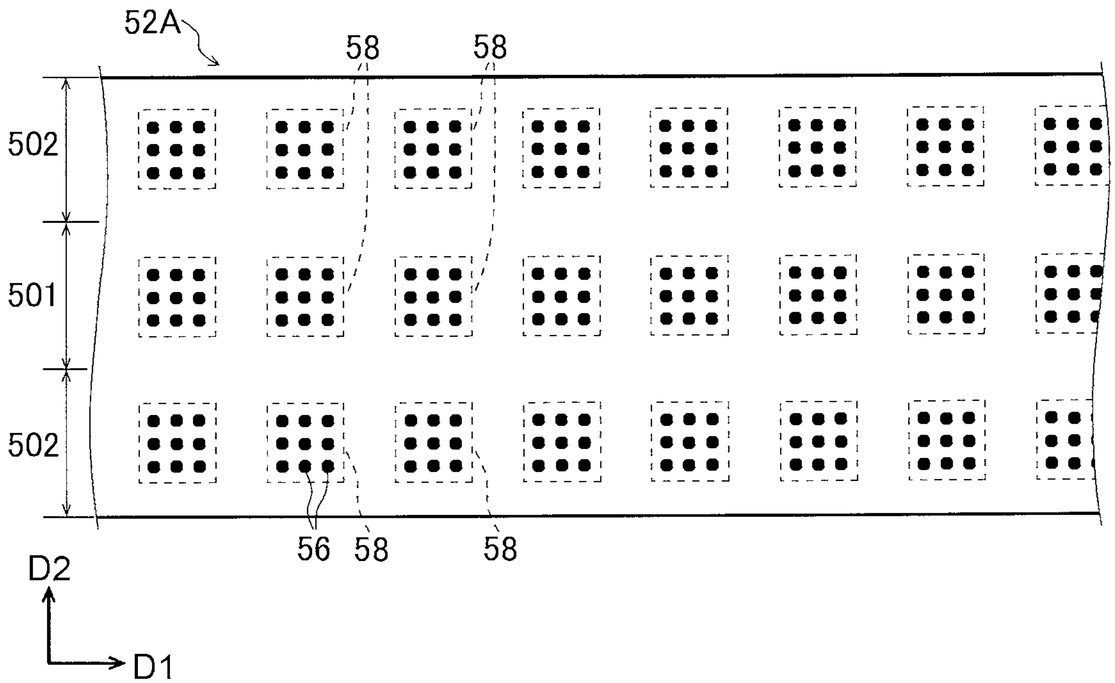
FIG. 25 is a plan view showing an example of an intermediate portion of each standard mask.

FIG. 25 is a plan view showing an example of the intermediate portion 52A of the standard mask 50A. As shown in FIG. 25, the standard mask 50A may include two or more standard regions 58 located in each of the end regions 502 and arranged in the first direction D1. In this case, the standard mask 50A may include or does not need to include two or more standard regions 58 located in the middle region 501 and arranged in the first direction D1.

Figure 26:
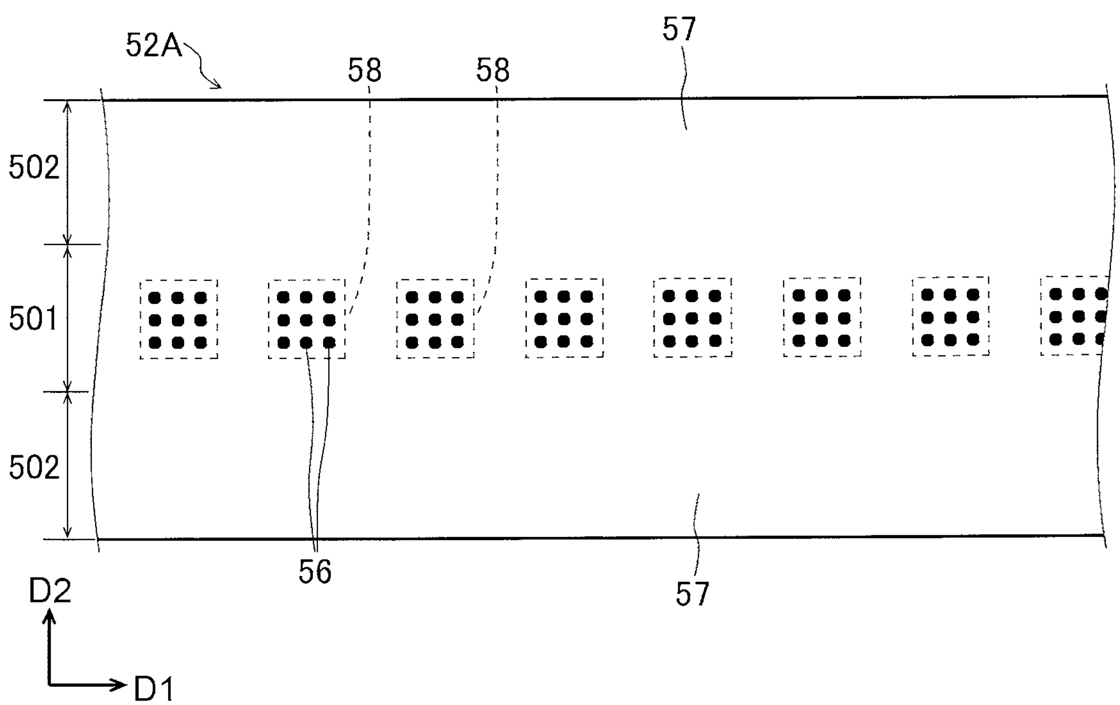
FIG. 26 is a plan view showing an example of an intermediate portion of each standard mask.

FIG. 26 is a plan view showing an example of the intermediate portion 52A of the standard mask 50A. As shown in FIG. 26, each of the end regions 502 of the standard mask 50A may include the non-penetrated region 57. For example, in each of the end regions 502, the through-holes 56 do not need to be located in a region that overlaps one of the standard regions 58 in the middle region 501 when viewed along the second direction D2.

Figure 27:
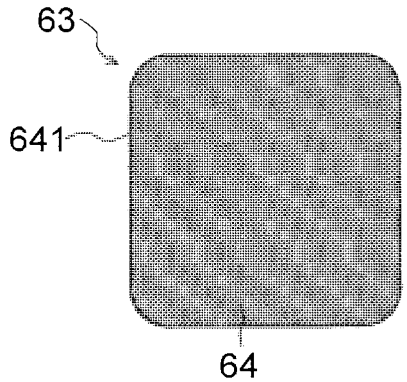
FIG. 27 is a plan view showing an example of a standard mark of the standard substrate.

FIG. 27 is a plan view showing an example of the standard mark region 62 of the standard substrate 60. As shown in FIG. 27, the first mark 64 of the standard mark region 62 may include a layer spreading over a region surrounded by the first outer edge 641. The layer of the first mark 64 may be a light blocking layer having a light blocking property.

Figure 28:
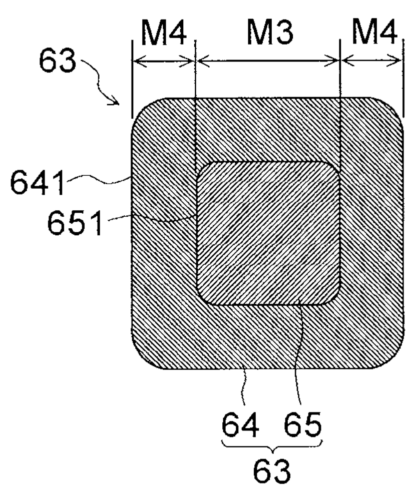
FIG. 28 is a plan view showing an example of a standard mark of the standard substrate.

FIG. 28 is a plan view showing an example of the standard mark region 62 of the standard substrate 60. As shown in FIG. 28, the second mark 65 of the standard mark region 62 may include a layer spreading over a region surrounded by the second outer edge 651. In this case, the first mark 64 may include a layer spreading between the first outer edge 641 and the second outer edge 651. For example, the first mark 64 may include a layer spreading over a region surrounded by the first outer edge 641, and the second mark 65 may include a layer spreading over a region located on the layer of the first mark 64 and surrounded by the second outer edge 651. The layer of the first mark 64 may be a light blocking layer having a light blocking property. The layer of the second mark 65 may be a light blocking layer having a light blocking property.

Figure 29:
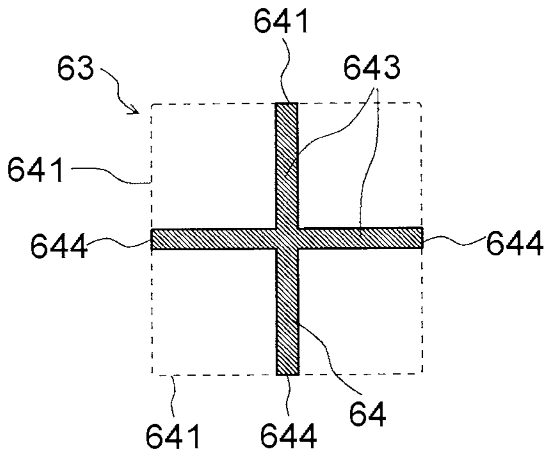
FIG. 29 is a plan view showing an example of a standard mark of the standard substrate.

FIG. 29 is a plan view showing an example of the standard mark region 62 of the standard substrate 60. As shown in FIG. 29, the standard mark region 62 may include the first mark 64 including two orthogonal linear elements 643. In this case, the first outer edge 641 of the first mark 64 may be determined by imaginary straight lines that each are tangent to an associated one of end portions 644 of the linear elements 643 and orthogonal to the associated one of the linear elements 643 as represented by the dashed lines in FIG. 29.

Figure 30:
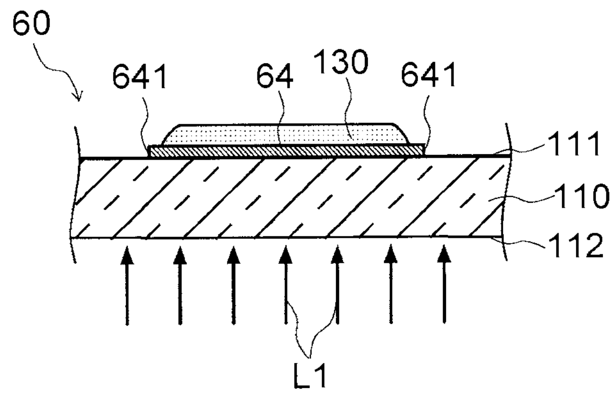
FIG. 30 is a sectional view showing an example of a step of observing the first vapor deposition layer on the standard mark of the standard substrate.
Figure 31:
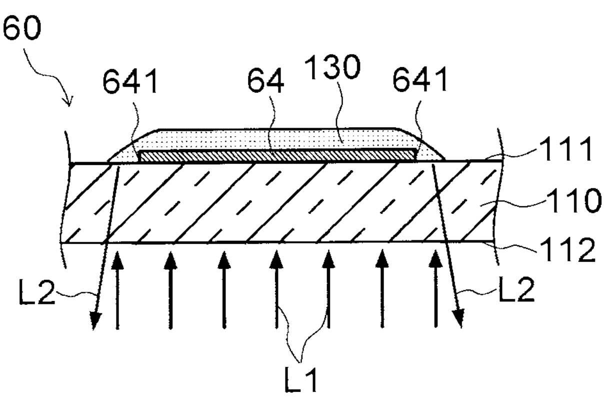
FIG. 31 is a sectional view showing an example of a step of observing the first vapor deposition layer on the standard mark of the standard substrate.

FIG. 30 and FIG. 31 are sectional views showing examples of a step of observing the first vapor deposition layer 130 on the first mark 64 of the standard substrate 60. In the examples shown in FIG. 30 and FIG. 31, the first mark 64 of the standard mark region 62 may be a light blocking layer having a light blocking property.

As shown in FIG. 30 and FIG. 31, the observation step of observing the first vapor deposition layer 130 may include a step of observing whether excitation light L2 is generated from the first vapor deposition layer 130 by applying light L1 from, of the surfaces of the standard substrate 60, the surface across from the light blocking layer of the first mark 64 and the first vapor deposition layer 130, that is, the second surface 112 side, toward the first mark 64. When the first vapor deposition layer 130 contains a fluorescent material, excitation light is generated from the first vapor deposition layer 130 when light is applied to the first vapor deposition layer 130. For this reason, as shown in FIG. 31, when the outer edge of the first vapor deposition layer 130 is located outside the first outer edge 641 of the first mark 64 in plan view, excitation light L2 is easily generated from the first vapor deposition layer 130. On the other hand, as shown in FIG. 30, when the outer edge of the first vapor deposition layer 130 is located inside the first outer edge 641 of the first mark 64 in plan view, excitation light L2 is difficult to be generated from the first vapor deposition layer 130. Therefore, by observing whether excitation light L2 is generated, information about whether the outer edge of the first vapor deposition layer 130 is located inside the first outer edge 641 of the first mark 64 in plan view is obtained.

In the observation step of observing the first vapor deposition layer 130, the absolute position of the first vapor deposition layer 130 in the coordinate system on the substrate 110 of the standard substrate 60 may be calculated. In this case, information to be obtained through the evaluation method for the first vapor deposition chamber 10 may include both or any one of information about the absolute position of the first vapor deposition layer 130 in the coordinate system on the substrate 110 of the standard substrate 60 and information about the relative position of the first vapor deposition layer 130 with respect to the standard mark 63 of the standard substrate 60.

An example of a method of calculating the absolute position of the first vapor deposition layer 130 in the coordinate system on the substrate 110 of the standard substrate 60 will be described. When, for example, the standard substrate 60 includes the alignment marks 68 as described above, the coordinates of each standard mark 63, that is, the first mark 64, the second mark 65, and the like, in the coordinate system on the substrate 110 of the standard substrate 60 may be calculated with reference to the alignment marks 68. In this case, information about the absolute position of the first vapor deposition layer 130 in the coordinate system on the substrate 110 of the standard substrate 60 is obtained in accordance with information about the coordinates of the standard mark 63 and information about a relative position deviation of the first vapor deposition layer 130 with respect to the standard mark 63. As in the case of the above-described observation step, the large automatic two-dimensional coordinate measuring system AMIC-1710 made by Sinto S-Precision, Ltd. may be used as a system of measuring the coordinates of the standard mark 63.

When the standard substrate 60 includes the alignment marks 68, the above-described determination step may be performed in accordance with information about the absolute position of the first vapor deposition layer 130 in the coordinate system on the substrate 110 of the standard substrate 60. For example, the determination step may be performed in accordance with whether the coordinates of the center of the first vapor deposition layer 130 falls within a prescribed range. The determination step may be performed in accordance with whether the coordinates of the outer edge of the first vapor deposition layer 130 falls within a prescribed range. In these cases, the determination step may be performed in accordance with the relation between the first vapor deposition layer 130 and the coordinate system on the substrate 110 of the standard substrate 60, determined by using the alignment marks 68. The observation step presumably observes the positional relation between the alignment marks 68 and the first vapor deposition layer 130. Therefore, the alignment marks 68 presumably function as a standard mark of the standard substrate 60. In this case, the number of the alignment marks 68 that function as a standard mark may be less than the number of the first vapor deposition layers 130 to be formed on the substrate 110.

Figure 32:
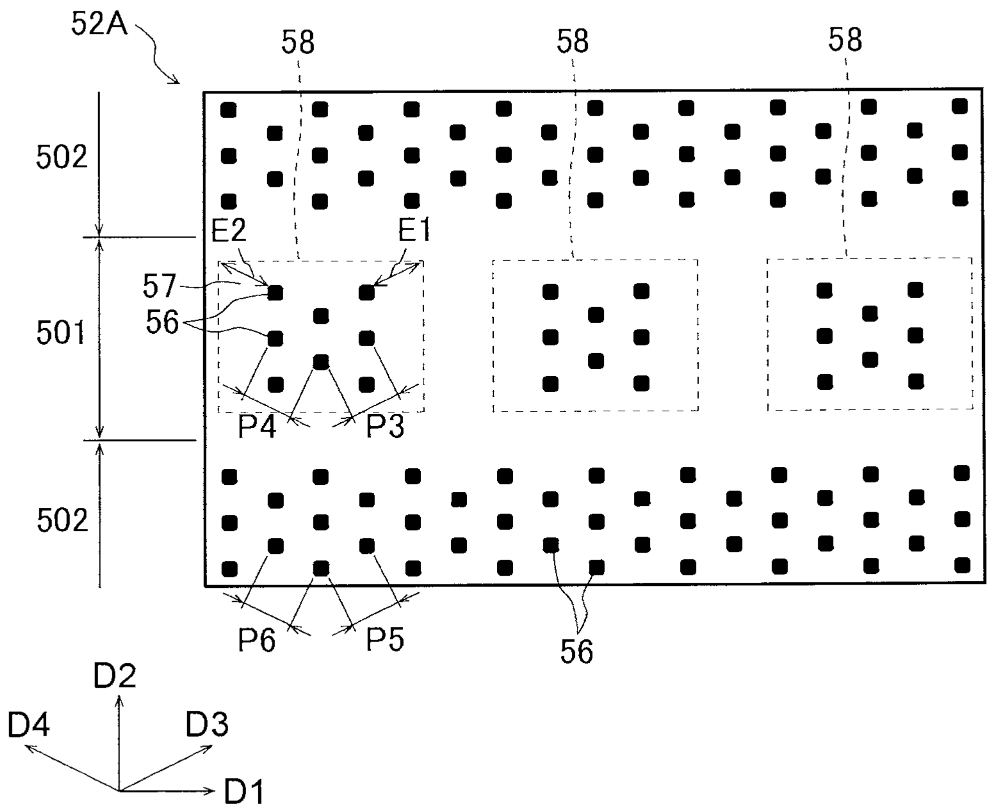
FIG. 32 is a plan view showing an example of an intermediate portion of each standard mask.

In the above-described embodiment, the example in which the arrangement direction of the through-holes 56 of the standard mask 50A is parallel to the first direction D1 that is the longitudinal direction of the standard mask 50A or the second direction D2 that is the width direction of the standard mask 50A is described. For example, the example in which the through-holes 56 of the standard mask 50A are arranged in the first direction D1 and the second direction D2 is described. However, the configuration is not limited thereto. The arrangement direction of the through-holes 56 of the standard region 58 of the standard mask 50A may be different from the first direction D1 or the second direction D2. For example, as shown in FIG. 32, the arrangement direction of the through-holes 56 of the standard mask 50A may be a third direction D3 and a fourth direction D4 different from the first direction D1 or the second direction D2. In the example shown in FIG. 32, the reference sign P3 indicates the arrangement period of the through-holes 56 of the standard region 58 in the third direction D3, and the reference sign P4 indicates the arrangement period of the through-holes 56 of the standard region 58 in the fourth direction D4.

The arrangement direction of the through-holes 56 located in each end region 502 may be different from the first direction D1 or the second direction D2. For example, as shown in FIG. 32, the arrangement direction of the through-holes 56 of the standard mask 50A may be the third direction D3 and the fourth direction D4 different from the first direction D1 or the second direction D2. In the example shown in FIG. 32, the reference sign P5 indicates the arrangement period of the through-holes 56 of each end region 502 in the third direction D3, and the reference sign P6 indicates the arrangement period of the through-holes 56 of each end region 502 in the fourth direction D4. The arrangement period P5 and arrangement period P6 of the through-holes 56 of each end region 502 may be the same or may be different from the arrangement period P3 and arrangement period P4 of the through-holes 56 of the middle region 501.

As shown in FIG. 32, each standard region 58 located in the middle region 501 may include the non-penetrated region 57 located around the through-holes 56 and having a dimension greater than the arrangement period of the through-holes 56 in plan view. For example, the dimension E1 of the non-penetrated region 57 of the standard region 58 in the third direction D3 may be greater than the arrangement period P3 of the through-holes 56 in the third direction D3. The dimension E2 of the non-penetrated region 57 of the standard region 58 in the fourth direction D4 may be greater than the arrangement period P4 of the through-holes 56 in the fourth direction D4. Thus, in the observation step, the first vapor deposition layers 130 made up of the vapor deposition material deposited onto the standard substrate 60 through the through-holes 56 of the standard region 58 are more easily distinguished from the first vapor deposition layers 130 made up of the vapor deposition material deposited onto the standard substrate 60 through the other through-holes 56.

Next, a second embodiment will be described. The second embodiment has a feature related to the mask support 40.

When a deformation occurs in a mask support, such as a frame, that supports a mask, the position of the mask fixed to the mask support changes. Therefore, it is desired to suppress a deformation of the mask support.

A mask support that supports a mask in a state where a tension is applied to the mask according to the second embodiment may include a frame including an opening and at least one bar located in the opening and connected to the frame. The frame may include a frame first surface to which the mask is fixed, a frame second surface located across from the frame first surface, an inner surface located between the frame first surface and the frame second surface and to which the at least one bar is connected, and an outer surface located across from the inner surface. The at least one bar may include a bar first surface located on the frame first surface side, a bar second surface located across from the bar first surface, and bar side surfaces located between the bar first surface and the bar second surface. The frame first surface and the bar first surface may be continuous.

According to the second embodiment, a deformation of the mask support is suppressed.

A first aspect of the second embodiment is a mask support that supports a mask in a state where a tension is applied to the mask. The mask support includes a frame including an opening, and at least one bar located in the opening and connected to the frame. The frame includes a frame first surface to which the mask is fixed, a frame second surface located across from the frame first surface, an inner surface located between the frame first surface and the frame second surface and to which the at least one bar is connected, and an outer surface located across from the inner surface. The at least one bar includes a bar first surface located on the frame first surface side, a bar second surface located across from the bar first surface, and bar side surfaces located between the bar first surface and the bar second surface. The frame first surface and the bar first surface are continuous.

In a second aspect of the second embodiment, in the mask support according to the first aspect, the frame first surface and the bar first surface may be located in a same plane.

In a third aspect of the second embodiment, in the mask support according to the first or second aspect, when the mask support is viewed along a direction normal to the frame first surface, the inner surface and each of the bar side surfaces may be connected via a first connection portion having a first radius of curvature.

In a fourth aspect of the second embodiment, in the mask support according to any one of the first to third aspects, the inner surface and the bar second surface may be connected via a second connection portion having a second radius of curvature.

In a fifth aspect of the second embodiment, in the mask support according to any one of the first to fourth aspects, the frame may include a pair of first sides extending in a first direction and a pair of second sides extending in a second direction that intersects with the first direction. The mask may be fixed to the second sides. The at least one bar may include a first bar connected to the first sides.

In a sixth aspect of the second embodiment, in the mask support according to any one of the first to fourth aspects, the frame may include a pair of first sides extending in a first direction and a pair of second sides extending in a second direction that intersects with the first direction. The mask may be fixed to the second sides. The at least one bar may include a second bar connected to the second sides.

In a seventh aspect of the second embodiment, in the mask support according to any one of the first to fourth aspects, the frame may include a pair of first sides extending in a first direction and a pair of second sides extending in a second direction that intersects with the first direction. The mask may be fixed to the second sides. The at least one bar may include a first bar connected to the first sides and a second bar connected to the second sides. When the mask support is viewed along a direction normal to the frame first surface, each of the bar side surfaces of the first bar and an associated one of the bar side surfaces of the second bar may be connected via a third connection portion having a third radius of curvature.

In an eighth aspect of the second embodiment, in the mask support according to any one of the first to seventh aspects, a width of the at least one bar on the bar first surface may be greater than a width of the at least one bar on the bar second surface.

In a ninth aspect of the second embodiment, in the mask support according to any one of the first to eighth aspects, the at least one bar may include a portion in which a width of the at least one bar reduces as a point approaches the bar second surface in a thickness direction of the at least one bar.

In a tenth aspect of the second embodiment, in the mask support according to any one of the first to ninth aspects, the inner surface includes a portion in which a distance from a center of the opening in plan view increases as a point approaches the frame second surface in a thickness direction of the frame.

In an eleventh aspect of the second embodiment, in the mask support according to any one of the first to tenth aspects, a thickness of the frame may be greater than or equal to 5 mm and less than or equal to 40 mm.

In a twelfth aspect of the second embodiment, in the mask support according to any one of the first to eleventh aspects, a thickness of the at least one bar may be greater than or equal to 50 μm and less than or equal to 1000 μm.

In a thirteenth aspect of the second embodiment, in the mask support according to any one of the first to twelfth aspects, a thickness of the at least one bar may be less than a thickness of the frame.

In a fourteenth aspect of the second embodiment, in the mask support according to any one of the first to thirteenth aspects, a ratio of a thickness of the at least one bar to a thickness of the frame may be lower than or equal to 0.85.

In a fifteenth aspect of the second embodiment, in the mask support according to any one of the first to fourteenth aspects, a width of the at least one bar may be greater than or equal to 1 mm and less than or equal to 100 mm.

A sixteenth aspect of the second embodiment is a method of manufacturing the mask support according to any one of the first to fifteenth aspects. The method includes a preparation step of preparing a plate including a first surface and a second surface located across from the first surface, and a machining step of forming the at least one bar by machining a middle region of the plate from the second surface side when the plate is viewed along a direction normal to the second surface.

A seventeenth aspect of the second embodiment is a mask apparatus. The mask apparatus includes the mask support according to any one of the first to fifteenth aspects and a mask including at least one through-hole and fixed to the frame first surface of the mask support.

An eighteenth aspect of the second embodiment is the mask apparatus according to the seventeenth aspect, and the mask support may include two or more openings partitioned by the at least one bar. The mask may include two or more effective regions. Each effective region may include a group of the regularly arranged through-holes. In plan view, the two or more effective regions may overlap the one opening.

A nineteenth aspect of the second embodiment is a method of manufacturing an organic device. The method includes a vapor deposition step of forming a vapor deposition layer on a substrate by depositing an organic material onto the substrate through the at least one through-hole of the mask of the mask apparatus according to the seventeenth aspect or the eighteenth aspect.

A twentieth aspect of the second embodiment is an organic device. The organic device includes the vapor deposition layer formed on the substrate through the vapor deposition step of the method according to the nineteenth aspect.

Hereinafter, the second embodiment will be described in detail with reference to the accompanying drawings. The embodiments described below are examples of the second embodiment, and the second embodiment is not interpreted limitedly to only these embodiments. In the following description and the drawings to be used in the following description, like reference signs used for corresponding portions in the above-described embodiment denote portions that can be configured similarly to those of the above-described embodiment. The description will not be repeated. When it is apparent that the operation and advantageous effects obtained in the above-described embodiment are also obtained in the following embodiment, the description may be omitted.

Figure 33:
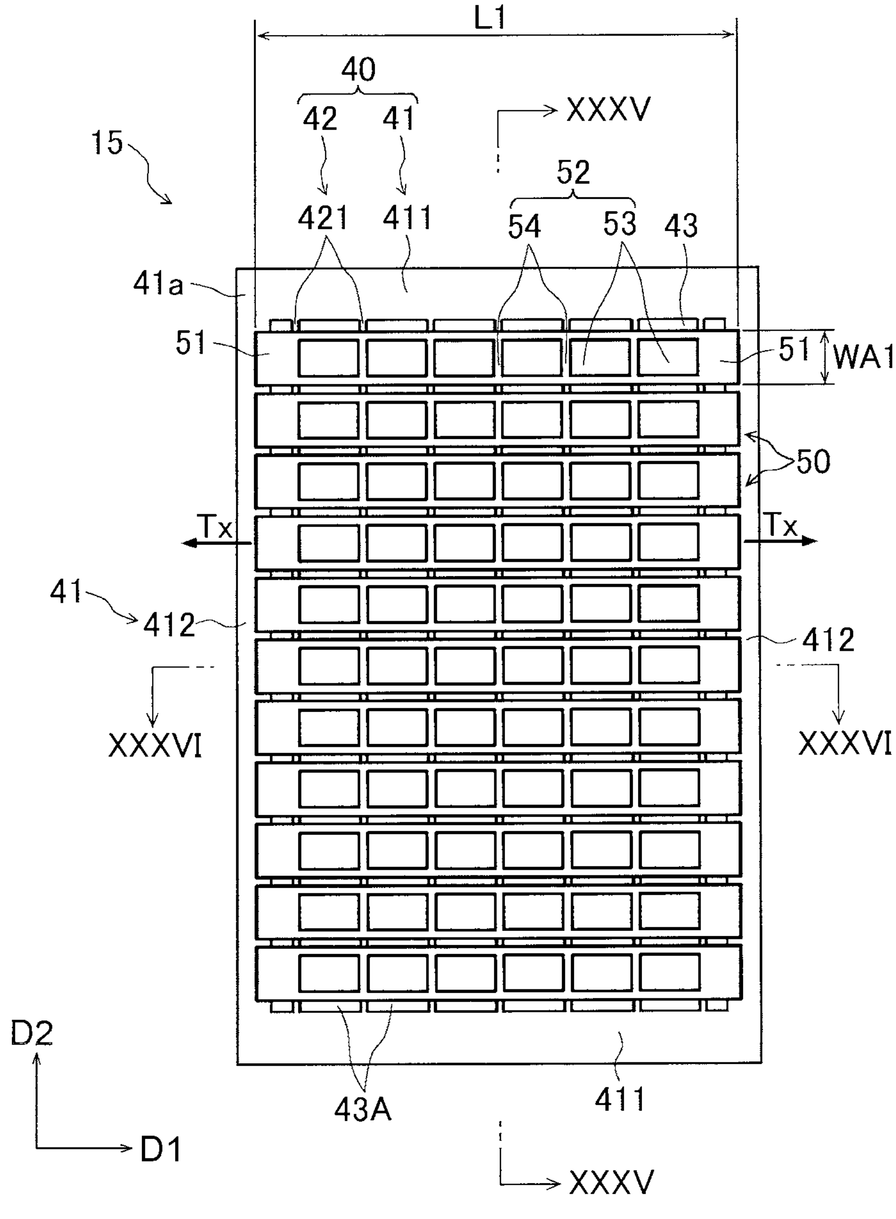
FIG. 33 is a plan view showing an example of a mask apparatus in a vapor deposition chamber.

FIG. 33 is a plan view showing the mask apparatus 15 when viewed from the first surface 551 side of each mask 50. In FIG. 33, the reference sign L1 represents the dimension of each mask 50 in the first direction D1, that is, the length of each mask 50. For example, the dimension L1 may be greater than or equal to 150 mm, may be greater than or equal to 300 mm, may be greater than or equal to 450 mm, or may be greater than or equal to 600 mm. For example, the dimension L1 may be less than or equal to 750 mm, may be less than or equal to 1000 mm, may be less than or equal to 1500 mm, or may be less than or equal to 2000 mm. The range of the dimension L1 may be determined from a first group consisting of 150 mm, 300 mm, 450 mm, and 600 mm and/or a second group consisting of 750 mm, 1000 mm, 1500 mm, and 2000 mm. The range of the dimension L1 may be determined by a combination of any one of the values included in the first group and any one of the values included in the second group. The range of the dimension L1 may be determined by a combination of any two of the values included in the first group. The range of the dimension L1 may be determined by a combination of any two of the values included in the second group. For example, the range of the dimension L1 may be greater than or equal to 150 mm and less than or equal to 2000 mm, may be greater than or equal to 150 mm and less than or equal to 1500 mm, may be greater than or equal to 150 mm and less than or equal to 1000 mm, may be greater than or equal to 150 mm and less than or equal to 750 mm, may be greater than or equal to 150 mm and less than or equal to 600 mm, may be greater than or equal to 150 mm and less than or equal to 450 mm, may be greater than or equal to 150 mm and less than or equal to 300 mm, may be greater than or equal to 300 mm and less than or equal to 2000 mm, may be greater than or equal to 300 mm and less than or equal to 1500 mm, may be greater than or equal to 300 mm and less than or equal to 1000 mm, may be greater than or equal to 300 mm and less than or equal to 750 mm, may be greater than or equal to 300 mm and less than or equal to 600 mm, may be greater than or equal to 300 mm and less than or equal to 450 mm, may be greater than or equal to 450 mm and less than or equal to 2000 mm, may be greater than or equal to 450 mm and less than or equal to 1500 mm, may be greater than or equal to 450 mm and less than or equal to 1000 mm, may be greater than or equal to 450 mm and less than or equal to 750 mm, may be greater than or equal to 450 mm and less than or equal to 600 mm, may be greater than or equal to 600 mm and less than or equal to 2000 mm, may be greater than or equal to 600 mm and less than or equal to 1500 mm, may be greater than or equal to 600 mm and less than or equal to 1000 mm, may be greater than or equal to 600 mm and less than or equal to 750 mm, may be greater than or equal to 750 mm and less than or equal to 2000 mm, may be greater than or equal to 750 mm and less than or equal to 1500 mm, may be greater than or equal to 750 mm and less than or equal to 1000 mm, may be greater than or equal to 1000 mm and less than or equal to 2000 mm, may be greater than or equal to 1000 mm and less than or equal to 1500 mm, or may be greater than or equal to 1500 mm and less than or equal to 2000 mm.

In FIG. 33, the reference sign WA1 represents the dimension of each mask 50 in the second direction D2, that is, the width of each mask 50. For example, the dimension WA1 may be greater than or equal to 50 mm, may be greater than or equal to 100 mm, may be greater than or equal to 150 mm, or may be greater than or equal to 200 mm. For example, the dimension WA1 may be less than or equal to 250 mm, may be less than or equal to 300 mm, may be less than or equal to 350 mm, or may be less than or equal to 400 mm. The range of the dimension WA1 may be determined from a first group consisting of 50 mm, 100 mm, 150 mm, and 200 mm and/or a second group consisting of 250 mm, 300 mm, 350 mm, and 400 mm. The range of the dimension WA1 may be determined by a combination of any one of the values included in the first group and any one of the values included in the second group. The range of the dimension WA1 may be determined by a combination of any two of the values included in the first group. The range of the dimension WA1 may be determined by a combination of any two of the values included in the second group. For example, the range of the dimension WA1 may be greater than or equal to 50 mm and less than or equal to 400 mm, may be greater than or equal to 50 mm and less than or equal to 350 mm, may be greater than or equal to 50 mm and less than or equal to 300 mm, may be greater than or equal to 50 mm and less than or equal to 250 mm, may be greater than or equal to 50 mm and less than or equal to 200 mm, may be greater than or equal to 50 mm and less than or equal to 150 mm, may be greater than or equal to 50 mm and less than or equal to 100 mm, may be greater than or equal to 100 mm and less than or equal to 400 mm, may be greater than or equal to 100 mm and less than or equal to 350 mm, may be greater than or equal to 100 mm and less than or equal to 300 mm, may be greater than or equal to 100 mm and less than or equal to 250 mm, may be greater than or equal to 100 mm and less than or equal to 200 mm, may be greater than or equal to 100 mm and less than or equal to 150 mm, may be greater than or equal to 150 mm and less than or equal to 400 mm, may be greater than or equal to 150 mm and less than or equal to 350 mm, may be greater than or equal to 150 mm and less than or equal to 300 mm, may be greater than or equal to 150 mm and less than or equal to 250 mm, may be greater than or equal to 150 mm and less than or equal to 200 mm, may be greater than or equal to 200 mm and less than or equal to 400 mm, may be greater than or equal to 200 mm and less than or equal to 350 mm, may be greater than or equal to 200 mm and less than or equal to 300 mm, may be greater than or equal to 200 mm and less than or equal to 250 mm, may be greater than or equal to 250 mm and less than or equal to 400 mm, may be greater than or equal to 250 mm and less than or equal to 350 mm, may be greater than or equal to 250 mm and less than or equal to 300 mm, may be greater than or equal to 300 mm and less than or equal to 400 mm, may be greater than or equal to 300 mm and less than or equal to 350 mm, or may be greater than or equal to 350 mm and less than or equal to 400 mm.

Figure 34:
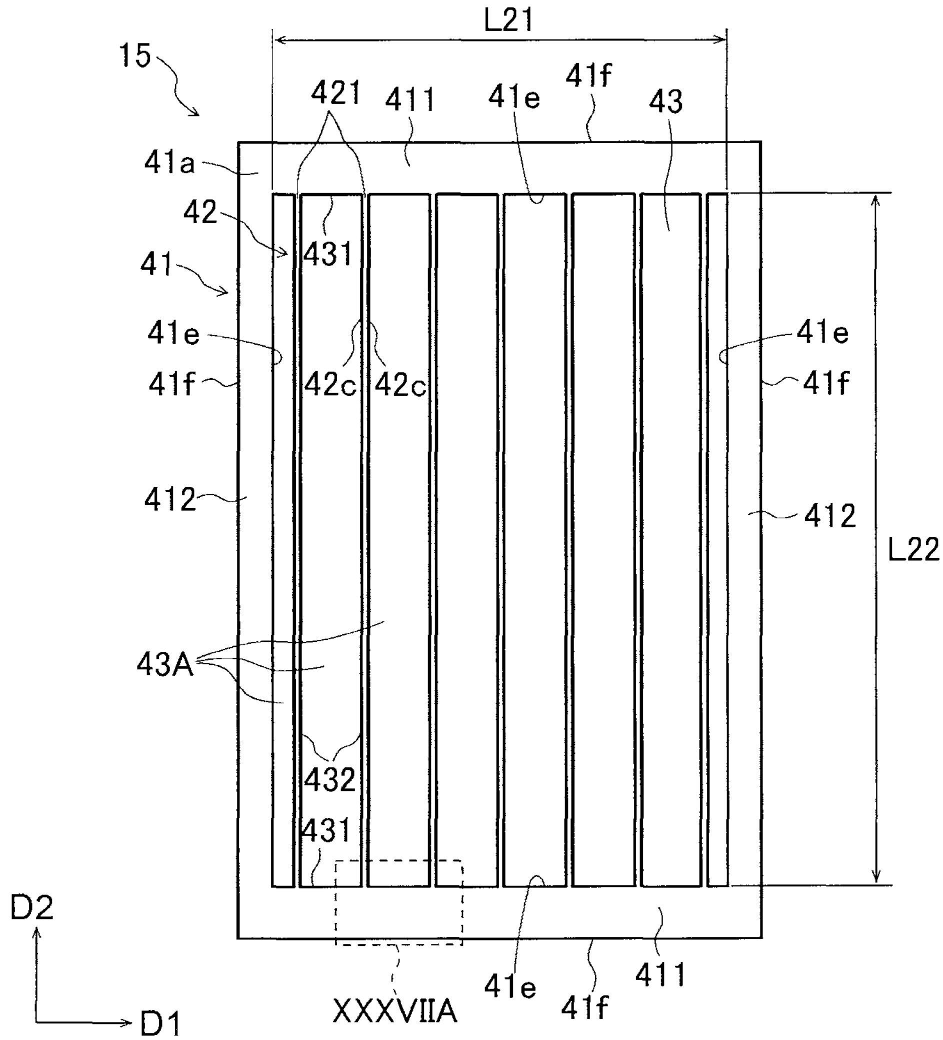
FIG. 34 is a plan view showing a state where the masks are removed from the mask apparatus of FIG. 33.

The mask support 40 will be described. FIG. 34 is a view showing a state where the masks 50 are removed from the mask apparatus 15 of FIG. 33. The mask support 40 may include the bars 42 connected to the frame 41 including the opening 43 in addition to the frame 41. The bars 42 may extend so as to cross the opening 43. The bars 42 may be located below a region that overlaps the opening 43 in plan view in the masks 50 in a vapor deposition step (described later). The bars 42 may support the masks 50 from the lower side in the vapor deposition step. Thus, warpage of the masks 50 under their own weight is suppressed.

The frame 41, the bars 42, and the opening 43 will be described. Initially, the frame 41 will be described.

As shown in FIG. 33 and FIG. 34, the frame 41 may include the pair of first sides 411 facing each other across the opening 43 and the pair of second sides 412 facing each other across the opening 43. The first sides 411 and the second sides 412 extend in different directions. For example, as shown in FIG. 33, the first sides 411 may extend in the first direction D1 that is the longitudinal direction of the masks 50, and the second sides 412 may extend in the second direction D2 perpendicular to the first direction D1. As shown in FIG. 33, the end portions 51 of each mask 50 may be fixed to the second sides 412. The second sides 412 to which the masks 50 are fixed may be longer than the first sides 411. The opening 43 of the frame 41 may be surrounded by the pair of first sides 411 and the pair of second sides 412.

In FIG. 34, the reference sign L21 represents the dimension of the opening 43 of the frame 41 in the first direction D1. The reference sign L22 represents the dimension of the opening 43 of the frame 41 in the second direction D2. For example, L22/L21 may be higher than or equal to 0.6, may be higher than or equal to 0.8, may be higher than or equal to 1.0, or may be higher than or equal to 1.2. For example, L22/L21 may be lower than or equal to 1.4, may be lower than or equal to 1.6, may be lower than or equal to 1.8, or may be lower than or equal to 2.0. The range of L22/L21 may be determined from a first group consisting of 0.6, 0.8, 1.0, and 1.2 and/or a second group consisting of 1.4, 1.6, 1.8, and 2.0. The range of L22/L21 may be determined by a combination of any one of the values included in the first group and any one of the values included in the second group. The range of L22/L21 may be determined by a combination of any two of the values included in the first group. The range of L22/L21 may be determined by a combination of any two of the values included in the second group. For example, the range of L22/L21 may be higher than or equal to 0.6 and lower than or equal to 2.0, may be higher than or equal to 0.6 and lower than or equal to 1.8, may be higher than or equal to 0.6 and lower than or equal to 1.6, may be higher than or equal to 0.6 and lower than or equal to 1.4, may be higher than or equal to 0.6 and lower than or equal to 1.2, may be higher than or equal to 0.6 and lower than or equal to 1.0, may be higher than or equal to 0.6 and lower than or equal to 0.8, may be higher than or equal to 0.8 and lower than or equal to 2.0, may be higher than or equal to 0.8 and lower than or equal to 1.8, may be higher than or equal to 0.8 and lower than or equal to 1.6, may be higher than or equal to 0.8 and lower than or equal to 1.4, may be higher than or equal to 0.8 and lower than or equal to 1.2, may be higher than or equal to 0.8 and lower than or equal to 1.0, may be higher than or equal to 1.0 and lower than or equal to 2.0, may be higher than or equal to 1.0 and lower than or equal to 1.8, may be higher than or equal to 1.0 and lower than or equal to 1.6, may be higher than or equal to 1.0 and lower than or equal to 1.4, may be higher than or equal to 1.0 and lower than or equal to 1.2, may be higher than or equal to 1.2 and lower than or equal to 2.0, may be higher than or equal to 1.2 and lower than or equal to 1.8, may be higher than or equal to 1.2 and lower than or equal to 1.6, may be higher than or equal to 1.2 and lower than or equal to 1.4, may be higher than or equal to 1.4 and lower than or equal to 2.0, may be higher than or equal to 1.4 and lower than or equal to 1.8, may be higher than or equal to 1.4 and lower than or equal to 1.6, may be higher than or equal to 1.6 and lower than or equal to 2.0, may be higher than or equal to 1.6 and lower than or equal to 1.8, or may be higher than or equal to 1.8 and lower than or equal to 2.0.

For example, the dimension L21 of the opening 43 in the first direction D1 may be greater than or equal to 150 mm, may be greater than or equal to 300 mm, may be greater than or equal to 450 mm, or may be greater than or equal to 600 mm. For example, the dimension L21 may be less than or equal to 750 mm, may be less than or equal to 1000 mm, may be less than or equal to 1500 mm, or may be less than or equal to 2000 mm. The range of the dimension L21 may be determined from a first group consisting of 150 mm, 300 mm, 450 mm, and 600 mm and/or a second group consisting of 750 mm, 1000 mm, 1500 mm, and 2000 mm. The range of the dimension L21 may be determined by a combination of any one of the values included in the first group and any one of the values included in the second group. The range of the dimension L21 may be determined by a combination of any two of the values included in the first group. The range of the dimension L21 may be determined by a combination of any two of the values included in the second group. For example, the range of the dimension L21 may be greater than or equal to 150 mm and less than or equal to 2000 mm, may be greater than or equal to 150 mm and less than or equal to 1500 mm, may be greater than or equal to 150 mm and less than or equal to 1000 mm, may be greater than or equal to 150 mm and less than or equal to 750 mm, may be greater than or equal to 150 mm and less than or equal to 600 mm, may be greater than or equal to 150 mm and less than or equal to 450 mm, may be greater than or equal to 150 mm and less than or equal to 300 mm, may be greater than or equal to 300 mm and less than or equal to 2000 mm, may be greater than or equal to 300 mm and less than or equal to 1500 mm, may be greater than or equal to 300 mm and less than or equal to 1000 mm, may be greater than or equal to 300 mm and less than or equal to 750 mm, may be greater than or equal to 300 mm and less than or equal to 600 mm, may be greater than or equal to 300 mm and less than or equal to 450 mm, may be greater than or equal to 450 mm and less than or equal to 2000 mm, may be greater than or equal to 450 mm and less than or equal to 1500 mm, may be greater than or equal to 450 mm and less than or equal to 1000 mm, may be greater than or equal to 450 mm and less than or equal to 750 mm, may be greater than or equal to 450 mm and less than or equal to 600 mm, may be greater than or equal to 600 mm and less than or equal to 2000 mm, may be greater than or equal to 600 mm and less than or equal to 1500 mm, may be greater than or equal to 600 mm and less than or equal to 1000 mm, may be greater than or equal to 600 mm and less than or equal to 750 mm, may be greater than or equal to 750 mm and less than or equal to 2000 mm, may be greater than or equal to 750 mm and less than or equal to 1500 mm, may be greater than or equal to 750 mm and less than or equal to 1000 mm, may be greater than or equal to 1000 mm and less than or equal to 2000 mm, may be greater than or equal to 1000 mm and less than or equal to 1500 mm, or may be greater than or equal to 1500 mm and less than or equal to 2000 mm.

For example, the dimension L22 of the opening 43 in the second direction D2 may be greater than or equal to 600 mm, may be greater than or equal to 800 mm, may be greater than or equal to 1000 mm, or may be greater than or equal to 1200 mm. For example, the dimension L22 may be less than or equal to 1400 mm, may be less than or equal to 1600 mm, may be less than or equal to 1800 mm, or may be less than or equal to 2000 mm. The range of the dimension L22 may be determined from a first group consisting of 600 mm, 800 mm, 1000 mm, and 1200 mm and/or a second group consisting of 1400 mm, 1600 mm, 1800 mm, and 2000 mm. The range of the dimension L22 may be determined by a combination of any one of the values included in the first group and any one of the values included in the second group. The range of the dimension L22 may be determined by a combination of any two of the values included in the first group. The range of the dimension L22 may be determined by a combination of any two of the values included in the second group. For example, the range of the dimension L22 may be greater than or equal to 600 mm and less than or equal to 2000 mm, may be greater than or equal to 600 mm and less than or equal to 1800 mm, may be greater than or equal to 600 mm and less than or equal to 1600 mm, may be greater than or equal to 600 mm and less than or equal to 1400 mm, may be greater than or equal to 600 mm and less than or equal to 1200 mm, may be greater than or equal to 600 mm and less than or equal to 1000 mm, may be greater than or equal to 600 mm and less than or equal to 800 mm, may be greater than or equal to 800 mm and less than or equal to 2000 mm, may be greater than or equal to 800 mm and less than or equal to 1800 mm, may be greater than or equal to 800 mm and less than or equal to 1600 mm, may be greater than or equal to 800 mm and less than or equal to 1400 mm, may be greater than or equal to 800 mm and less than or equal to 1200 mm, may be greater than or equal to 800 mm and less than or equal to 1000 mm, may be greater than or equal to 1000 mm and less than or equal to 2000 mm, may be greater than or equal to 1000 mm and less than or equal to 1800 mm, may be greater than or equal to 1000 mm and less than or equal to 1600 mm, may be greater than or equal to 1000 mm and less than or equal to 1400 mm, may be greater than or equal to 1000 mm and less than or equal to 1200 mm, may be greater than or equal to 1200 mm and less than or equal to 2000 mm, may be greater than or equal to 1200 mm and less than or equal to 1800 mm, may be greater than or equal to 1200 mm and less than or equal to 1600 mm, may be greater than or equal to 1200 mm and less than or equal to 1400 mm, may be greater than or equal to 1400 mm and less than or equal to 2000 mm, may be greater than or equal to 1400 mm and less than or equal to 1800 mm, may be greater than or equal to 1400 mm and less than or equal to 1600 mm, may be greater than or equal to 1600 mm and less than or equal to 2000 mm, may be greater than or equal to 1600 mm and less than or equal to 1800 mm, or may be greater than or equal to 1800 mm and less than or equal to 2000 mm.

Figure 35:
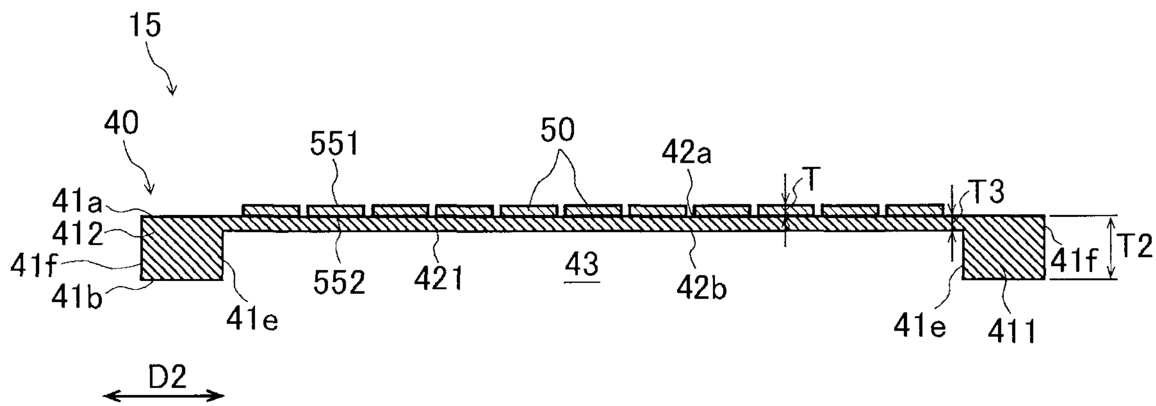
FIG. 35 is a sectional view of the mask apparatus, taken along the line XXXV-XXXV in FIG. 33.
Figure 36:
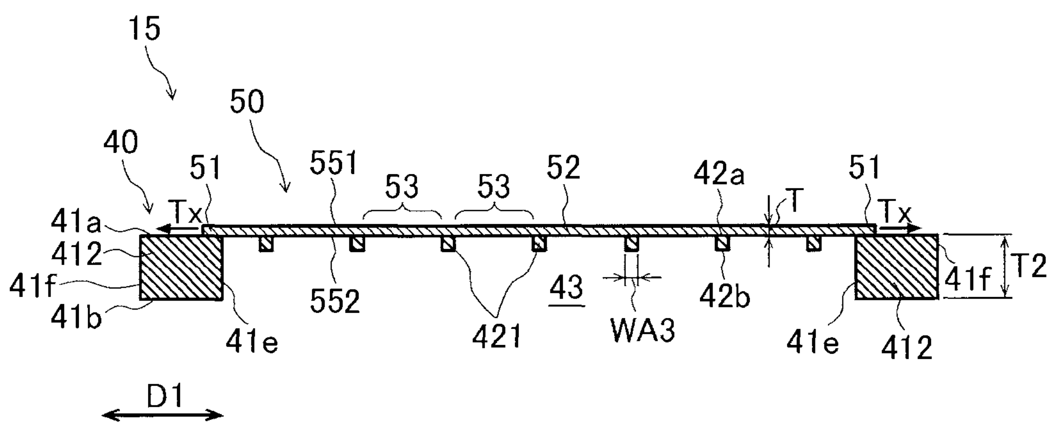
FIG. 36 is a sectional view of the mask apparatus, taken along the line XXXVI-XXXVI in FIG. 33.

FIG. 35 is a sectional view of the mask apparatus 15, taken along the line XXXV-XXXV in FIG. 33. FIG. 36 is a sectional view of the mask apparatus 15, taken along the line XXXVI-XXXVI in FIG. 33. As shown in FIG. 35 and FIG. 36, the frame 41 includes an inner surface 41*e* and an outer surface 41*f*. The inner surface 41*e* and the outer surface 41*f* are located between the frame first surface 41*a* and the frame second surface 41*b*. The inner surface 41*e* faces the opening 43. The outer surface 41*f* is located across from the inner surface 41*e*. As shown in FIG. 35 and FIG. 36, the inner surface 41*e* and the outer surface 41*f* may expand along the direction normal to the frame first surface 41*a*.

The bars 42 will be described. The bars 42 are regions connected to the inner surface 41*e* of the frame 41 and crossing the opening 43 in plan view. As shown in FIG. 33 and FIG. 34, the bars 42 may include the first bars 421 connected to the inner surfaces 41*e* of the first sides 411 of the frame 41. The first bars 421 may extend in the second direction D2. For example, each first bar 421 may include a pair of bar side surfaces 42*c* extending the second direction D2 in plan view, and the bar side surfaces 42*c* may be connected to the inner surfaces 41*e* of the first sides 411 of the frame 41. A plurality of the first bars 421 may be arranged along the first direction D1. The length of each first side 411 may be the same as the dimension L22 of the opening 43 of the frame 41 in the second direction D2.

As shown in FIG. 35 and FIG. 36, each first bar 421 may include the bar first surface 42*a* located on the frame first surface 41*a* side and the bar second surface 42*b* located across from the bar first surface 42*a*. The bar first surface 42*a* may be in contact with the second surfaces 552 of the masks 50. The first bars 421 suppress warpage of the masks 50 under their own weight.

Figure 37A:
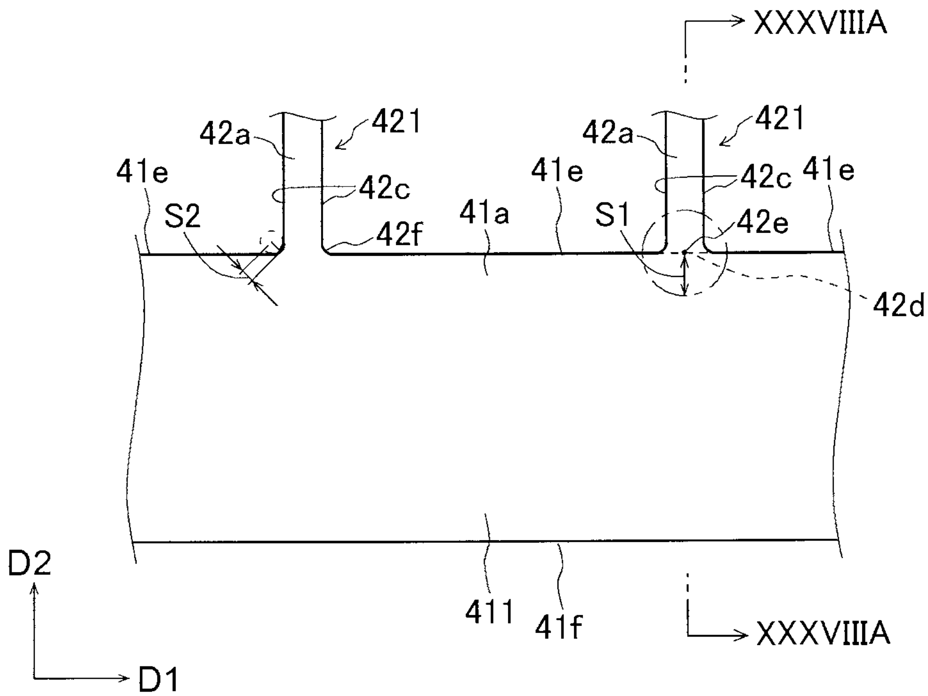
FIG. 37A is an enlarged plan view showing a mask support in the range surrounded by the dashed line and indicated by the reference sign XXXVIIA in FIG. 34.
Figure 38A:
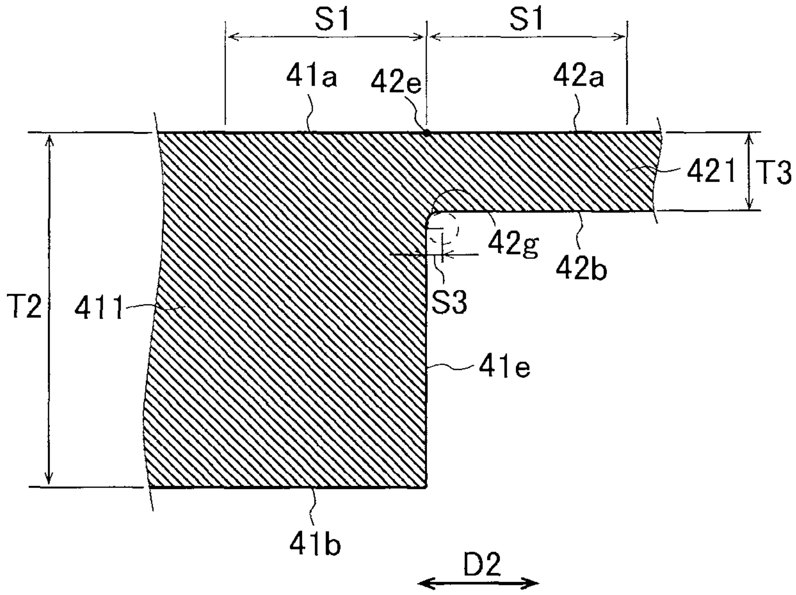
FIG. 38A is a sectional view of the mask support, taken along the line XXXVIIIA-XXXVIIIA in FIG. 37A.

The structure of the boundary between the frame 41 and each bar 42 will be described with reference to FIG. 37A and FIG. 38A. FIG. 37A is an enlarged plan view showing an example of the mask support 40 in the range surrounded by the dashed line and indicated by the reference sign XXXVIIA in FIG. 34. FIG. 38A is a sectional view of the mask support 40, taken along the line XXXVIIIA-XXXVIIIA in FIG. 37A.

As shown in FIG. 37A and FIG. 38A, the frame first surface 41*a* of the frame 41 and the bar first surface 42*a* of each bar 42 may be continuous at the boundary between the frame 41 and the bar 42. For example, all of the frame 41 and the bars 42 may be manufactured by mechanically machining one plate. In this case, by machining the plate such that the frame first surface 41*a* of the frame 41 and the bar first surface 42*a* of each bar 42 are made up of one surface of the plate, the continuous frame first surface 41*a* and bar first surfaces 42*a* are formed.

Whether the frame first surface 41*a* of the frame 41 and the bar first surface 42*a* of each bar 42 are continuous may be determined in accordance with whether the frame first surface 41*a* and the bar first surface 42*a* are located in the same plane around the boundary between the frame 41 and each bar 42. Specifically, the positions of the frame first surface 41*a* and frame second surface 41*b* in the direction normal to the frame first surface 41*a* are measured in a region around the boundary between the frame 41 and each bar 42. The region around the boundary is a region within the range of a radius S1 around a connection point 42*e* shown in FIG. 37A in the frame first surface 41*a* and the frame second surface 41*b*. The position of the region around the boundary in the direction normal to the frame first surface 41*a* is located in the range of an average value±first threshold, it is determined that the frame first surface 41*a* and the bar first surface 42*a* are located in the same plane. The first threshold is, for example, 0.5 mm.

The above-described connection point 42*e* is the center point of an end 42*d* of each bar 42. The end 42*d* is defined as a portion at which an extended line in plan view of the inner surface 41*e* of the frame 41, to which the bar 42 is connected, intersects with the bar 42. In the example shown in FIG. 37A, the end 42*d* is a portion at which an extended line of the inner surface 41*e* of the first side 411 extending in the first direction D1 in plan view intersects with the first bar 421 extending in the second direction D2. The connection point 42*e* is the center point of the end 42*d* in the first direction D1 in which the inner surface 41*e* extends. The radius S1 is, for example, 2.5 mm.

A laser displacement meter LK-G85 made by Keyence Corporation can be used as a measuring instrument for measuring the positions of the frame first surface 41*a* and frame second surface 41*b* in the direction normal to the frame first surface 41*a*. The measurement condition of LK-G85 is as follows.

Measurement interval: 100 μm

Figure 37B:
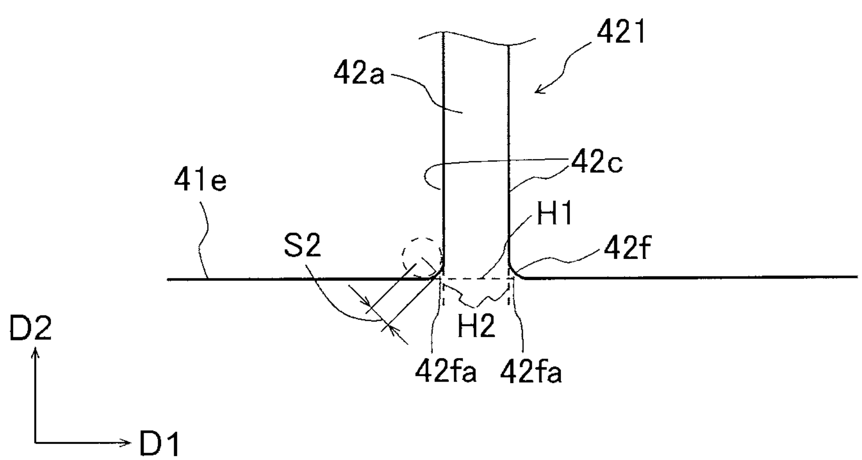
FIG. 37B is an enlarged plan view showing a first connection portion of FIG. 37A.

When the frame 41 and the bars 42 are manufactured by mechanically machining one plate, a shape due to machining may occur at connection portions where the frame 41 and the bars 42 are connected. As shown in FIG. 37A, the mask support 40 includes first connection portions 42*f* where the inner surface 41*e* of the frame 41 and the bar side surfaces 42*c* of each bar 42 are connected in plan view. FIG. 37B is an enlarged plan view showing the first connection portion 42*f*. When, for example, machining using a cutter is performed, each first connection portion 42*f* may include a transition portion 42*fa*. Each transition portion 42*fa* is a portion of the mask support 40, defined by an extended line H1 of the inner surface 41*e* and an extended line H2 of each bar side surface 42*c*. The stiffness of the mask support 40 in the case where the first connection portion 42*f* includes the transition portion 42*fa* is greater than the stiffness of the mask support 40 in the case where the first connection portion 42*f* does not include the transition portion 42*fa*. In other words, the transition portions 42*fa* enhance the stiffness of the mask support 40.

The transition portion 42*fa* may include a curved portion having a first radius of curvature S2. For example, the first radius of curvature S2 may be greater than or equal to 1.0 mm, may be greater than or equal to 1.5 mm, or may be greater than or equal to 2.0 mm. For example, the first radius of curvature S2 may be less than or equal to 3.0 mm, may be less than or equal to 4.0 mm, or may be less than or equal to 5.0 mm. The range of the first radius of curvature S2 may be determined from a first group consisting of 1.0 mm, 1.5 mm, and 2.0 mm and/or a second group consisting of 3.0 mm, 4.0 mm, and 5.0 mm. The range of the first radius of curvature S2 may be determined by a combination of any one of the values included in the first group and any one of the values included in the second group. The range of the first radius of curvature S2 may be determined by a combination of any two of the values included in the first group. The range of the first radius of curvature S2 may be determined by a combination of any two of the values included in the second group. For example, the range of the first radius of curvature S2 may be greater than or equal to 1.0 mm and less than or equal to 5.0 mm, may be greater than or equal to 1.0 mm and less than or equal to 4.0 mm, may be greater than or equal to 1.0 mm and less than or equal to 3.0 mm, may be greater than or equal to 1.0 mm and less than or equal to 2.0 mm, may be greater than or equal to 1.0 mm and less than or equal to 1.5 mm, may be greater than or equal to 1.5 mm and less than or equal to 5.0 mm, may be greater than or equal to 1.5 mm and less than or equal to 4.0 mm, may be greater than or equal to 1.5 mm and less than or equal to 3.0 mm, may be greater than or equal to 1.5 mm and less than or equal to 2.0 mm, may be greater than or equal to 2.0 mm and less than or equal to 5.0 mm, 2.0 mm and less than or equal to 4.0 mm, may be greater than or equal to 2.0 mm and less than or equal to 3.0 mm, may be greater than or equal to 3.0 mm and less than or equal to 5.0 mm, may be greater than or equal to 3.0 mm and less than or equal to 4.0 mm, or may be greater than or equal to 4.0 mm and less than or equal to 5.0 mm. AMIC-1710 made by Sinto S-Precision, Ltd. may be used as a measuring instrument for measuring the first radius of curvature S2.

Although not shown in the drawing, the inner surface 41*e* and each bar side surface 42*c* may be connected without intervening a curved portion.

Figure 38B:
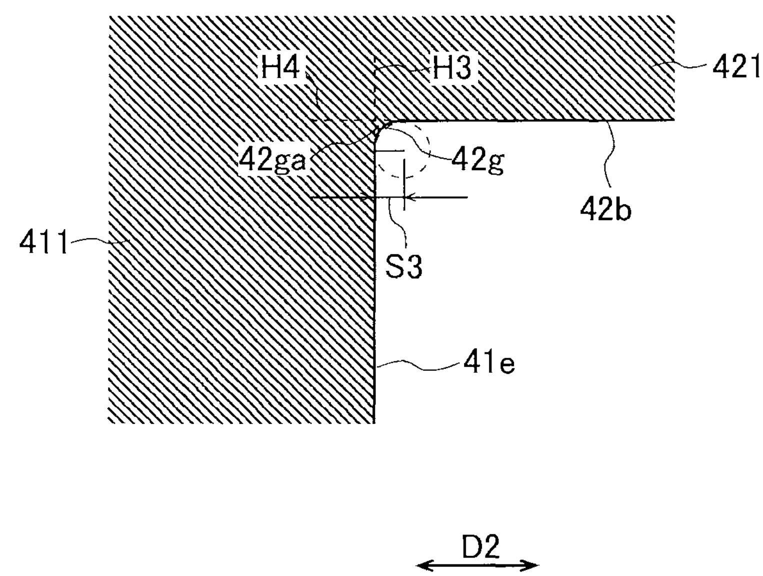
FIG. 38B is an enlarged sectional view showing a second connection portion of FIG. 38A.

As shown in FIG. 38A, in the longitudinal sectional view, the mask support 40 includes a second connection portion 42*g* where the inner surface 41*e* of the frame 41 and the bar second surface 42*b* of each bar 42 are connected. FIG. 38B is an enlarged sectional view showing the second connection portion 42*g*. When, for example, machining using a cutter is performed, the second connection portion 42*g* may include a transition portion 42*ga*. Each transition portion 42*ga* is a portion of the mask support 40, defined by an extended line H3 of the inner surface 41*e* and an extended line H4 of the bar second surface 42*b*. The stiffness of the mask support 40 in the case where the second connection portion 42*g* includes the transition portion 42*ga* is greater than the stiffness of the mask support 40 in the case where the second connection portion 42*g* does not include the transition portion 42*ga*. In other words, the transition portion 42*ga* enhances the stiffness of the mask support 40.

The transition portion 42*ga* may have a second radius of curvature S3. For example, the second radius of curvature S3 may be greater than or equal to 1.0 mm, may be greater than or equal to 1.5 mm, or may be greater than or equal to 2.0 mm. For example, the second radius of curvature S3 may be less than or equal to 3.0 mm, may be less than or equal to 4.0 mm, or may be less than or equal to 5.0 mm. The range of the second radius of curvature S3 may be determined from a first group consisting of 1.0 mm, 1.5 mm, and 2.0 mm and/or a second group consisting of 3.0 mm, 4.0 mm, and 5.0 mm. The range of the second radius of curvature S3 may be determined by a combination of any one of the values included in the first group and any one of the values included in the second group. The range of the second radius of curvature S3 may be determined by a combination of any two of the values included in the first group. The range of the second radius of curvature S3 may be determined by a combination of any two of the values included in the second group. For example, the range of the second radius of curvature S3 may be greater than or equal to 1.0 mm and less than or equal to 5.0 mm, may be greater than or equal to 1.0 mm and less than or equal to 4.0 mm, may be greater than or equal to 1.0 mm and less than or equal to 3.0 mm, may be greater than or equal to 1.0 mm and less than or equal to 2.0 mm, may be greater than or equal to 1.0 mm and less than or equal to 1.5 mm, may be greater than or equal to 1.5 mm and less than or equal to 5.0 mm, may be greater than or equal to 1.5 mm and less than or equal to 4.0 mm, may be greater than or equal to 1.5 mm and less than or equal to 3.0 mm, may be greater than or equal to 1.5 mm and less than or equal to 2.0 mm, may be greater than or equal to 2.0 mm and less than or equal to 5.0 mm, 2.0 mm and less than or equal to 4.0 mm, may be greater than or equal to 2.0 mm and less than or equal to 3.0 mm, may be greater than or equal to 3.0 mm and less than or equal to 5.0 mm, may be greater than or equal to 3.0 mm and less than or equal to 4.0 mm, or may be greater than or equal to 4.0 mm and less than or equal to 5.0 mm. AMIC-1710 made by Sinto S-Precision, Ltd. may be used as a measuring instrument for measuring the second radius of curvature S3.

Although not shown in the drawing, the inner surface 41*e* and the bar second surface 42*b* may be connected without intervening a curved portion.

The opening 43 will be described. Since the bars 42 extend so as to cross the opening 43, the opening 43 is partitioned into two or more regions in plan view. For example, as shown in FIG. 34, the opening 43 includes two or more first openings 43A. The two or more first openings 43A are arranged in the first direction D1.

As shown in FIG. 34, the outline of each first opening 43A may include a pair of first edges 431 extending in the first direction D1 and a pair of second edges 432 extending in the second direction D2. At least one of the pair of first edges 431 may be made up of the inner surface 41*e* of any one of the first sides 411. Each of the pair of first edges 431 may be made up of the inner surface 41*e* of the first side 411. Each of the second edges 432 may be made up of the inner surface 41*e* of the second side 412 or the bar side surface 42*c* of the first bar 421.

The first openings 43A may overlap the effective regions 53 of the masks 50 in plan view. For example, as shown in FIG. 33, in the state of the mask apparatus 15, two or more effective regions 53 arranged in the second direction D2 may overlap one first opening 43A in plan view. The effective regions 53 of two or more masks 50 may overlap one first opening 43A.

For example, the thickness T2 of the frame 41 may be greater than or equal to 5 mm, may be greater than or equal to 10 mm, may be greater than or equal to 15 mm, or may be greater than or equal to 20 mm. For example, the thickness T2 of the frame 41 may be less than or equal to 25 mm, may be less than or equal to 30 mm, may be less than or equal to 35 mm, or may be less than or equal to 40 mm. The range of the thickness T2 of the frame 41 may be determined from a first group consisting of 5 mm, 10 mm, 15 mm, and 20 mm and/or a second group consisting of 25 mm, 30 mm, 35 mm, and 40 mm. The range of the thickness T2 of the frame 41 may be determined by a combination of any one of the values included in the first group and any one of the values included in the second group. The range of the thickness T2 of the frame 41 may be determined by a combination of any two of the values included in the first group. The range of the thickness T2 of the frame 41 may be determined by a combination of any two of the values included in the second group. For example, the range of the thickness T2 may be greater than or equal to 5 mm and less than or equal to 40 mm, may be greater than or equal to 5 mm and less than or equal to 35 mm, may be greater than or equal to 5 mm and less than or equal to 30 mm, may be greater than or equal to 5 mm and less than or equal to 25 mm, may be greater than or equal to 5 mm and less than or equal to 20 mm, may be greater than or equal to 5 mm and less than or equal to 15 mm, may be greater than or equal to 5 mm and less than or equal to 10 mm, may be greater than or equal to 10 mm and less than or equal to 40 mm, may be greater than or equal to 10 mm and less than or equal to 35 mm, may be greater than or equal to 10 mm and less than or equal to 30 mm, may be greater than or equal to 10 mm and less than or equal to 25 mm, may be greater than or equal to 10 mm and less than or equal to 20 mm, may be greater than or equal to 10 mm and less than or equal to 15 mm, may be greater than or equal to 15 mm and less than or equal to 40 mm, may be greater than or equal to 15 mm and less than or equal to 35 mm, may be greater than or equal to 15 mm and less than or equal to 30 mm, may be greater than or equal to 15 mm and less than or equal to 25 mm, may be greater than or equal to 15 mm and less than or equal to 20 mm, may be greater than or equal to 20 mm and less than or equal to 40 mm, may be greater than or equal to 20 mm and less than or equal to 35 mm, may be greater than or equal to 20 mm and less than or equal to 30 mm, may be greater than or equal to 20 mm and less than or equal to 25 mm, may be greater than or equal to 25 mm and less than or equal to 40 mm, may be greater than or equal to 25 mm and less than or equal to 35 mm, may be greater than or equal to 25 mm and less than or equal to 30 mm, may be greater than or equal to 30 mm and less than or equal to 40 mm, may be greater than or equal to 30 mm and less than or equal to 35 mm, or may be greater than or equal to 35 mm and less than or equal to 40 mm.

When the thickness T2 of the frame 41 is greater than or equal to 5 mm, a deformation, such as warpage, of the frame 41 is suppressed. When the thickness T2 of the frame 41 is less than or equal to 40 mm, an excessive increase in the weight of the frame 41 is suppressed. Thus, the handleability of the mask support 40 is improved. For example, the mask support 40 can be transported by using a small lifter.

For example, the thickness T3 of the bar 42 may be greater than or equal to 50 μm, may be greater than or equal to 100 μm, may be greater than or equal to 200 μm, or may be greater than or equal to 300 μm. For example, the thickness T3 of the bar 42 may be less than or equal to 500 μm, may be less than or equal to 700 μm, may be less than or equal to 1 mm, or may be less than or equal to 10 mm. The range of the thickness T3 of the bar 42 may be determined from a first group consisting of 50 μm, 100 μm, 200 μm, and 300 μm and/or a second group consisting of 500 μm, 700 μm, 1 mm, and 10 mm. The range of the thickness T3 of the bar 42 may be determined by a combination of any one of the values included in the first group and any one of the values included in the second group. The range of the thickness T3 of the bar 42 may be determined by a combination of any two of the values included in the first group. The range of the thickness T3 of the bar 42 may be determined by a combination of any two of the values included in the second group. For example, the range of the thickness T3 may be greater than or equal to 50 μm and less than or equal to 10 mm, may be greater than or equal to 50 μm and less than or equal to 1 mm, may be greater than or equal to 50 μm and less than or equal to 700 μm, may be greater than or equal to 50 μm and less than or equal to 500 μm, may be greater than or equal to 50 μm and less than or equal to 300 μm, may be greater than or equal to 50 μm and less than or equal to 200 μm, may be greater than or equal to 50 μm and less than or equal to 100 μm, may be greater than or equal to 100 μm and less than or equal to 10 mm, may be greater than or equal to 100 μm and less than or equal to 1 mm, may be greater than or equal to 100 μm and less than or equal to 700 μm, may be greater than or equal to 100 μm and less than or equal to 500 μm, may be greater than or equal to 100 μm and less than or equal to 300 μm, may be greater than or equal to 100 μm and less than or equal to 200 may be greater than or equal to 200 μm and less than or equal to 10 mm, may be greater than or equal to 200 μm and less than or equal to 1 mm, may be greater than or equal to 200 μm and less than or equal to 700 μm, may be greater than or equal to 200 μm and less than or equal to 500 μm, may be greater than or equal to 200 μm and less than or equal to 300 may be greater than or equal to 300 μm and less than or equal to 10 mm, may be greater than or equal to 300 μm and less than or equal to 1 mm, may be greater than or equal to 300 μm and less than or equal to 700 μm, may be greater than or equal to 300 μm and less than or equal to 500 μm, may be greater than or equal to 500 μm and less than or equal to 10 mm, may be greater than or equal to 500 μm and less than or equal to 1 mm, may be greater than or equal to 500 μm and less than or equal to 700 μm, may be greater than or equal to 700 μm and less than or equal to 10 mm, may be greater than or equal to 700 μm and less than or equal to 1 mm, or may be greater than or equal to 1 mm and less than or equal to 10 mm.

The thickness T3 of the bar 42 may be less than the thickness T2 of the frame 41. As the thickness of the bar 42 increases, the amount of vapor deposition material to be adhered to the bar 42 in the vapor deposition step increases. When the thickness T3 of the bar 42 is less than the thickness T2 of the frame 41, interference of the bar 42 with vapor deposition is suppressed. Therefore, from the viewpoint of the efficiency of vapor deposition, it is preferable that the thickness T3 of the bar 42 is small.

On the other hand, as the thickness T3 of the bar 42 increases, the stiffness of the bar 42 increases. In the present embodiment, the frame 41 and each bar 42 are integrated. Therefore, an increase in the stiffness of each bar 42 leads to suppressing a deformation of the frame 41. However, as the thickness T3 of the bar 42 increases, the weight of the bar 42 increases. An increase in the weight of each bar 42 leads to a deformation of the frame 41 toward the inner side. This is because the frame 41 is pulled by gravitational force that acts on each bar 42. The inner side means a direction from the frame 41 toward the center of the opening 43. When the thickness T3 of each bar 42 is increased to suppress a deformation of the frame 41, it is preferable to consider not only the stiffness of each bar 42 but also a deformation of the frame 41 due to an increase in the weight of each bar 42.

As described in an example (described later), a deformation amount of the frame 41 may have a local minimum value that is determined in accordance with the relationship with the thickness T3 of each bar 42. When the deformation amount of the frame 41 is a local minimum value, the suppressed deformation amount of the frame 41 based on the stiffness of the bar 42 balances with the deformation amount of the frame 41 based on the own weight of the bars 42. The thickness T3 at the time when the deformation amount of the frame 41 is a local minimum value is also referred to as reversal thickness. When the thickness T3 is less than or equal to the reversal thickness, the deformation amount of the frame 41 reduces as the thickness T3 of each bar 42 increases. When the thickness T3 is greater than the reversal thickness, the deformation amount of the frame 41 increases as the thickness T3 of each bar 42 increases.

The ratio of the thickness T3 to the thickness T2 at the time when the deformation amount of the frame 41 is a local minimum value is also referred to as reversal ratio. The reversal ratio may fall within the range $0<T3/T2<1$.

For example, T3/T2 may be higher than or equal to 0.1, may be higher than or equal to 0.2, may be higher than or equal to 0.3, or may be higher than or equal to 0.4. For example, T3/T2 may be lower than or equal to 0.5, may be lower than or equal to 0.6, may be lower than or equal to 0.7, or may be lower than or equal to 0.85. The range of T3/T2 may be determined from a first group consisting of 0.1, 0.2, 0.3, and 0.4 and/or a second group consisting of 0.5, 0.6, 0.7, and 0.85. The range of T3/T2 may be determined by a combination of any one of the values included in the first group and any one of the values included in the second group. The range of T3/T2 may be determined by a combination of any two of the values included in the first group. The range of T3/T2 may be determined by a combination of any two of the values included in the second group. For example, the range of T3/T2 may be higher than or equal to 0.1 and lower than or equal to 0.85, may be higher than or equal to 0.1 and lower than or equal to 0.7, may be higher than or equal to 0.1 and lower than or equal to 0.6, may be higher than or equal to 0.1 and lower than or equal to 0.5, may be higher than or equal to 0.1 and lower than or equal to 0.4, may be higher than or equal to 0.1 and lower than or equal to 0.3, may be higher than or equal to 0.1 and lower than or equal to 0.2, may be higher than or equal to 0.2 and lower than or equal to 0.85, may be higher than or equal to 0.2 and lower than or equal to 0.7, may be higher than or equal to 0.2 and lower than or equal to 0.6, may be higher than or equal to 0.2 and lower than or equal to 0.5, may be higher than or equal to 0.2 and lower than or equal to 0.4, may be higher than or equal to 0.2 and lower than or equal to 0.3, may be higher than or equal to 0.3 and lower than or equal to 0.85, may be higher than or equal to 0.3 and lower than or equal to 0.7, may be higher than or equal to 0.3 and lower than or equal to 0.6, may be higher than or equal to 0.3 and lower than or equal to 0.5, may be higher than or equal to 0.3 and lower than or equal to 0.4, may be higher than or equal to 0.4 and lower than or equal to 0.85, may be higher than or equal to 0.4 and lower than or equal to 0.7, may be higher than or equal to 0.4 and lower than or equal to 0.6, may be higher than or equal to 0.4 and lower than or equal to 0.5, may be higher than or equal to 0.5 and lower than or equal to 0.85, may be higher than or equal to 0.5 and lower than or equal to 0.7, may be higher than or equal to 0.5 and lower than or equal to 0.6, may be higher than or equal to 0.6 and lower than or equal to 0.85, may be higher than or equal to 0.6 and lower than or equal to 0.7, or may be higher than or equal to 0.7 and lower than or equal to 0.85.

A contact-type measuring method is adopted as a method of measuring the thickness T of the metal plate 55, the thickness T2 of the frame 41, and the thickness T3 of each bar 42. A length gauge HEIDENHAIM-METRO "MT1271" made by HEIDENHAIN, including a ball-push guide-type plunger, is used as the contact-type measuring method.

A method of manufacturing the mask apparatus 15 will be described. Initially, an example of the method of manufacturing the mask support 40 will be described.

Figure 39:
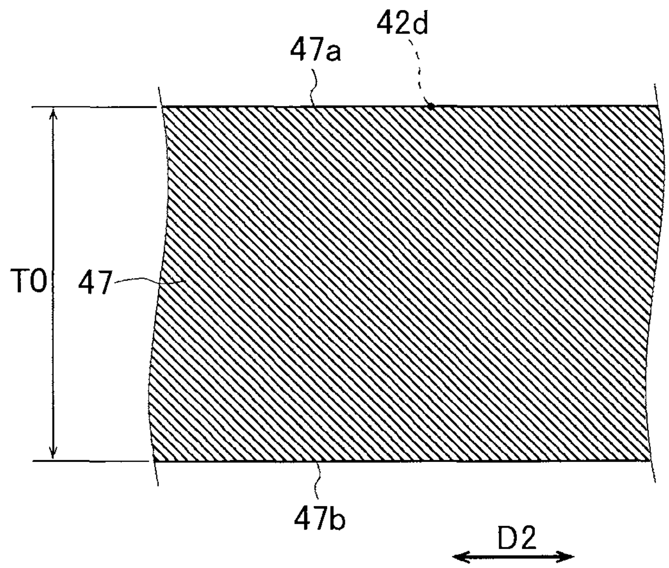
FIG. 39 is a sectional view showing an example of a method of manufacturing the mask support.

Initially, as shown in FIG. 39, a plate 47 including a first surface 47*a* and a second surface 47*b* located across from the first surface 47*a* may be prepared. The material of the plate 47 may be a material similar to the material of the metal plate 55 of the mask 50. For example, an iron alloy containing nickel may be used as the material of the plate 47. The thickness TO of the plate 47 is greater than or equal to the thickness T2 of the frame 41. The thickness TO of the plate 47 may be the same as the thickness T2 of the frame 41. In FIG. 39, the point indicated by the reference sign 42*d* represents a position where the end 42*d* at which the frame 41 and the bar 42 are connected appears.

Figure 40:
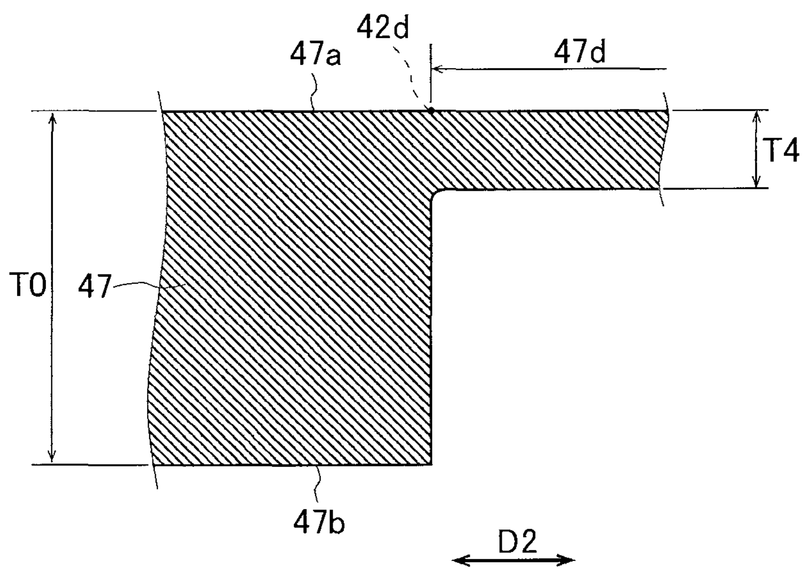
FIG. 40 is a sectional view showing an example of a method of manufacturing the mask support.
Figure 41:
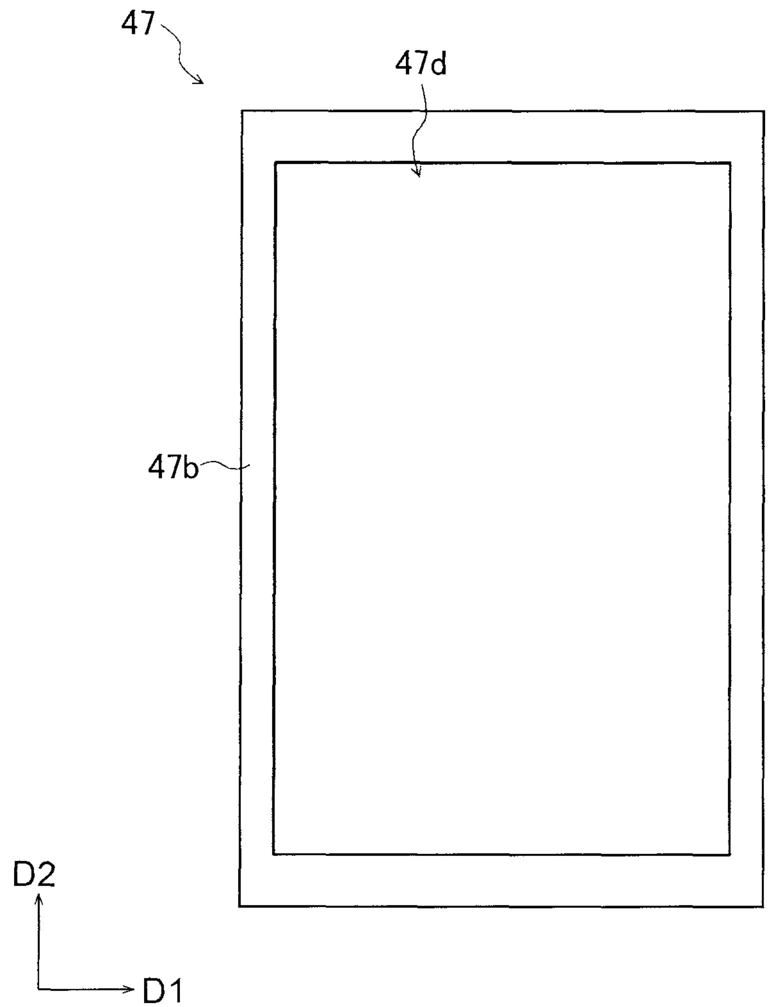
FIG. 41 is a plan view showing a plate of FIG. 40 when viewed from a second surface side.

Subsequently, a machining step of machining the middle region 47*d*, located inside the position of the end 42*d* of the plate 47, from the second surface 47*b* side by using a cutter or a processing machine may be performed. The machining step may include a first machining step of machining the plate 47 until the thickness T4 of the middle region 47*d* becomes the thickness T3 of the bar 42 as shown in FIG. 40. FIG. 41 is a plan view showing the plate 47 shown in FIG. 40 when viewed from the second surface 47*b* side. A drill, a cutting tool, a milling cutter, an end mill, or the like may be used as a cutter for performing the first machining step. Laser beam machining, water plasma processing, wire-cut processing, or the like may be adopted as a machining method to be performed by the processing machine.

The machining step may include a second machining step of partially forming an opening from the second surface 47*b* to the first surface 47*a* in the middle region 47*d* by partially machining the middle region 47*d* from the second surface 47*b* side with a cutter or a processing machine. In this case, regions left in the middle region 47*d* without forming an opening make up the bars 42. A drill, a cutting tool, a milling cutter, an end mill, or the like may be used as a cutter for performing the second machining step. Laser beam machining, water plasma processing, wire-cut processing, or the like may be adopted as a machining method to be performed by the processing machine.

In this way, as shown in FIG. 34, the mask support 40 including the frame 41 and the bars 42 is manufactured. The second machining step may be performed after the first machining step. Alternatively, the second machining step may be performed before the first machining step.

Subsequently, a fixing step of fixing the mask 50 to the second sides 412 of the frame 41 may be performed. For example, in a state where a tension Tx is applied to the mask 50 in the first direction D1, the end portions 51 of the mask 50 may be fixed to the frame first surfaces 41*a* of the second sides 412. For example, a welding process may be used as a method of fixing the mask 50 to the frame 41. Laser beam may be used in the welding process. Laser beam may be applied to the end portions 51. The end portions 51 applied with laser beam may melt to weld the end portions 51 to the frame first surfaces 41*a* of the second sides 412. In this way, as shown in FIG. 33, the mask apparatus 15 including the mask support 40 and the masks 50 is manufactured.

In the embodiment of the present disclosure, as described above, the mask support 40 is created by mechanically machining one plate 47. For this reason, the frame 41 and the bars 42 of the mask support 40 are integrated. Therefore, in comparison with the case where the frame 41 and the bars 42 are different members, the stiffness of the mask support 40 in the direction in which the bars 42 extend is improved. When, for example, the bars 42 include the first bars 421 extending in the second direction D2, the stiffness of the mask support 40 in the second direction D2 is improved. Therefore, for example, a deformation of the frame 41 of the mask support 40 in the second direction D2 due to a force received by the mask support 40 from the masks 50 is suppressed. Thus, a deviation of the positions of the through-holes 56 of each mask 50 fixed to the frame 41 from designed positions is suppressed. The designed positions are ideal positions of the through-holes 56.

Figure 42:
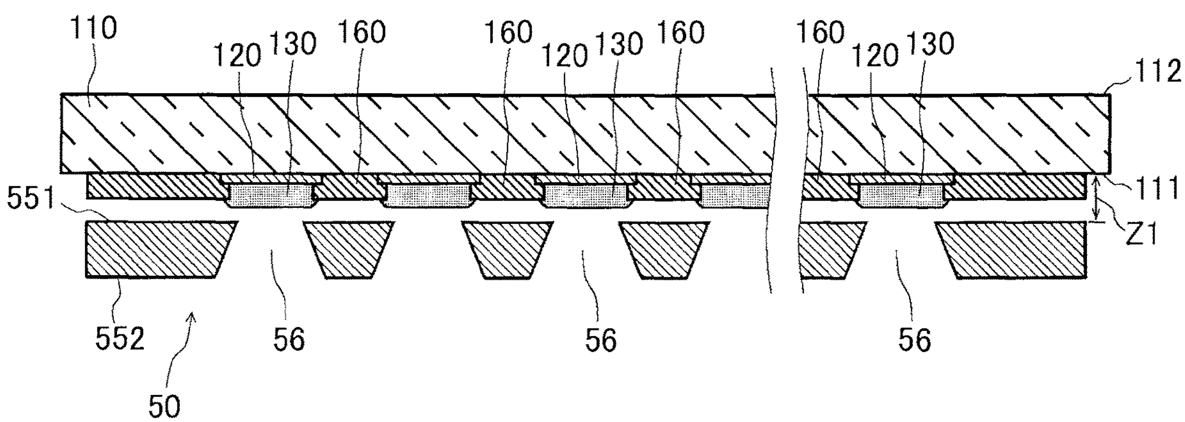
FIG. 42 is a sectional view showing an example of vapor deposition layers formed by using a mask apparatus.

FIG. 42 is a sectional view showing part of the mask 50 of the mask apparatus 15 assembled with the substrate 110. According to the aspect of the present disclosure, a deviation of the positions of the through-holes 56 of the mask 50 from the designed positions is suppressed. Therefore, the accuracy of the positions of the first vapor deposition layers 130 formed from a vapor deposition material to be deposited onto the substrate 110 via the through-holes 56 is increased.

An example of the advantage that the accuracy of the positions of the first vapor deposition layers 130 is high will be described. When the organic device 100 includes the electrically insulating layers 160 as shown in FIG. 42, the dimension of each electrically insulating layer 160 in the surface direction of the substrate 110 may be set in accordance with the accuracy of the positions of the first vapor deposition layers 130 in the vapor deposition step. For example, as the accuracy of the positions of the first vapor deposition layers 130 increases, the dimension of each electrically insulating layer 160 may be set to a smaller value. When the pixel density of the organic device 100 is constant, the area of each first electrode layer 120 and the area of each first vapor deposition layer 130 can be increased as the dimension of each electrically insulating layer 160 reduces. Thus, the drive efficiency of the organic device 100 is increased, with the result that the service life of the organic device 100 is extended.

It is a conceivable advantage that, when the frame first surface 41*a* of the frame 41 and the bar first surface 42*a* of each bar 42 are in the same plane, the position of the surface of the mask 50 supported from the lower side by the bars 42 is easily controlled with respect to the frame first surface 41*a* of the frame 41. Thus, as shown in FIG. 42, in the vapor deposition step, a distance Z1 between the first surface 551 of the mask 50 and the first surface 111 of the substrate 110 is easily controlled. Therefore, for example, a shadow in the vapor deposition step is easily suppressed or adjusted.

Next, the case where the frame 41 and the first bars 421 are integrated as in the case of the present embodiment and the case where the first bars 421 and the frame 41 are different members as in the case of FIG. 13A will be compared with each other.

Figure 43:
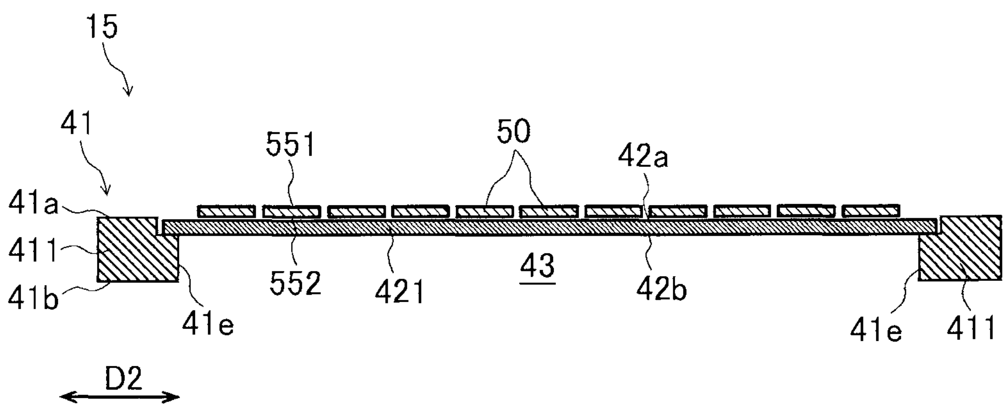
FIG. 43 is a sectional view of the mask apparatus.

FIG. 43 is a sectional view of the mask apparatus 15, taken along the second direction D2 in FIG. 13A. The first bars 421 of the mask apparatus 15 of FIG. 13A are fixed to the frame first surface 41*a* side of the first sides 411 of the frame 41 by welding. Therefore, as compared to the first bars 421 of FIG. 33, contribution of the first bars 421 of FIG. 13A to the stiffness of the mask support 40 in the second direction D2 is small.

Since the first bars 421 of FIG. 13A are members different from the frame 41, a deviation can occur between the frame first surface 41*a* and the bar first surfaces 42*a* of the first bars 421 in the direction normal to the frame first surface 41*a* of the frame 41.

In contrast, since the frame 41 and the bars 42 are integrated in the mask apparatus 15 of FIG. 33, the stiffness of the mask support 40 in the direction in which the bars 42 extend is effectively improved. Since the frame first surface 41*a* of the frame 41 and the bar first surfaces 42*a* of the bars 42 are in the same plane, the position of the surface of the mask 50 is easily controlled with respect to the frame first surface 41*a* of the frame 41.

The second embodiment may be modified into various forms. Hereinafter, other embodiments will be described with reference to the drawings as needed. In the following description and the drawings to be used in the following description, like reference signs used for corresponding portions in the above-described embodiment denote portions that can be configured similarly to those of the above-described embodiment. The description will not be repeated. When it is apparent that the operation and advantageous effects obtained in the above-described embodiment are also obtained in the following embodiment, the description may be omitted.

Figure 44:
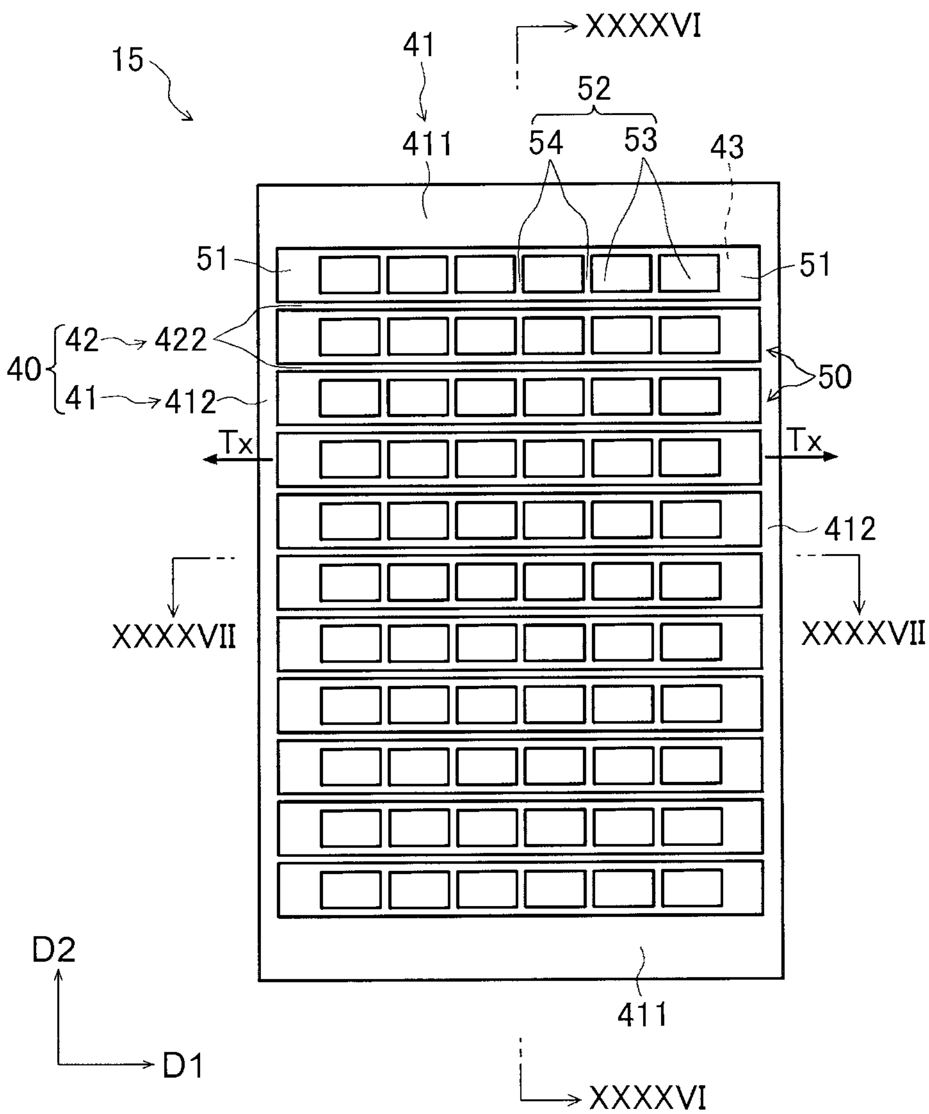
FIG. 44 is a plan view showing an example of the mask apparatus.
Figure 45:
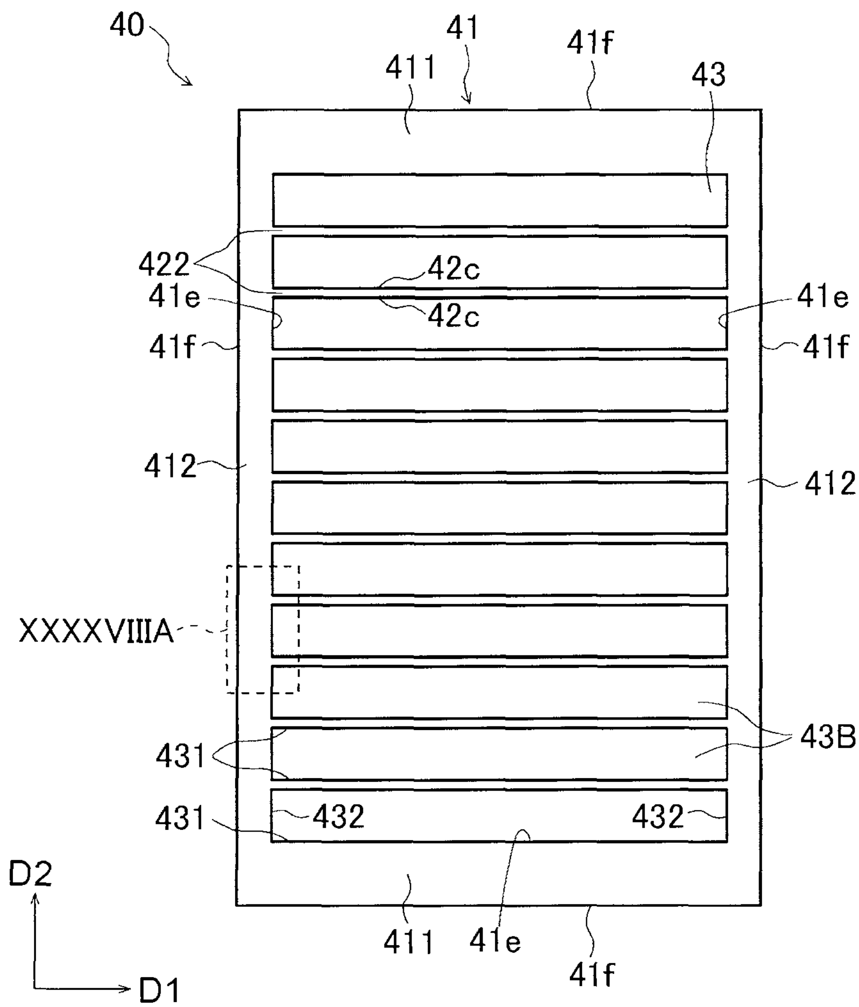
FIG. 45 is a plan view showing a state where masks are removed from the mask apparatus of FIG. 44.

FIG. 44 is a plan view showing an example of the mask apparatus 15 when viewed from the first surface 551 side of each mask 50. FIG. 45 is a view showing a state where the masks 50 are removed from the mask apparatus 15 of FIG. 44. The bars 42 may include second bars 422 connected to the inner surfaces 41*e* of the second sides 412 of the frame 41. The second bars 422 may extend in the first direction D1. For example, each second bar 422 may include a pair of bar side surfaces 42*c* extending the first direction D1 in plan view, and the bar side surfaces 42*c* may be connected to the inner surfaces 41*e* of the second sides 412 of the frame 41. A plurality of the second bars 422 may be arranged along the second direction D2. The length of each second bar 422 may be the same as the dimension L21 of the opening 43 of the frame 41 in the first direction D1.

Figure 46:
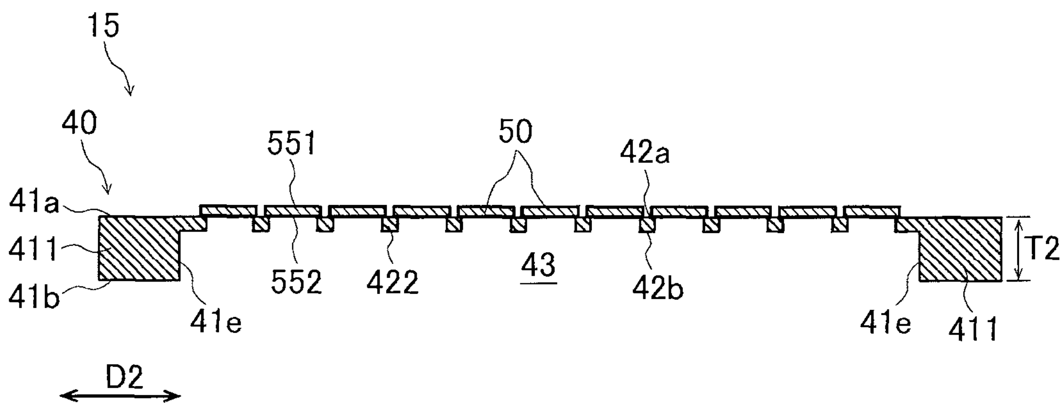
FIG. 46 is a sectional view of the mask apparatus, taken along the line XXXXVI-XXXXVI in FIG. 44.
Figure 47:
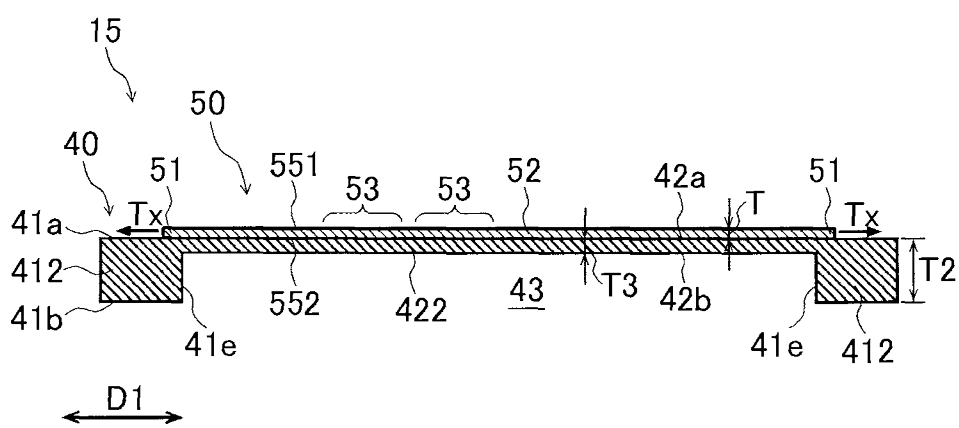
FIG. 47 is a sectional view of the mask apparatus, taken along the line XXXXVII-XXXXVII in FIG. 44.

FIG. 46 is a sectional view of the mask apparatus 15, taken along the line XXXXVI-XXXXVI in FIG. 44. FIG. 47 is a sectional view of the mask apparatus 15, taken along the line XXXXVII-XXXXVII in FIG. 44. Each second bar 422 may overlap a gap between adjacent two of the masks 50 in the second direction D2 in plan view. With the second bars 422, deposition of a vapor deposition material onto the substrate 110 through a gap between the adjacent two masks 50 is suppressed.

The bar first surface 42*a* of each second bar 422 may be in contact with the second surface 552 of the mask 50. The second bars 422, as well as the first bars 421, suppress warpage of the masks 50 under their own weight.

Figure 48A:
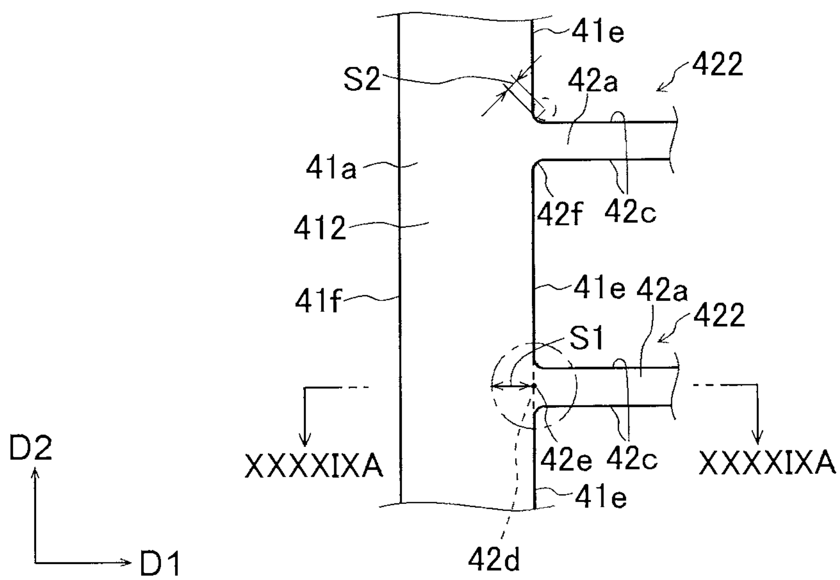
FIG. 48A is an enlarged plan view showing an example of a mask support in the range surrounded by the dashed line and indicated by the reference sign XXXXVIIIA in FIG. 45.
Figure 49A:
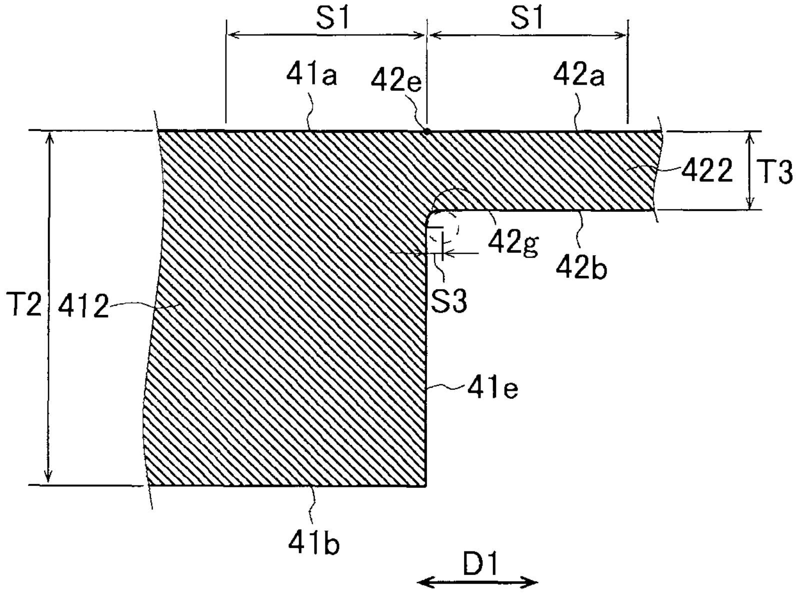
FIG. 49A is a sectional view of the mask support, taken along the line XXXXIXA-XXXXIXA in FIG. 48A.

A structure at the boundary between each second side 412 of the frame 41 and each of the second bars 422 of the bars 42 will be described with reference to FIG. 48A and FIG. 49A. FIG. 48A is an enlarged plan view showing an example of the mask support 40 in the range surrounded by the dashed line and indicated by the reference sign XXXXVIIIA in FIG. 45. FIG. 49A is a sectional view of the mask support 40, taken along the line XXXXIXA-XXXXIXA in FIG. 48A.

As shown in FIG. 48A and FIG. 49A, the frame first surface 41*a* of the frame 41 and the bar first surface 42*a* of each bar 42 may be continuous at the boundary between the frame 41 and each bar 42. For example, as in the case of the first sides 411, the frame first surface 41*a* and the bar first surface 42*a* may be located in the same plane around the boundary between each second side 412 of the frame 41 and each of the second bars 422 of the bars 42.

Figure 48B:
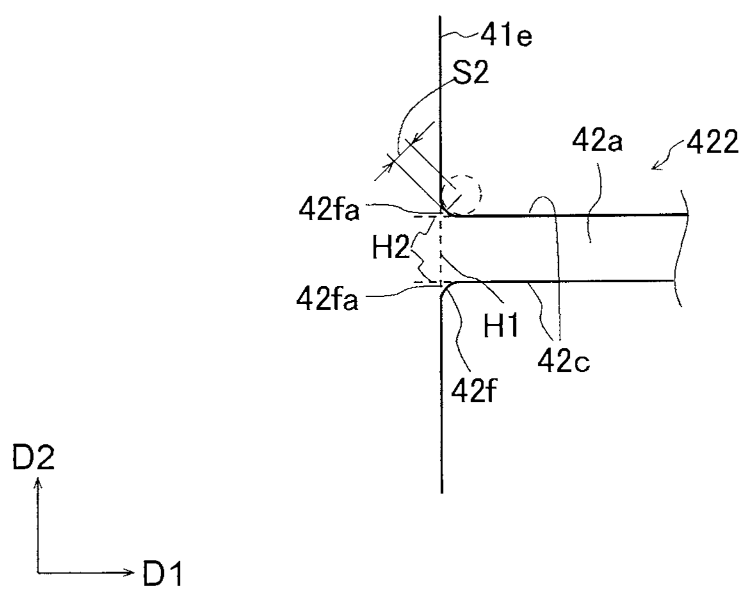
FIG. 48B is an enlarged plan view showing a first connection portion of FIG. 48A.

As shown in FIG. 48A, the mask support 40 includes a first connection portion 42*f* where the inner surface 41*e* of each second side 412 of the frame 41 and each of the bar side surfaces 42*c* of the second bars 422 of the bars 42 are connected in plan view. FIG. 48B is an enlarged plan view showing the first connection portion 42*f*. When, for example, machining using a cutting tool is performed, the first connection portion 42*f* may include a transition portion 42*fa*. The transition portion 42*fa* may include a curved portion having a first radius of curvature S2.

Figure 49B:
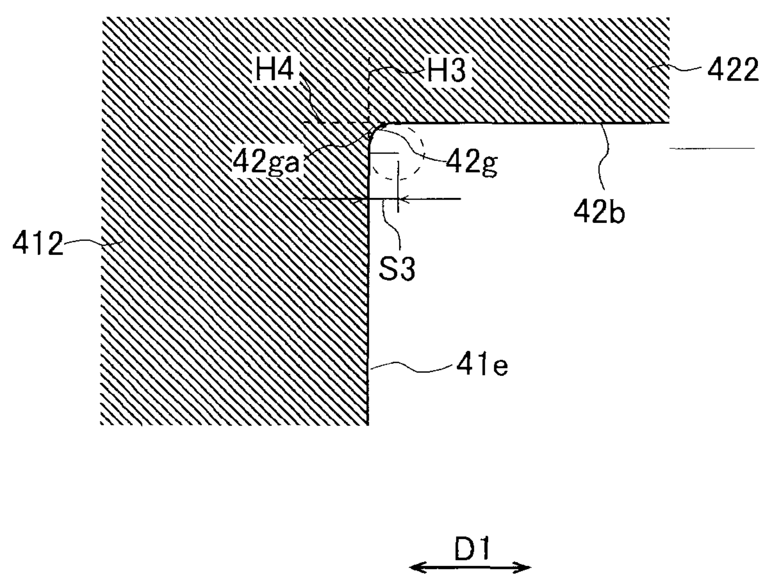
FIG. 49B is an enlarged sectional view showing a second connection portion of FIG. 49A.

As shown in FIG. 49A, in the longitudinal sectional view, the mask support 40 includes a second connection portion 42*g* where the inner surface 41*e* of each second side 412 of the frame 41 and the bar second surface 42*b* of each of the second bars 422 of the bars 42 are connected. FIG. 49B is an enlarged sectional view showing the second connection portion 42*g*. When, for example, machining using a cutting tool is performed, the second connection portion 42*g* may include a transition portion 42*ga*, as in the case of the above-described embodiment. The transition portion 42*ga* may include a curved portion having a second radius of curvature S3.

The opening 43 will be described. Since the bars 42 extend so as to cross the opening 43, the opening 43 is partitioned into two or more regions in plan view. For example, as shown in FIG. 45, the opening 43 includes two or more second openings 43B. The two or more second openings 43B are arranged in the second direction D2.

As shown in FIG. 45, the outline of each second opening 43B may include a pair of first edges 431 extending in the first direction D1 and a pair of second edges 432 extending in the second direction D2. Each of the first edges 431 may be made up of the inner surface 41*e* of the first side 411 or the bar side surface 42*c* of the second bar 422. At least one of the pair of second edges 432 may be made up of the inner surface 41*e* of any one of the second sides 412. Each of the pair of second edges 432 may be made up of the inner surface 41*e* of the second side 412.

The second openings 43B may overlap the effective regions 53 of the masks 50 in plan view. In the state of the mask apparatus 15, two or more effective regions 53 arranged in the first direction D1 may overlap one second opening 43B in plan view. The two or more effective regions 53 of one mask 50 may overlap one second opening 43B.

The mask support 40 shown in FIG. 44 to FIG. 49B, as well as the mask support 40 of the second embodiment, can be created by mechanically machining one plate. For this reason, the frame 41 and the bars 42 of the mask support 40 are integrated. Therefore, in comparison with the case where the frame 41 and the bars 42 are different members, the stiffness of the mask support 40 in the direction in which the bars 42 extend is improved. When, for example, the bars 42 include the second bars 422 extending in the first direction D1, the stiffness of the mask support 40 in the first direction D1 is improved. Therefore, for example, a deformation of the frame 41 of the mask support 40 in the first direction D1 due to a force received by the mask support 40 from the masks 50 is suppressed. Thus, a deviation of the positions of the through-holes 56 of each mask 50 fixed to the frame 41 from designed positions is suppressed.

When the frame first surface 41*a* of each second side 412 of the frame 41 and the bar first surface 42*a* of each of the second bars 422 of the bars 42 are in the same plane, the position of the surface of the mask 50 supported from the lower side by the bars 42 is easily controlled with respect to the frame first surface 41*a* of the frame 41. Thus, a distance Z1 between the first surface 551 of the mask 50 and the first surface 111 of the substrate 110 is easily controlled. Therefore, for example, a shadow in the vapor deposition step is easily suppressed or adjusted.

As in the case of the above-described embodiment, the thickness T3 of the bar 42 may be less than the thickness T2 of the frame 41. For example, T3/T2 may be higher than or equal to 0.1, may be higher than or equal to 0.2, may be higher than or equal to 0.3, or may be higher than or equal to 0.4. For example, T3/T2 may be lower than or equal to 0.5, may be lower than or equal to 0.6, may be lower than or equal to 0.7, or may be lower than or equal to 0.85. The range of T3/T2 may be determined from a first group consisting of 0.1, 0.2, 0.3, and 0.4 and/or a second group consisting of 0.5, 0.6, 0.7, and 0.85. The range of T3/T2 may be determined by a combination of any one of the values included in the first group and any one of the values included in the second group. The range of T3/T2 may be determined by a combination of any two of the values included in the first group. The range of T3/T2 may be determined by a combination of any two of the values included in the second group. For example, the range of T3/T2 may be higher than or equal to 0.1 and lower than or equal to 0.85, may be higher than or equal to 0.1 and lower than or equal to 0.7, may be higher than or equal to 0.1 and lower than or equal to 0.6, may be higher than or equal to 0.1 and lower than or equal to 0.5, may be higher than or equal to 0.1 and lower than or equal to 0.4, may be higher than or equal to 0.1 and lower than or equal to 0.3, may be higher than or equal to 0.1 and lower than or equal to 0.2, may be higher than or equal to 0.2 and lower than or equal to 0.85, may be higher than or equal to 0.2 and lower than or equal to 0.7, may be higher than or equal to 0.2 and lower than or equal to 0.6, may be higher than or equal to 0.2 and lower than or equal to 0.5, may be higher than or equal to 0.2 and lower than or equal to 0.4, may be higher than or equal to 0.2 and lower than or equal to 0.3, may be higher than or equal to 0.3 and lower than or equal to 0.85, may be higher than or equal to 0.3 and lower than or equal to 0.7, may be higher than or equal to 0.3 and lower than or equal to 0.6, may be higher than or equal to 0.3 and lower than or equal to 0.5, may be higher than or equal to 0.3 and lower than or equal to 0.4, may be higher than or equal to 0.4 and lower than or equal to 0.85, may be higher than or equal to 0.4 and lower than or equal to 0.7, may be higher than or equal to 0.4 and lower than or equal to 0.6, may be higher than or equal to 0.4 and lower than or equal to 0.5, may be higher than or equal to 0.5 and lower than or equal to 0.85, may be higher than or equal to 0.5 and lower than or equal to 0.7, may be higher than or equal to 0.5 and lower than or equal to 0.6, may be higher than or equal to 0.6 and lower than or equal to 0.85, may be higher than or equal to 0.6 and lower than or equal to 0.7, or may be higher than or equal to 0.7 and lower than or equal to 0.85.

Another example of the mask apparatus 15 will be described with reference to FIG. 50 to FIG. 53. Here, the case where the mask apparatus 15 includes the second bars 422 made up of different members from the frame 41 will be described.

Figure 50:
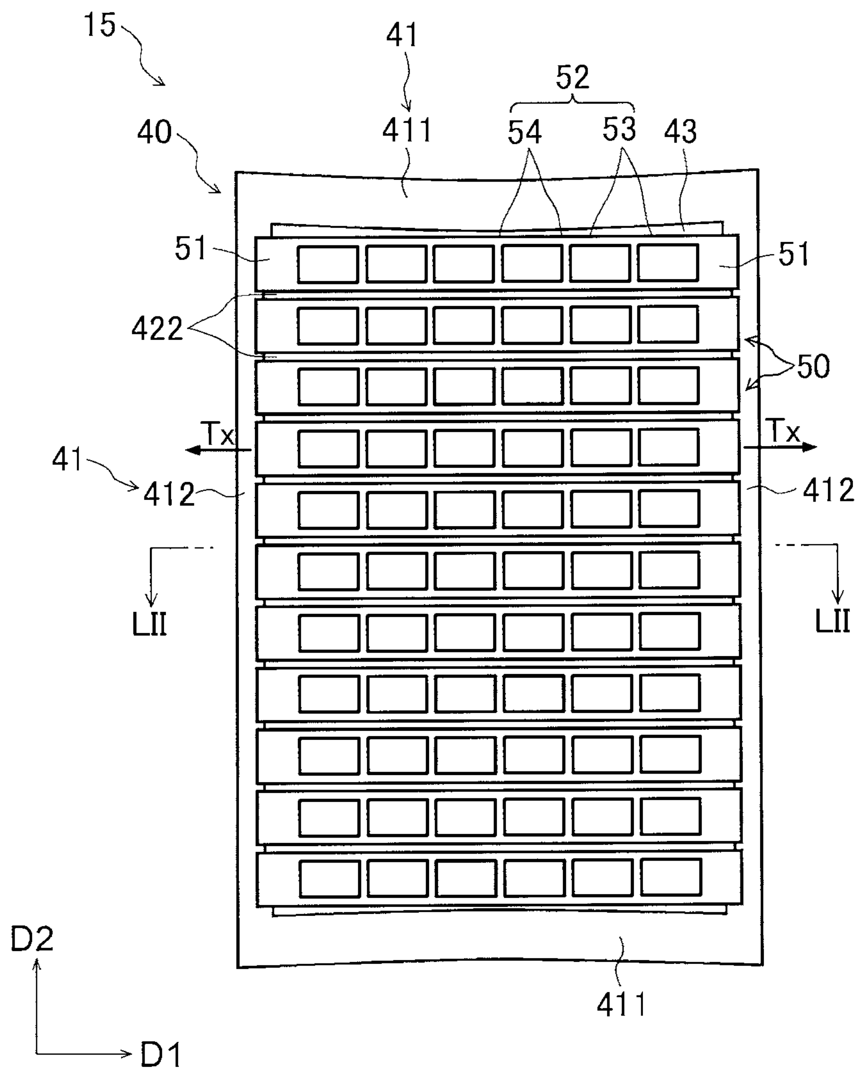
FIG. 50 is a plan view showing an example of a mask apparatus.
Figure 51:
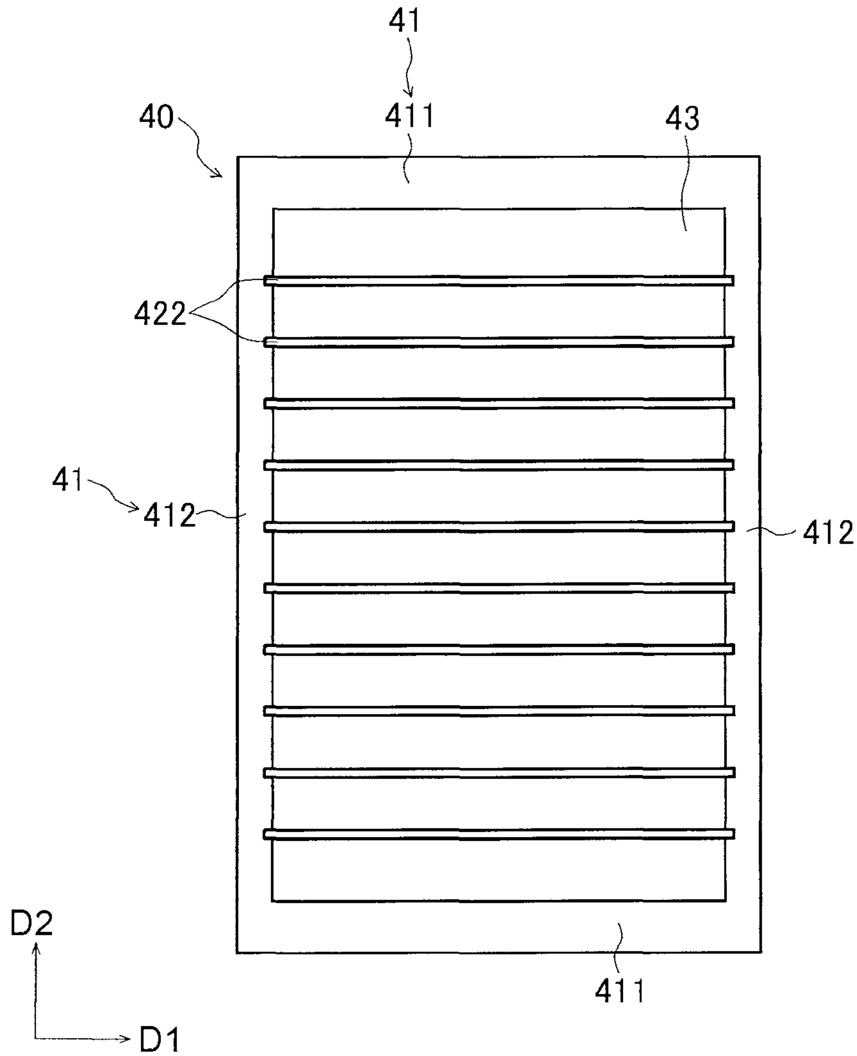
FIG. 51 is a plan view showing a state where masks are removed from the mask apparatus of FIG. 50.
Figure 52:
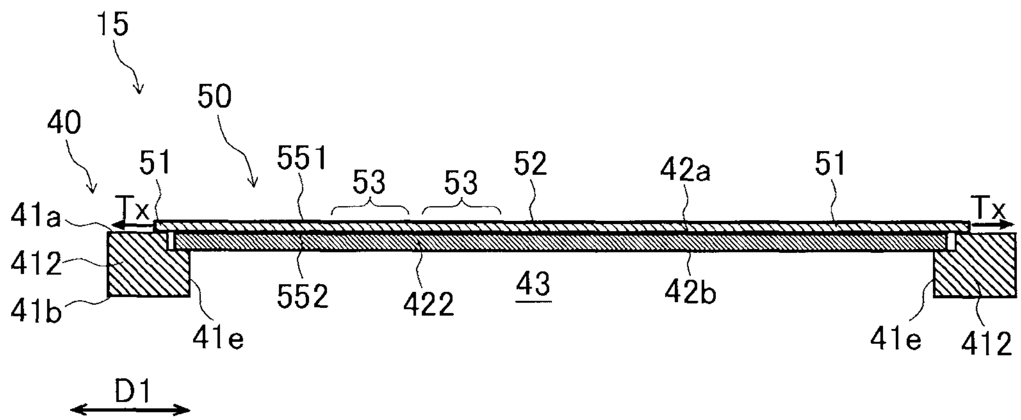
FIG. 52 is a sectional view of the mask apparatus, taken along the line LII-LII in FIG. 50.

FIG. 50 is a plan view showing an example of the mask apparatus 15. FIG. 51 is a plan view showing a state where the masks 50 are removed from the mask apparatus 15 of FIG. 50. FIG. 52 is a sectional view of the mask apparatus 15, taken along the line LII-LII in FIG. 50. The second bars 422 of the mask apparatus 15 of FIG. 50 to FIG. 52 are fixed to the frame first surface 41*a* side of the second sides 412 of the frame 41 by welding. Therefore, as compared to the bars 42 integrated with the frame 41, contribution of the second bars 422 of FIG. 50 to FIG. 52 to the stiffness of the mask support 40 in the first direction D1 is small.

Figure 53:
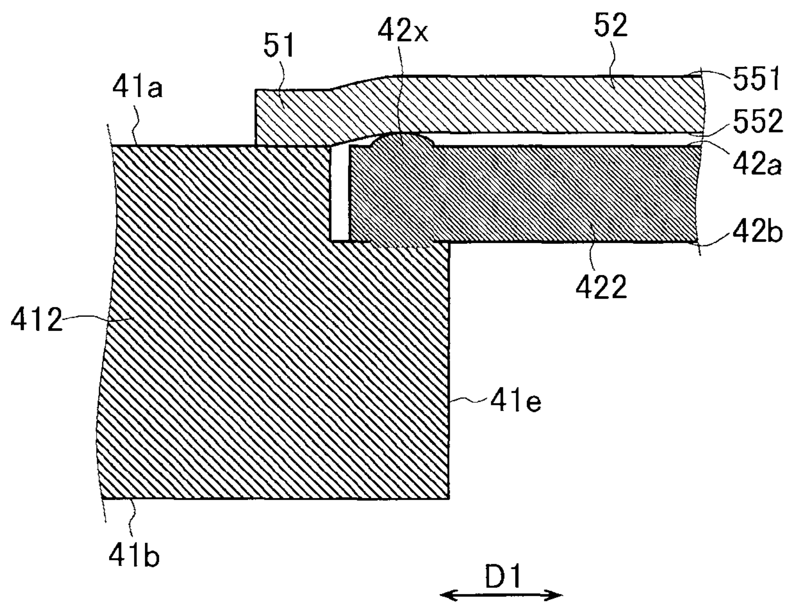
FIG. 53 is an enlarged sectional view showing a welded region of a second bar member and its surroundings of the mask apparatus of FIG. 52.

When the second bars 422 of FIG. 50 to FIG. 52 are fixed to the second sides 412 of the frame 41, a welded region of each second bar 422 may overlap the mask 50. FIG. 53 is an enlarged sectional view showing the welded region 42*x* of each second bar 422 and its surroundings. When the welded region 42*x* of the second bar 422 is uplifted to above the frame first surface 41*a* of the frame 41 as shown in FIG. 53, part of the mask 50 is pressed upward by the welded region 42*x*. In this case, as shown in FIG. 53, there is a possibility that a gap occurs between the second surface 552 of the mask 50 and the bar first surface 42*a* of the second bar 422.

In contrast, in the example shown in FIG. 44 to FIG. 49B, since the frame 41 and the bars 42 are integrated, the stiffness of the mask support 40 in the direction in which the bars 42 extend is effectively improved. Since the frame first surface 41*a* of the frame 41 and the bar first surfaces 42*a* of the bars 42 are in the same plane, the position of the surface of the mask 50 is easily controlled with respect to the frame first surface 41*a* of the frame 41.

An example in which the mask support 40 of the mask apparatus 15 includes both the first bars 421 and the second bars 422 will be described with reference to FIG. 54 to FIG. 60.

Figure 54:
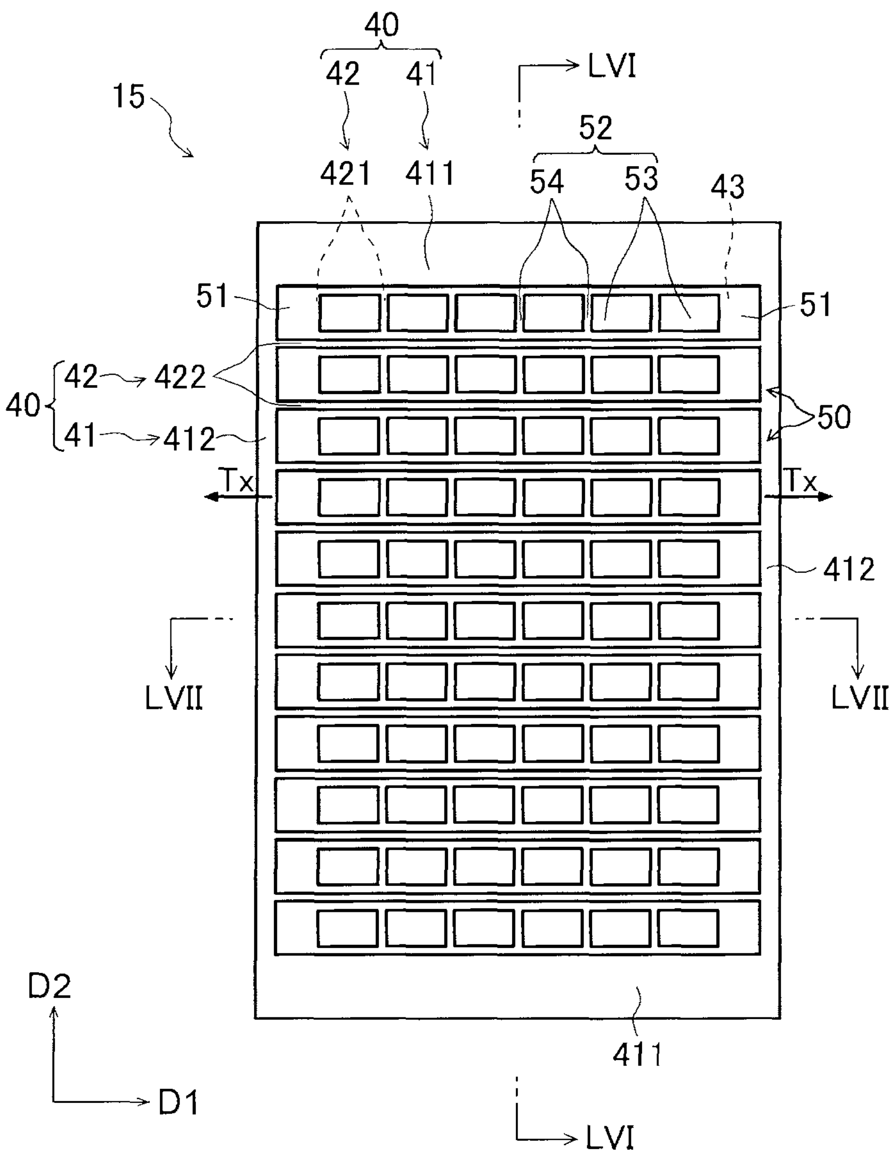
FIG. 54 is a plan view showing an example of a mask apparatus.
Figure 55:
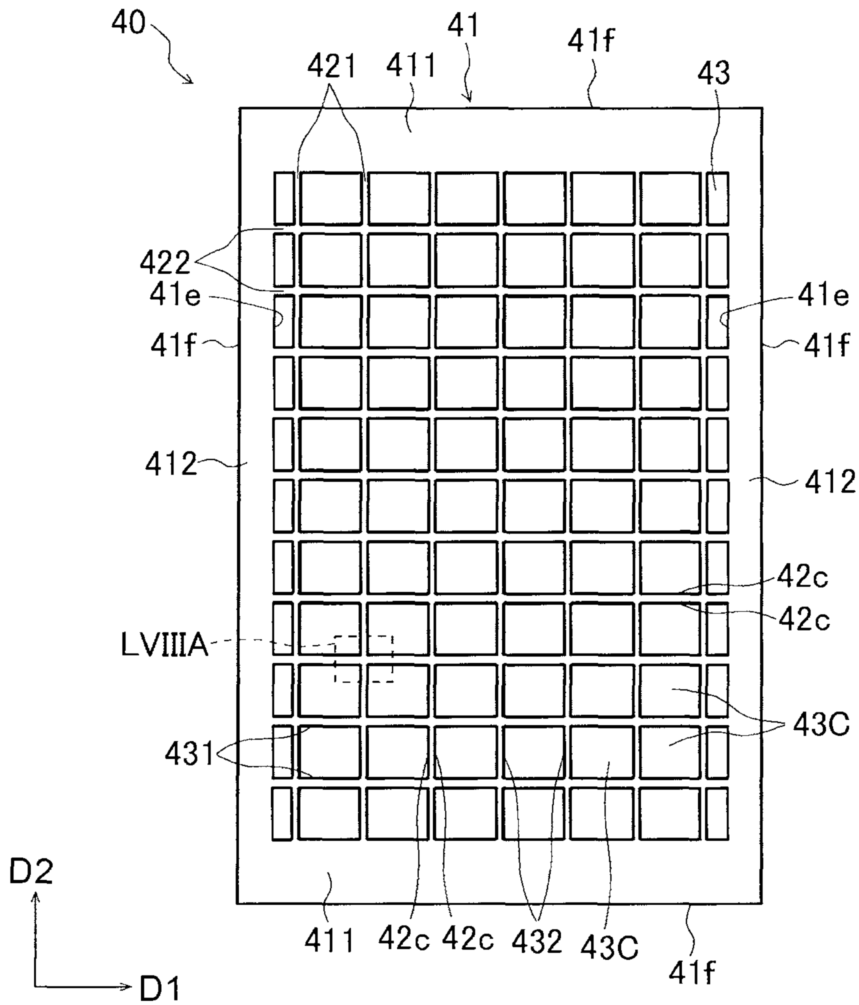
FIG. 55 is a plan view showing a state where masks are removed from the mask apparatus of FIG. 54.

FIG. 54 is a plan view showing an example of the mask apparatus 15. FIG. 55 is a plan view showing a state where the masks 50 are removed from the mask apparatus 15 of FIG. 54. The bars 42 may include the first bars 421 connected to the first sides 411 of the frame 41 and the second bars connected to the second sides 412 of the frame 41. The first bars 421 may extend from one of the first sides 411 to the other one of the first sides 411 in the second direction D2. The second bars 422 may extend from one of the second sides 412 to the other one of the second sides 412 in the first direction D1.

Figure 56:
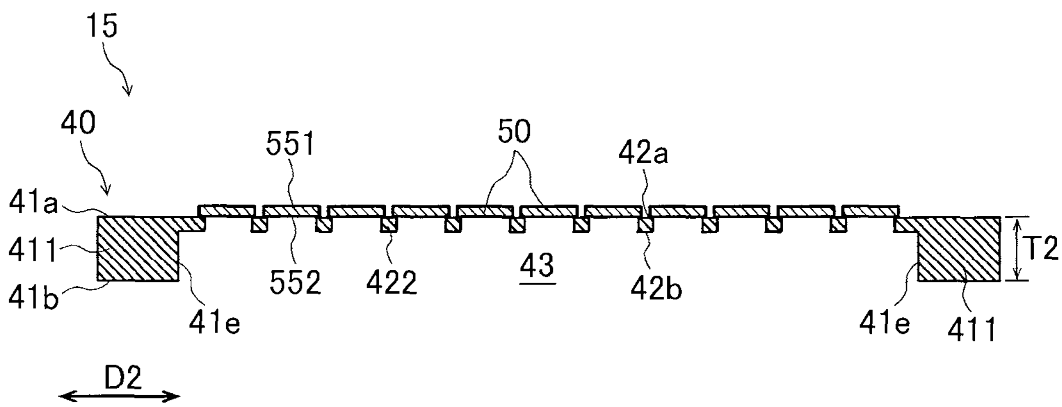
FIG. 56 is a sectional view of the mask apparatus, taken along the line LVI-LVI in FIG. 54.
Figure 57:
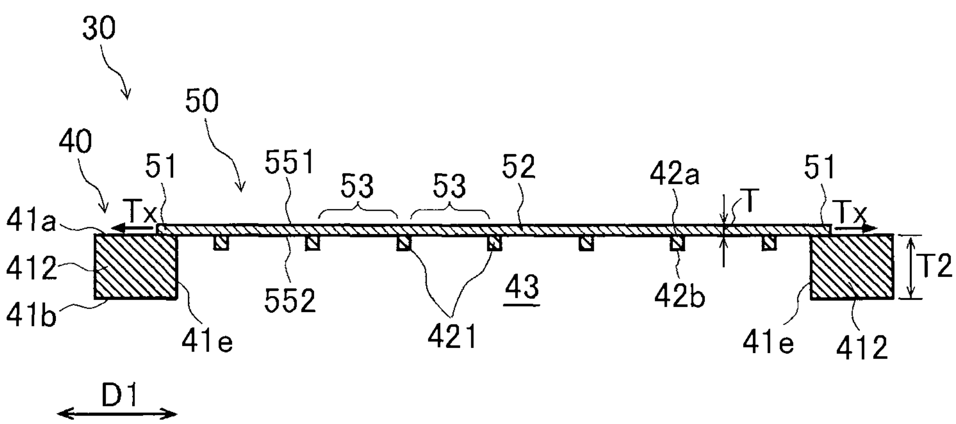
FIG. 57 is a sectional view of the mask apparatus, taken along the line LVII-LVII in FIG. 54.

FIG. 56 is a sectional view of the mask apparatus 15, taken along the line LVI-LVI in FIG. 54. FIG. 57 is a sectional view of the mask apparatus 15, taken along the line LVII-LVII in FIG. 54. The first bars 421 and the second bars 422 may be in contact with the second surface 552 of the mask 50.

The frame first surface 41*a* of the frame 41 and the bar first surface 42*a* of each bar 42 may be continuous at the boundary between the frame 41 and the bar 42. A structure at the boundary between each first side 411 of the frame 41 and each of the first bars 421 of the bars 42 is similar to the case of the embodiment shown in FIG. 37A and FIG. 38A, so the description is omitted. A structure at the boundary between each second side 412 of the frame 41 and each of the second bars 422 of the bars 42 is similar to the case of the embodiment shown in FIG. 48A and FIG. 49A, so the description is omitted.

Figure 58A:
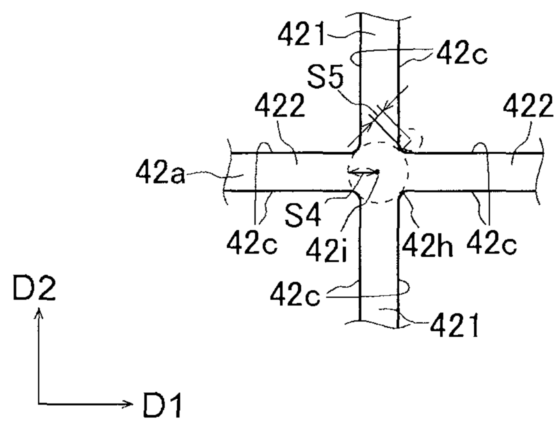
FIG. 58A is an enlarged plan view showing an example of a mask support in a range surrounded by the dashed line and indicated by the reference sign LVIIIA in FIG. 55.

The structure of a connection portion between each of the first bars 421 and each of the second bars 422 of the bars 42 will be described with reference to FIG. 58A. FIG. 58A is an enlarged plan view showing an example of the mask support 40 in the range surrounded by the dashed line and indicated by the reference sign LVIIIA in FIG. 55.

The bar first surface 42*a* of each first bar 421 and the bar first surface 42*a* of each second bar 422 may be located in the same plane. For example, as shown in FIG. 58A, in the region within the range of a radius S4 about an intersection 42*i* between the first bar 421 and the second bar 422, the position of the bar first surface 42*a* in the normal direction is within the range of an average value±second threshold. The second threshold is, for example, 0.5 μm. The radius S4 is, for example, 10 mm.

Figure 58B:
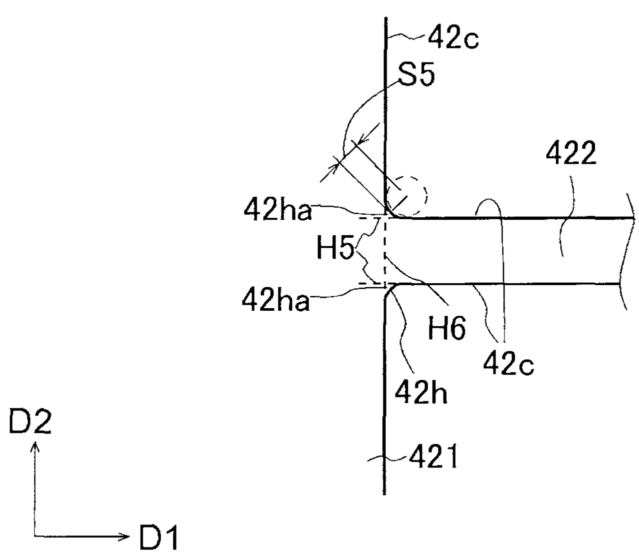
FIG. 58B is an enlarged plan view showing a third connection portion of FIG. 58A.

As shown in FIG. 58A, the mask support 40 includes a third connection portion 42*h* where the bar side surface 42*c* of each of the first bars 421 and the bar side surface 42*c* of each of the second bars 422 of the frame 41 are connected in plan view. FIG. 58B is an enlarged plan view showing the third connection portion 42*h*. When, for example, machining using a cutter is performed, the third connection portion 42*h* may include a transition portion 42*ha*. Each transition portion 42*ha* is a portion of the bars 42, defined by an extended line H5 of the bar side surface 42*c* of each first bar 421 and an extended line H6 of the bar side surface 42*c* of each second bar 422. The stiffness of the bars 42 in the case where the third connection portion 42*h* includes the transition portion 42*ha* is greater than the stiffness of the bars 42 in the case where the third connection portion 42*h* does not include the transition portion 42*ha*. In other words, the transition portion 42*ha* enhances the stiffness of the bars 42.

The transition portion 42*ha* may include a curved portion having a third radius of curvature S5. For example, the third radius of curvature S5 may be greater than or equal to 10 μm, may be greater than or equal to 100 μm, may be greater than or equal to 1 mm, or may be greater than or equal to 2 mm. For example, the third radius of curvature S5 may be less than or equal to 3 mm, may be less than or equal to 5 mm, may be less than or equal to 10 mm, or may be less than or equal to 20 mm. The range of the third radius of curvature S5 may be determined from a first group consisting of 10 μm, 100 μm, 1 mm, and 2 mm and/or a second group consisting of 3 mm, 5 mm, 10 mm, and 20 mm. The range of the third radius of curvature S5 may be determined by a combination of any one of the values included in the first group and any one of the values included in the second group. The range of the third radius of curvature S5 may be determined by a combination of any two of the values included in the first group. The range of the third radius of curvature S5 may be determined by a combination of any two of the values included in the second group. For example, the range of the third radius of curvature S5 may be greater than or equal to 10 μm and less than or equal to 20 mm, may be greater than or equal to 10 μm and less than or equal to 10 mm, may be greater than or equal to 10 μm and less than or equal to 5 mm, may be greater than or equal to 10 μm and less than or equal to 3 mm, may be greater than or equal to 10 μm and less than or equal to 2 mm, may be greater than or equal to 10 μm and less than or equal to 1 mm, may be greater than or equal to 10 μm and less than or equal to 100 μm, may be greater than or equal to 100 μm and less than or equal to 20 mm, may be greater than or equal to 100 μm and less than or equal to 10 mm, may be greater than or equal to 100 μm and less than or equal to 5 mm, may be greater than or equal to 100 μm and less than or equal to 3 mm, may be greater than or equal to 100 μm and less than or equal to 2 mm, may be greater than or equal to 100 μm and less than or equal to 1 mm, may be greater than or equal to 1 mm and less than or equal to 20 mm, may be greater than or equal to 1 mm and less than or equal to 10 mm, may be greater than or equal to 1 mm and less than or equal to 5 mm, may be greater than or equal to 1 mm and less than or equal to 3 mm, may be greater than or equal to 1 mm and less than or equal to 2 mm, may be greater than or equal to 2 mm and less than or equal to 20 mm, may be greater than or equal to 2 mm and less than or equal to 10 mm, may be greater than or equal to 2 mm and less than or equal to 5 mm, may be greater than or equal to 2 mm and less than or equal to 3 mm, may be greater than or equal to 3 mm and less than or equal to 20 mm, may be greater than or equal to 3 mm and less than or equal to 10 mm, may be greater than or equal to 3 mm and less than or equal to 5 mm, may be greater than or equal to 5 mm and less than or equal to 20 mm, may be greater than or equal to 5 mm and less than or equal to 10 mm, or may be greater than or equal to 10 mm and less than or equal to 20 mm. AMIC-1710 made by Sinto S-Precision, Ltd. may be used as a measuring instrument for measuring the third radius of curvature S5.

The opening 43 will be described. In the present embodiment as well, the opening 43 is partitioned into two or more regions by the bars 42 in plan view. For example, as shown in FIG. 55, the opening 43 includes a plurality of third openings 43C. The plurality of third openings 43C is arranged in the first direction D1 and the second direction D2.

As shown in FIG. 55, the outline of each third opening 43C may include a pair of first edges 431 extending in the first direction D1, and a pair of second edges 432 extending in the second direction D2. Each of the pair of first edges 431 may be made up of the bar side surface 42*c* of the second bar 422. Each of the pair of second edges 432 may be made up of the bar side surface 42*c* of the first bar 421.

The third openings 43C may overlap the effective regions 53 of the masks 50 in plan view. In the state of the mask apparatus 15, one effective region 53 may overlap one third opening 43C in plan view. In plan view, two or more effective regions 53 may overlap one third opening 43C. For example, two or more effective regions 53 arranged in the first direction D1 may overlap one third opening 43C. For example, two or more effective regions 53 arranged in the second direction D2 may overlap one third opening 43C.

The mask support 40 shown in FIG. 54 to FIG. 58A, as well as the mask support 40 shown in FIG. 1 to FIG. 42, and FIG. 44 to FIG. 49A, can be created by mechanically machining one plate. For this reason, the frame 41 and the bars 42 of the mask support 40 are integrated. Therefore, in comparison with the case where the frame 41 and the bars 42 are different members, the stiffness of the mask support 40 in the direction in which the bars 42 extend is improved. When, for example, the bars 42 include the second bars 422 extending in the first direction D1 and the first bars 421 extending in the second direction D2, the stiffness of the mask support 40 in the first direction D1 and the second direction D2 is improved. Therefore, for example, a deformation of the frame 41 of the mask support 40 in the first direction D1 and the second direction D2 due to a force received by the mask support 40 from the masks 50 is suppressed. Thus, a deviation of the positions of the through-holes 56 of each mask 50 fixed to the frame 41 from designed positions is suppressed.

Since the mask support 40 is created by mechanically machining one plate, the bar first surface 42*a* of each of the first bars 421 of the bars 42 and the bar first surface 42*a* of each of the second bars 422 of the bars 42 are continuous. For example, the bar first surface 42*a* of each first bar 421 and the bar first surface 42*a* of each second bar 422 may be located in the same plane. For this reason, the position of the surface of the mask 50 to be supported from the lower side by the bars 42 is easily controlled with respect to the frame first surface 41*a* of the frame 41. Thus, a distance Z1 between the first surface 551 of the mask 50 and the first surface 111 of the substrate 110 is easily controlled. Therefore, for example, a shadow in the vapor deposition step is easily suppressed or adjusted.

As in the case of the above-described embodiment, the thickness T3 of the bar 42 may be less than the thickness T2 of the frame 41. For example, T3/T2 may be higher than or equal to 0.1, may be higher than or equal to 0.2, may be higher than or equal to 0.3, or may be higher than or equal to 0.4. For example, T3/T2 may be lower than or equal to 0.5, may be lower than or equal to 0.6, may be lower than or equal to 0.7, or may be lower than or equal to 0.85. The range of T3/T2 may be determined from a first group consisting of 0.1, 0.2, 0.3, and 0.4 and/or a second group consisting of 0.5, 0.6, 0.7, and 0.85. The range of T3/T2 may be determined by a combination of any one of the values included in the first group and any one of the values included in the second group. The range of T3/T2 may be determined by a combination of any two of the values included in the first group. The range of T3/T2 may be determined by a combination of any two of the values included in the second group. For example, the range of T3/T2 may be higher than or equal to 0.1 and lower than or equal to 0.85, may be higher than or equal to 0.1 and lower than or equal to 0.7, may be higher than or equal to 0.1 and lower than or equal to 0.6, may be higher than or equal to 0.1 and lower than or equal to 0.5, may be higher than or equal to 0.1 and lower than or equal to 0.4, may be higher than or equal to 0.1 and lower than or equal to 0.3, may be higher than or equal to 0.1 and lower than or equal to 0.2, may be higher than or equal to 0.2 and lower than or equal to 0.85, may be higher than or equal to 0.2 and lower than or equal to 0.7, may be higher than or equal to 0.2 and lower than or equal to 0.6, may be higher than or equal to 0.2 and lower than or equal to 0.5, may be higher than or equal to 0.2 and lower than or equal to 0.4, may be higher than or equal to 0.2 and lower than or equal to 0.3, may be higher than or equal to 0.3 and lower than or equal to 0.85, may be higher than or equal to 0.3 and lower than or equal to 0.7, may be higher than or equal to 0.3 and lower than or equal to 0.6, may be higher than or equal to 0.3 and lower than or equal to 0.5, may be higher than or equal to 0.3 and lower than or equal to 0.4, may be higher than or equal to 0.4 and lower than or equal to 0.85, may be higher than or equal to 0.4 and lower than or equal to 0.7, may be higher than or equal to 0.4 and lower than or equal to 0.6, may be higher than or equal to 0.4 and lower than or equal to 0.5, may be higher than or equal to 0.5 and lower than or equal to 0.85, may be higher than or equal to 0.5 and lower than or equal to 0.7, may be higher than or equal to 0.5 and lower than or equal to 0.6, may be higher than or equal to 0.6 and lower than or equal to 0.85, may be higher than or equal to 0.6 and lower than or equal to 0.7, or may be higher than or equal to 0.7 and lower than or equal to 0.85.

Another example of the mask apparatus 15 will be described with reference to FIG. 59 to FIG. 62. Here, the case where the mask apparatus 15 includes the first bars 421 and the second bars 422 made up of different members from the frame 41 will be described.

Figure 59:
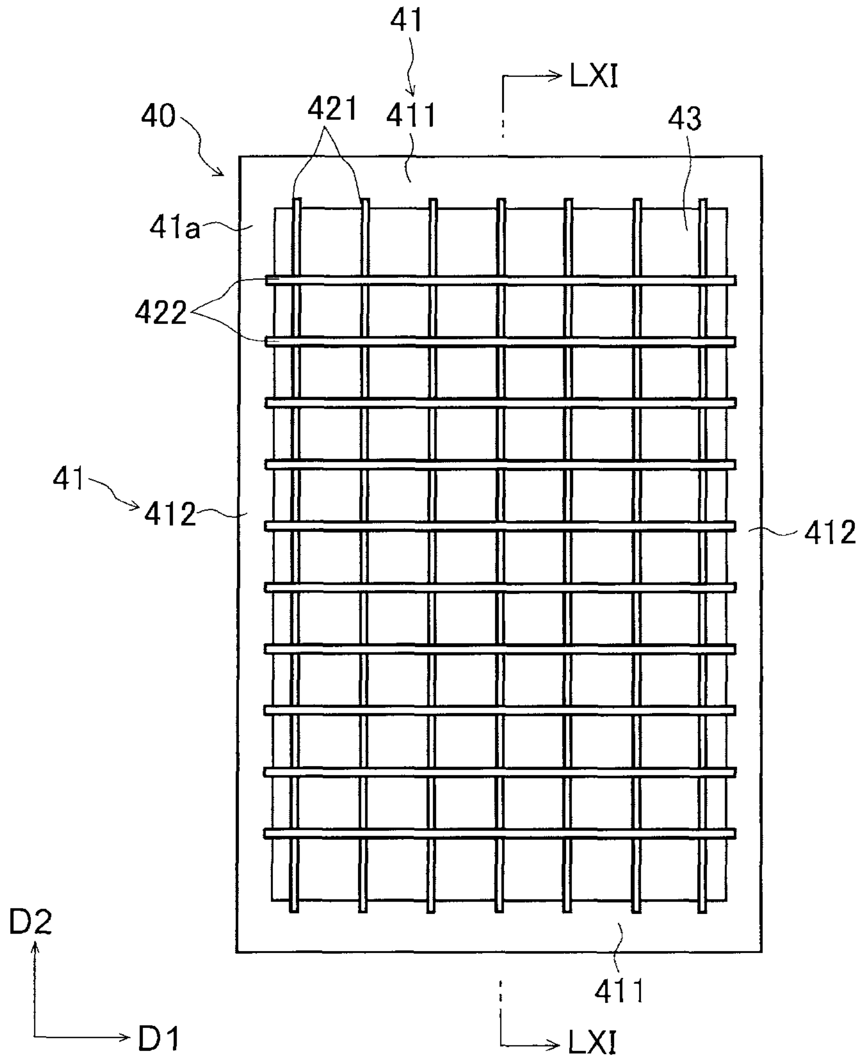
FIG. 59 is a plan view showing an example of a mask support.
Figure 60:
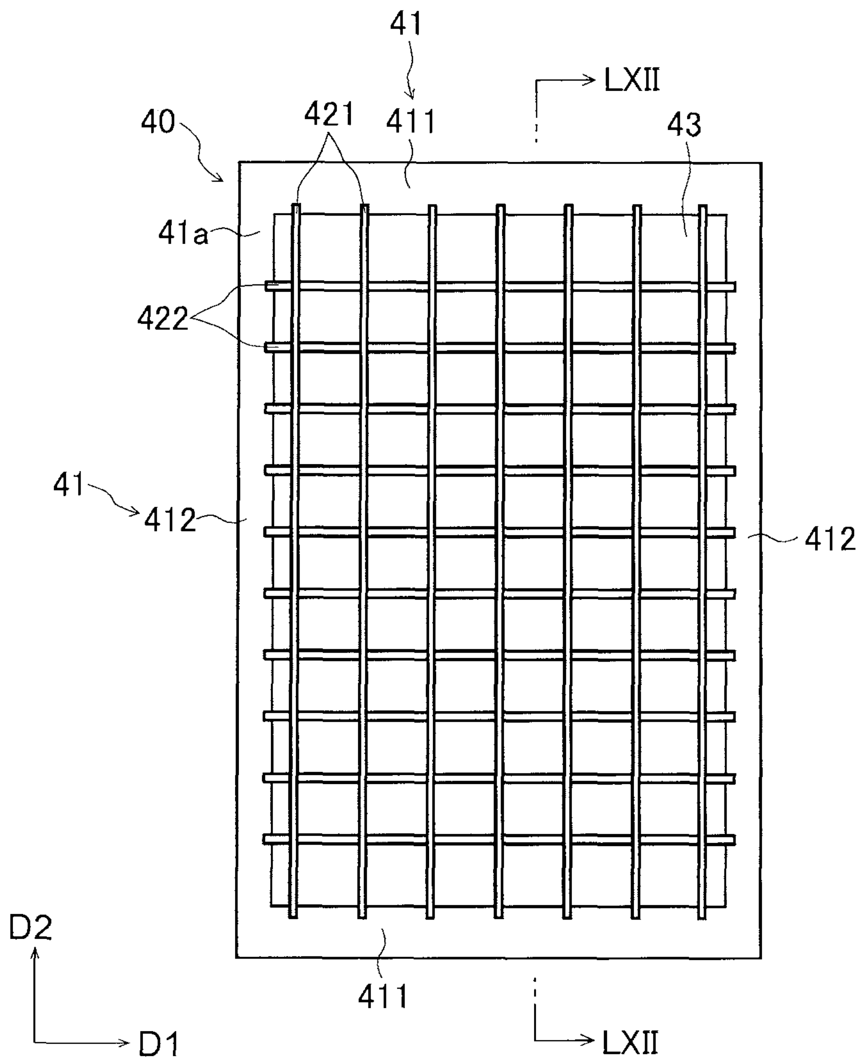
FIG. 60 is a plan view showing an example of a mask support.

FIG. 59 and FIG. 60 each are a plan view showing the mask support 40 including the first bars 421 and the second bars 422 made up of different members from the frame 41. In the example shown in FIG. 59, the first bars 421 are located between the frame first surface 41*a* of the frame 41 and the second bars 422. In the example shown in FIG. 60, the second bars 422 are located between the frame first surface 41*a* of the frame 41 and the first bars 421.

Figure 61:
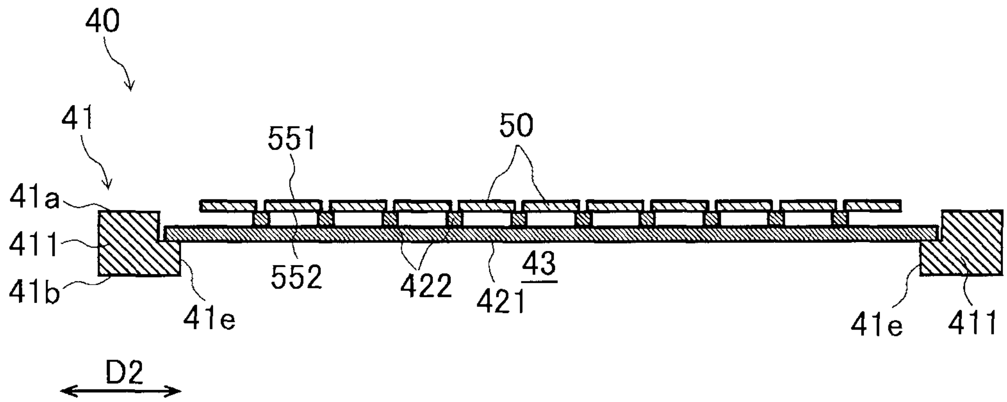
FIG. 61 is a sectional view of a mask apparatus including the mask support shown in FIG. 59, taken along the line LXI-LXI in FIG. 59.

FIG. 61 is a sectional view of the mask apparatus 15 including the mask support 40 shown in FIG. 59, taken along the line LXI-LXI in FIG. 59. In the embodiment shown in FIG. 59 and FIG. 61, the second bars 422 are located between the first bars 421 and the second surfaces 552 of the masks 50. In this case, the ends of each mask 50 in the second direction D2 are supported from the lower side since the ends are in contact with the second bars 422; however, nothing is in contact with the middle portion of each mask 50 in the second direction D2. Therefore, it is presumable that warpage occurs in each mask 50 along the second direction D2 that is the width direction of the mask 50.

Figure 62:
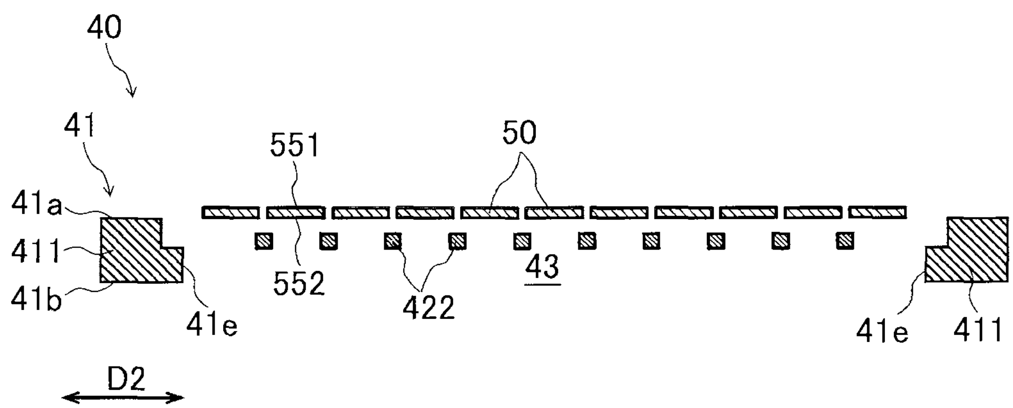
FIG. 62 is a sectional view of a mask apparatus including the mask support shown in FIG. 60, taken along the line LXII-LXII in FIG. 60.

FIG. 62 is a sectional view of the mask apparatus 15 including the mask support 40 shown in FIG. 60, taken along the line LXII-LXII in FIG. 60. In the embodiment shown in FIG. 60 and FIG. 62, the first bars 421 are located between the second bars 422 and the second surfaces 552 of the masks 50. Therefore, there is a gap corresponding to the thickness of the first bar 421 in the thickness direction of the mask 50 between each second bar 422 and an associated gap between adjacent two masks 50 in the second direction D2.

In contrast, in the example shown in FIG. 54 to FIG. 58B, the frame 41 and the bars 42 are integrated. Therefore, the stiffness of the mask support 40 in the direction in which the bars 42 extend is effectively improved. In addition, the first bars 421 and second bars 422 of the bars 42 are integrated. Therefore, the bar first surface 42*a* of each first bar 421 and the bar first surface 42*a* of each second bar 422 may be located in the same plane. Thus, occurrence of a gap between each of the first bars 421 and second bars 422 of the bars 42 and the second surface 552 of each mask 50 is suppressed. Therefore, the masks 50 are effectively supported by the bars 42 from the lower side. In addition, entry of a vapor deposition material into a gap between the second surface 552 of each mask 50 and each bar 42 is suppressed.

Figure 63:
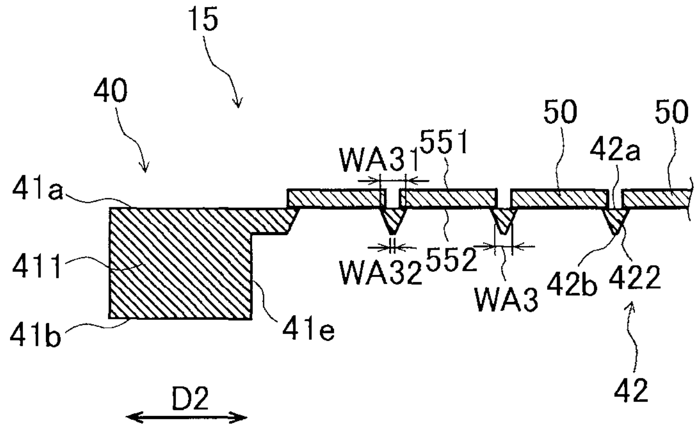
FIG. 63 is a sectional view showing an example of a mask apparatus.

FIG. 63 is a sectional view of an example of the mask apparatus 15, taken along the second direction D2. As shown in FIG. 63, each of the second bars 422 of the bars 42 may include a portion in which the width WA3 of the bar 42 reduces as a point approaches the bar second surface 42*b* in the thickness direction of the bar 42. The width WA31 of each bar 42 on the bar first surface 42*a* may be greater than the width WA32 of each bar 42 on the bar second surface 42*b*.

When the width WA3 of each bar 42 reduces as a point approaches the bar second surface 42*b* in the thickness direction of the bar 42, adhesion of a vapor deposition material to the bar 42 in the vapor deposition step is suppressed. When the width WA31 of each bar 42 on the bar first surface 42*a* is increased, the stiffness of the bar 42 is improved. Therefore, according to the embodiment shown in FIG. 63, for example, adhesion of a vapor deposition material to each bar 42 in vapor deposition step is suppressed while the stiffness of each bar 42 is maintained.

Figure 64:
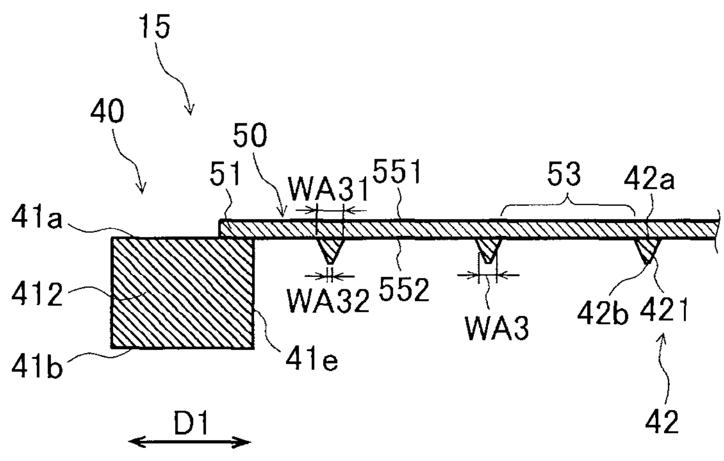
FIG. 64 is a sectional view showing an example of a mask apparatus.

FIG. 64 is a sectional view of an example of the mask apparatus 15, taken along the first direction D1. As shown in FIG. 64, each of the first bars 421 of the bars 42 may include a portion in which the width WA3 of the bar 42 reduces as a point approaches the bar second surface 42*b* in the thickness direction of the bar 42. The width WA31 of each bar 42 on the bar first surface 42*a* may be greater than the width WA32 of each bar 42 on the bar second surface 42*b*.

According to the embodiment shown in FIG. 64, as in the case of the embodiment shown in FIG. 63, adhesion of a vapor deposition material to each bar 42 in the vapor deposition step is suppressed while the stiffness of each bar 42 is maintained.

Figure 65:
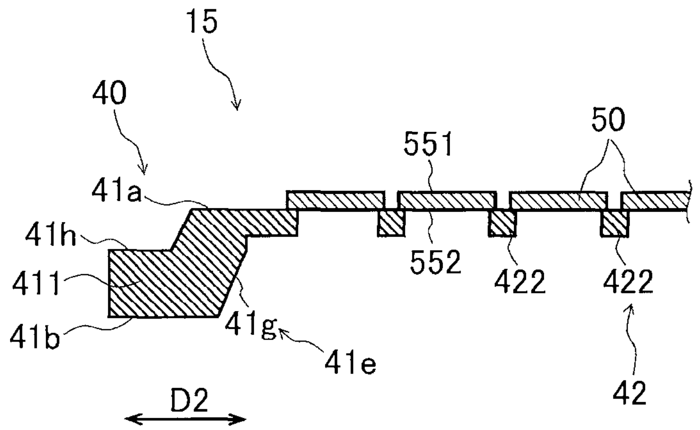
FIG. 65 is a sectional view showing an example of a mask apparatus.

As shown in FIG. 65, each first side 411 of the frame 41 may include a frame third surface 41*h* located between the frame first surface 41*a* and the frame second surface 41*b* in the thickness direction of the frame 41 and located outside the frame first surface 41*a* in plan view. The inner surface 41*e* of the first side 411 may include an inclined surface 41*g* that is displaced outward as a point approaches the frame second surface 41*b* in the thickness direction of the frame 41. The "outside" is a side away from the center point of the opening 43 of the frame 41 in plan view.

When the inner surface 41*e* of each first side 411 includes the inclined surface 41*g*, adhesion of a vapor deposition material to the inner surface 41*e* of each first side 411 in the vapor deposition step is suppressed.

Figure 66:
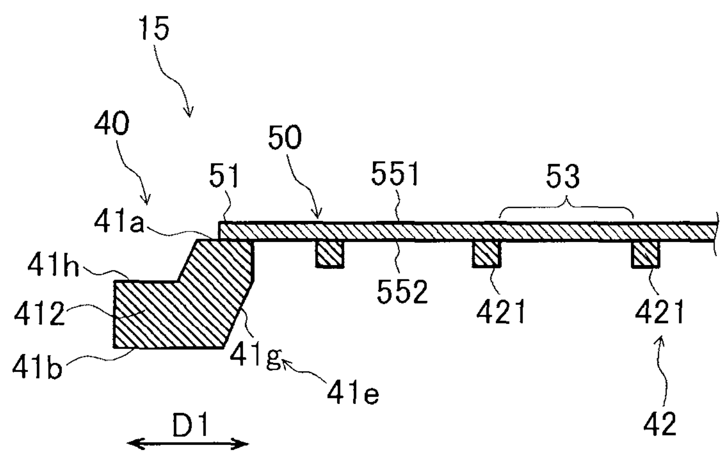
FIG. 66 is a sectional view showing an example of a mask apparatus.

As shown in FIG. 66, each second side 412 of the frame 41 may include the frame third surface 41*h* located between the frame first surface 41*a* and the frame second surface 41*b* in the thickness direction of the frame 41 and located outside the frame first surface 41*a* in plan view. The inner surface 41*e* of each second side 412 may include an inclined surface 41*g* that is displaced outward as a point approaches the frame second surface 41*b* in the thickness direction of the frame 41.

When the inner surface 41*e* of each second side 412 includes the inclined surface 41*g*, adhesion of a vapor deposition material to the inner surface 41*e* of each second side 412 in the vapor deposition step is suppressed as in the case of each first side 411 shown in FIG. 65.

Figure 67:
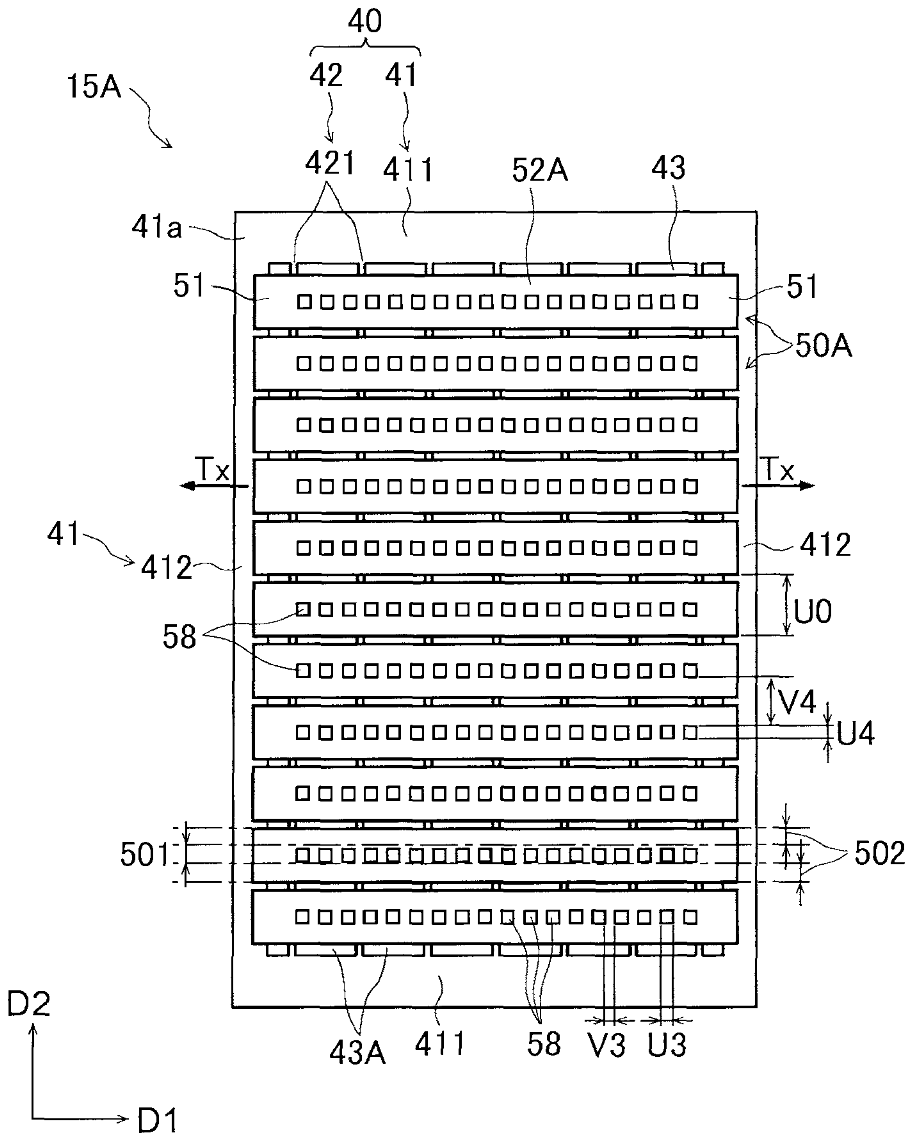
FIG. 67 is a plan view showing an example of a standard mask apparatus.

FIG. 67 is a plan view showing an example of the standard mask apparatus 15A. The standard mask apparatus 15A may include the above-described mask support 40 in which the frame 41 and the bars 42 are integrated.

The standard mask apparatus 15A is used to evaluate the characteristics of the first vapor deposition chamber 10. Therefore, high accuracy is desired for the component elements of the standard mask apparatus 15A. As described above, the mask support 40 including the frame 41 and the bars 42, integrated with each other, has a high stiffness in the direction in which the bars 42 extend as compared to the case where the frame 41 and the bars 42 are different members. Therefore, a deformation of the frame 41 of the mask support 40 in the second direction D2 due to a force received by the mask support 40 from the standard masks 50A is suppressed. Thus, a deviation of the positions of the through-holes 56 of the standard masks 50A fixed to the frame 41 from designed positions is suppressed. For this reason, further accurate evaluation of the characteristics of the first vapor deposition chamber 10 can be performed.

When the frame first surface 41*a* of the frame 41 and the bar first surface 42*a* of each bar 42 are in the same plane, the position of the surface of each standard mask 50A supported from the lower side by the bars 42 is easily controlled with respect to the frame first surface 41*a* of the frame 41. Thus, in the vapor deposition step, the distance Z1 between the first surface 551 of each mask 50 and the first surface 111 of the substrate 110 is easily controlled. Therefore, for example, a shadow in the vapor deposition step is easily suppressed or adjusted. Hence, further accurate evaluation of the characteristics of the first vapor deposition chamber 10 can be performed.

In the example shown in FIG. 67, the bars 42 of the mask support 40 of the standard mask apparatus 15A include the first bars 421 connected to the inner surfaces 41*e* of the first sides 411. Although not shown in the drawing, the bars 42 of the mask support 40 of the standard mask apparatus 15A may include the second bars 422 connected to the inner surfaces 41*e* of the second sides 412. Although not shown in the drawing, the bars 42 of the mask support 40 of the standard mask apparatus 15A may include the first bars 421 connected to the inner surfaces 41*e* of the first sides 411, and the second bars 422 connected to the inner surfaces 41*e* of the second sides 412.

Next, the second embodiment will be more specifically described by way of the example; however, the second embodiment is not limited to the following example without departing from the purport of the second embodiment.

A deformation that occurs in the frame 41 is examined by simulation.

Figure 68:
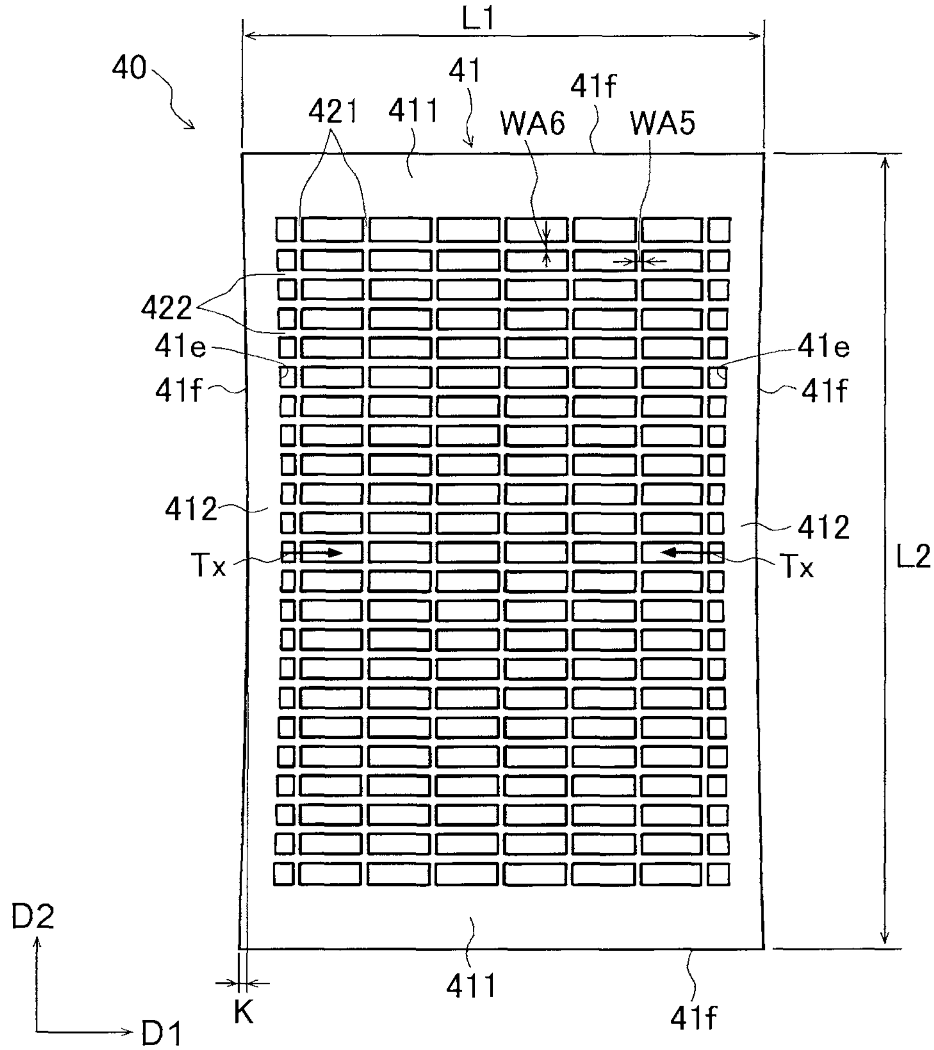
FIG. 68 is a plan view showing a mask support in examples.

As shown in FIG. 68, the mask support 40 including the frame 41 and the bars 42 is designed. The frame first surface 41*a* of the frame 41 and the bar first surface 42*a* of each bar 42 are located in the same plane. The material of the frame 41 and the bars 42 is an iron alloy containing 36 percent by weight of nickel. The configuration, dimensions, and the like of each of the frame 41 and the bars 42 are as follows.

The length L1 of each first side 411: 1105 mm

The length L2 of each second side 412: 1701 mm

The number of the first bars 421: 7

The width WA5 of each first bar 421: 3 mm

The number of the second bars 422: 22

The width WA6 of each second bar 422: 5.5 mm

The thickness T2 of the frame 41: 30 mm

The thickness T3 of each bar 42: 0.0 mm, 1.7 mm, 4.4 mm, 7.0 mm, 9.7 mm, 12.3 mm, 15.0 mm, 20.0 mm, 25.0 mm, and 30.0 mm A deformation amount K in each second side 412 when a force Tx is applied to the second side 412 in the first direction D1 as shown in FIG. 68 is calculated by simulation. The force Tx corresponds to a force received by the second side 412 from the mask 50. The force Tx is set to 27 N. ADINA made by ADINA R&D, Inc. is used as the software for simulation. The results of the simulation are shown in FIG. 69.

Figure 70:
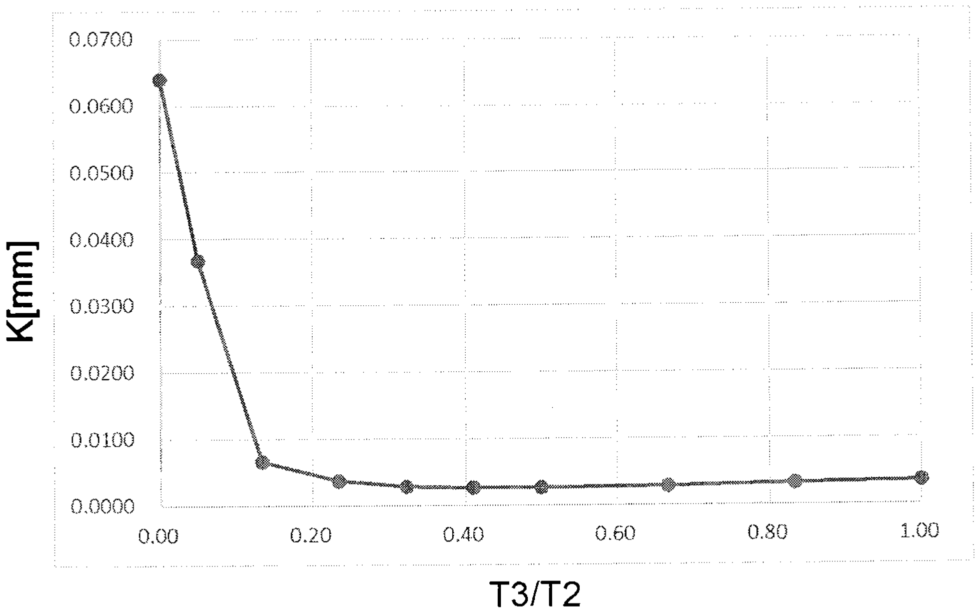
FIG. 70 is a graph showing the results of simulation.
Figure 71:
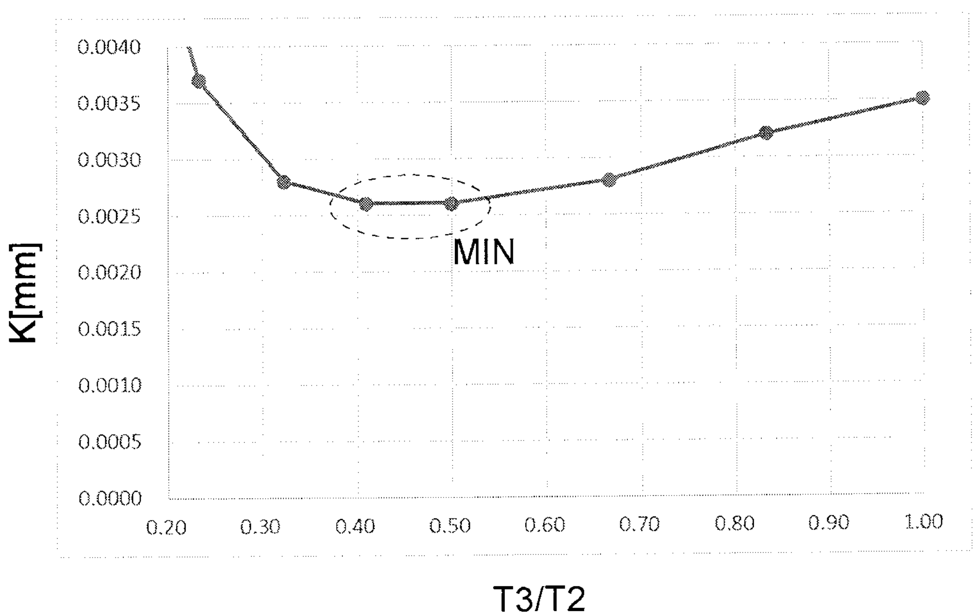
FIG. 71 is a graph showing the results of simulation.

FIG. 70 and FIG. 71 each show the relationship between the thickness T3 of each bar 42 and deformation amount K. The abscissa axis represents the ratio of the thickness T3 of each bar 42 to the thickness T2 of the frame 41. It is estimated that a local minimum ratio that is the ratio T3/T2 obtained when the deformation amount K of the frame 41 is a local minimum value MIN is higher than or equal to 0.40 and lower than or equal to 0.60.

Next, a third embodiment will be described. The third embodiment has a feature related to a method of fixing the masks 50 to the mask support 40.

The third embodiment provides a method of manufacturing a mask apparatus and a method of manufacturing an organic device, which are capable of shortening time consumed to align masks with a frame.

The method of manufacturing a mask apparatus according to the third embodiment may include a frame preparation step, a mask preparation step, a placement step, a mask alignment step, and a joining step. In the frame preparation step, a frame including a frame first surface, a frame second surface located across from the frame first surface, an opening extending through from the frame first surface to the frame second surface, a wall surface located outside the opening in plan view and extending from the frame first surface toward the frame second surface, the frame wall surface including a first wall surface edge located adjacent to the frame first surface and a second wall surface edge located adjacent to the frame second surface, and a frame third surface extending outward from the second wall surface edge along the frame second surface in plan view may be prepared. In the mask preparation step, a mask including a first mask edge located at one of side edges in a second direction, a second mask edge located at the other one of the side edges in the second direction, a pair of end portions located on both sides in a first direction perpendicular to the second direction, and a through-hole located between the pair of end portions may be prepared. In the placement step, the mask may be placed on the frame such that end portions of the mask overlap the first wall surface edge in plan view and the first wall surface edge extends in a straight line in the second direction from the first mask edge of the mask to the second mask edge. In the mask alignment step, after the placement step, the mask may be aligned with the frame while being pulled in the first direction by a joint tension and being pressed against the frame. In the joining step, after the mask alignment step, the mask may be joined with the frame while being pulled in the first direction by the joint tension and being pressed against the frame.

The method of manufacturing an organic device according to the third embodiment may include an apparatus preparation step of preparing a mask apparatus through the method of manufacturing a mask apparatus, a close contact step, and a vapor deposition step. In the close contact step, the mask of the mask apparatus may be brought into close contact with a substrate. In the vapor deposition step, a vapor deposition layer may be formed by depositing a vapor deposition material onto the substrate through the at least one through-hole of the mask.

A mask apparatus according to the third embodiment may include a frame and a mask provided on the frame. The frame may include a frame first surface, a frame second surface located across from the frame first surface, an opening extending through from the frame first surface to the frame second surface, a wall surface located outside the opening in plan view and extending from the frame first surface toward the frame second surface, the frame wall surface including a first wall surface edge located adjacent to the frame first surface and a second wall surface edge located adjacent to the frame second surface, and a frame third surface extending outward from the second wall surface edge along the frame second surface in plan view. The mask may include a first mask edge located at one of side edges in a second direction, a second mask edge located at the other one of the side edges in the second direction, a pair of end portions located on both sides in a first direction perpendicular to the second direction and overlapping the frame first surface, and a through-hole located between the pair of end portions. The mask may include a pair of mask ends located on both sides in the first direction and inside the first wall surface edge. The first wall surface edge may extend in a straight line in the first direction from an extended line of the first mask edge of the mask to an extended line of the second mask edge.

An intermediate product of a mask apparatus according to the third embodiment may include a frame and a mask provided on the frame. The frame may include a frame first surface, a frame second surface located across from the frame first surface, an opening extending through from the frame first surface to the frame second surface, a frame wall surface located outside the opening in plan view and extending from the frame first surface toward the frame second surface, the frame wall surface including a first wall surface edge located adjacent to the frame first surface and a second wall surface edge located adjacent to the frame second surface, and a frame third surface extending outward from the second wall surface edge along the frame second surface in plan view. The mask may include a first mask edge located at one of side edges in a second direction, a second mask edge located at the other one of the side edges in the second direction, a pair of end portions located on both sides in a first direction perpendicular to the second direction and overlapping the frame first surface, and a through-hole located between the pair of end portions. The first wall surface edge may overlap the end portions of the mask in plan view and extend in a straight line in the first direction from the first mask edge of the mask to the second mask edge.

According to the third embodiment, time consumed to align a mask with a frame is shortened.

A first aspect of the third embodiment is a method of manufacturing a mask apparatus. The method includes a frame preparation step of preparing a frame including a frame first surface, a frame second surface located across from the frame first surface, an opening extending through from the frame first surface to the frame second surface, a frame wall surface located outside the opening in plan view and extending from the frame first surface toward the frame second surface, the frame wall surface including a first wall surface edge located adjacent to the frame first surface and a second wall surface edge located adjacent to the frame second surface, and a frame third surface extending outward from the second wall surface edge along the frame second surface in plan view, a mask preparation step of preparing at least one mask including a first mask edge located at one of side edges in a second direction, a second mask edge located at the other one of the side edges in the second direction, a pair of end portions located on both sides in a first direction perpendicular to the second direction, and a through-hole located between the pair of end portions, a placement step of placing the at least one mask on the frame such that the end portions of the at least one mask overlap the first wall surface edge in plan view and the first wall surface edge extends in a straight line in the second direction from the first mask edge of the at least one mask to the second mask edge, a mask alignment step of, after the placement step, aligning the at least one mask with the frame while the at least one mask is being pulled in the first direction by a joint tension and being pressed against the frame, and a joining step of, after the mask alignment step, joining the at least one mask with the frame while the at least one mask is being pulled in the first direction by the joint tension and being pressed against the frame.

In a second aspect of the third embodiment, in the method of manufacturing a mask apparatus according to the first aspect, the mask alignment step may include a first checking step of checking a position of the through-hole with respect to the frame while the joint tension is being applied to the at least one mask and the at least one mask is being pressed against the frame.

In a third aspect of the third embodiment, in the method of manufacturing a mask apparatus according to the second aspect, the mask alignment step may include a moving step of moving the at least one mask in any one of directions in a two-dimensional plane defined by the second direction and the first direction in accordance with a position check result of the through-hole in the first checking step while the joint tension is being applied to the at least one mask and the at least one mask is being pressed against the frame.

In a fourth aspect of the third embodiment, in the method of manufacturing a mask apparatus according to any one of the first to third aspects, the mask alignment step may include a second checking step of, after the moving step, checking a position of the through-hole with respect to the frame while the joint tension is being applied to the at least one mask and the at least one mask is being pressed against the frame.

In a fifth aspect of the third embodiment, in the method of manufacturing a mask apparatus according to the first aspect, the mask alignment step may include a third checking step of checking a position of the through-hole with respect to the frame while the at least one mask is being pressed against the frame, a tension adjustment step of adjusting a tension to be applied to the at least one mask in accordance with a position check result of the through-hole in the third checking step, and a fourth checking step of, after the tension adjustment step, checking a position of the through-hole with respect to the frame while the joint tension is being applied to the at least one mask and the at least one mask is being pressed against the frame.

A sixth aspect of the third embodiment, in the method of manufacturing a mask apparatus according to any one of the first to fifth aspects, may further include a cutting step of, after the joining step, cutting the end portions of the at least one mask. In the joining step, a joint portion extending from each of the end portions of the at least one mask to the frame may be formed. In the cutting step, the at least one mask may be cut at a position outside the joint portion in the first direction in each of the end portions of the at least one mask, and a portion outside the cut position may be removed.

In a seventh aspect of the third embodiment, in the method of manufacturing a mask apparatus according to the sixth aspect, a frame groove extending in the second direction may be provided on the frame first surface of the frame. In the cutting step, the at least one mask may be cut along the frame groove.

In an eighth aspect of the third embodiment, in the method of manufacturing a mask apparatus according to any one of the first to seventh aspects, when the two or more masks arranged in the second direction are joined with the frame, the first wall surface edge of the frame may extend in a straight line in the second direction from one of the masks to another one of the masks.

In a ninth aspect of the third embodiment, in the method of manufacturing a mask apparatus according to the eighth aspect, the first wall surface edge of the frame may extend in a straight line in the second direction from one of the masks, located farthest to one side in the second direction, to another one of the masks, located farthest to a side opposite from the one of the masks.

Each of the first to ninth aspects may be a mask apparatus manufactured through the method of manufacturing a mask apparatus according to any one of the first to ninth aspects.

A tenth aspect of the third embodiment is a method of manufacturing an organic device. The manufacturing method includes an apparatus preparation step of preparing the mask apparatus through the method of manufacturing a mask apparatus according to any one of the first to ninth aspects, a close contact step of bringing the at least one mask of the mask apparatus into close contact with a substrate, and a vapor deposition step of forming a vapor deposition layer by depositing a vapor deposition material onto the substrate through the through-hole of the at least one mask.

In an eleventh aspect of the third embodiment, in the close contact step of the method of manufacturing an organic device according to the tenth aspect, the substrate may be held by an electrostatic chuck from the upper side.

Each of the tenth and eleventh aspects may be an organic device manufactured through the method of manufacturing an organic device according to the tenth or eleventh aspect.

A twelfth aspect of the third embodiment is a mask apparatus. The mask apparatus includes a frame including a frame first surface, a frame second surface located across from the frame first surface, an opening extending through from the frame first surface to the frame second surface, a frame wall surface located outside the opening in plan view and extending from the frame first surface toward the frame second surface, the frame wall surface including a first wall surface edge located adjacent to the frame first surface and a second wall surface edge located adjacent to the frame second surface, and a frame third surface extending outward from the second wall surface edge along the frame second surface in plan view, and at least one mask provided on the frame and including a first mask edge located at one of side edges in a second direction, a second mask edge located at the other one of the side edges in the second direction, a pair of end portions located on both sides in a first direction perpendicular to the second direction and overlapping the frame first surface, and a through-hole located between the pair of end portions. The at least one mask includes a pair of mask ends located on both sides in the first direction and inside the first wall surface edge. The first wall surface edge extends in a straight line in the first direction from an extended line of the first mask edge of the at least one mask to an extended line of the second mask edge.

In a thirteenth aspect of the third embodiment, the mask apparatus according to the twelfth aspect may include the two or more masks arranged in the second direction. The first wall surface edge may extend in a straight line in the second direction from one of the masks to another one of the masks.

In a fourteenth aspect of the third embodiment, in the mask apparatus according to the thirteenth aspect, the first wall surface edge may extend in a straight line in the second direction from one of the masks, located farthest to one side in the second direction, to another one of the masks, located farthest to a side opposite from the one of the masks.

In a fifteenth aspect of the third embodiment, in the mask apparatus according to any one of the twelfth to fourteenth aspects, a frame groove extending in the second direction may be provided on the frame first surface of the frame.

A sixteenth aspect of the third embodiment is an intermediate product of a mask apparatus. The intermediate product of the mask apparatus includes a frame including a frame first surface, a frame second surface located across from the frame first surface, an opening extending through from the frame first surface to the frame second surface, a frame wall surface located outside the opening in plan view and extending from the frame first surface toward the frame second surface, the frame wall surface including a first wall surface edge located adjacent to the frame first surface and a second wall surface edge located adjacent to the frame second surface, and a frame third surface extending outward from the second wall surface edge along the frame second surface in plan view, and at least one mask provided on the frame and including a first mask edge located at one of side edges in a second direction, a second mask edge located at the other one of the side edges in the second direction, a pair of end portions located on both sides in a first direction perpendicular to the second direction and overlapping the frame first surface, and a through-hole located between the pair of end portions. The first wall surface edge overlaps the end portions of the at least one mask in plan view and extends in a straight line in the first direction from the first mask edge of the at least one mask to the second mask edge.

Hereinafter, the third embodiment will be described in detail with reference to the accompanying drawings. The embodiments described below are examples of the third embodiment, and the third embodiment is not interpreted limitedly to only these embodiments. In the following description and the drawings to be used in the following description, like reference signs used for corresponding portions in the above-described embodiment denote portions that can be configured similarly to those of the above-described embodiment. The description will not be repeated. When it is apparent that the operation and advantageous effects obtained in the above-described embodiment are also obtained in the following embodiment, the description may be omitted.

In the following embodiment, an example in which a mask apparatus is the mask apparatus 15 including the mask support 40 and the masks 50 will be described. Although not shown in the drawing, a mask apparatus may be the standard mask apparatus 15A including the mask support 40 and the standard masks 50A. In other words, the technical idea of the present embodiment may be applied to the standard mask apparatus 15A, a method of manufacturing the standard mask apparatus 15A, and a vapor deposition method using the standard mask apparatus 15A.

Figure 72:
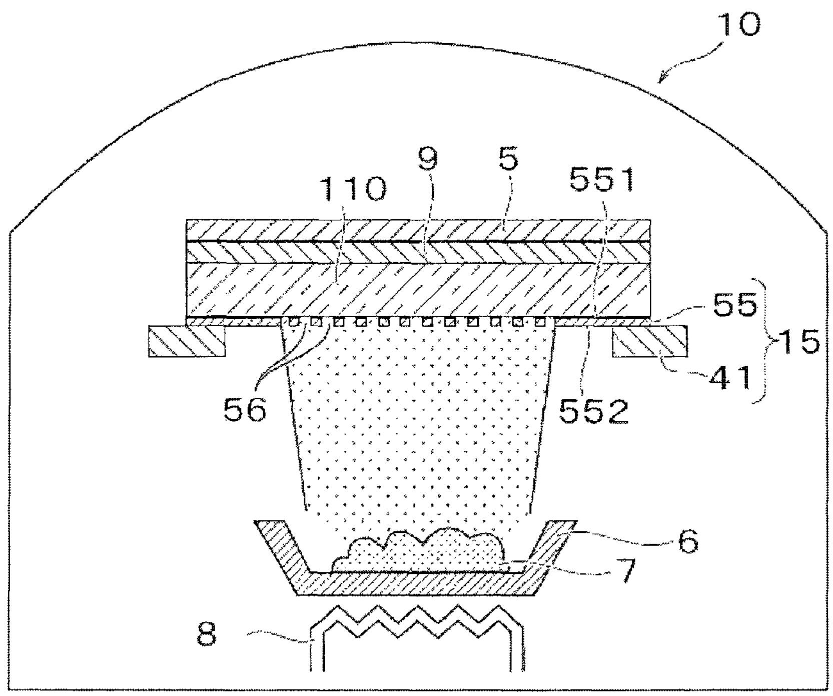
FIG. 72 is a view showing a vapor deposition chamber in which a mask apparatus is provided according to a third embodiment.

FIG. 72 is a longitudinal sectional view showing an example of the vapor deposition chamber 10. As shown in FIG. 72, the substrate 110 may be held by an electrostatic chuck 9 that uses electrostatic force. The electrostatic chuck 9 is placed on the substrate 110. The vapor deposition chamber 10 may include the magnet 5 placed on the electrostatic chuck 9. A cooling plate (not shown) for cooling the substrate 110 during vapor deposition may be interposed between the electrostatic chuck 9 and the magnet 5. The vapor deposition chamber 10 does not need to include the magnet 5. In this case, the mask 50 may be brought into close contact with the substrate 110 by the electrostatic force of the electrostatic chuck 9.

Figure 73:
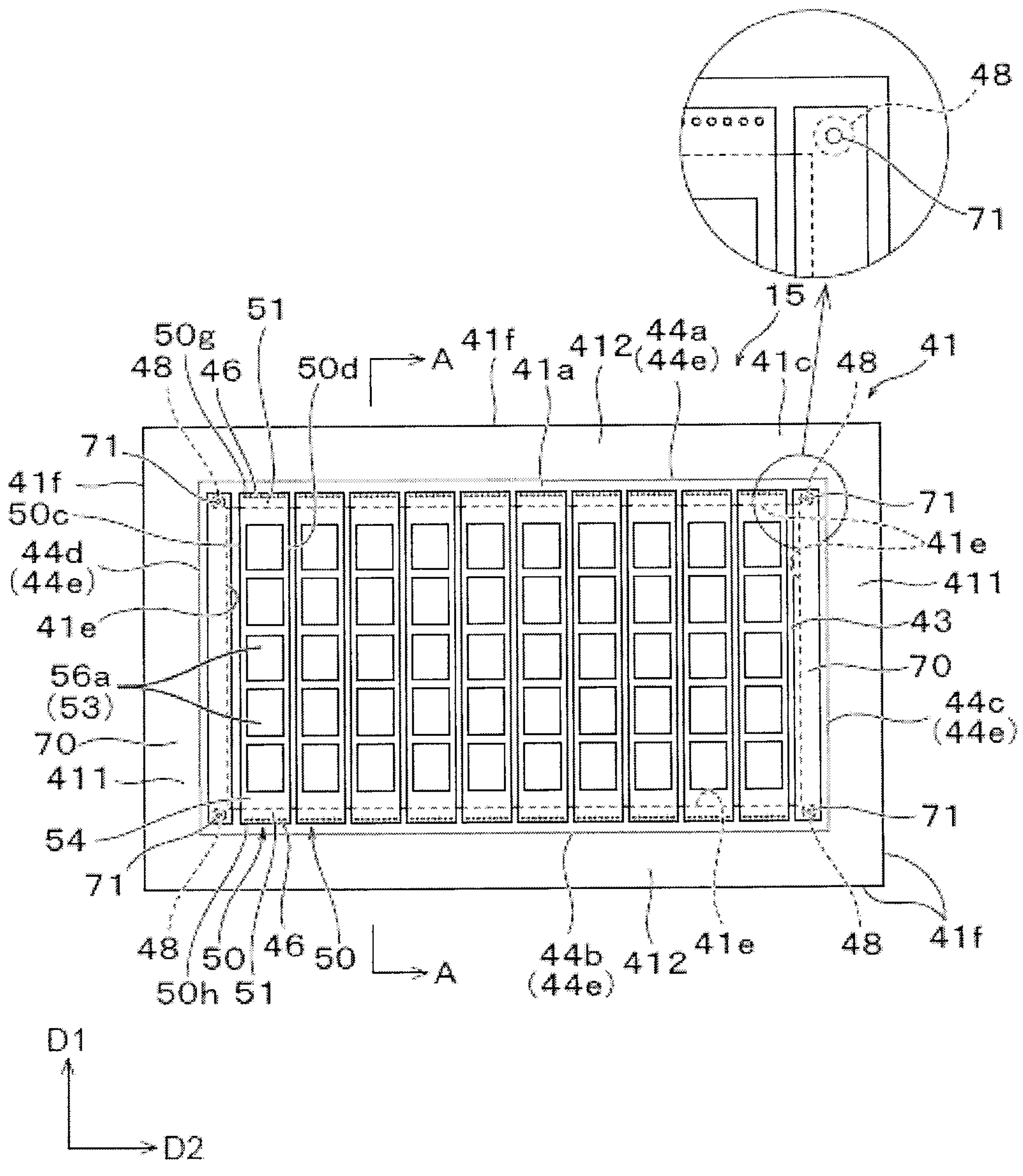
FIG. 73 is a plan view showing the mask apparatus according to the third embodiment.

FIG. 73 is a plan view showing an example of the mask apparatus 15. The mask apparatus 15 may include the mask support 40 including the frame 41 and the masks 50 provided on the frame 41. The two or more masks 50 arranged in the second direction D2 may be provided on the frame 41. Each mask 50 may be formed in a long narrow shape such that the first direction D1 perpendicular to the second direction D2 is a longitudinal direction. Each mask 50 may include a plurality of through-hole groups 56*a* (or a plurality of effective regions 53 (both will be described later)) arranged in a line in the first direction D1.

The frame 41 supports the masks 50 in a state where the masks 50 are pulled in a planar direction to suppress warpage of the masks 50.

Figure 74:
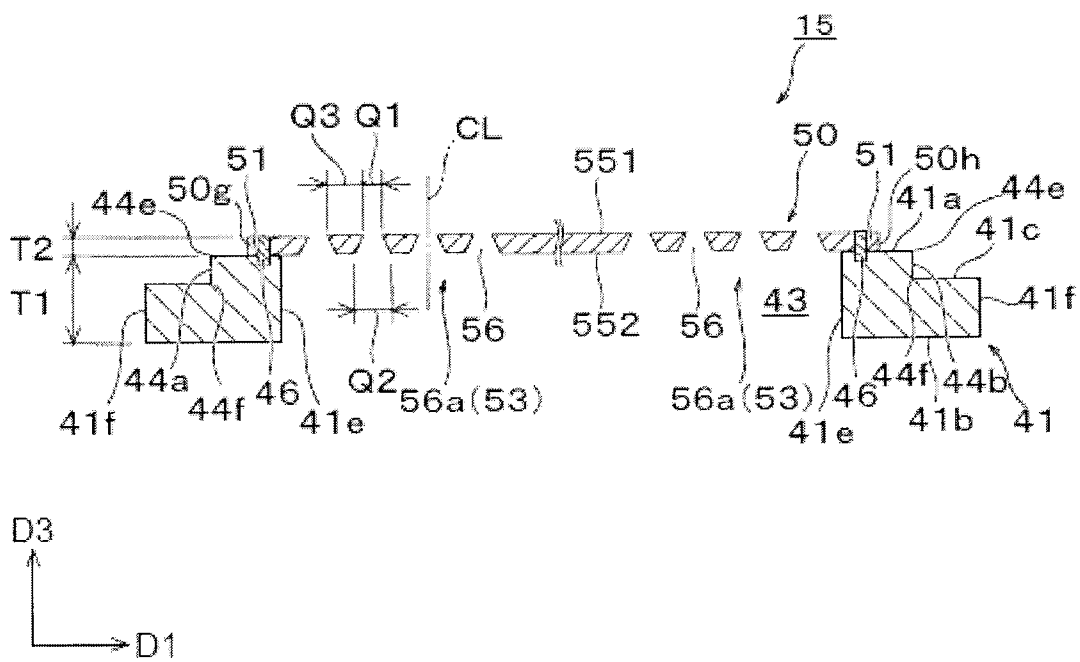
FIG. 74 is a view schematically showing a cross section taken along the line A-A in FIG. 73.

As shown in FIG. 74, the frame 41 may include the frame first surface 41*a* located adjacent to the masks 50 and the frame second surface 41*b* located across from the frame first surface 41*a*. The second surface 552 (described later) of each mask 50 is joined with the frame first surface 41*a*. FIG. 74 is a schematic sectional view taken along the line A-A in FIG. 73. To clarify the drawing, the number of the through-hole groups 56*a* (described later) and the number of the through-holes 56 (described later) are reduced.

As shown in FIG. 73, the frame 41 may be formed in a rectangular frame shape in plan view. For example, the frame 41 may include a pair of first sides 411 extending in the first direction D1 and a pair of second sides 412 extending in the second direction D2. The frame 41 may include the opening 43 that extends through from the frame first surface 41*a* to the frame second surface 41*b*. The opening 43 is located between the pair of first sides 411 and is located between the pair of second sides 412. The opening 43 overlaps the through-hole groups 56*a* of the masks 50 in plan view and exposes the through-hole groups 56*a* to the frame second surface 41*b* side. In the example shown in FIG. 73, the opening 43 is formed in a rectangular shape along the second direction D2 and the first direction D1 in plan view. Here, the "plan view" is a term that means a view in the thickness direction D3 of the masks 50 and means, for example, a view in a direction vertical to the drawing sheet of FIG. 73. The thickness direction D3 is a direction perpendicular to the second direction D2 and perpendicular to the first direction D1. When the masks 50 extend in a horizontal direction, the thickness direction D3 is an up and down direction D3.

As shown in FIG. 73 and FIG. 74, the frame 41 may include four frame wall surfaces 44*a* to 44*d* extending from the frame first surface 41*a* toward the frame second surface 41*b*, and a frame third surface 41*c*. The frame wall surfaces 44*a*, 44*b* are located on both sides and outside the opening 43 in the first direction D1 in plan view. In other words, in the first direction D1, the opening 43 is located between the frame wall surface 44*a* and the frame wall surface 44*b*. The frame wall surfaces 44*c*, 44*d* are located on both sides and outside the opening 43 in the second direction D2. In other words, in the second direction D2, the opening 43 is located between the frame wall surface 44*c* and the frame wall surface 44*d*. The four frame wall surfaces 44*a* to 44*d* are formed in a rectangular shape along the opening 43 in plan view. The frame first surface 41*a* is formed in a rectangular frame shape in plan view. Here, "outside" means a side across from the center side (inside) of the opening 43 in plan view. For example, outside in the second direction D2 means the right side or the left side in FIG. 73, and outside in the first direction D1 means the upper side or the lower side in FIG. 73.

Figure 75A:
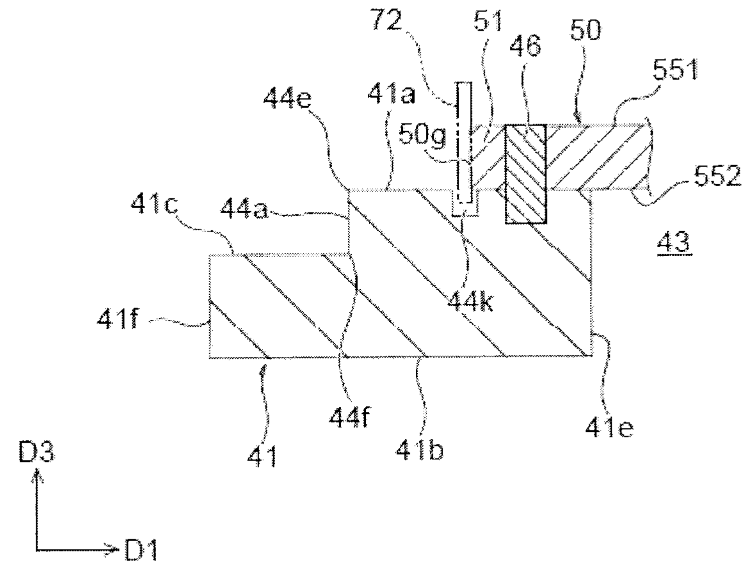
FIG. 75A is a partially enlarged sectional view of FIG. 74.

The frame wall surfaces 44*a* to 44*d* are connected to the frame first surface 41*a* and are not connected to the frame second surface 41*b*. As shown in FIG. 74 and FIG. 75A, the frame wall surfaces 44*a* to 44*d* extend in a direction that intersects with the frame first surface 41*a* when viewed in the cross section taken along the thickness direction D3. Typically, FIG. 74 shows the pair of frame wall surfaces 44*a*, 44*b*, and FIG. 75A shows the frame wall surface 44*a*. The frame wall surfaces 44*a*, 44*b* shown in the drawing are formed vertically to the frame first surface 41*a*. Alternatively, the frame wall surfaces 44*a*, 44*b* may be inclined with respect to the frame first surface 41*a* so as to be gradually located outward while advancing toward the frame second surface 41*b*. This also applies to the frame wall surfaces 44*c*, 44*d*.

Figure 76:
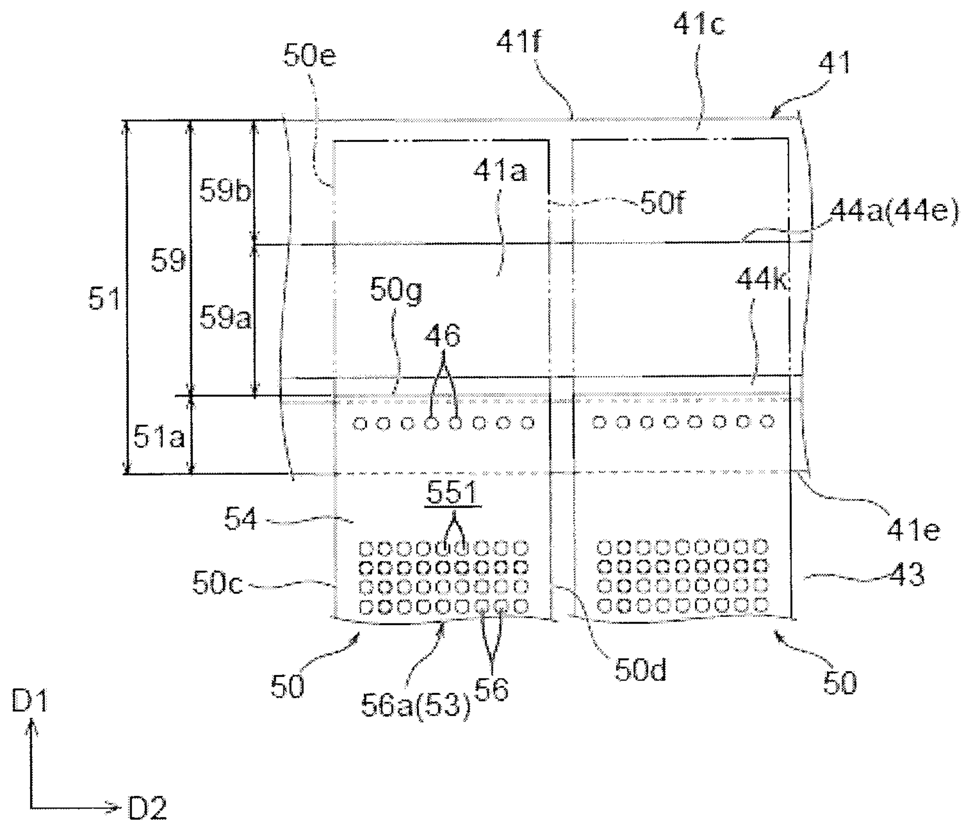
FIG. 76 is a partially enlarged plan view showing the mask apparatus of FIG. 73.

The frame wall surfaces 44*a*, 44*b* include the first wall surface edges 44*e* located at edges adjacent to the frame first surface 41*a*. The first wall surface edges 44*e* overlap associated overlapping portions 51 (described later) of the masks 50 in plan view before a cutting step (described later). The overlapping portions 51 are also referred to as end portions 51. As shown in FIG. 76, the first wall surface edges 44*e* of the frame wall surfaces 44*a*, 44*b* extend in a straight line in the second direction D2 from a first extended line 50*e* of a first mask edge 50*c* (described later) of the mask 50 to a second extended line 50*f* of a second mask edge 50*d* after the cutting step. Here, the term "the first wall surface edge 44*e* extends in a straight line" means that the first wall surface edge 44*e* forms a single straight line in plan view; however, the term does not strictly mean that shape. The term is, for example, used as a concept including that, in a mask alignment step (described later), the first wall surface edge 44*e* is formed in a nonlinear shape within a range in which concentration of stress to be generated in the mask 50 due to reaction force received by the mask 50 from the frame 41 is suppressed.

As described above, the plurality of masks 50 is joined with the frame 41. Thus, as shown in FIG. 73 and FIG. 76, the first wall surface edges 44*e* of the frame wall surfaces 44*a*, 44*b* may extend in a straight line in the second direction D2 from one of the masks 50 to another one of the masks 50. As shown in FIG. 73, the first wall surface edges 44*e* of the frame wall surfaces 44*a*, 44*b* may extend in a straight line in the second direction D2 from one of the masks 50, located farthest to one side in the second direction D2, to another one of the masks 50, located farthest to the other side opposite from the one of the masks 50.

As shown in FIG. 74, the frame wall surfaces 44*a*, 44*b* include the second wall surface edges 44*f* located at edges adjacent to the frame second surface 41*b*. The frame third surface 41*c* extends outward from the second wall surface edges 44*f* and extends to the outer surface 41*f* (described later). The frame third surface 41*c* extends along the frame second surface 41*b*. The frame third surface 41*c* shown in FIG. 74 and FIG. 75A in the drawing is formed parallel to the frame second surface 41*b*. Although not shown in the drawing, the frame third surface 41*c* may be inclined with respect to the frame second surface 41*b* so as to gradually approach the frame second surface 41*b* while advancing outward.

The frame wall surfaces 44c, 44d, as well as the frame wall surfaces 44a, 44b, each may include a first wall surface edge 44e and a second wall surface edge 44f. The frame third surface 41c may also extend outward from the second wall surface edge 44f of each of the frame wall surfaces 44c, 44d. The frame third surface 41c may extend to the outer surface 41f (described later). In other words, as shown in FIG. 73, the frame third surface 41c may be formed in a rectangular frame shape in plan view.

Figure 75B:
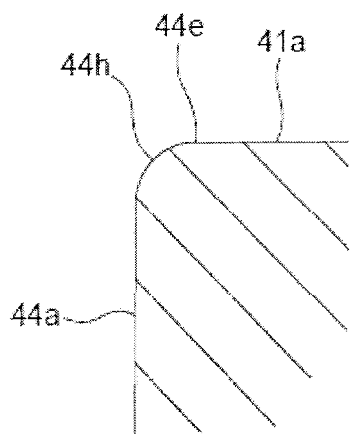
FIG. 75B is a partially enlarged sectional view of FIG. 75A.

As shown in FIG. 75B, in the cross section taken along the thickness direction D3, the frame wall surface 44a may include a curved portion 44h located at a portion adjacent to the frame first surface 41a. The curved portion 44h may have a curved shape. The first wall surface edge 44e is located at an edge adjacent to the frame first surface 41a in the curved portion 44h. In other words, the first wall surface edge 44e is located at a position where the curved portion 44h and the frame first surface 41a intersect with each other. The curved portion 44h may be, for example, formed in a shape that is part of a circular arc. In this case, the curved portion 44h may have, for example, a radius greater than or equal to 0.3 mm in a cross section taken along the thickness direction D3 and vertical to the frame wall surface 44a. An upper limit of the radius of the curved portion 44h in this case may be less than or equal to a dimension in the thickness direction D3 of the frame wall surface 44a. The other frame wall surfaces 44b to 44d may also similarly include the curved portion 44h. The frame wall surface 44a does not need to include the curved portion 44h. In this case, the first wall surface edge 44e is located at a position where the frame wall surface 44a and the frame first surface 41a intersect with each other.

As shown in FIG. 75A, a frame groove 44k that extends in the second direction D2 may be provided on the frame first surface 41a. The frame groove 44k may be located inside the frame wall surfaces 44a, 44b in the first direction D1. The frame groove 44k may be configured such that a cutting device (for example, cutting blade 72) for cutting a mask 50 can be inserted. The frame groove 44k is located between the opening 43 and the frame wall surfaces 44a, 44b in plan view. The frame groove 44k may extend in a straight line in the second direction D2. The frame groove 44k may extend in a straight line in the second direction D2 from one of the masks 50, located farthest to one side in the second direction D2 (for example, the leftmost side in FIG. 73), to another one of the masks 50, located farthest to a side (for example, the rightmost side in FIG. 73) opposite from the one of the masks 50.

The cross section of the frame groove 44k may have any shape as long as the cutting blade 72 can be inserted. FIG. 75A shows an example in which the cross section of the frame groove 44k includes a rectangular shape.

As shown in FIG. 73 to FIG. 75A, the opening 43 is defined by the four inner surfaces 41e. The inner surfaces 41e extend from the frame first surface 41a to the frame second surface 41b. The inner surfaces 41e may be formed vertically to the frame first surface 41a and the frame second surface 41b.

As shown in FIG. 73 to FIG. 75A, the outer periphery of the frame 41 in plan view is defined by the four outer surfaces 41f. The outer surfaces 41f extend from the frame third surface 41c to the frame second surface 41b. The outer surfaces 41f may be formed vertically to the frame third surface 41c and the frame second surface 41b.

As shown in FIG. 73, frame alignment marks 48 may be provided on the frame first surface 41a of the frame 41. The frame alignment marks 48 are used to, for example, align alignment masks 80 (described later). For example, the four frame alignment marks 48 may be provided as shown in FIG. 73. The frame alignment marks 48 may be respectively located near the corners of the opening 43. When the frame alignment marks 48 are used to be aligned with mask alignment marks 81 by applying light, the frame alignment marks 48 may extend through the frame 41. However, the frame alignment marks 48 do not need to extend through the frame 41 as long as the frame alignment marks 48 can be used to be aligned with the mask alignment marks 81. The planar shape of each frame alignment mark 48 is selected and is, for example, a circular shape in FIG. 73.

Next, the masks 50 according to one embodiment of the present disclosure will be described with reference to FIG. 73, FIG. 74, FIG. 76, and FIG. 77. The masks 50 can be manufactured by any manufacturing method. The masks 50 may be manufactured by, for example, etching a rolled material or plating. When the masks 50 are manufactured by plating, each mask 50 may be made up of two or more layers. In this case, the through-holes 56 (described later) are formed so as to extend through these layers.

As shown in FIG. 73 and FIG. 76, each mask 50 may include a first mask edge 50c and a second mask edge 50d located on both sides in the second direction D2 (the width direction of the mask 50) in plan view. The first mask edge 50c is located at one of side edges (the left side in FIG. 73) in the second direction D2 and extends from a first mask end 50g (described later) to a second mask end 50h (described later). The second mask edge 50d is located at the other one of the side edges (the right side in FIG. 73) in the second direction D2 and extends from the first mask end 50g to the second mask end 50h. The mask edges 50c, 50d extend in the first direction D1. FIG. 76 shows a first extended line 50e extended from the first mask edge 50c and shows a second extended line 50f extended from the second mask edge 50d. The extended lines 50e, 50f are lines extending outward in the first direction D1 from the mask ends 50g, 50h (described later) and may be lines extending in a straight line from the associated mask edges 50c, 50d.

Each mask 50 may include the first mask end 50g and the second mask end 50h located on both sides in the first direction D1 perpendicular to the second direction D2. The first mask end 50g is located at one (upper-side in FIG. 73) end in the first direction D1 and extends from the first mask edge 50c to the second mask edge 50d. The second mask end 50h is located at the other (lower-side in FIG. 73) end in the first direction D1 and extends from the first mask edge 50c to the second mask edge 50d. The mask ends 50g, 50h extend in the second direction D2. The mask end 50g is located inside the first wall surface edge 44e of the associated frame wall surface 44a of the frame 41 in the first direction D1 in plan view. The mask end 50h is located inside the first wall surface edge 44e of the associated frame wall surface 44b of the frame 41 in the first direction D1 in plan view. More specifically, the first mask end 50g is located inside (lower side in FIG. 73) the first wall surface edge 44e of the frame wall surface 44a in the first direction D1, and the second mask end 50h is located inside (upper side in FIG. 73) the first wall surface edge 44e of the frame wall surface 44b in the first direction D1. Each of the mask ends 50g, 50h is formed by cutting the mask 50 with the cutting blade 72 (described later) and is located at a position that overlaps the associated frame groove 44k in plan view.

As shown in FIG. 74 and FIG. 76, each mask 50 may include the pair of end portions 51 that overlap the frame first surface 41a and that are located on both sides in the first direction D1. Each end portion 51 is a portion located between the first mask edge 50c and the second mask edge

50*d* and located outside the through-hole group 56*a* (described later) in plan view in the first direction D1. Part of each end portion 51 is cut and removed in the cutting step (described later). More specifically, each end portion 51 includes a mask welding portion 51*a* to be welded with the frame 41 to form a welded portion 46 (described later) and a removal portion 59 located outside the mask welding portion 51*a* in plan view in the first direction D1 and to be cut and removed in the cutting step. The removal portion 59 is made up of a pressing portion 59*a* to be pressed against the frame 41 together with the mask welding portion 51*a* in the mask alignment step (described later), and a holding portion 59*b* that is held by mask clamps 70 (described later). In FIG. 76, the removal portions 59 are represented by the alternate long and two-short dashed lines.

As shown in FIG. 74, each mask 50 may include two or more through-holes 56. Each mask 50 may include the through-hole group 56*a* made up of two or more through-holes 56. In the present embodiment, as shown in FIG. 73, each mask 50 includes the two or more through-hole groups 56*a* arranged in the first direction D1. The through-hole groups 56*a* are located between the first mask edge 50*c* and the second mask edge 50*d* in the second direction D2 and located between the pair of end portions 51 in the first direction D1.

As shown in FIG. 74, the through-holes 56 extend from the first surface 551 to the second surface 552 and extend through the mask 50. To simplify the drawing, FIG. 74 shows an example in which the wall surface of each through-hole 56 is inclined in a straight line with respect to a central axis CL so as to be spaced away from the central axis CL as a point advances from the first surface 551 toward the second surface 552. In this way, the wall surface of each through-hole 56 may be formed such that the opening dimension on the first surface 551 is less than the opening dimension on the second surface 552.

Figure 77:
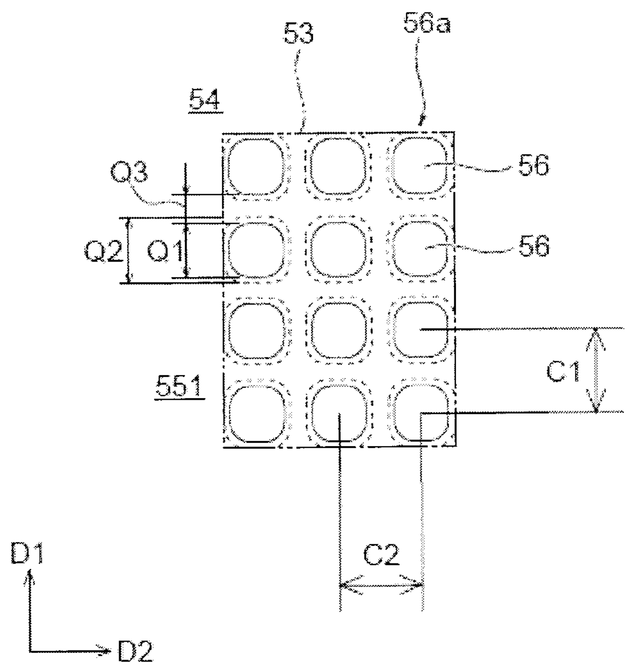
FIG. 77 is an enlarged plan view showing a through-hole group of a mask of FIG. 73.

As shown in FIG. 77, the through-holes 56 may make up the through-hole group 56*a*. The through-hole group 56*a* overlaps the opening 43 (see FIG. 73 and FIG. 74) of the frame 41 and is exposed through the opening 43. All the through-hole groups 56*a* may overlap the opening 43. As shown in FIG. 77, each through-hole group 56*a* may be made up of a group of two or more through-holes 56. A through-hole group 56*a* is used as a term that means a collection of a plurality of regularly arranged through-holes 56. Outer edge through-holes 56 that are components of one through-hole group 56*a* are through-holes located farthest to the outer side among the plurality of through-holes 56 regularly arranged similarly. Through-holes 56 regularly arranged similarly and intended to pass a vapor deposition material 7 do not need to be present outside the outer edge through-holes 56. However, through-holes or recessed portions for other purposes (not shown) may be formed outside the outer edge through-holes 56. These through-holes or recessed portions for other purposes may be formed without the regularity of arrangement of the through-holes 56 or may be regarded as not belonging to the through-hole group 56*a*.

As shown in FIG. 73, a plurality of through-hole groups 56*a* may be arranged at predetermined intervals (at a predetermined pitch). The through-hole groups 56*a* may be arranged at predetermined intervals in the first direction D1. Although not shown in the drawing, the through-hole groups 56*a* may be arranged in parallel in the second direction D2 and the first direction D1. In other words, the through-hole groups 56*a* that make up one line along the second direction D2 and the through-hole groups 56*a* that make up another line adjacent to the one line in the first direction D1 may be aligned in the first direction D1.

As shown in FIG. 77, in one through-hole group 56*a*, a plurality of through-holes 56 may be arranged at predetermined intervals (at a predetermined pitch). The through-holes 56 may be arranged at predetermined intervals (the reference sign C2 shown in FIG. 77) in the second direction D2 and may be arranged at predetermined intervals (the reference sign C1 shown in FIG. 77) in the first direction D1. The arrangement pitch C1 of the through-holes 56 in the first direction D1 and the arrangement pitch C2 of the through-holes 56 in the second direction D2 may be different or may be equal. FIG. 77 shows an example in which the arrangement pitch C2 in the second direction D2 is equal to the arrangement pitch C1 in the first direction D1. As shown in FIG. 77, the through-holes 56 may be arranged in parallel. More specifically, the through-holes 56 that make up one line along the second direction D2 and the through-holes 56 that make up another line adjacent to the one line in the first direction D1 may be aligned in the first direction D1. The arrangement pitches C1, C2 of the through-holes 56 may be, for example, determined as follows according to the pixel density of a display device or a projection device.

When the pixel density is higher than or equal to 600 ppi: the pitch is less than or equal to 42.3 μm.

When the pixel density is higher than or equal to 1200 ppi: the pitch is less than or equal to 21.2 μm.

When the pixel density is higher than or equal to 3000 ppi: the pitch is less than or equal to 8.5 μm.

When the pixel density is higher than or equal to 5000 ppi: the pitch is less than or equal to 5.1 μm.

A display device or a projection device with a pixel density of 600 ppi may be used to display an image or a video at a distance of about 15 cm from an eyeball and may be used as, for example, an organic device for a smartphone. A display device or a projection device with a pixel density of 1200 ppi may be used to display an image or a video at a distance of about 8 cm from an eyeball and may be, for example, used to display or project an image or a video for presenting virtual reality (so-called VR). A display device or a projection device with a pixel density of 3000 ppi may be used to display an image or a video at a distance of about 3 cm from an eyeball and may be, for example, used to display or project an image or a video for presenting augmented reality (so-called AR). A display device or a projection device with a pixel density of 5000 ppi may be used to display an image or a video at a distance of about 2 cm from an eyeball and may be, for example, used to display or project an image or a video for expressing augmented reality.

Through-holes 56 in one through-hole group 56*a* may be arranged not in parallel arrangement but in staggered arrangement (not shown). In other words, the through-holes 56 that make up one line along the second direction D2 and the through-holes 56 that make up another line adjacent to the one line in the first direction D1 do not need to be aligned in the first direction D1. The through-holes 56 that make up one line and the through-holes 56 that make up another line adjacent to the one line may be shifted in the second direction D2. The shift amount may be half of the arrangement pitch C2 in the second direction D2, and the shift amount may be selected.

As shown in FIG. 77, each through-hole 56 may have a substantially rectangular outline in plan view. In this case, four corners of the outline of the through-hole 56 may be curved. The shape of the outline can be optionally determined according to the shape of each pixel. Each through-hole 56 may have, for example, another polygonal shape, such as a hexagonal shape and an octagonal shape, and may have a circular shape. The shape of the outline may be a combination of a plurality of shapes. The through-holes 56 may have different outline shapes from one another. When the through-hole 56 has an outline of a polygonal shape, the opening dimension of the through-hole 56 may be the interval between a pair of opposite sides in the polygon as shown in FIG. 77.

In FIG. 74 and FIG. 77, the opening dimension of the through-hole 56 on the first surface 551 of the mask 50 is represented by the reference sign Q1. The opening dimension of the through-hole 56 on the second surface 552 of the mask 50 is represented by the reference sign Q2. The reference sign Q3 represents a distance between the mutually adjacent through-holes 56 on the first surface 551. In FIG. 77, since the planar shape of each through-hole 56 is a square, the opening dimension of the through-hole 56 in the second direction D2 is equal to the opening dimension of the through-hole 56 in the first direction D1. Typically, the dimension of the through-hole 56 in the first direction D1 is represented by the reference signs Q1, Q2.

The dimension Q1, the dimension Q2, and the dimension Q3 are determined like, for example, the following Table 1 according to the pixel density of a display device or a projection device.

TABLE 1

| Pixel Density | Q1 | Q2 | Q3 |
|---|---|---|---|
| 600 ppi | 14.0 μm or Greater 28.0 μm or Less | 14.0 μm or Greater 40.0 μm or Less | 14.0 μm or Greater 28.0 μm or Less |
| 1200 ppi | 7.0 μm or Greater 15.0 μm or Less | 7.0 μm or Greater 19.0 μm or Less | 6.0 μm or Greater 14.0 μm or Less |
| 3000 ppi | 3.0 μm or Greater 6.0 μm or Less | 3.0 μm or Greater 7.0 μm or Less | 2.5 μm or Greater 5.5 μm or Less |
| 5000 ppi | 1.7 μm or Greater 3.4 μm or Less | 1.7 μm or Greater 4.0 μm or Less | 1.7 μm or Greater 3.4 μm or Less |

The through-hole group 56*a* may be referred to as effective region 53. A region located around the effective region 53 may be referred to as peripheral region 54. In the present embodiment, the peripheral region 54 surrounds one effective region 53. The outline of the effective region 53 may be defined by a line that is externally tangent to the through-holes 56 located farthest to the outer side within the associated through-hole group 56*a*. More specifically, the outline of the effective region 53 may be defined by a line that is tangent to the openings of the through-holes 56. In the example shown in FIG. 77, since the through-holes 56 are arranged parallel, the outline of the effective region 53 is the outline of a substantially rectangular shape. Although not shown in the drawing, each effective region 53 can have an outline of various shapes according to the shape of a display region of an organic device. For example, each effective region 53 may have an outline of a circular shape.

As shown in FIG. 74, each mask 50 has a thickness T from the first surface 551 to the second surface 552. For example, the thickness T may be greater than or equal to 2 μm, may be greater than or equal to 5 μm, may be greater than or equal to 10 μm, or may be greater than or equal to 15 μm. When the thickness T is greater than or equal to 2 μm, the mechanical strength of the mask 50 is ensured. For example, the thickness T may be less than or equal to 20 μm, may be less than or equal to 30 μm, may be less than or equal to 40 μm, or may be less than or equal to 50 μm. When the thickness T is less than or equal to 50 μm, occurrence of a shadow is suppressed. The range of the thickness T may be determined from a first group consisting of 2 μm, 5 μm, 10 μm, and 15 μm and/or a second group consisting of 20 μm, 30 μm, 40 μm, and 50 μm. The range of the thickness T may be determined by a combination of any one of the values included in the first group and any one of the values included in the second group. The range of the thickness T may be determined by a combination of any two of the values included in the first group. The range of the thickness T may be determined by a combination of any two of the values included in the second group. For example, the range of the thickness T may be greater than or equal to 2 μm and less than or equal to 50 μm, may be greater than or equal to 2 μm and less than or equal to 40 μm, may be greater than or equal to 2 μm and less than or equal to 30 μm, may be greater than or equal to 2 μm and less than or equal to 20 μm, may be greater than or equal to 2 μm and less than or equal to 15 μm, may be greater than or equal to 2 μm and less than or equal to 10 μm, may be greater than or equal to 2 μm and less than or equal to 5 μm, may be greater than or equal to 5 μm and less than or equal to 50 μm, may be greater than or equal to 5 μm and less than or equal to 40 μm, may be greater than or equal to 5 μm and less than or equal to 30 μm, may be greater than or equal to 5 μm and less than or equal to 20 μm, may be greater than or equal to 5 μm and less than or equal to 15 μm, may be greater than or equal to 5 μm and less than or equal to 10 μm, may be greater than or equal to 10 μm and less than or equal to 50 μm, may be greater than or equal to 10 μm and less than or equal to 40 μm, may be greater than or equal to 10 μm and less than or equal to 30 μm, may be greater than or equal to 10 μm and less than or equal to 20 μm, may be greater than or equal to 10 μm and less than or equal to 15 μm, may be greater than or equal to 15 μm and less than or equal to 50 μm, may be greater than or equal to 15 μm and less than or equal to 40 μm, may be greater than or equal to 15 μm and less than or equal to 30 μm, may be greater than or equal to 15 μm and less than or equal to 20 μm, may be greater than or equal to 20 μm and less than or equal to 50 μm, may be greater than or equal to 20 μm and less than or equal to 40 μm, may be greater than or equal to 20 μm and less than or equal to 30 μm, may be greater than or equal to 30 μm and less than or equal to 50 μm, may be greater than or equal to 30 μm and less than or equal to 40 μm, or may be greater than or equal to 40 μm and less than or equal to 50 μm.

As shown in FIG. 74 and FIG. 75A, each mask 50 is fixedly joined with the frame 41. For example, the mask 50 may be joined with the frame 41 by welding. For example, the mask 50 may be joined with the frame 41 by the welded portion 46 formed by spot welding. As shown in FIG. 76, the welded portion 46 may be formed at a position between the opening 43 and the frame groove 44*k*. As shown in FIG. 73, one mask 50 may be joined with the frame 41 by a plurality of spot-shaped welded portions 46. In this case, the plurality of welded portions 46 may be arranged in the second direction D2. Alternatively, although not shown in the drawing, the welded portion 46 may be formed so as to continuously extend in the second direction D2.

As shown in FIG. 73, two alignment masks 80 may be provided on the frame 41. One of the alignment masks 80 is located closer to the frame wall surface 44*d* with respect to the mask 50 located closest to the frame wall surface 44*d*. The other one of the alignment masks 80 is located closer the frame wall surface 44*c* with respect to the mask 50 located closest to the frame wall surface 44*c* side. In FIG. 73, one of the alignment masks 80 is located on the left side of the mask 50 located closest to the left side, and the other one of the alignment masks 80 is located on the right side of the mask 50 located closest to the right side. The alignment masks 80 are joined with the frame first surface 41*a* of the frame 41. The alignment masks 80 may be stretched to be fixed to the frame 41.

Each alignment mask 80 includes two mask alignment marks 81. Each mask alignment mark 81 is located at a position that overlaps the associated frame alignment mark 48 in plan view. When the mask alignment marks 81 are aligned with the frame alignment marks 48 by applying light, the mask alignment marks 81 may extend through the alignment mask 80. However, the mask alignment marks 81 do not need to extend through the alignment mask 80 as long as the mask alignment marks 81 can be aligned with the frame alignment marks 48. The planar shape of each mask alignment mark 81 is selected and is, for example, a circular shape in FIG. 73. The diameter of each mask alignment mark 81 may be less than the diameter of each frame alignment mark 48.

Next, the method of manufacturing the thus configured mask apparatus 15 according to the present embodiment will be described with reference to FIG. 78 to FIG. 89. The method of manufacturing the mask apparatus 15 according to the present embodiment may include a frame preparation step, a mask preparation step, a holding step, a placement step, a mask alignment step, a joining step, a detachment step, and a cutting step.

Initially, as the frame preparation step, the frame 41 is prepared. The frame 41 can be manufactured by any manufacturing method. For example, the frame 41 shown in FIG. 73 to FIG. 75B may be manufactured by machining a plate material, a forging material, or the like. The frame 41 may be attached to a stretching apparatus (not shown). The stretching apparatus is an apparatus to fix the mask 50 to the frame 41 while applying a tension to the mask 50. After that, the alignment mask 80 (see FIG. 73) may be joined with the frame 41. At this time, the mask alignment marks 81 of the alignment mask 80 are aligned with the frame alignment marks 48 of the frame 41.

Initially, as the mask preparation step, the mask 50 is prepared. The mask 50 can be manufactured by any manufacturing method, such as etching or plating of a rolled material, as described above.

Figure 78:
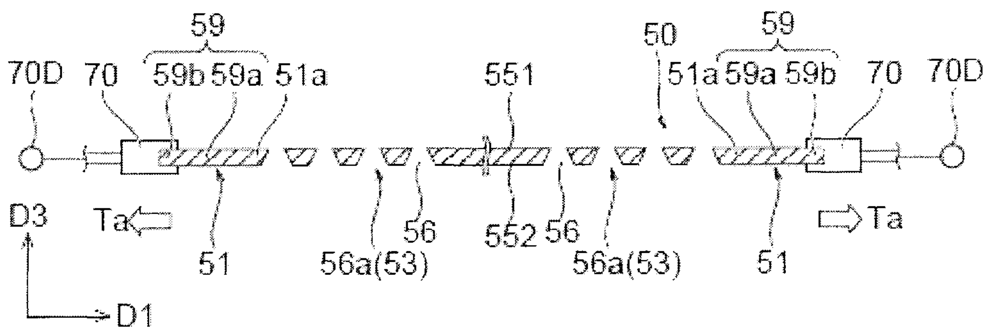
FIG. 78 is a view showing a holding step in a method of manufacturing the mask apparatus according to the third embodiment.

Subsequently, as the holding step, the mask 50 is held by the mechanical mask clamps 70. In this case, as shown in FIG. 78, the holding portions 59*b* of the removal portions 59 located at both end portions in the first direction D1 of the mask 50 may be held by the mask clamps 70 (see FIG. 81). One of the holding portions 59*b* may be held by the two mask clamps 70 at different positions in the second direction D2. A drive unit 70D may be coupled to each mask clamp 70. The drive unit 70D may be configured to be capable of individually pulling the mask clamps 70. A first tension Ta in the first direction D1 may be applied to the mask 50 by the drive unit 70D pulling the mask clamps 70 in the first direction D1. The first tension Ta is a tension to be applied to the mask 50 in the holding step. The first tension Ta may be a relatively small value to such an extent that large warpage of the mask 50 is suppressed. Here, a tension to be applied to the mask 50 may be a tension to be applied from the mask clamps 70 to the mask 50 and may be a tension to be applied to the mask 50 as a result of the mask clamps 70 pulling the mask 50. A tension to be applied to the mask 50 may be checked through a display unit (not shown) or the like of the drive unit 70D. When the mask 50 is pressed against the frame 41, a tension in the effective regions 53 of the mask 50 is less than a tension to be applied from the mask clamps 70 to the mask 50.

Figure 79:
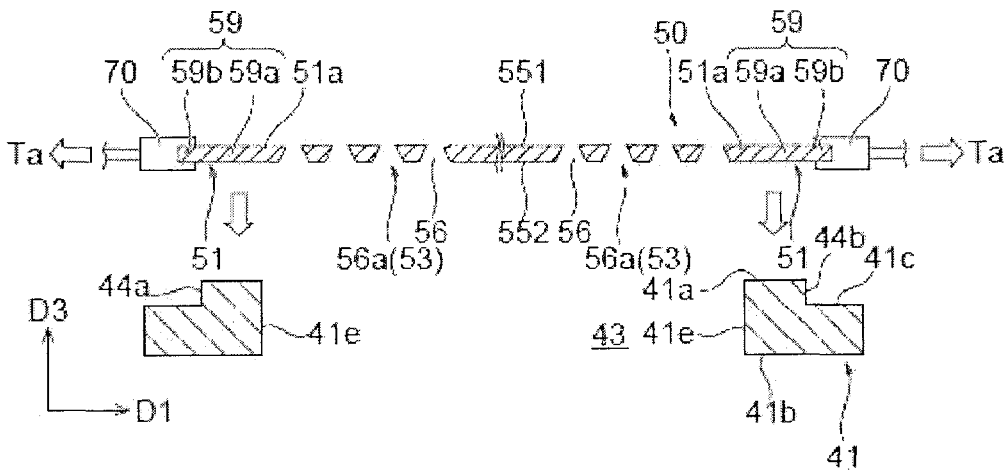
FIG. 79 is a view showing a placement step in the method of manufacturing the mask apparatus according to the third embodiment.
Figure 81:
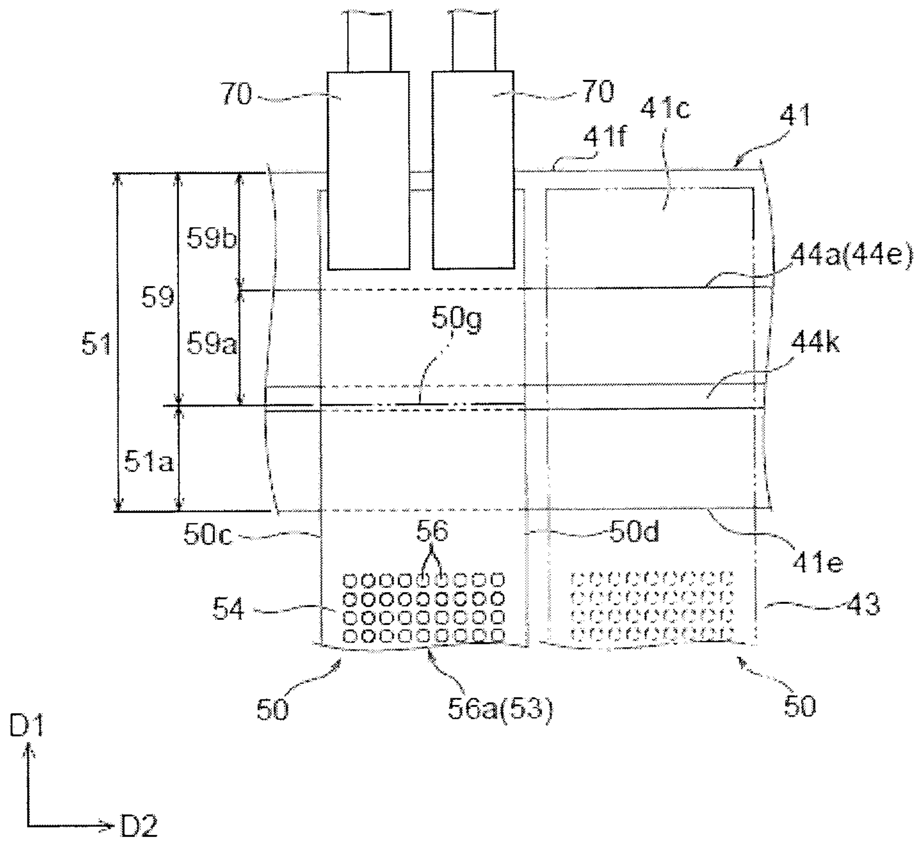
FIG. 81 is a partially enlarged plan view showing the mask apparatus in the mask alignment step of the method of manufacturing the mask apparatus according to the third embodiment.

Next, as the placement step, as shown in FIG. 79, the mask 50 is placed on the frame 41. More specifically, initially, the mask 50 is placed above the frame 41, and then the mask 50 is lowered and brought into contact with the frame 41. In this case, as shown in FIG. 81, the end portions 51 of the mask 50 respectively overlap the first wall surface edges 44*e* of the frame wall surfaces 44*a*, 44*b* in plan view and overlap the frame first surface 41*a*. In addition, the mask 50 is placed such that the first wall surface edges 44*e* extend in a straight line in the second direction D2 from the first mask edge 50*c* of the mask 50 to the second mask edge 50*d*. The mask 50 is placed such that a direction perpendicular to the first wall surface edges 44*e* and the frame grooves 44*k* is the longitudinal direction. In the placement step, the mask 50 may be placed in a state where the first tension Ta is applied continuously from the holding step.

Figure 80A:
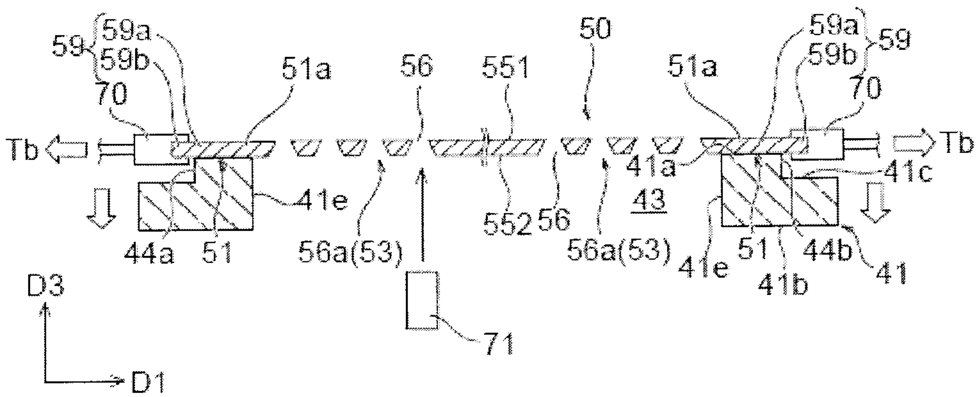
FIG. 80A is a view showing a first through-hole checking step of a mask alignment step in the method of manufacturing the mask apparatus according to the third embodiment.
Figure 80B:
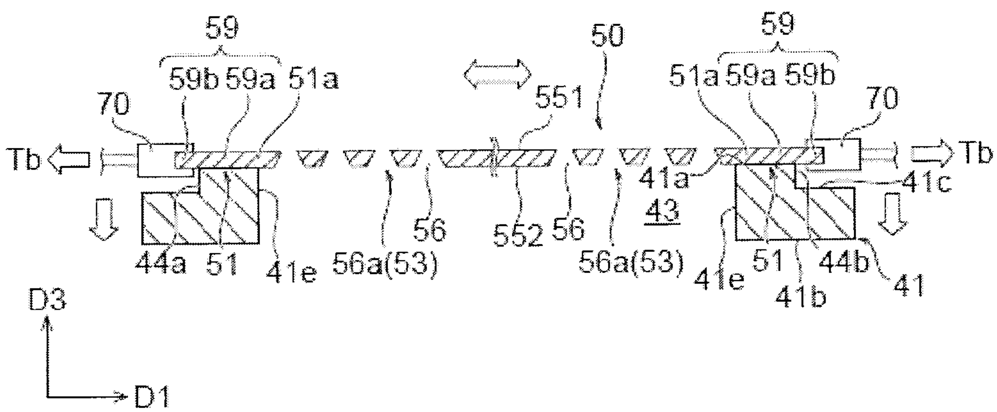
FIG. 80B is a view showing a moving step of the mask alignment step in the method of manufacturing the mask apparatus according to the third embodiment.

Subsequently, as the mask alignment step, as shown in FIG. 80A and FIG. 80B, the mask 50 is aligned with the frame 41. In the mask alignment step, the mask 50 is pulled in the first direction D1 by a second tension Tb, and the mask 50 is pressed against the frame 41. The second tension Tb is a tension to be applied to the mask 50 in the mask alignment step. The second tension Tb may be greater than the first tension Ta.

The mask alignment step may include a tension increasing step, a first through-hole checking step, a moving step, a second through-hole checking step, a tension adjustment step, and a third through-hole checking step. The first through-hole checking step is an example of the first checking step. The second through-hole checking step is an example of the second checking step and is also an example of the third checking step. The third through-hole checking step is an example of the fourth checking step.

In the tension increasing step, a tension to be applied to the mask 50 is increased. More specifically, the drive unit 70D (see FIG. 78) increases the tensile force of each mask clamp 70. Thus, a tension to be applied to the mask 50 is increased from the first tension Ta to the second tension Tb.

In the first through-hole checking step, as shown in FIG. 80A, the position of the through-hole 56 with respect to the frame 41 is checked. More specifically, it may be checked whether the through-hole 56 is positioned within an allowable range with respect to a desired position. For example, the coordinates of the through-hole 56 with respect to an optionally set origin may be measured, and the measured coordinates may be compared with target coordinates of the through-hole 56. For example, the coordinates of the through-hole 56 may be measured by setting the center of the four mask alignment marks 81 (see FIG. 73) as an origin. For example, an intersection of two straight lines each passing through the centers of the two diagonally positioned mask alignment marks 81 may be set as an origin. The center of each mask alignment mark 81 may be measured by taking an image of the alignment mask 80 from the lower side with a camera 71 and performing image analysis. The coordinates of the through-hole 56 may be the central point of the through-hole 56 in plan view. The coordinates of the through-hole 56 may be measured by taking an image of the mask 50 from the lower side with the camera 71 and performing image analysis. Measurement of coordinates may be performed for a plurality of the through-holes 56, and the positions of the plurality of through-holes 56 may be checked. A position deviation amount and a position deviation direction may be obtained in accordance with a check result on the positions of these through-holes 56. In the first through-hole checking step, the second tension Tb may be applied to the mask 50, and the mask 50 may be pressed against the frame 41.

As a result of position check of the through-holes 56 in the first through-hole checking step, when the through-hole 56 is positioned within the allowable range with respect to the desired position, the mask alignment step may be ended, and the process may proceed to the joining step. In this case, the moving step and the like (described later) may be unnecessary. When the through-hole 56 is positioned within the allowable range, the second tension Tb applied to the mask 50 in the first through-hole checking step is equal to a joint tension Td (described later). On the other hand, when the through-hole 56 is not positioned within the allowable range with respect to the desired position, the moving step is performed.

In the moving step, as shown in FIG. 80B, the mask 50 is moved in any one of directions in a two-dimensional plane defined by the second direction D2 and the first direction D1. For example, the mask 50 may be moved in the second direction D2 in FIG. 81, and the mask 50 may be moved in the first direction D1. Alternatively, the mask 50 may be pivoted in plan view. Here, the mask 50 may be moved with respect to the frame 41 by moving the mask clamps 70. In the moving step, the mask 50 may be moved in accordance with a check result on the position of the through-hole 56 in the first through-hole checking step. The amount of movement of the mask 50 may be a value according to the position deviation amount obtained in the first through-hole checking step. The direction of movement of the mask 50 may be a direction according to the position deviation direction obtained in the first through-hole checking step. In the moving step, the mask 50 is moved with respect to the frame 41 while being pressed against the frame 41 without being lifted. Thus, lifting and lowering are not needed to move the mask 50, so time consumed in the mask alignment step is shortened. In the moving step, the second tension Tb may be applied to the mask 50.

In the second through-hole checking step, the position of the through-hole 56 with respect to the frame 41 is checked. The second through-hole checking step may be performed similarly to the first through-hole checking step.

As a result of position check of the through-hole 56 in the second through-hole checking step, when the through-hole 56 is positioned within the allowable range with respect to the desired position, the mask alignment step may be ended, and the process may proceed to the joining step. In this case, the tension adjustment step and the like (described later) may be unnecessary. When the through-hole 56 is positioned within the allowable range, the second tension Tb applied to the mask 50 in the second through-hole checking step is equal to a joint tension Td (described later). On the other hand, when the through-hole 56 is not positioned within the allowable range with respect to the desired position, the tension adjustment step is performed.

Figure 80C:
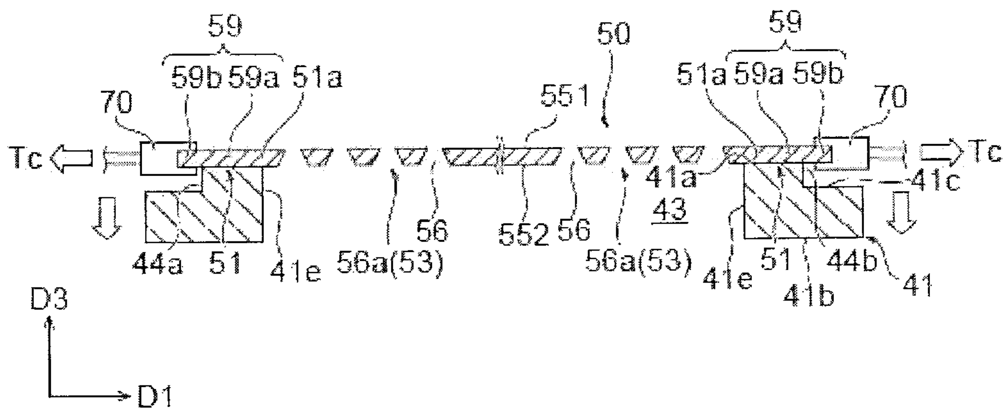
FIG. 80C is a view showing a tension adjustment step of the mask alignment step in the method of manufacturing the mask apparatus according to the third embodiment.

In the tension adjustment step, as shown in FIG. 80C, the second tension Tb to be applied to the mask 50 is adjusted in accordance with a check result on the position of the through-hole 56 in the second through-hole checking step. More specifically, a force of the drive unit 70D to pull the mask clamps 70 is adjusted such that each of the through-holes 56 is positioned within the allowable range with respect to the desired position. Thus, an associated one of the through-holes 56 is aligned with each of the first electrode layers 120 on the substrate 110 in the close contact step (described later) by adjusting the positions of the through-holes 56. The warpage amount of the mask 50 can also be adjusted to a desired warpage amount. By individually adjusting the tensile force of each mask clamp 70, the positions of part of the all the through-holes 56 of the mask 50 can be adjusted, and the through-holes 56 can be positioned within their allowable ranges. In the tension adjustment step, the positions of the through-holes 56 may be adjusted by changing a tension without moving the mask clamps 70. The tensile force of each mask clamp 70 is individually adjusted, with the result that a tension to be applied to the mask 50 is adjusted. The adjusted tension is referred to as third tension Tc. In the tension adjustment step as well, the mask 50 may be pressed against the frame 41. A difference between the third tension Tc and the second tension Tb may be smaller than a difference between the first tension Ta and the second tension Tb.

After that, the third through-hole checking step is performed. In the third through-hole checking step, as well as the first through-hole checking step, the position of the through-hole 56 with respect to the frame 41 is checked. In the third through-hole checking step, the third tension Tc may be applied to the mask 50, and the mask 50 may be pressed against the frame 41.

As a result of position check of the through-hole 56 in the third through-hole checking step, when the through-hole 56 is positioned within the allowable range with respect to the desired position, the mask alignment step may be ended, and the process may proceed to the joining step. In this case, the third tension Tc applied to the mask 50 in the third through-hole checking step is equal to the joint tension Td (described later). On the other hand, when the through-hole 56 is not positioned within the allowable range with respect to the desired position, the tension adjustment step and the third through-hole checking step may be performed again. Until the through-hole 56 is positioned within the allowable range with respect to the desired position, the tension adjustment step and the third through-hole checking step may be repeatedly performed. A tension applied to the mask 50 in the last third through-hole checking step may be referred to as third tension Tc. Depending on the position check result of the second through-hole checking step, the moving step may be performed again, and the mask 50 may be moved with respect to the frame 41. Depending on the position check result of the third through-hole checking step, the moving step may be performed again, and the mask 50 may be moved with respect to the frame 41.

Depending on the position check result of the first through-hole checking step, the moving step and the second through-hole checking step may be omitted, and the tension adjustment step may be performed. In other words, as the alignment step, the first through-hole checking step and the moving step may be omitted, and the second through-hole checking step may be performed.

As described above, in the mask alignment step, the mask 50 is pressed against the frame 41. The pressing force may be a force to such an extent that lifting of the mask 50 from the frame 41 is suppressed. For example, as shown in FIG. 81, the case where each of the holding portions 59*b* located at both sides of the mask 50 in the second direction D2 is held by the two mask clamps 70 is described. In the mask alignment step, a tension in the first direction D1 to be applied to one of the holding portions 59*b* is the second tension Tb. A tension to be applied to the other one of the holding portions 59*b* is also the same. When the mask clamps 70 are relatively lowered in a state where the tension is applied, the tension is converted to a pressing force, and the mask 50 is pressed against the frame 41. For example, the second surface 552 at each holding portion 59*b* held by the mask clamp 70 may be lowered from the frame first surface 41*a* within the range greater than or equal to 0.25 mm and less than or equal to 1.00 mm. In this case, the thickness of the mask 50 may be 20 μm, the pixel density may be 600 ppi (equivalent to full high vision), and the effective region 53 may correspond to a display region of 5.5 inches. A pressing force is applied to the mask 50 when the mask clamps 70 are displaced downward. Therefore, the mask 50 receives a reaction force from the first wall surface edges 44*e* of the frame wall surfaces 44*a*, 44*b*. However, as shown in FIG. 81, the mask 50 is placed on the frame 41 such that the first wall surface edges 44*e* extend in a straight line in the second direction D2 from the first mask edge 50*c* of the mask 50 to the second mask edge 50*d*. Thus, a reaction force to be received from each first wall surface edge 44*e* is uniformed in the width direction of the mask 50.

Figure 82:
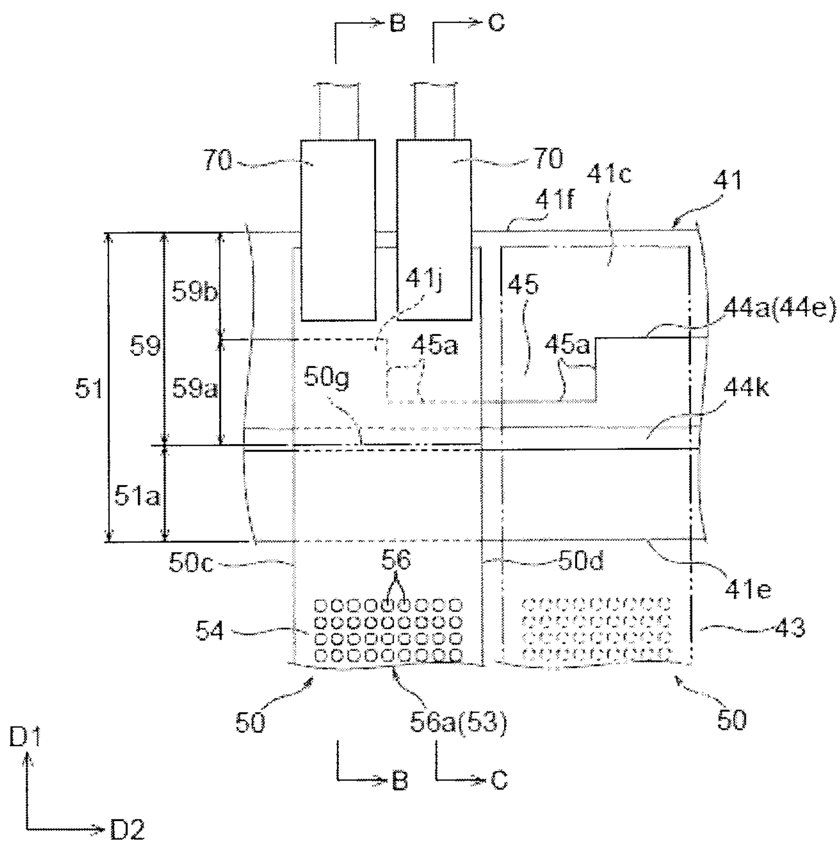
FIG. 82 is a partially enlarged plan view showing the mask apparatus in the mask alignment step of the method of manufacturing the mask apparatus.
Figure 83:
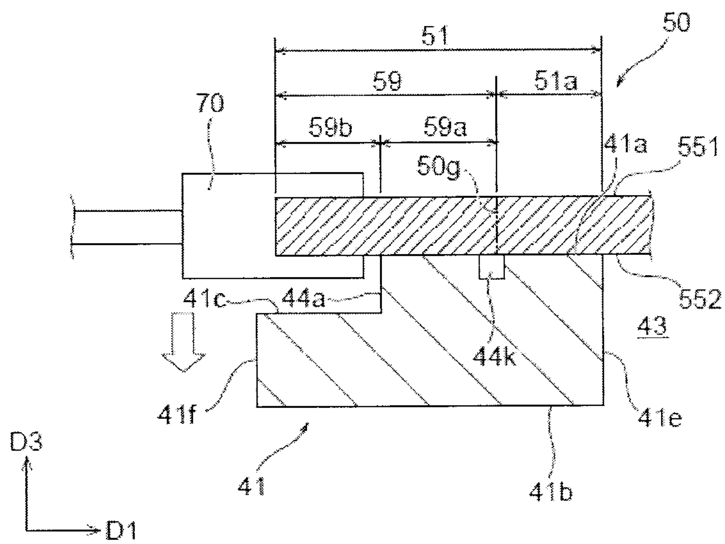
FIG. 83 is a view schematically showing a cross section taken along the line B-B in FIG. 82.

Here, the case where the substrate 110 that is a component of the organic device 100 is held by a mechanical substrate clamp 73 (see FIG. 84) in the vapor deposition step (described later) will be described with reference to FIG. 82 to FIG. 84. In this case, the substrate 110 is brought into close contact with the mask 50 of the mask apparatus 15 in a state where the substrate 110 is held by the substrate clamp 73. Since the mask 50 is fixedly joined with the frame 41, frame recessed portions 45 for avoiding interference with the substrate clamp 73 are formed on the frame first surface 41*a* of the frame 41. As shown in FIG. 82, each frame recessed portion 45 is formed in a rectangular shape so as to be recessed from the frame wall surface 44*a* or the frame wall surface 44*b* in plan view. A recess end edge 45*a* of each frame recessed portion 45 adjacent to the frame first surface 41*a* is also similarly formed in a rectangular shape so as to be recessed in plan view. Each of the end portions 51 of the mask 50 to be fixed to the frame 41 is placed so as to partially overlap the frame recessed portions 45. The frame 41 shown in FIG. 82 has a similar shape to the frame 41 shown in FIG. 73 to FIG. 75A, and the like except the frame recessed portions 45 are provided, so the frame 41 will be described by using like reference signs for the sake of convenience.

When the mask 50 is pressed against the frame first surface 41*a* on which the thus configured frame recessed portions 45 are provided, the mask 50 receives a reaction force from each of the first wall surface edges 44*e* of the frame wall surfaces 44*a*, 44*b* and also receives a reaction force from each of the recess end edges 45*a* of the frame recessed portions 45. The position of each first wall surface edge 44*e* in the first direction D1 is located outside the position of the associated recess end edge 45*a* in the first direction D1. In other words, a position to receive a reaction force from the first wall surface edge 44*e* is located relatively outside (left side in FIG. 83) in the first direction D1 as shown in FIG. 83. On the other hand, a position to receive a reaction force from the recess end edge 45*a* is located relatively inside (right side in FIG. 84) in the first direction D1 as shown in FIG. 84. In this way, the position to receive a reaction force from the first wall surface edge 44*e* and the position to receive a reaction force from the recess end edge 45*a* are different in the first direction D1. Therefore, a reaction force to be received by the mask 50 from the frame 41 tends to be imbalanced in the width direction of the mask 50.

Figure 84:
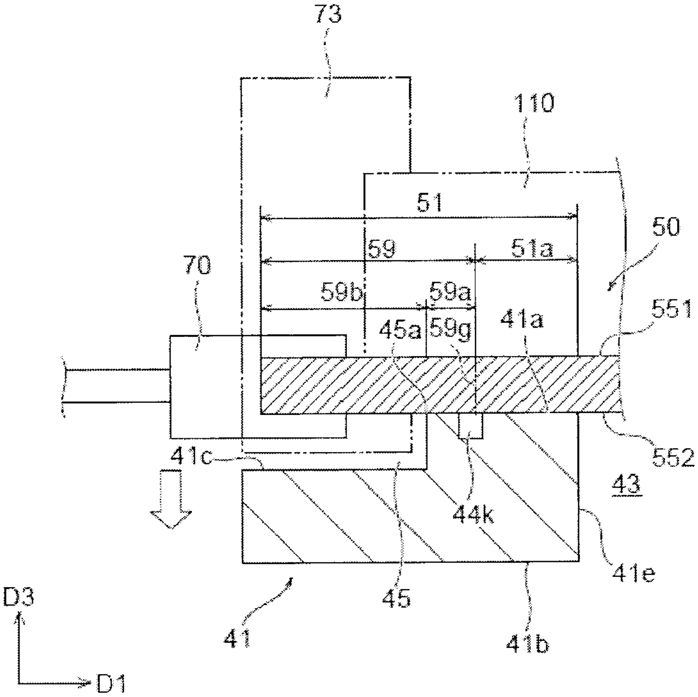
FIG. 84 is a view schematically showing a cross section taken along the line C-C in FIG. 82.

In other words, the position to receive a reaction force from each of the first wall surface edges 44*e* of the frame wall surfaces 44*a*, 44*b* (see FIG. 83) is closer to the mask clamps 70 with respect to the position to receive a reaction force from an associated one of the recess end edges 45*a* of the frame recessed portions 45 (see FIG. 84). Therefore, a reaction force to be received from each of the first wall surface edges 44*e* of the frame wall surfaces 44*a*, 44*b* can be greater than a reaction force to be received from an associated one of the recess end edges 45*a* of the frame recessed portions 45. Particularly, a reaction force can increase near the intersection between each of the first wall surface edges 44*e* of the frame wall surfaces 44*a*, 44*b* and an associated one of the recess end edges 45*a* of the frame recessed portions 45 (the corner 41*j* of the frame first surface 41*a* in plan view). For this reason, a stress to be generated in the mask 50 tends to concentrate on the corner 41*j*. When the mask 50 is moved while being pressed against the frame 41 in this case, there is presumably a possibility that deformation or breakage occurs in the mask 50 at the corner 41*j*.

Therefore, when the mask 50 is moved to be aligned with the frame 41 as shown in FIG. 82, not the mask 50 is moved while being pressed against the frame 41, but the mask 50 is moved in a state where the mask 50 is lifted to be spaced apart from the frame first surface 41*a*. When the moving step for the mask 50 ends, the mask 50 is lowered and pressed against the frame 41 again, and the checking step is performed. In this way, since a lifting step and a lowering step for the mask 50 are added in the mask alignment step, a lot of time has been consumed in the mask alignment step for the mask 50.

Figure 91:
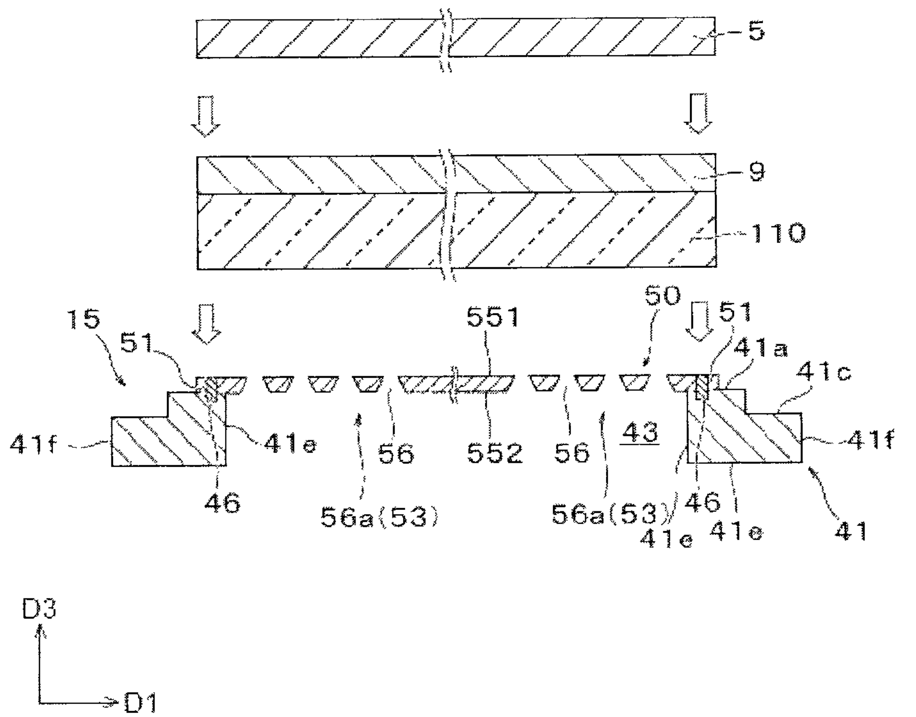
FIG. 91 is a view showing a close contact step in the method of manufacturing the organic device according to the third embodiment.

In contrast, in the present embodiment, the substrate 110 is held by the electrostatic chuck 9 as shown in FIG. 91 (described later) without using the mechanical substrate clamp 73. Since the electrostatic chuck 9 is located on the upper side of the substrate 110, no portion protrudes downward or laterally from the substrate 110. Thus, formation of the frame recessed portions 45 as shown in FIG. 82 in the frame 41 is not necessary. For this reason, the first wall surface edges 44*e* that overlap the end portions 51 of the mask 50 can be formed so as to extend in a straight line in the second direction D2 from the first mask edge 50*c* of the mask 50 to the second mask edge 50*d*. Therefore, a reaction force to be received from the frame 41 by the mask 50 is applied from each first wall surface edge 44*e* to the mask 50, and a reaction force to be received from each first wall surface edge 44*e* is uniformed in the width direction. Hence, concentration of a stress to be generated in the mask 50 due to a reaction force to be received by the mask 50 from the frame 41 is suppressed.

Even when the mask 50 is moved while being pressed against the frame 41 in this state, occurrence of deformation or breakage in the mask 50 is suppressed. For this reason, the mask 50 can be moved while being pressed against the frame 41, and the lifting step and the lowering step for the mask 50 as in the case of the example shown in FIG. 82 to FIG. 84 are unnecessary in the mask alignment step. Therefore, time to be consumed in the mask alignment step for the mask 50 is shortened.

Figure 85:
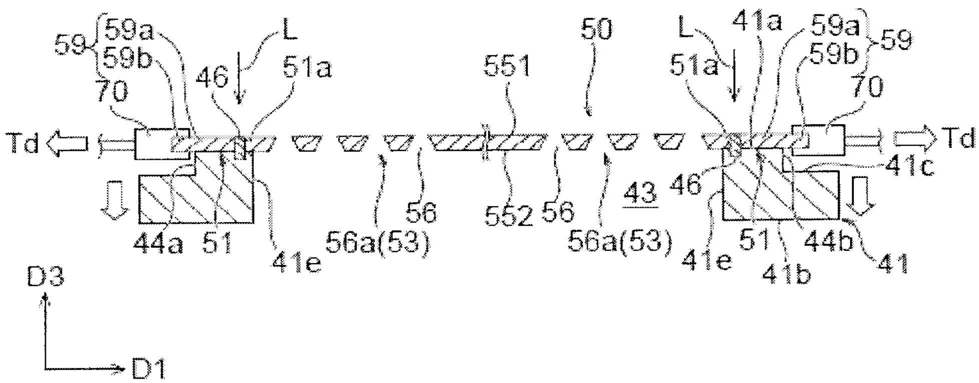
FIG. 85 is a view showing a joining step in the method of manufacturing the mask apparatus according to the third embodiment.

After the mask alignment step, as the joining step, as shown in FIG. 85, the mask 50 is joined with the frame 41. In the joining step, the mask 50 is pulled in the first direction D1 and pressed against the frame 41 by the joint tension Td. The joint tension Td is a tension to be applied to the mask 50 in the joining step. The joint tension Td may be a tension applied to the mask 50 in the mask alignment step. In other words, during times from the end of the mask alignment step to the joining step, a tension to be applied to the mask 50 may be unchanged. In other words, in the mask alignment step, alignment of the mask 50 is performed in a state where the joint tension Td is applied. During times from the end of the mask alignment step to the joining step, a force pressing the mask 50 against the frame 41 may be unchanged.

For example, the joint tension Td may be the second tension Tb applied to the mask 50 in the first through-hole checking step. More specifically, as a result of position check of the through-hole 56 in the first through-hole checking step, when the through-hole 56 is positioned within the allowable range with respect to the desired position, the mask alignment step ends. In this case, the state where the second tension Tb is applied to the mask 50 may be maintained in the first through-hole checking step, and the joining step may be performed. In other words, during times from the end of the first through-hole checking step to the joining step, a tension to be applied to the mask 50 is unchanged. In other words, in the first through-hole checking step, the joint tension Td is applied to the mask 50, and the position of the through-hole 56 with respect to the frame 41 is checked. During times from the end of the first through-hole checking step to the joining step, a force pressing the mask 50 against the frame 41 may be unchanged.

Alternatively, for example, the joint tension Td may be the second tension Tb applied to the mask 50 in the second through-hole checking step. More specifically, as a result of position check of the through-hole 56 in the second through-hole checking step, when the through-hole 56 is positioned within the allowable range with respect to the desired position, the mask alignment step ends. In this case, the state where the second tension Tb is applied to the mask 50 may be maintained in the second through-hole checking step, and the joining step may be performed. In other words, during times from the end of the second through-hole checking step to the joining step, a tension to be applied to the mask 50 is unchanged. In other words, in the second through-hole checking step, the joint tension Td is applied to the mask 50, and the position of the through-hole 56 with respect to the frame 41 is checked. During times from the end of the second through-hole checking step to the joining step, a force pressing the mask 50 against the frame 41 may be unchanged.

Alternatively, for example, the joint tension Td may be the third tension Tc. More specifically, when the tension adjustment step has been performed, a tension to be applied to the mask 50 is the third tension Tc adjusted from the second tension Tb. The state where the third tension Tc is applied to the mask 50 may be maintained in the third through-hole checking step, and the joining step may be performed. In other words, during times from the end of the third through-hole checking step to the joining step, a tension to be applied to the mask 50 is unchanged. In other words, in the third through-hole checking step, the joint tension Td is applied to the mask 50, and the position of the through-hole 56 with respect to the frame 41 is checked. During times from the end of the third through-hole checking step to the joining step, a force pressing the mask 50 against the frame 41 may be unchanged.

In the joining step, the welded portion 46 (an example of the joint portion) extending from each of the end portions 51 of the mask 50 to the frame 41 is formed in a state where the joint tension Td is applied. For example, the mask 50 may be joined with the frame 41 by spot welding using laser beam L. In this case, as shown in FIG. 85, the laser beam L may be applied to the first surface 551 of the mask 50, and a melting portion may be formed in a region from the first surface 551 over the second surface 552 to the frame 41 within the region to which the laser beam L is applied. When application of the laser beam L ends, the melting portion may be cooled to be solidified, and the welded portions 46 as shown in FIG. 85 may be formed. In this way, the mask 50 is fixedly joined with the frame 41.

Figure 86:
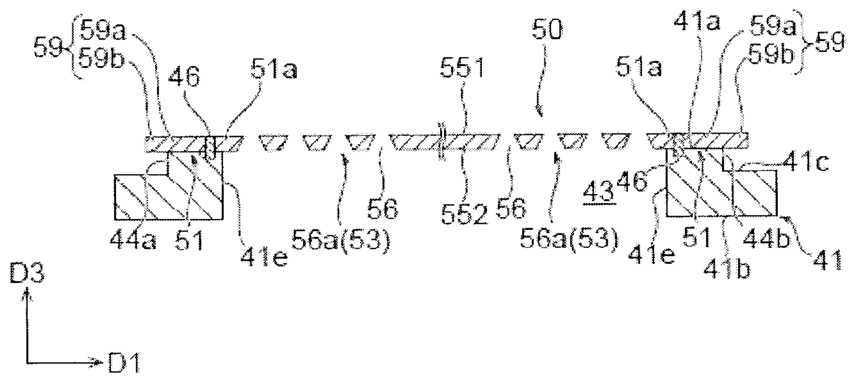
FIG. 86 is a view showing a detachment step in the method of manufacturing the mask apparatus according to the third embodiment.
Figure 87:
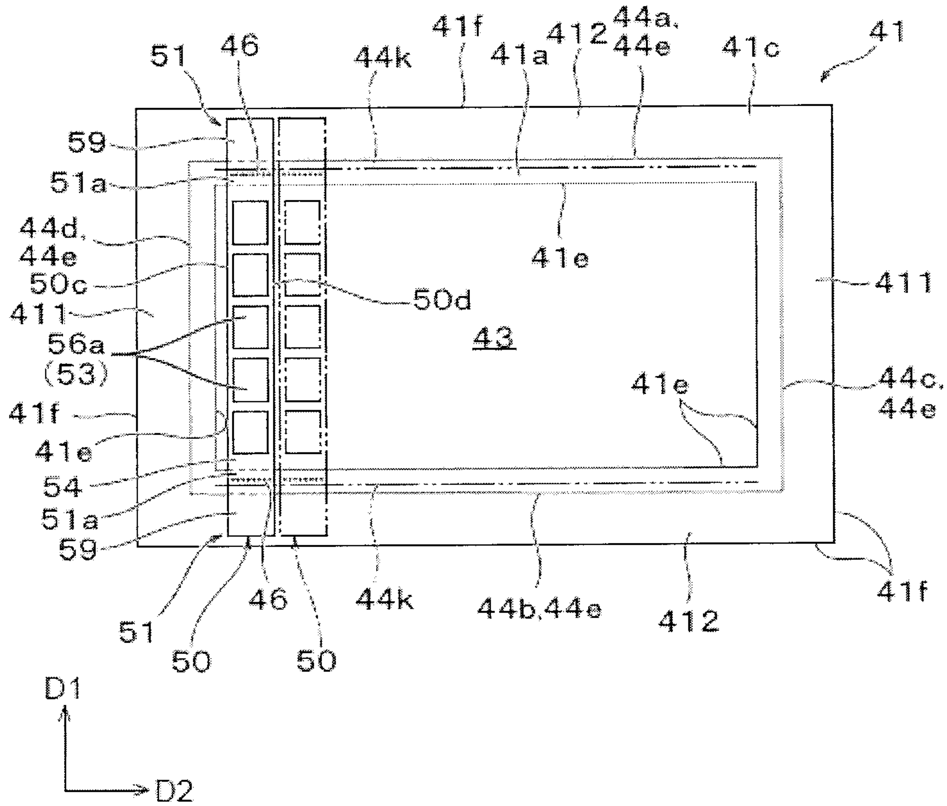
FIG. 87 is a plan view showing a frame with which one mask is joined in the method of manufacturing the mask apparatus according to the third embodiment.

After the joining step, as the detachment step, as shown in FIG. 86, the mask clamps 70 are detached from the mask 50. In this way, as shown in FIG. 87, one mask 50 is fixed to the frame 41.

The detached mask clamps 70 go to handle the mask 50 to be subsequently joined with the frame 41 and hold the mask 50. By performing the above-described steps, the mask 50 is joined with the frame 41 (see the mask 50 indicated by the alternate long and two-short dashed line in FIG. 87). After that, by repeating the steps similarly, a desired number of the masks 50 are joined with the frame 41 as shown in FIG. 88.

Figure 88:
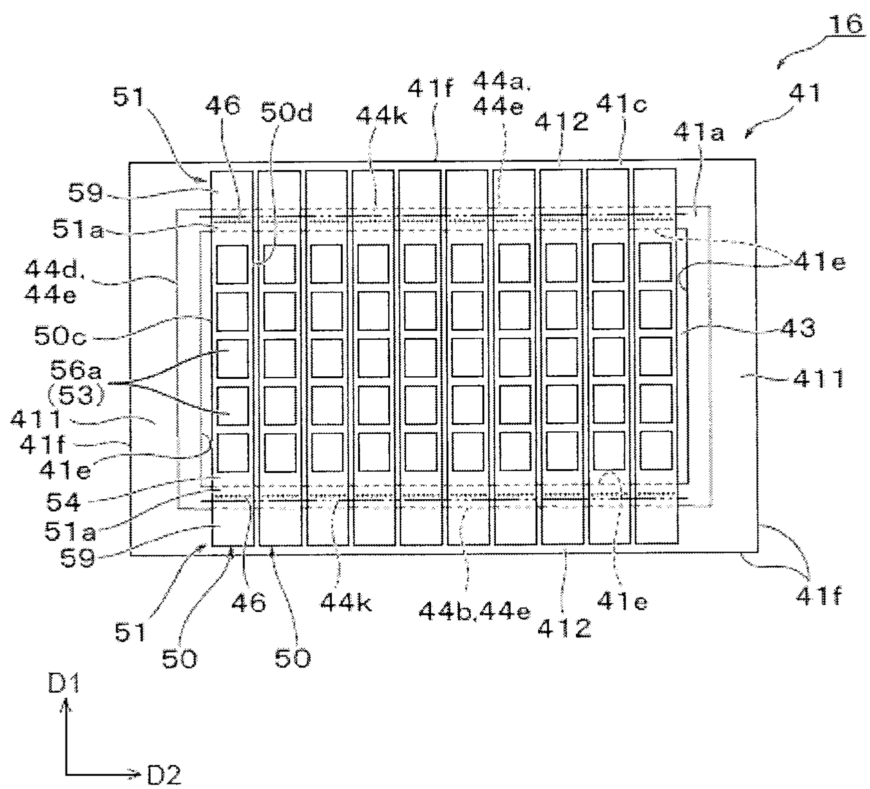
FIG. 88 is a plan view showing intermediate product of the mask apparatus to be obtained through the method of manufacturing the mask apparatus according to the third embodiment.

In this way, an intermediate product 16 as shown in FIG. 88 is obtained. The intermediate product 16 includes the frame 41 and the masks 50 joined with the frame 41 and placed in a stage before the cutting step (described later). Therefore, in the masks 50 that are components of the intermediate product 16 of a mask apparatus, the removal portions 59 to be removed by cutting in the cutting step are remaining. In this point, the intermediate product 16 of a mask apparatus and the mask apparatus 15 may be distinguished from each other.

Figure 89:
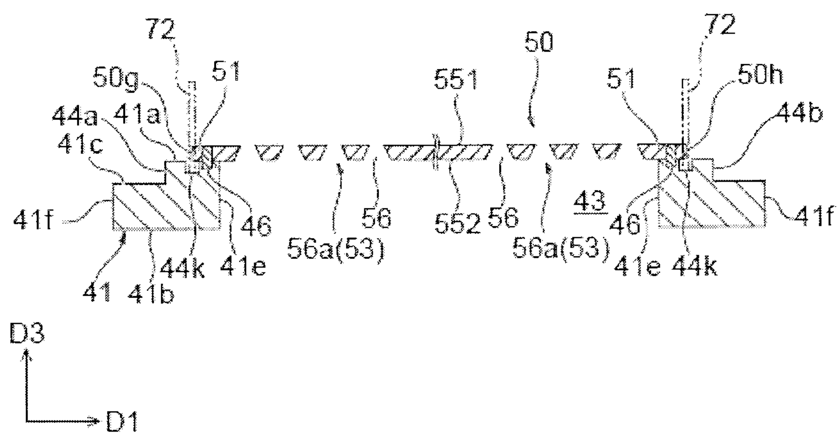
FIG. 89 is a view showing a cutting step in the method of manufacturing the mask apparatus according to the third embodiment.
Figure 90:
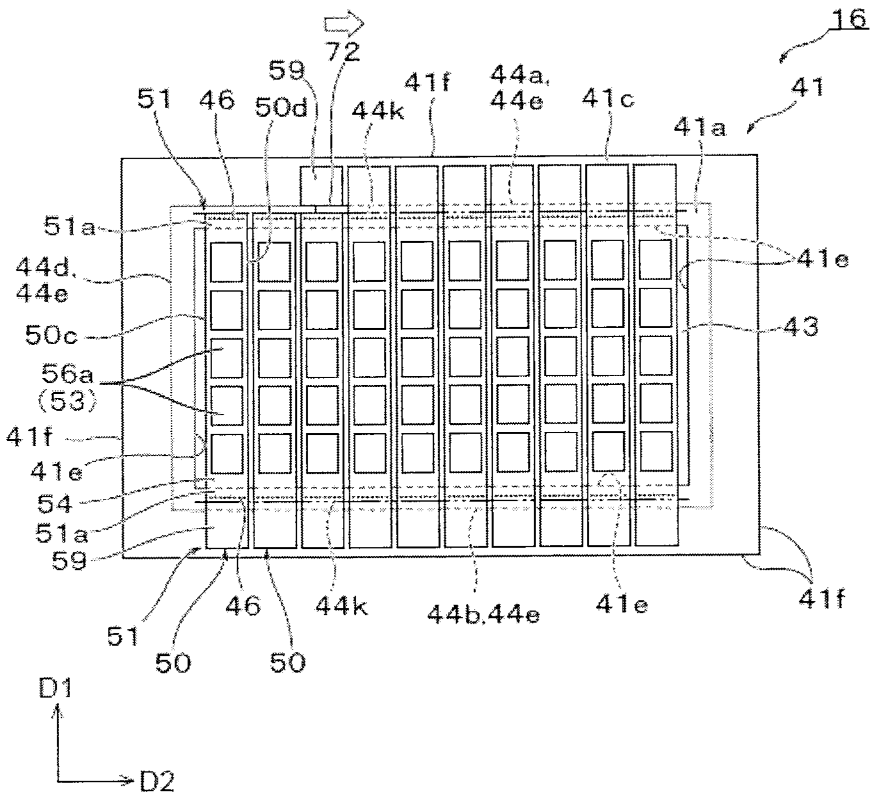
FIG. 90 is a plan view showing the mask apparatus in the cutting step of the method of manufacturing the mask apparatus according to the third embodiment.

After that, as the cutting step, as shown in FIG. 89, the end portions 51 of each mask 50 are cut (also referred as trimming). In this case, each mask 50 is cut at a position outside the welded portion 46 in the first direction D1 in each of the end portions 51 of the mask 50, and the removal portion 59 that is a portion outside the cutting position is removed. The cutting blade 72 to cut the mask 50 cuts the mask 50 while being partially inserted in the frame groove 44*k* provided on the frame first surface 41*a* of the frame 41. Then, the cutting blade 72 sequentially cuts the masks 50 as shown in FIG. 90 while advancing in the second direction D2 along the frame groove 44*k*. Thus, the masks 50 are cut along the frame grooves 44*k*. The two end portions 51 of each mask 50 may be cut separately with the one cutting blade 72 (see FIG. 90) or may be cut with the two cutting blades 72 at the same time.

In this way, the mask apparatus 15 as shown in FIG. 73 is obtained.

Next, the method of manufacturing the organic device 100 using the mask apparatus 15 according to the present embodiment will be described. The manufacturing method may include a step of forming the first vapor deposition layers 130 by depositing the vapor deposition material 7 onto the substrate 110 with the mask apparatus 15. More specifically, the method of manufacturing an organic device according to the present embodiment may include a substrate preparation step, an apparatus preparation step, an apparatus alignment step, a close contact step, and a vapor deposition step.

As the substrate preparation step, the substrate 110 may be prepared. As the apparatus preparation step, the mask apparatus 15 may be prepared.

After the apparatus preparation step, as the apparatus alignment step, the mask apparatus 15 is aligned with the substrate 110. In the apparatus alignment step, the position of the mask apparatus 15 with respect to the substrate 110 is checked. For example, the position of the frame 41 with respect to the substrate 110 may be adjusted such that the mask alignment marks 81 of the alignment mask 80 are aligned with associated alignment marks (not shown) of the substrate 110. Thus, the position of each mask 50 with respect to the substrate 110 is adjusted.

After the apparatus alignment step, as the close contact step, as shown in FIG. 91, the masks 50 of the mask apparatus 15 may be brought into close contact with the substrate 110. The first surface 551 of each mask 50 may be brought into contact with the substrate 110. More specifically, initially, the mask apparatus 15 is placed in the vapor deposition chamber 10 such that the first surface 551 of each mask 50 is faced upward. In addition, the substrate 110 is held by the electrostatic chuck 9 from the upper side. Subsequently, the substrate 110 is placed above the mask 50 in a state where the substrate 110 is held by the electrostatic chuck 9. Subsequently, the lower surface (vapor deposition surface) of the substrate 110 is mated with the first surface 551 of each mask 50. At this time, the substrate 110 and each mask 50 are aligned with each other.

Subsequently, the magnet 5 is placed on the upper surface of the electrostatic chuck 9, and the masks 50 are attracted to the substrate 110 by the magnetic force of the magnet 5. Thus, the substrate 110 is brought into close contact with the first surface 551 of each mask 50 (see FIG. 92). When the first electrode layers 120 are anodes, the first electrode layers 120, hole injection layers, hole transport layers, and the like may be formed on the substrate 110 before bringing each mask 50 into close contact.

Each mask 50 and the substrate 110 may be brought into close contact with each other not by the magnet 5 but by the electrostatic chuck 9. In this case, after the substrate 110 and each mask 50 are aligned with each other, each mask 50 is attracted to the substrate 110 by the electrostatic force of the electrostatic chuck 9 by increasing the electrostatic force of the electrostatic chuck 9. In this way, the substrate 110 may be brought into close contact with the first surface 551 of each mask 50.

Figure 92:
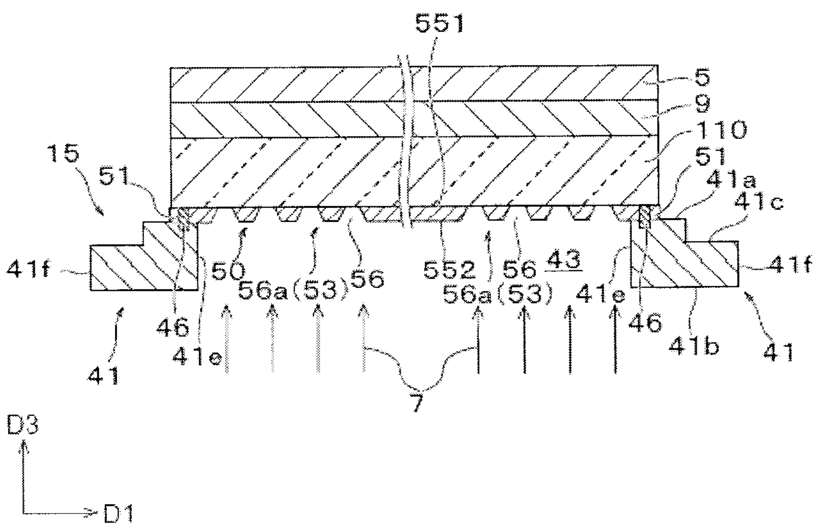
FIG. 92 is a view showing a vapor deposition step in the method of manufacturing the organic device according to the third embodiment.

After the close contact step, as the vapor deposition step, as shown in FIG. 92, the first vapor deposition layers 130 may be formed by depositing the vapor deposition material 7 onto the substrate 110 through the through-holes 56 of each mask 50. The first vapor deposition layers 130 may be formed on associated hole transport layers. The first vapor deposition layers 130 are formed in a pattern corresponding to the pattern of the through-holes 56.

After that, an electron transport layer, an electron injection layer, the second electrode layer 141, and the like may be formed on each first vapor deposition layer 130. In this way, the organic device 100 is obtained.

According to the present embodiment, in the mask alignment step of aligning the mask 50 with the frame 41, the mask 50 is pressed against the frame 41. During then, the end portions 51 of the mask 50 are placed so as to respectively overlap the first wall surface edges 44*e*, adjacent to the frame first surface 41*a*, of the frame wall surfaces 44*a*, 44*b* of the frame 41 and each first wall surface edge 44*e* extends in a straight line in the second direction D2 from the first mask edge 50*c* of the mask 50 to the second mask edge 50*d* in plan view. Thus, a reaction force to be received by the mask 50 from the frame 41 is applied from each first wall surface edge 44*e* to the mask 50, and a reaction force to be received from each first wall surface edge 44*e* is uniformed in the width direction of the mask 50. In this case, local concentration of a stress to be generated in the mask 50 due to a reaction force to be received from the frame 41 by the mask 50 is suppressed. For this reason, the mask 50 can be moved while being pressed against the frame 41, and time consumed in the mask alignment step for the mask 50 is shortened.

According to the present embodiment, in the joining step, the mask 50 is joined with the frame while being pulled in the first direction D1 and pressed against the frame 41. by the joint tension Td. In the mask alignment step, the joint tension Td is applied to the mask 50. Thus, alignment of the mask 50 can be performed with a tension equal to a tension to be applied to the mask 50 in the joining step. Therefore, the positional accuracy of each through-hole 56 is improved.

According to the present embodiment, the mask alignment step includes the first through-hole checking step of checking the position of the through-hole 56 with respect to the frame 41 while pressing the mask 50 against the frame 41. Thus, the position of the through-hole 56 can be checked in a state where the mask 50 is pressed against the frame 41, so alignment of the mask 50 can be efficiently performed. For this reason, time consumed in the mask alignment step for the mask 50 is further shortened. In addition, the joint tension Td is applied to the mask 50 in the first through-hole checking step. Thus, the position of the through-hole 56 can be checked with a tension equal to a tension to be applied to the mask 50 in the joining step. Therefore, the positional accuracy of each through-hole 56 is improved.

According to the present embodiment, the mask alignment step includes the moving step of moving the mask 50 in any one of directions in a two-dimensional plane defined by the second direction D2 and the first direction D1 while pressing the mask 50 against the frame 41. Thus, the mask 50 can be moved in a two-dimensional manner while being pressed against the frame 41, so alignment of the mask 50 can be efficiently performed. For this reason, time consumed in the mask alignment step for the mask 50 is further shortened. The mask 50 can be moved in accordance with a check result on the position of the through-hole 56 in the first through-hole checking step. Thus, the position deviation of each through-hole 56 is effectively corrected. In terms of this point as well, alignment of the mask 50 can be efficiently performed. In addition, the joint tension Td is applied to the mask 50 in the moving step. Thus, the mask 50 can be moved with a tension equal to a tension to be applied to the mask 50 in the joining step. Therefore, the positional accuracy of each through-hole 56 is improved.

According to the present embodiment, the mask alignment step includes the second through-hole checking step of, after the moving step, checking the position of the through-hole 56 with respect to the frame 41 while pressing the mask 50 against the frame 41. Thus, the position of the through-hole 56 can be checked in a state where the mask 50 is pressed against the frame 41, so alignment of the mask 50 can be efficiently performed. For this reason, time consumed in the mask alignment step for the mask 50 is further shortened. In addition, the joint tension Td is applied to the mask 50 in the second through-hole checking step. Thus, the position of the through-hole 56 can be checked with a tension equal to a tension to be applied to the mask 50 in the joining step. Therefore, the positional accuracy of each through-hole 56 is improved.

According to the present embodiment, after the position of the through-hole 56 is checked in the second through-hole checking step, when a tension to be applied to the mask 50 is adjusted, the position of the through-hole 56 is checked as the third through-hole checking step thereafter. The joint tension Td is applied to the mask 50 in the third through-hole checking step. Thus, when a tension to be applied to the mask 50 is adjusted, the position of the through-hole 56 is checked with a tension equal to a tension to be applied to the mask 50 in the joining step thereafter. Therefore, the positional accuracy of each through-hole 56 is improved.

According to the present embodiment, after the welded portion 46 to join the mask 50 with the frame 41 is formed, the mask 50 is cut at a position outside the welded portion 46 in the first direction D1 in each of the end portions 51 of the mask 50. Thus, the mask 50 can be joined with the frame 41 in a state where the mask 50 is aligned with the frame 41. Therefore, even after the mask 50 is cut, the aligned state is maintained. Therefore, the positional accuracy of each through-hole 56 is improved.

According to the present embodiment, the frame grooves 44*k* that extend in the second direction D2 are provided on the frame first surface 41*a* of the frame 41, and the mask 50 is cut along the frame groove 44*k*. Thus, even after the mask 50 is joined with the frame 41, the mask 50 can be cut with a cutting device, such as the cutting blade 72. Therefore, the mask 50 can be efficiently cut. Since each frame groove 44*k* is provided on the frame first surface 41*a*, the mask 50 can be cut inside the first wall surface edge 44*e* of each of the frame wall sur faces 44*a*, 44*b* in the first direction D1. Thus, the length of the mask 50 remaining outside the welded portions 46 in the first direction D1 can be shortened. Therefore, part of the mask 50 to be released from a tension after being joined with the frame 41 is shortened. In this case, remaining of a cleaning fluid at the time when the mask apparatus 15 is washed is suppressed, so inconvenience due to remaining cleaning fluid is suppressed.

According to the present embodiment, the first wall surface edges 44*e* of the frame wall surfaces 44*a*, 44*b* of the frame 41 extend in a straight line in the second direction D2 from one of the masks 50 to another one of the masks 50. Thus, the influence of a reaction force to be received from the first wall surface edges 44*e* is made uniform among the masks 50. Therefore, alignment of each mask 50 is easily performed, and the positional accuracy of the through-holes 56 of each mask 50 is improved. Among others, according to the present embodiment, the first wall surface edges 44*e* extend in a straight line in the second direction D2 from one of the masks 50, located farthest to one side in the second direction D2, to another one of the masks 50, located farthest to the other side opposite from the one of the masks 50. Therefore, alignment of all the masks 50 is easily performed, and the positional accuracy of the through-holes 56 of each mask 50 is further improved.

According to the present embodiment, at the time when the masks 50 of the mask apparatus 15 are brought into close contact with the substrate 110, the substrate 110 is held by the electrostatic chuck 9 from the upper side. Thus, formation of an obstacle that protrudes downward or laterally from the substrate 110 and that interferes with the frame 41 is avoided. For this reason, the first wall surface edges 44*e* that overlap the end portions 51 of each mask 50 can be formed so as to extend in a straight line in the second direction D2.

According to the present embodiment, the example in which the first wall surface edges 44*e* of the frame wall surfaces 44*a*, 44*b* extend in a straight line in the second direction D2 from one of the masks 50, located farthest to one side in the second direction D2, to another one of the masks 50, located farthest to the other side opposite from the one of the masks 50 is described. However, the configuration is not limited thereto. For at least one of the masks 50 of the plurality of masks 50 joined with the frame 41, the first wall surface edges 44*e* of the frame wall surfaces 44*a*, 44*b* may be extended in a straight line in the second direction D2 from the first extended line 50*e* of the first mask edge 50*c* of the mask 50 to the second extended line 50*f* of the second mask edge 50*d* after the cutting step. In addition, the first wall surface edges 44*e* just need to extend in a straight line in each mask 50 and do not need to extend in a straight line from one of the masks 50 to another adjacent one of the masks 50.

The standard mask apparatus 15A including the standard mask 50A and the mask support 40 may be manufactured in accordance with the method of manufacturing a mask apparatus according to the present embodiment. The standard mask apparatus 15A is used to evaluate the characteristics of the vapor deposition chamber 10. Therefore, high accuracy is desired for the component elements of the standard mask apparatus 15A. According to the present embodiment, the positional accuracy of each through-hole 56 of the standard mask 50A is improved. For this reason, further accurate evaluation of the characteristics of the vapor deposition chamber 10 can be performed.

Although not shown in the drawing, the mask support 40 of the present embodiment may include the bars 42 connected to the frame 41 as in the case of the above-described embodiments. The bars 42 may be integrated with the frame 41 as in the case of the second embodiment. As described above, the mask support 40 including the frame 41 and the bars 42, integrated with each other, has a high stiffness in the direction in which the bars 42 extend as compared to the case where the frame 41 and the bars 42 are different members. Therefore, a deformation of the frame 41 of the mask support 40 in the second direction D2 due to a force received by the mask support 40 from the mask 50 or the standard mask 50A is suppressed. Thus, a deviation of the positions of the through-holes 56 from designed positions is suppressed.

The bar first surface 42*a* of each bar 42 may be located in the same plane with the frame first surface 41*a* of the frame 41. Thus, the position of the surface of the mask 50 or standard mask 50A to be supported by the bars 42 from the lower side is easily controlled with respect to the frame first surface 41*a* of the frame 41. Therefore, the positional accuracy of each through-hole 56 is improved.

The plurality of component elements described in the embodiments and modifications may be combined as needed. Alternatively, some component elements may be deleted from all the component elements described in the embodiments and the modifications.

The invention claimed is:

1. A method of manufacturing a standard mask apparatus for evaluating a vapor deposition chamber of a manufacturing apparatus for an organic device, the manufacturing method comprising:

- a fixing step of fixing at least one standard mask to a frame, wherein
- the frame includes a pair of first sides extending in a first direction, a pair of second sides extending in a second direction that intersects with the first direction, and an opening,
- the at least one standard mask includes a pair of end portions in the first direction, and at least one through-hole located between the pair of end portions, and
- the fixing step includes
  - a placement step of placing the at least one standard mask such that the pair of end portions overlaps the pair of second sides,
  - a mask alignment step of, after the placement step, while a joint tension is being applied to the at least one standard mask in the first direction and the at least one standard mask is being pressed against the frame, adjusting a position of the at least one standard mask with respect to the frame, and a joining step of, after the mask alignment step, while a joint tension is being applied to the at least one standard mask in the first direction and the at least one standard mask is being pressed against the frame, joining the at least one standard mask with the frame, wherein, in the mask alignment step, the at least one standard mask is moved with respect to the frame while being pressed against the frame.

2. The method according to claim 1, wherein the mask alignment step includes a first checking step of, while a joint tension is being applied to the at least one standard mask in the first direction and the at least one standard mask is being pressed against the frame, checking a position of the at least one through-hole with respect to the frame.

3. The method according to claim 1, wherein the mask alignment step includes a moving step of, while a joint tension is being applied to the at least one standard mask in the first direction and the at least one standard mask is being pressed against the frame, moving the at least one standard mask in any one of directions in a two-dimensional plane defined by the first direction and the second direction.

4. The method according to claim 1, wherein the frame includes a frame first surface to which the at least one standard mask is fixed, a frame second surface located across from the frame first surface, an inner surface located between the frame first surface and the frame second surface and facing the opening, and a frame wall surface located outside the inner surface in plan view and connected to the frame first surface, the frame wall surface includes a first wall surface edge where the frame wall surface and the frame first surface intersect with each other, in the mask alignment step, each of the pair of end portions overlaps the first wall surface edge, and part of the first wall surface edge that overlaps the pair of end portions extends in a straight line in the second direction.

5. The method according to claim 1, wherein the standard mask apparatus includes at least one bar located in the opening and connected to the frame, the frame includes a frame first surface to which the at least one standard mask is fixed, a frame second surface located across from the frame first surface, an inner surface located between the frame first surface and the frame second surface and to which the at least one bar is connected, and an outer surface located across from the inner surface, the at least one bar includes a bar first surface located on the frame first surface side, a bar second surface located across from the bar first surface, and bar side surfaces located between the bar first surface and the bar second surface, and the frame first surface and the bar first surface are continuous.

6. The method according to claim 1, wherein the standard mask apparatus includes the two or more standard masks fixed to the pair of second sides and arranged in the second direction.

7. The method according to claim 6, wherein the standard mask apparatus includes standard regions each including the at least one through-hole, and the standard regions are arranged in the first direction and in the second direction that intersects with the first direction, each standard region is located in a middle region, and the middle region is a region in a middle when the at least one standard mask is trisected in the second direction.

8. The method according to claim 7, wherein each standard region includes a non-penetrated region located around the at least one through-hole in the middle region, and the non-penetrated region has a dimension greater in plan view than an arrangement period of the at least one through-hole.

* * * * *